US012807634B2

(12) United States Patent
Kim et al.

(10) Patent No.: US 12,807,634 B2
(45) Date of Patent: Nov. 24, 2026

(54) ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Hwang Suk Kim, Suwon-si (KR); Sangho Park, Suwon-si (KR); Minsik Min, Suwon-si (KR); Hyejin Bae, Suwon-si (KR); Soonok Jeon, Suwon-si (KR); Hyesung Choi, Suwon-si (KR); Hosuk Kang, Suwon-si (KR); Jong Soo Kim, Suwon-si (KR); Joonghee Won, Suwon-si (KR); Jun Chwae, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 1015 days.

(21) Appl. No.: 18/065,690

(22) Filed: Dec. 14, 2022

(65) Prior Publication Data

US 2024/0002418 A1 Jan. 4, 2024

(30) Foreign Application Priority Data

Jun. 30, 2022 (KR) ........................ 10-2022-0080854

(51) Int. Cl.
*H01L 51/00* (2006.01)
*C07F 15/00* (2006.01)
(Continued)

(52) U.S. Cl.
CPC .......... *C07F 15/0086* (2013.01); *H10K 50/11* (2023.02); *H10K 85/346* (2023.02)

(58) Field of Classification Search
None
See application file for complete search history.

(56) References Cited

U.S. PATENT DOCUMENTS 6,310,360 B1 10/2001 Forrest et al.
6,515,298 B2 2/2003 Forrest et al.
(Continued)

FOREIGN PATENT DOCUMENTS

EP 3428174 A1 1/2019
EP 3431482 A1 1/2019
(Continued)

OTHER PUBLICATIONS

European Search Report for European Patent Application No. 23162080.8 dated Nov. 21, 2023.
(Continued)

*Primary Examiner* — Jay Yang
(74) *Attorney, Agent, or Firm* — CANTOR COLBURN LLP

(57) ABSTRACT

An organometallic compound represented by Formula 1:

Formula 1

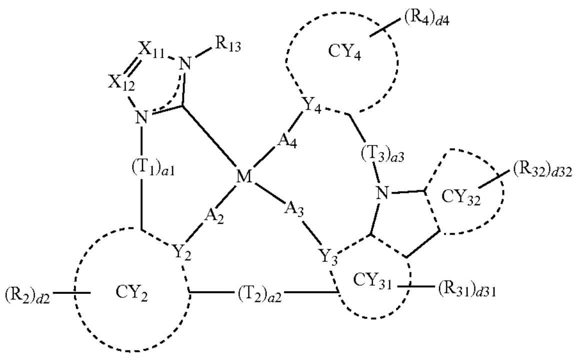

wherein, M is a transition metal, $X_{11}$ is N or $C(R_{11})$, $X_{12}$ is N or $C(R_{12})$, at least one of $X_{11}$ and $X_{12}$ is N, ring $CY_2$, ring $CY_{31}$, ring $CY_{32}$, and ring $CY_4$ are each independently a $C_3$-$C_{60}$ carbocyclic group or a $C_1$-$C_{60}$ heterocyclic group, $Y_2$ to $Y_4$ are each independently C or N, $A_2$ to $A_4$ are each independently a chemical bond, O, or S, a1 to a3 are each
(Continued)

independently an integer from 1 to 3, and the remaining substitutions are as provided in the detailed description.

20 Claims, 4 Drawing Sheets

(51) Int. Cl.

| | |
|---|---|
| ***C09K 11/06*** | (2006.01) |
| ***H10K 50/11*** | (2023.01) |
| ***H10K 85/30*** | (2023.01) |

(56) References Cited

U.S. PATENT DOCUMENTS

| | | | | |
|---|---|---|---|---|
| 6,894,307 | B2 | 5/2005 | Forrest et al. | |
| 8,476,823 | B2 | 7/2013 | Kuma et al. | |
| 8,643,268 | B2 | 2/2014 | Ogiwara et al. | |
| 9,153,790 | B2 | 10/2015 | Kuma et al. | |
| 9,385,329 | B2 | 7/2016 | Li et al. | |
| 9,493,698 | B2 | 11/2016 | Beers et al. | |
| 9,905,779 | B2 | 2/2018 | Ogiwara et al. | |
| 10,069,077 | B2 | 9/2018 | Park et al. | |
| 10,090,483 | B2 | 10/2018 | Kim et al. | |
| 2016/0322590 | A1 | 11/2016 | Inoue et al. | |
| 2017/0077418 | A1 | 3/2017 | Stoessel et al. | |
| 2017/0163010 | A1 | 6/2017 | Nakanotani et al. | |
| 2018/0053901 | A1 | 2/2018 | Yoshida et al. | |
| 2018/0130959 | A1 | 5/2018 | Ogiwara et al. | |
| 2018/0248127 | A1 | 8/2018 | Lee et al. | |
| 2019/0036042 | A1* | 1/2019 | Kim .................... | C07F 15/0086 |
| 2019/0225636 | A1 | 7/2019 | Bae et al. | |
| 2019/0305229 | A1 | 10/2019 | Ihn et al. | |
| 2019/0334100 | A1 | 10/2019 | Han et al. | |
| 2020/0083458 | A1 | 3/2020 | Jeon et al. | |
| 2020/0168798 | A1 | 5/2020 | Han et al. | |
| 2020/0203634 | A1 | 6/2020 | Kim et al. | |
| 2020/0266366 | A1 | 8/2020 | Bold et al. | |
| 2020/0321537 | A1 | 10/2020 | Jeon et al. | |
| 2020/0392173 | A1 | 12/2020 | Bae et al. | |
| 2020/0395560 | A1 | 12/2020 | Bae et al. | |
| 2021/0167299 | A1 | 6/2021 | Chung et al. | |
| 2021/0249610 | A1 | 8/2021 | Kim et al. | |
| 2021/0408379 | A1 | 12/2021 | Numata et al. | |
| 2022/0106345 | A1 | 4/2022 | Bae et al. | |
| 2023/0002429 | A1 | 1/2023 | Min et al. | |
| 2023/0084208 | A1 | 3/2023 | Kim et al. | |
| 2023/0090659 | A1 | 3/2023 | Kwon et al. | |

FOREIGN PATENT DOCUMENTS

| | | | |
|---|---|---|---|
| EP | 3822280 | A1 | 5/2021 |
| JP | 2002193952 | A | 7/2002 |
| KR | 20170025990 | A | 3/2017 |
| KR | 20170032148 | A | 3/2017 |
| KR | 20180098809 | A | 9/2018 |
| KR | 20190089626 | A | 7/2019 |
| KR | 20200143236 | A | 12/2020 |
| KR | 20220166404 | A | 12/2022 |
| WO | 0215645 | A1 | 2/2002 |
| WO | 2005019373 | A2 | 3/2005 |
| WO | 2014047616 | A1 | 3/2014 |
| WO | 2016158540 | A1 | 10/2016 |

OTHER PUBLICATIONS

Fleetham et al., Efficient "Pure" Blue OLEDs Employing Tetradentate Pt Complexes with a Narrow Spectral Bandwidth, Adv. Mater. 2014, 26, 7116-7121.

Li et al., Tetradentate Platinum (II) Complexes for Highly Efficient Phosphorescent Emitters and Sky Blue OLEDs, Chem. Mater. 2020, 32, 537-548.

Seifert et al., "Chemical degradation mechanisms of highly efficient blue phosphorescent emitters used for organic light emitting diodes", Organic Electronics, 14, 2013, 115-123.

* cited by examiner

ORGANOMETALLIC COMPOUND, ORGANIC LIGHT-EMITTING DEVICE INCLUDING THE SAME, AND ELECTRONIC APPARATUS INCLUDING THE ORGANIC LIGHT-EMITTING DEVICE

CROSS-REFERENCE TO RELATED APPLICATION

This application is based on and claims priority to Korean Patent Application No. 10-2022-0080854, filed on Jun. 30, 2022, in the Korean Intellectual Property Office, and all the benefits accruing therefrom under 35 U.S.C. § 119, the content of which is incorporated by reference herein in its entirety.

BACKGROUND

1. Field

The subject matter relates to an organometallic compound, an organic light-emitting device including the same, and an electronic apparatus including the organic light-emitting device.

2. Description of the Related Art

Organic light-emitting devices (OLEDs) are self-emissive devices, which have improved characteristics in terms of viewing angles, response time, luminance, driving voltage, and response speed. In addition, OLEDS can produce full-color images.

In a typical example, an organic light-emitting device may include an anode, a cathode, and an organic layer arranged between the anode and the cathode, wherein the organic layer includes an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons may transition from an excited state to a ground state, thereby generating light.

SUMMARY

Provided are an organometallic compound, an organic light-emitting device including the same, and an electronic apparatus including the organic light-emitting device.

According to an aspect, provided is an organometallic compound represented by Formula 1:

Formula 1

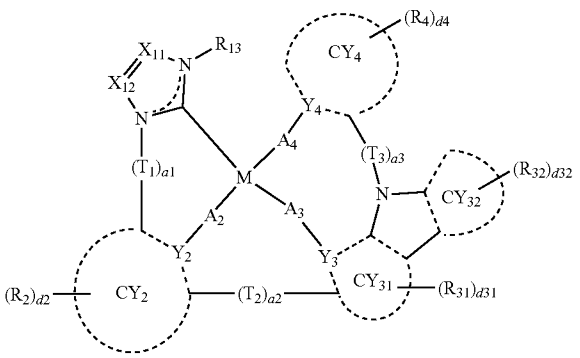

wherein, in Formula 1,

M is a transition metal, $X_{11}$ is N or $C(R_{11})$, $X_{12}$ is N or $C(R_{12})$, at least one of $X_{11}$ and $X_{12}$ is N, ring $CY_2$, ring $CY_{31}$, ring $CY_{32}$, and ring $CY_4$ are each independently a $C_3$-$C_{60}$ carbocyclic group or a $C_1$-$C_{60}$ heterocyclic group, $Y_2$ to $Y_4$ are each independently C or N, $A_2$ to $A_4$ are each independently a chemical bond, O, or S, $T_1$ may be a single bond, a double bond, *—N[$(L_1)_{b1}$-$(R_{1a})$]—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(=O)—*', *—S(=O)—*', *—S(=O)$_2$—*', *—C($R_{1a}$)=*', *=C($R_{1a}$)—*', *—C($R_{1a}$)=C($R_{1b}$)—*', *—C(=S)—*', or *—C≡C—*', $T_2$ may be a single bond, a double bond, *—N[$(L_2)_{b2}$-$(R_{2a})$]—*', *—B($R_{2a}$)—*', *—P($R_{2a}$)—*', *—C($R_{2a}$)($R_{2b}$)—*', *—Si($R_{2a}$)($R_{2b}$)—*', *—Ge($R_{2a}$)($R_{2b}$)—*', *—S—*', *—Se—*', *—O—*', *—C(=O)—*', *—S(=O)—*', *—S(=O)$_2$—*', *—C($R_{2a}$)=*', *=C($R_{2a}$)—*', *—C($R_{2a}$)=C($R_{2b}$)—*', *—C(=S)—*', or *—C≡C—*', $T_3$ may be a single bond, a double bond, *—N[$(L_3)_{b3}$-$(R_{3a})$]—*', *—B($R_{3a}$)—*', *—P($R_{3a}$)—*', *—C($R_{3a}$)($R_{3b}$)—*', *—Si($R_{3a}$)($R_{3b}$)—*', *—Ge($R_{3a}$)($R_{3b}$)—*', *—S—*', *—Se—*', *—O—*', *—C(=O)—*', *—S(=O)—*', *—S(=O)$_2$—*', *—C($R_{3a}$)=*', *=C($R_{3a}$)—*', *—C($R_{3a}$)=C($R_{3b}$)—*', *—C(=S)—*', or *—C≡C—*', a1 to a3 are each independently an integer from 1 to 3,

* and *' each indicate a binding site to a neighboring atom, $L_1$ to $L_3$ are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b1 to b3 are each independently an integer from 1 to 3, $R_{1a}$, $R_{1b}$, $R_2$, $R_{2a}$, $R_{2b}$, $R_{3a}$, $R_{3b}$, $R_4$, $R_{10a}$, $R_{11}$ to $R_{13}$, $R_{31}$, and $R_{32}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$Ge(Q_1)(Q_2)(Q_3)$, —$N(Q_4)(Q_5)$, —$B(Q_6)(Q_7)$, —$P(Q_8)(Q_9)$, or —$P(=O)(Q_8)(Q_9)$, d2, d31, d32, and d4 are each independently an integer from 0 to 10, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, a $C_1$-$C_{60}$alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$Ge(Q_{11})(Q_{12})(Q_{13})$, —$N(Q_{14})(Q_{15})$, —$B(Q_{16})(Q_{17})$, —$P(Q_{18})(Q_{19})$, —$P(=O)(Q_{18})(Q_{19})$, or a combination thereof, a $C_3$-$C_{10}$cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, a $C_3$-$C_{10}$cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$Ge(Q_{21})(Q_{22})(Q_{23})$, —$N(Q_{24})(Q_{25})$, —$B(Q_{26})(Q_{27})$, —$P(Q_{28})(Q_{29})$, —$P(=O)(Q_{28})(Q_{29})$, or a combination thereof, or —$Si(Q_{31})(Q_{32})(Q_{33})$, —$Ge(Q_{31})(Q_{32})(Q_{33})$, —$N(Q_{34})(Q_{35})$, —$B(Q_{36})(Q_{37})$, —$P(Q_{38})(Q_{39})$, or —$P(=O)(Q_{38})(Q_{39})$, and $Q_1$ to Q, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

According to another aspect, an organic light-emitting device includes a first electrode, a second electrode, and an organic layer arranged between the first electrode and the second electrode, wherein the organic layer includes an emission layer, and wherein the organic layer further includes at least one of the organometallic compound.

According to still another aspect, an electronic apparatus includes the organic light-emitting device.

Additional aspects will be set forth in part in the detailed description that follows and, in part, will be apparent from the detailed description, or may be learned by practice of the presented exemplary embodiments.

BRIEF DESCRIPTION OF THE DRAWINGS

The above and other aspects, features, and advantages of certain exemplary embodiments will be more apparent from the following detailed description taken in conjunction with the accompanying drawings, in which.

DETAILED DESCRIPTION

Figure 1:
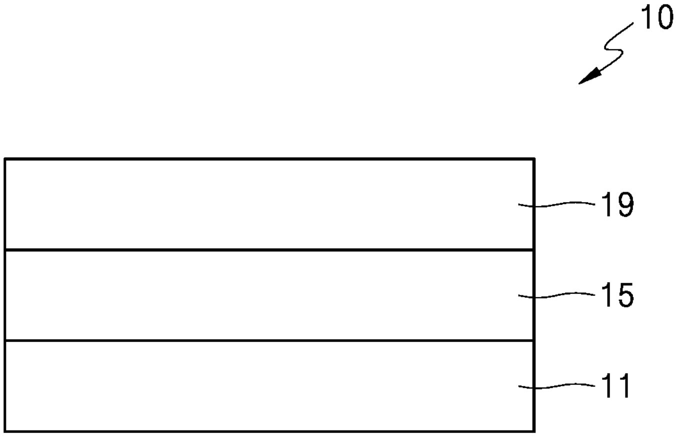
FIG. 1 is a schematic cross-sectional view of an organic light-emitting device according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the exemplary embodiments are merely described in further detail below, and by referring to the figures, to explain particular aspects and features. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a work function or a highest occupied molecular orbital (HOMO) energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

An aspect provides an organometallic compound represented by Formula 1:

Formula 1

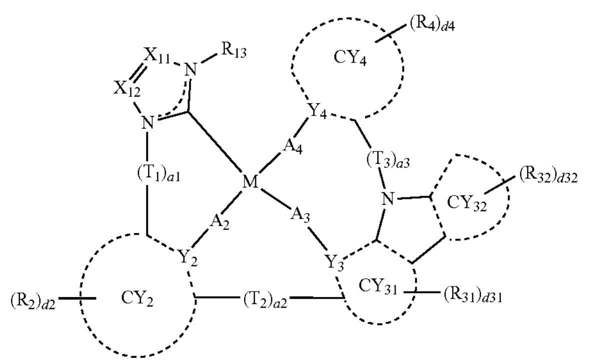

wherein, in Formula 1,

M is a transition metal.

In one or more embodiments, M in Formula 1 may be a first-row transition metal of the Periodic Table of Elements, a second-row transition metal of the Periodic Table of Elements, or a third-row transition metal of the Periodic Table of Elements.

For example, M in Formula 1 may be iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

In one or more embodiments, M in Formula 1 may be platinum, palladium, or gold.

For example, M in Formula 1 may be platinum.

In Formula 1, $X_{11}$ is N or $C(R_{11})$, $X_{12}$ is N or $C(R_{12})$, and at least one of $X_{11}$ and $X_{12}$ is N.

In one or more embodiments, i) $X_{11}$ may be N, and $X_{12}$ may be $C(R_{12})$;

ii) $X_{11}$ may be $C(R_{11})$, and $X_{12}$ may be N; or iii) $X_{11}$ may be N, and $X_{12}$ may be N, and $R_{11}$ and $R_{12}$ are each as described herein.

In Formula 1, ring $CY_2$, ring $CY_{31}$, ring $CY_{32}$, and ring $CY_4$ are each independently a $C_3$-$C_{60}$ carbocyclic group or a $C_1$-$C_{60}$ heterocyclic group.

In one or more embodiments, ring $CY_2$, ring $CY_{31}$, ring $CY_{32}$, and ring $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzotriazole, a benzoxazole group, a benzothiazole group, a benzoxadiazole group, a benzothiadiazole group, a 5,6,7,8-tetrahydroisoquinoline group, or a 5,6,7,8-tetrahydroquinoline group.

$Y_2$ to $Y_4$ are each independently C or N.

In one or more embodiments, at least one of $Y_2$ to $Y_4$ may be N.

In one or more embodiments, $Y_2$ may be C, $Y_3$ may be C, and $Y_4$ may be N;

$Y_2$ may be N, $Y_3$ may be C, and $Y_4$ may be C;

$Y_2$ may be C, $Y_3$ may be N, and $Y_4$ may be C;

$Y_2$ may be N, $Y_3$ may be C, and $Y_4$ may be N;

$Y_2$ may be N, $Y_3$ may be N, and $Y_4$ may be C;

$Y_2$ may be C, $Y_3$ may be N, and $Y_4$ may be N; or $Y_2$ may be N, $Y_3$ may be N, and $Y_4$ may be N.

$A_2$ to $A_4$ are each independently a chemical bond, O, or S.

The chemical bond may be a covalent bond, a metal bond, or a coordinate bond, but embodiments are not limited thereto.

$T_1$ may be a single bond, a double bond, *—N[$(L_1)_{b1}$-$(R_{1a})$]—*', *—B$(R_{1a})$—*', *—P$(R_{1a})$—*', *—C$(R_{1a})(R_{1b})$—*', *—Si$(R_{1a})(R_{1b})$—*', *—Ge$(R_{1a})(R_{1b})$—*', *—S—*', *—Se—*', *—O—*', *—C(═O)—*', *—S(═O)—*', *—S$(═O)_2$—*', *—C$(R_{1a})$═*', *═C$(R_{1a})$—*', *—C$(R_{1a})$═C$(R_{1b})$—*', *—C(═S)—*', or *—C≡C—*'.

$T_2$ may be a single bond, a double bond, *—N[$(L_2)_{b2}$-$(R_{2a})$]—*', *—B$(R_{2a})$—*', *—P$(R_{2a})$—*', *—C$(R_{2a})(R_{2b})$—*', *—Si$(R_{2a})(R_{2b})$—*', *—Ge$(R_{2a})(R_{2b})$—*', *—S—*', *—Se—*', *—O—*', *—C(═O)—*', *—, S(═O)—*', *—S$(═O)_2$—*', *—C$(R_{2a})$═*', *═C$(R_{2a})$—*', *—C$(R_{2a})$═C$(R_{2b})$—*', *—C(═S)—*', or *—C≡C—*'.

$T_3$ may be a single bond, a double bond, *—N[$(L_3)_{b3}$-$(R_{3a})$]—*', *—B$(R_{3a})$—*', *—P$(R_{3a})$—*', *—C$(R_{3a})(R_{3b})$—*', *—Si$(R_{3a})(R_{3b})$—*', *—Ge$(R_{3a})(R_{3b})$—*', *—S—*', *—Se—*', *—O—*', *—C(═O)—*', *—S(═O)—*', *—S$(═O)_2$—*', *—C$(R_{3a})$═*', *═C$(R_{3a})$—*', *—C$(R_{3a})$═C$(R_{3b})$—*', *—C(═S)—*', or *—C≡C—*'.

a1 to a3 in Formula 1 respectively indicate the number of $T_1$(s) to the number of $T_3$(s) and may each independently be an integer from 1 to 3 (for example, 1, 2, or 3).

a1 to a3 are each independently an integer from 1 to 3.

In one or more embodiments, at least one of $T_1$ and $T_3$ may be a single bond.

For example, $T_1$ may be a single bond; $T_3$ may be a single bond; or $T_1$ and $T_3$ may each be a single bond.

When a1 is 2 or greater, two or more of $T_1$ may be identical to or different from each other, when a2 is 2 or greater, two or more of $T_2$ may be identical to or different from each other, and when a3 is 2 or greater, two or more of $T_3$ may be identical to or different from each other.

In one or more embodiments, $T_2$ may be *—N[$(L_2)_{b2}$-$(R_{2a})$]—*', *—S—*', *—Se—*', or *—O—*', and a2 may be 1.

In one or more embodiments, $T_2$ may be *—O—*' and a2 may be 1.

* and *' each indicate a binding site to a neighboring atom in the formulae for $T_1$, $T_2$, and $T_3$.

$L_1$ to $L_3$ are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

b1 to b3 are each independently an integer from 1 to 3.

$R_{1a}$, $R_{1b}$, $R_2$, $R_{2a}$, $R_{2b}$, $R_{3a}$, $R_{3b}$, $R_4$, $R_{10a}$, $R_{11}$ to $R_{13}$, $R_{31}$, and $R_{32}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si$(Q_1)(Q_2)(Q_3)$, —Ge$(Q_1)(Q_2)(Q_3)$, —N$(Q_4)(Q_5)$, —B$(Q_6)(Q_7)$, —P$(Q_8)(Q_9)$, or —P(═O)$(Q_8)(Q_9)$.

d2, d31, d32, and d4 are each independently an integer from 0 to 10.

d2, d31, d32, and d4 in Formula 1 respectively indicate the number of $R_2$, the number of $R_{31}$, the number of $R_{32}$, and the number of $R_4$, and may each independently be an integer from 0 to 10 (for example, 0, 1, 2, 3, or 4). When d2 is 2 or greater, two or more of $R_2$ may be identical to or different from each other, when d31 is 2 or greater, two or more of $R_{31}$ may be identical to or different from each other, when d32 is 2 or greater, two or more of $R_{32}$ may be identical to or different from each other, and when d4 is 2 or greater, two or more of $R_4$ may be identical to or different from each other.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si$(Q_{11})(Q_{12})(Q_{13})$, —Ge$(Q_{11})(Q_{12})(Q_{13})$, —N$(Q_{14})(Q_{15})$, —B$(Q_{16})(Q_{17})$, —P$(Q_{18})(Q_{19})$, —P(═O)$(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —Si($Q_{21}$)($Q_{22}$)($Q_{23}$), —Ge($Q_{21}$)($Q_{22}$)($Q_{23}$), —N($Q_{24}$)($Q_{25}$), —B($Q_{26}$)($Q_{27}$), —P($Q_{28}$)($Q_{29}$), —P(═O)($Q_{28}$)($Q_{29}$), or a combination thereof; or —Si($Q_{31}$)($Q_{32}$)($Q_{33}$), —Ge($Q_{31}$)($Q_{32}$)($Q_{33}$), —N($Q_{34}$)($Q_{35}$), —B($Q_{36}$)($Q_{37}$), —P($Q_{38}$)($Q_{39}$), or —P(═O)($Q_{38}$)($Q_{39}$).

$Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

In one or more embodiments, $R_{1a}$, $R_{1b}$, $R_{2a}$, $R_{2b}$, $R_{3a}$, $R_{3b}$, $R_4$, $R_{10a}$, $R_{11}$ to $R_{13}$, $R_2$, $R_{31}$, and $R_{32}$ may each independently be:

hydrogen, deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{31})(Q_{32})(Q_{33})$, or a combination thereof; or —$Si(Q_1)(Q_2)(Q_3)$, —$Ge(Q_1)(Q_2)(Q_3)$, —$N(Q_4)(Q_5)$, —$B(Q_6)(Q_7)$, —$P(Q_8)(Q_9)$, or —$P(=O)(Q_8)(Q_9)$, and $Q_1$ to $Q_9$ and $Q_{31}$ to $Q_{33}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one of deuterium, a $C_1$-$C_{10}$ alkyl group, a phenyl group, or a combination thereof.

In one or more embodiments, $R_{1a}$, $R_{1b}$, $R_{2a}$, $R_{2b}$, $R_{3a}$, $R_{3b}$, $R_4$, $R_{10a}$, $R_{11}$ to $R_{13}$, $R_2$, $R_{31}$, and $R_{32}$ may each independently be:

hydrogen, deuterium, —F, —Cl, —Br, —I, —$SF_5$, —$CD_3$, —$CD_2H$, —$CDH_2$, —$CF_3$, —$CF_2H$, —$CFH_2$, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a group represented by one of Formulae 9-1 to 9-61, 9-201 to 9-237, 10-1 to 10-129, or 10-201 to 10-355;

a group represented by one of Formulae 9-1 to 9-61, 9-201 to 9-237, 10-1 to 10-129, or 10-201 to 10-350 in which at least one hydrogen is substituted with deuterium, —F, or a cyano group; or —$Si(Q_1)(Q_2)(Q_3)$, —$Ge(Q_1)(Q_2)(Q_3)$, or —$N(Q_4)(Q_5)$, and $Q_1$ to $Q_5$ are each as described herein:

9-1

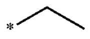

-continued 9-2

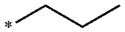

9-3

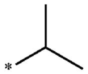

9-4

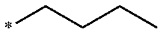

9-5

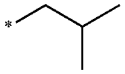

9-6

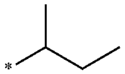

9-7

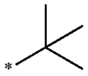

9-8

9-9

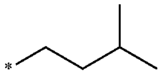

9-10

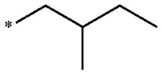

9-11

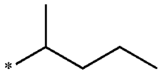

9-12

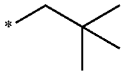

9-13

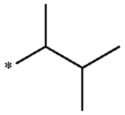

9-14

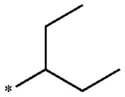

9-15

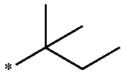

9-16

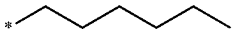

9-17

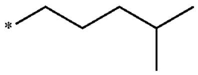

9-18

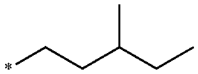

9-19

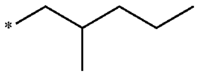

9-20

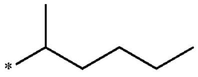

-continued
9-21
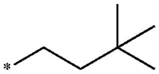
9-22
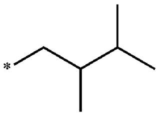
9-23
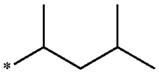
9-24
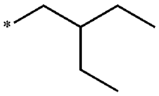
9-25
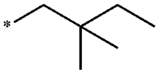
9-26
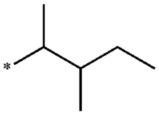
9-27
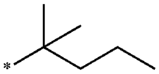
9-28
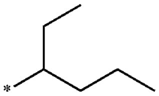
9-29
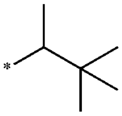
9-30
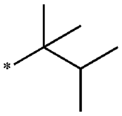
9-31
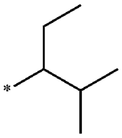
9-32
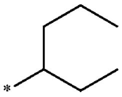
9-33
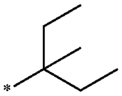
9-34
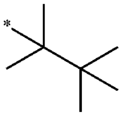
-continued
9-35
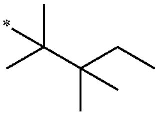
9-36
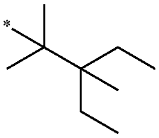
9-37
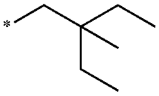
9-38
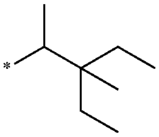
9-39
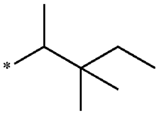
9-40
9-41
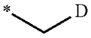
9-42
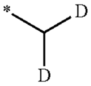
9-43
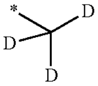
9-44
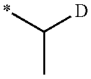
9-45
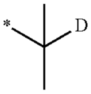
9-46
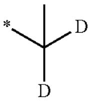
9-47
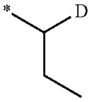
9-48
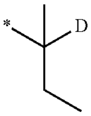

-continued
9-49
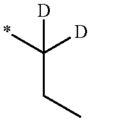
9-50
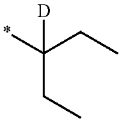
9-51
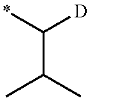
9-52
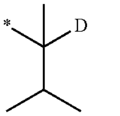
9-53
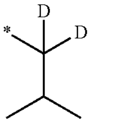
9-54
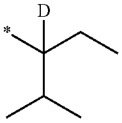
9-55
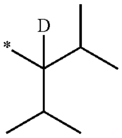
9-56
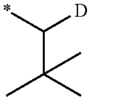
9-57
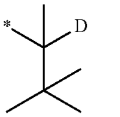
9-58
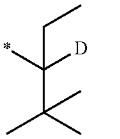
9-59
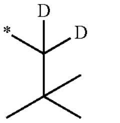
9-60
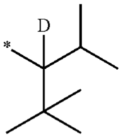
-continued
9-61
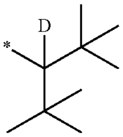
9-201
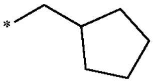
9-202
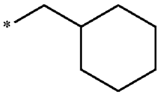
9-203
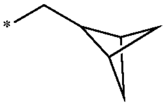
9-204
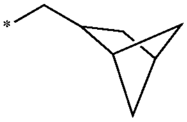
9-205
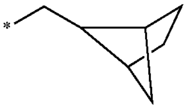
9-206
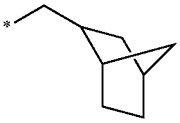
9-207
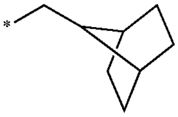
9-208
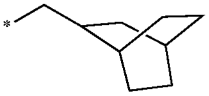
9-209
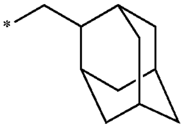
9-210
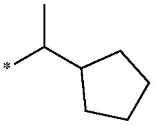
9-211
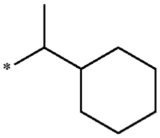

-continued
9-212
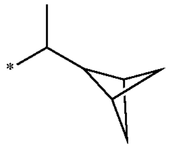
9-213
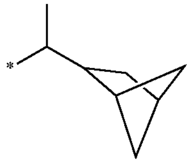
9-214
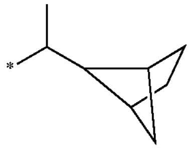
9-215
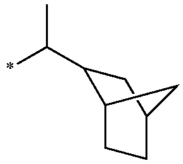
9-216
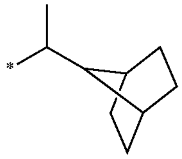
9-217
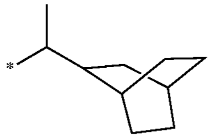
9-218
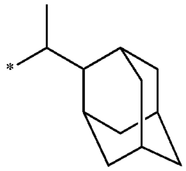
9-219
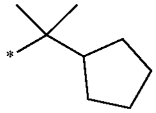
9-220
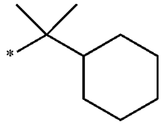
9-221
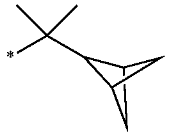
-continued
9-222
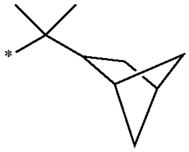
9-223
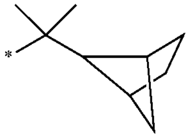
9-224
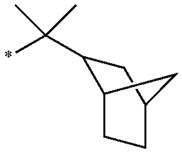
9-225
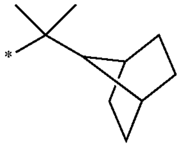
9-226
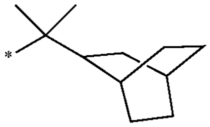
9-227
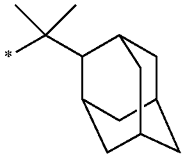
9-228
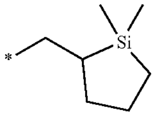
9-229
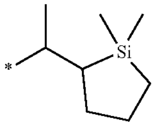
9-230
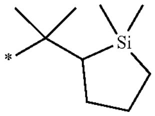
9-231
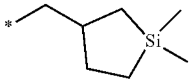
9-232
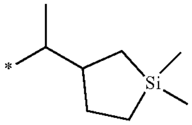

-continued
9-233
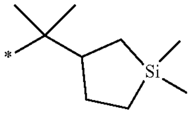
9-234
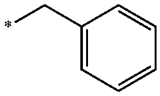
9-235
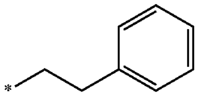
9-236
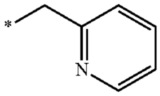
9-237
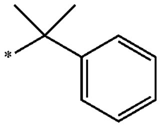
10-1
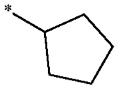
10-2
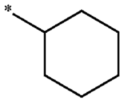
10-3
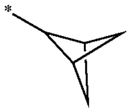
10-4
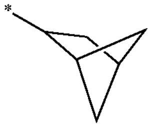
10-5
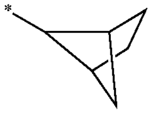
10-6
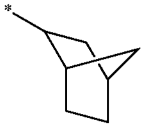
10-7
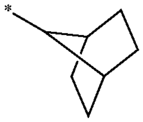
10-8
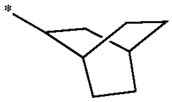
-continued
10-9
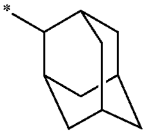
10-10
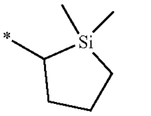
10-11
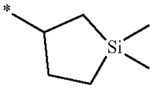
10-12
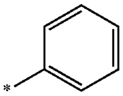
10-13
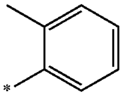
10-14
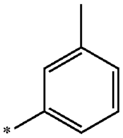
10-15
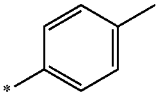
10-16
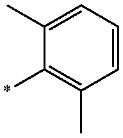
10-17
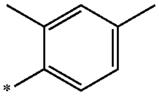
10-18
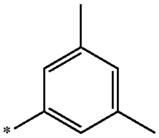
10-19
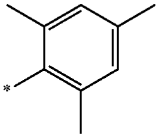
10-20
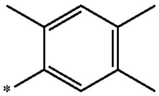

-continued
10-21
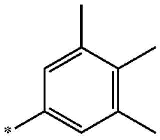
10-22
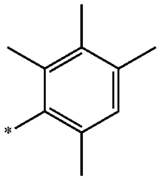
10-23
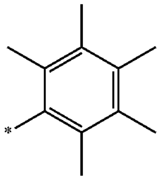
10-24
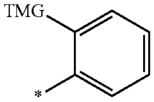
10-25
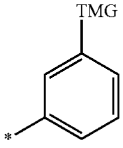
10-26
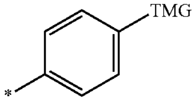
10-27
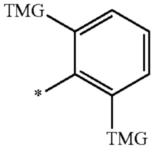
10-28
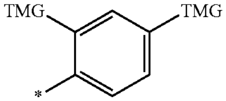
10-29
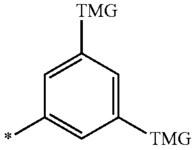
10-30
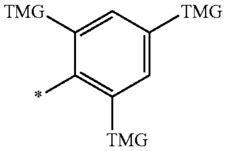
10-31
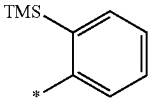
-continued
10-32
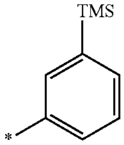
10-33
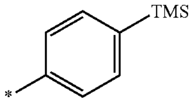
10-34
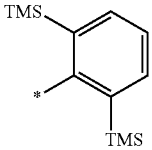
10-35
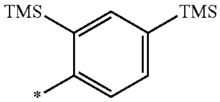
10-36
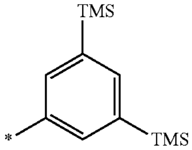
10-37
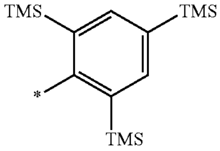
10-38
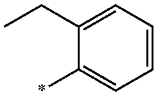
10-39
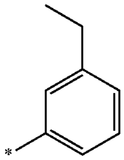
10-40
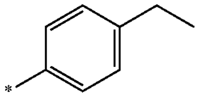
10-41
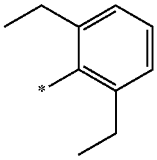
10-42
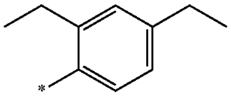

-continued
10-43
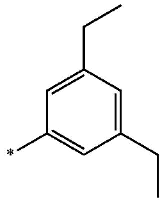
10-44
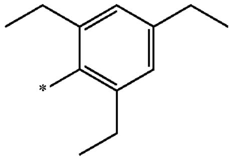
10-45
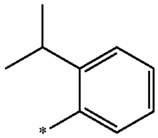
10-46
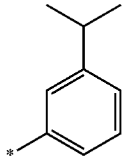
10-47
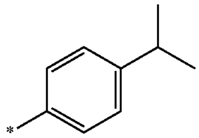
10-48
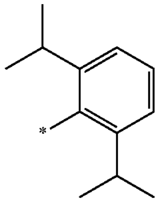
10-49
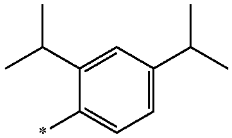
10-50
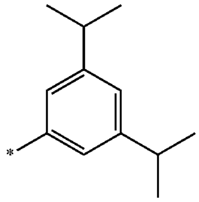
10-51
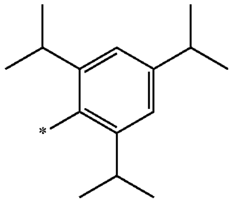
-continued
10-52
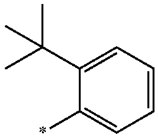
10-53
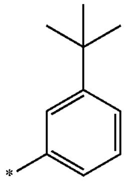
10-54
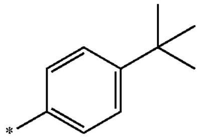
10-55
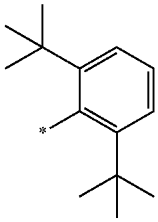
10-56
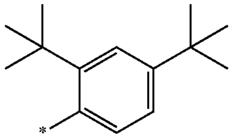
10-57
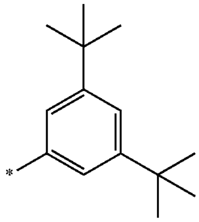
10-58
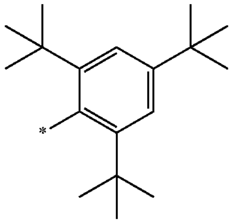
10-59
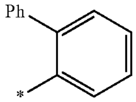
10-60
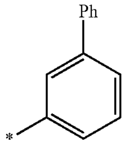

-continued
10-61
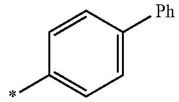
10-62
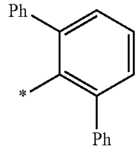
10-63
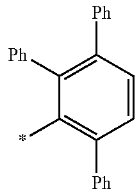
10-64
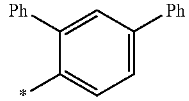
10-65
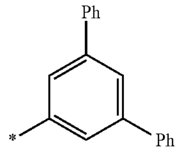
10-66
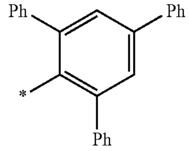
10-67
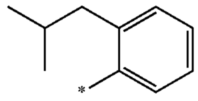
10-68
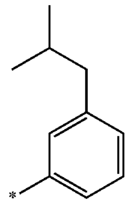
10-69
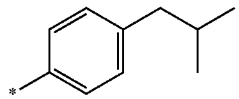
10-70
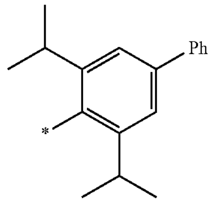
-continued
10-71
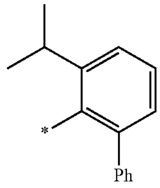
10-72
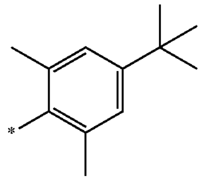
10-73
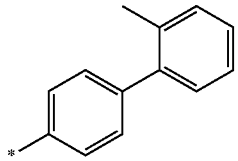
10-74
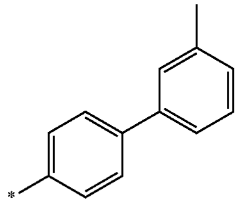
10-75
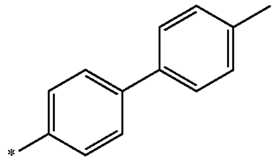
10-76
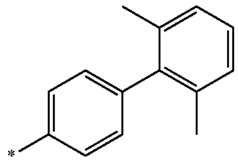
10-77
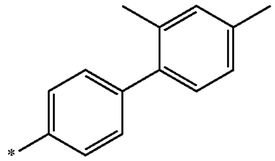
10-78
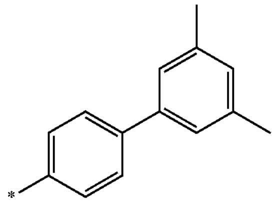

-continued
10-79
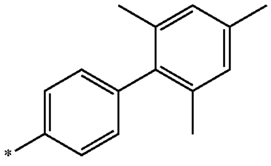
10-80
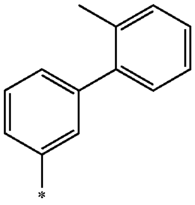
10-81
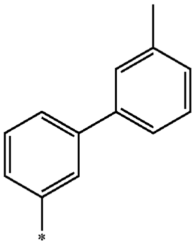
10-82
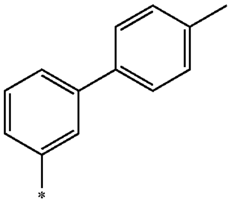
10-83
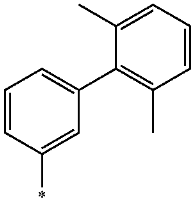
10-84
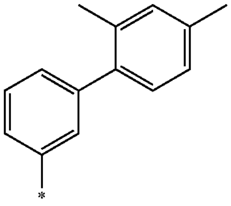
10-85
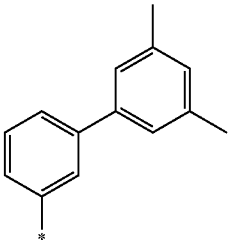
-continued
10-86
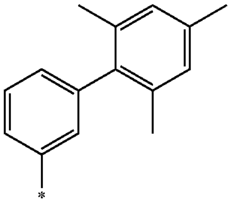
10-87
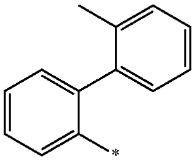
10-88
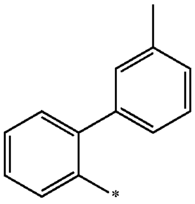
10-89
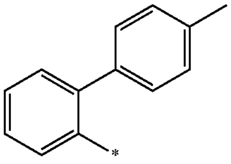
10-90
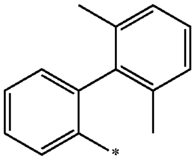
10-91
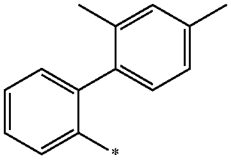
10-92
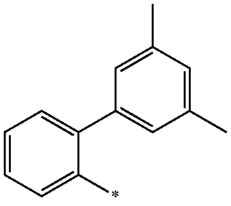
10-93
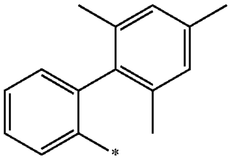

-continued
10-94
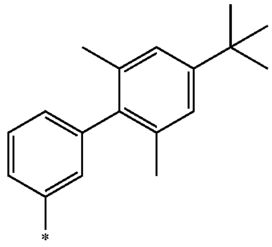
10-95
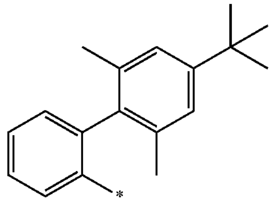
10-96
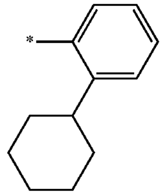
10-97
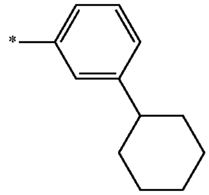
10-98
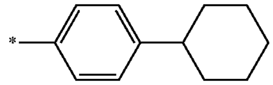
10-99
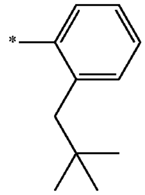
10-100
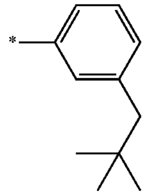
10-101
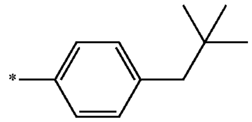
-continued
10-102
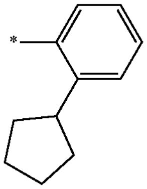
10-103
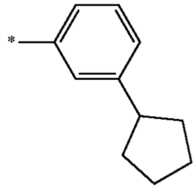
10-104
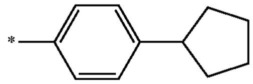
10-105
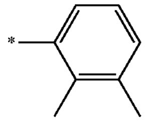
10-106
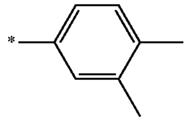
10-107
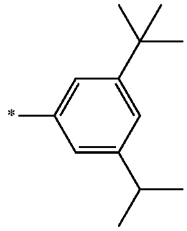
10-108
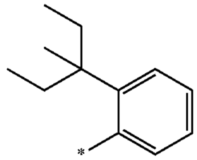
10-109
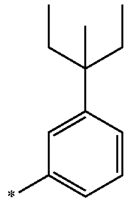
10-110
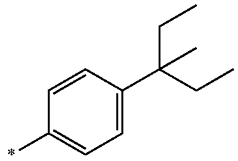

-continued
10-111
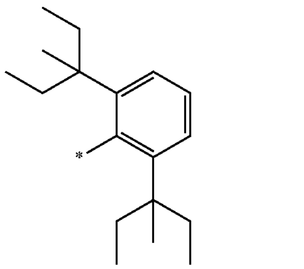
10-112
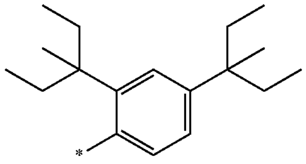
10-113
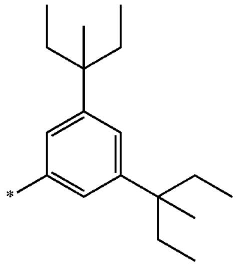
10-114
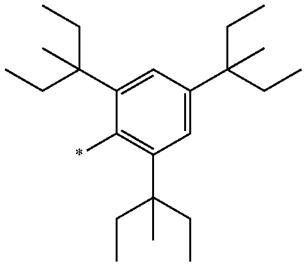
10-115
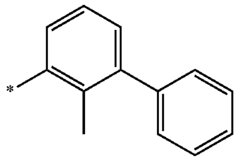
10-116
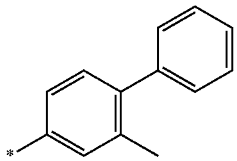
10-117
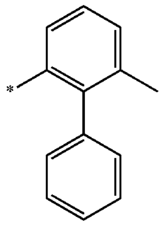
-continued
10-118
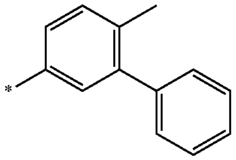
10-119
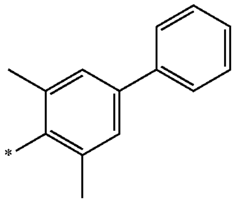
10-120
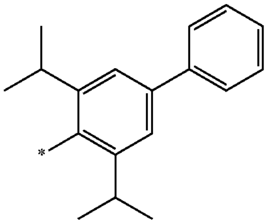
10-121
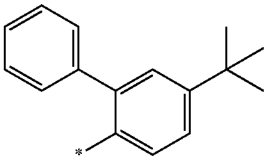
10-122
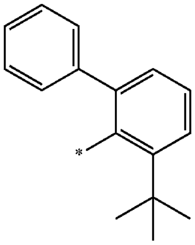
10-123
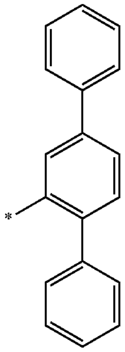

-continued
10-124
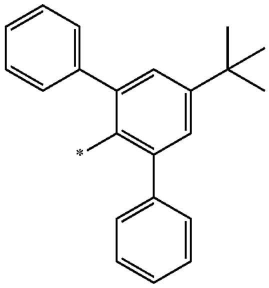
10-125
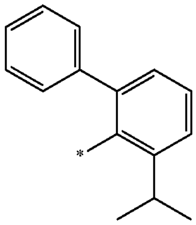
10-126
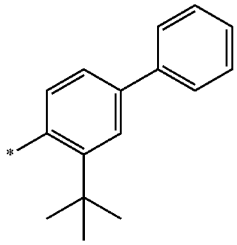
10-127
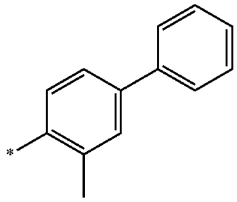
10-128
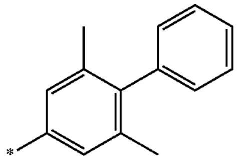
10-129
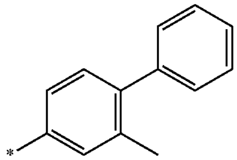
10-201
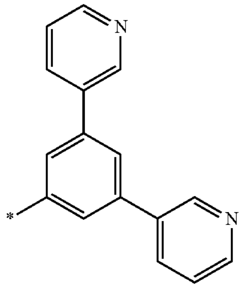
-continued
10-202
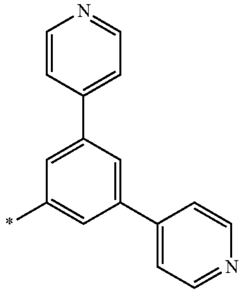
10-203
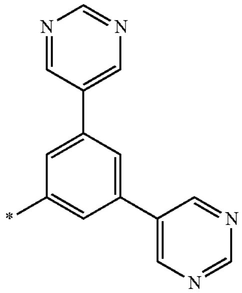
10-204
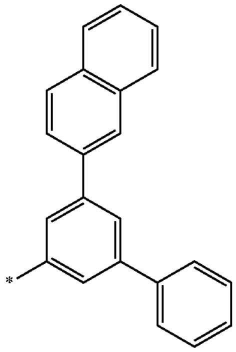
10-205
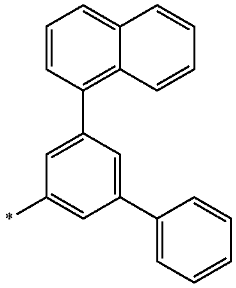
10-206
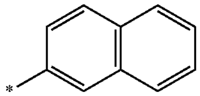
10-207
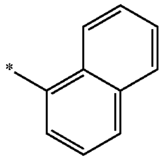

-continued
10-208
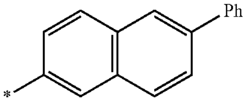
10-209
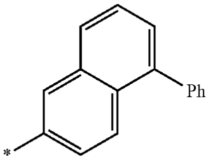
10-210
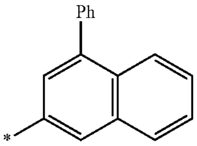
10-211
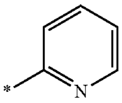
10-212
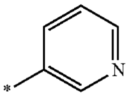
10-213
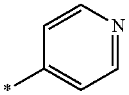
10-214
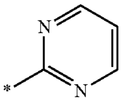
10-215
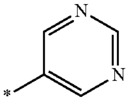
10-216
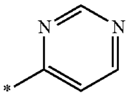
10-217
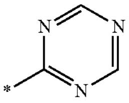
10-218
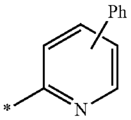
10-219
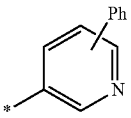
10-220
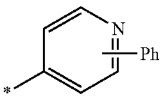
-continued
10-221
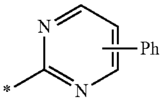
10-222
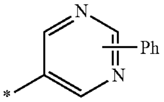
10-223
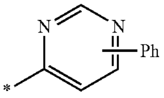
10-224
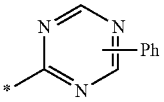
10-225
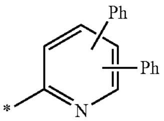
10-226
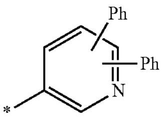
10-227
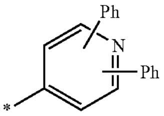
10-228
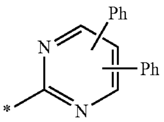
10-229
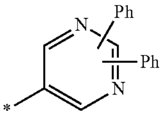
10-230
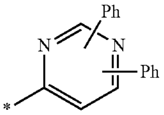
10-231
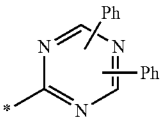
10-232
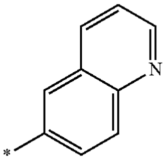

-continued
10-233
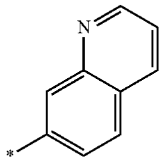
10-234
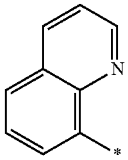
10-235
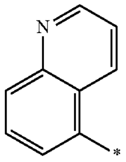
10-236
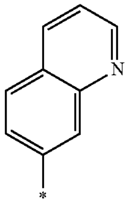
10-237
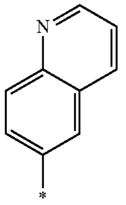
10-238
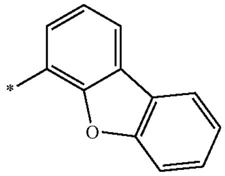
10-239
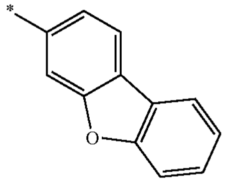
10-240
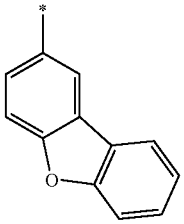
-continued
10-241
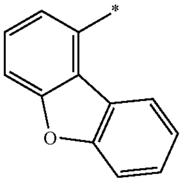
10-242
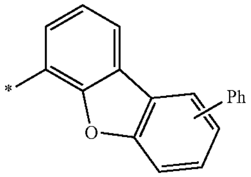
10-243
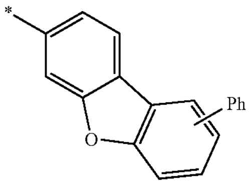
10-244
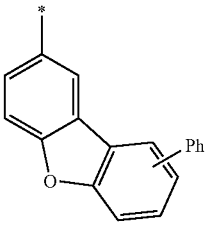
10-245
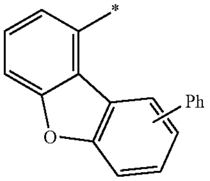
10-246
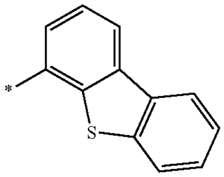
10-247
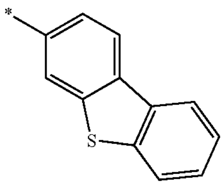
10-248
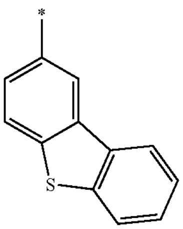

10-249
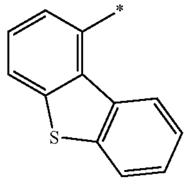
10-250
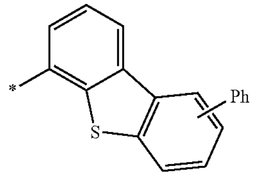
10-251
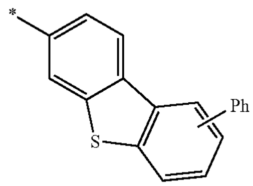
10-252
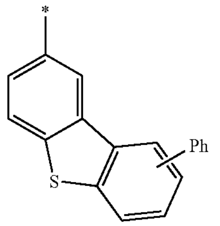
10-253
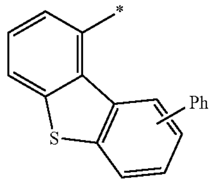
10-254
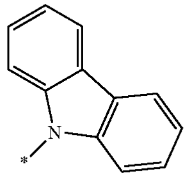
10-255
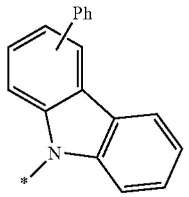
10-256
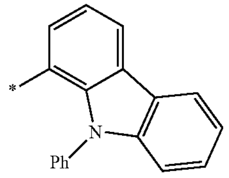
10-257
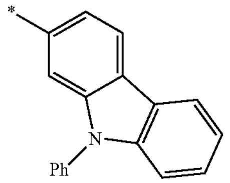
10-258
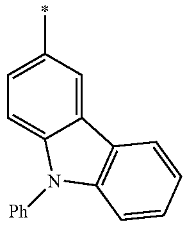
10-259
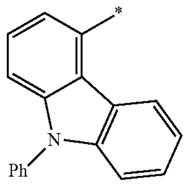
10-260
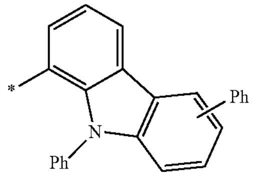
10-261
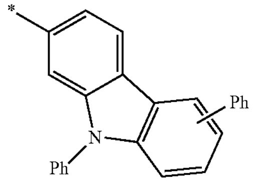
10-262
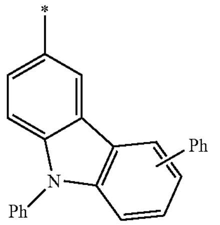
10-263
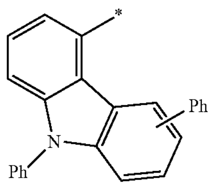

-continued
10-264
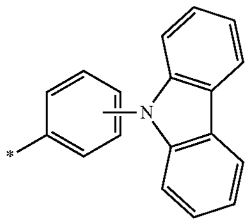
10-265
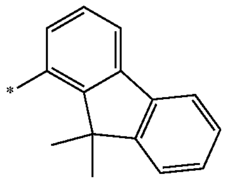
10-266
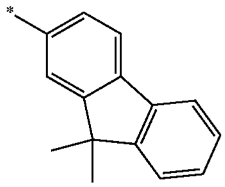
10-267
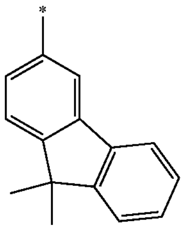
10-268
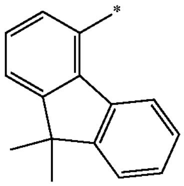
10-269
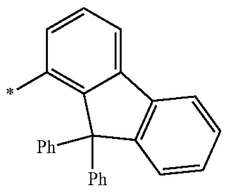
10-270
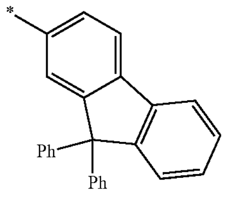
-continued
10-271
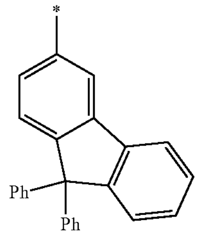
10-272
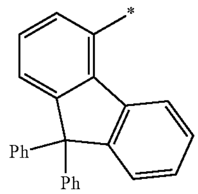
10-273
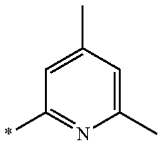
10-274
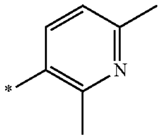
10-275
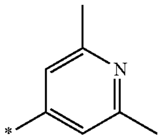
10-276
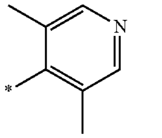
10-277
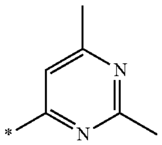
10-278
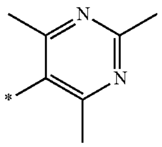
10-279
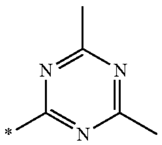

-continued
10-280
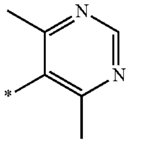
10-281
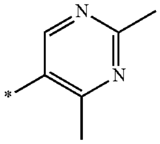
10-282
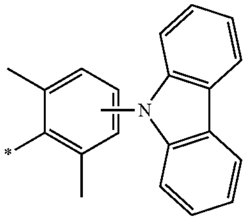
10-283
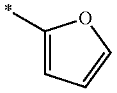
10-284
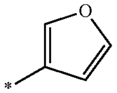
10-285
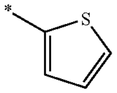
10-286
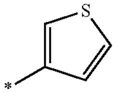
10-287
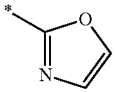
10-288
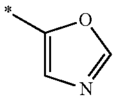
10-289
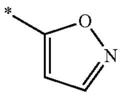
10-290
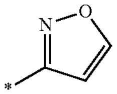
10-291
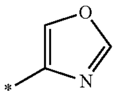
10-292
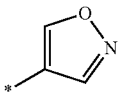
-continued
10-293
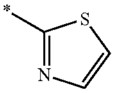
10-294
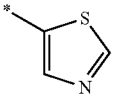
10-295
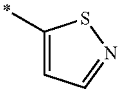
10-296
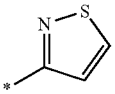
10-297
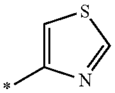
10-298
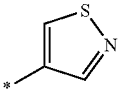
10-299
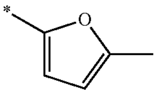
10-300
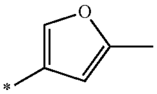
10-301
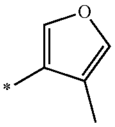
10-302
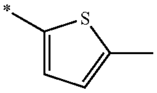
10-303
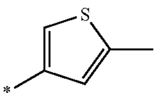
10-304
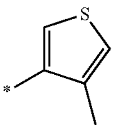
10-305
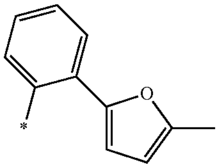

-continued
10-306
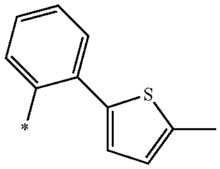
10-307
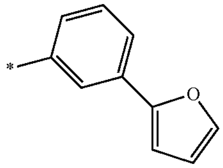
10-308
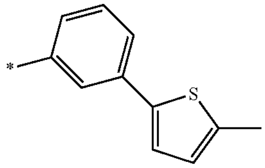
10-309
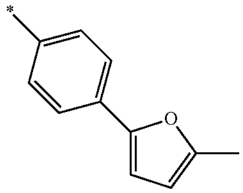
10-310
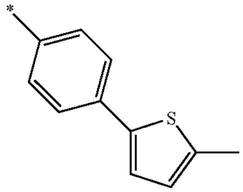
10-311
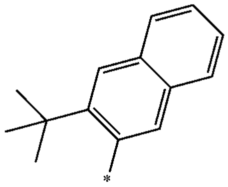
10-312
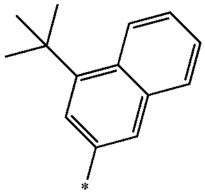
10-313
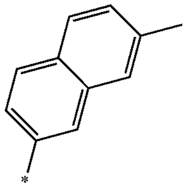
-continued
10-314
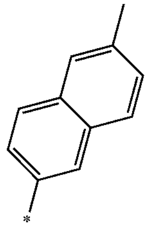
10-315
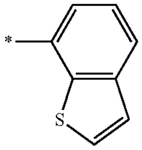
10-316
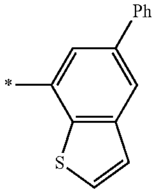
10-317
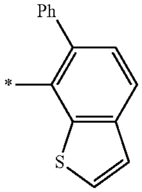
10-318
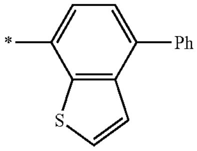
10-319
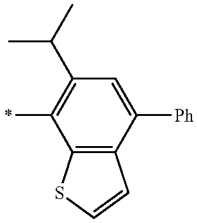
10-320
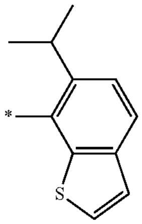

-continued
10-321
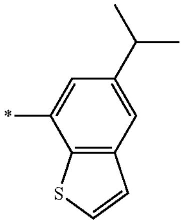
10-322
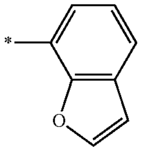
10-323
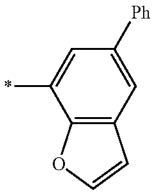
10-324
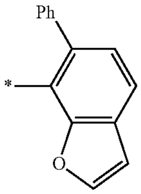
10-325
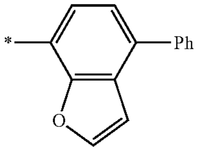
10-326
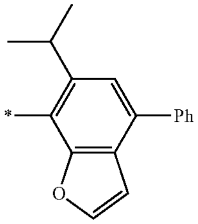
10-327
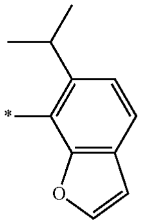
-continued
10-328
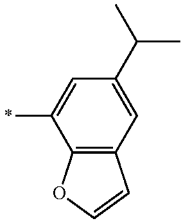
10-329
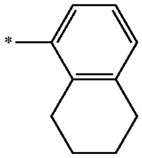
10-330
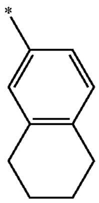
10-331
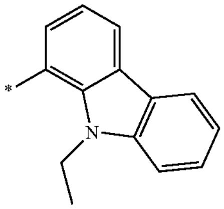
10-332
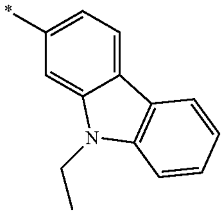
10-333
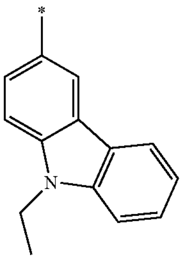
10-334
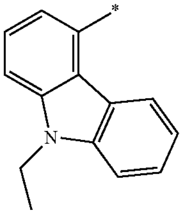

-continued
10-335
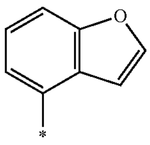
10-336
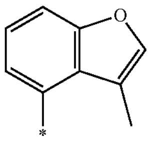
10-337
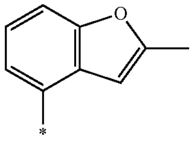
10-338
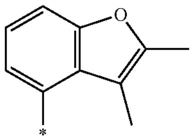
10-339
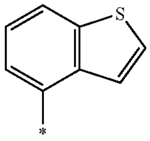
10-340
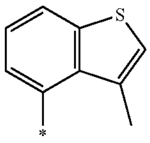
10-341
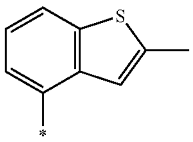
10-342
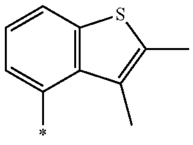
10-343
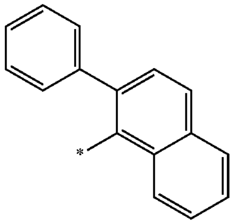
10-344
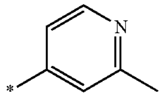
-continued
10-345
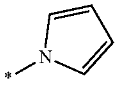
10-346
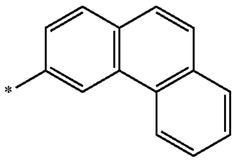
10-347
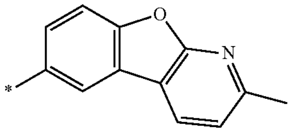
10-348
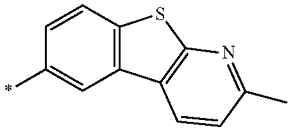
10-349
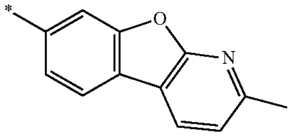
10-350
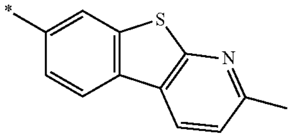
10-351
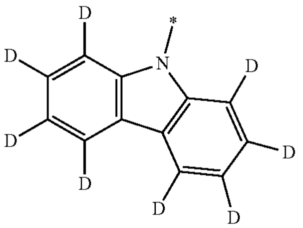
10-352
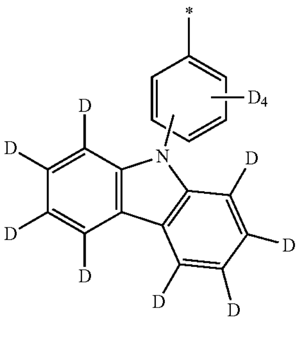
10-353
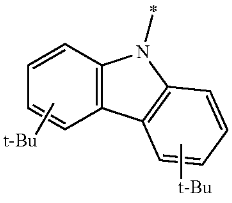

-continued 10-354

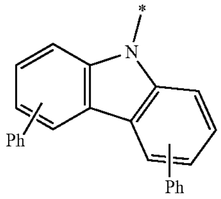

10-355

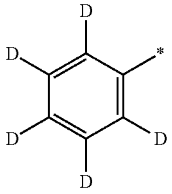

wherein, in Formulae 9-1 to 9-61, 9-201 to 9-237, 10-1 to 10-129, and 10-201 to 10-355, * indicates a binding site to a neighboring atom, “Ph” indicates a phenyl group, “TMS” indicates a trimethylsilyl group, and “TMG” indicates a trimethylgermyl group.

In one or more embodiments, a group represented by

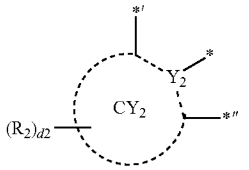

in Formula 1 may be a group represented by one of Formulae 2-1 to 2-3:

CY2-1

Formula 2-1

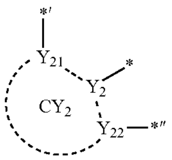

CY2-2

Formula 2-2

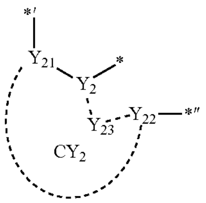

Formula 2-3

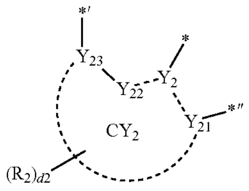

wherein, in Formulae 2-1 to 2-3, $Y_{21}$ to $Y_{23}$ may each independently be C or N, $Y_{21}$ and $Y_2$ may be linked to each other via a chemical bond, $Y_2$ and $Y_{21}$ are linked to each other via a chemical bond, $Y_2$ and $Y_{22}$ may be linked to each other via a chemical bond, $Y_2$ and $Y_{23}$ are linked to each other via a chemical bond, and $Y_{22}$ and $Y_{23}$ may be linked to each other via a chemical bond,

*' indicates a binding site to $T_1$, *" indicates a binding site to $T_2$, and * indicates a binding site to $A_2$ or M, and ring $CY_2$, $Y_2$, $R_2$, and d2 are each as described herein.

In one or more embodiments, a group represented by

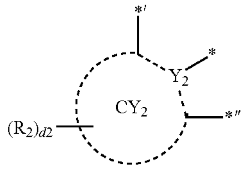

in Formula 1 may be a group represented by one of Formulae CY2-1 to CY2-35:

CY2-1

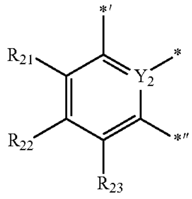

CY2-2

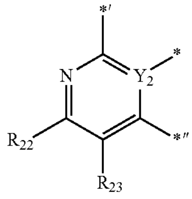

CY2-3

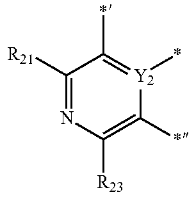

CY2-4

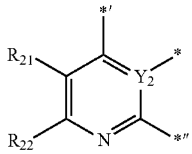

CY2-5

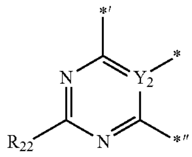

-continued
CY2-6
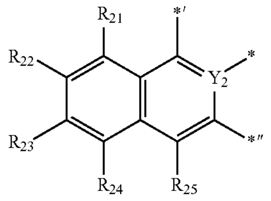
CY2-7
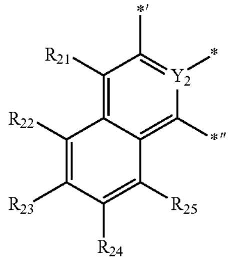
CY2-8
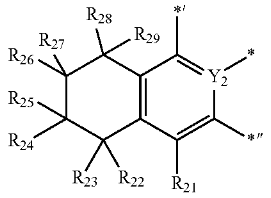
CY2-9
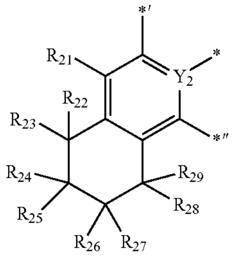
CY2-10
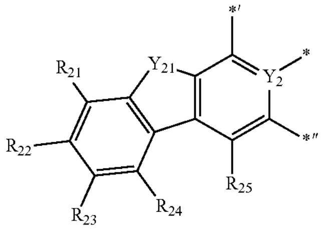
CY2-11
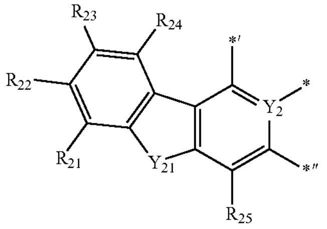
-continued
CY2-12
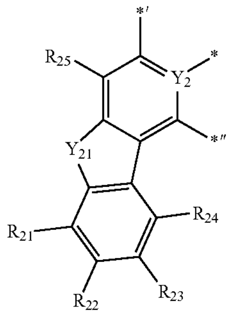
CY2-13
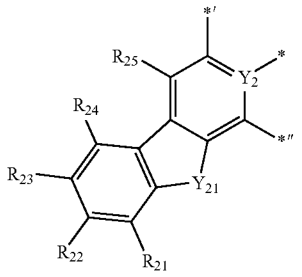
CY2-14
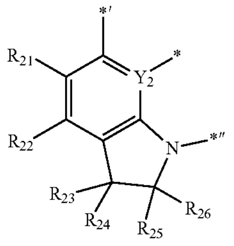
CY2-15
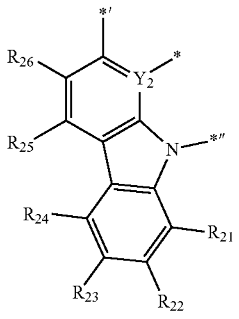
CY2-16
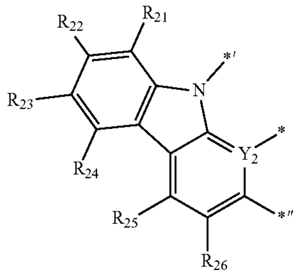

-continued
CY2-17
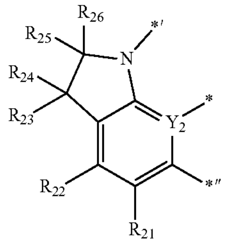
CY2-18
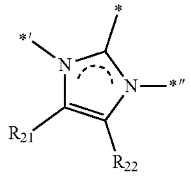
CY2-19
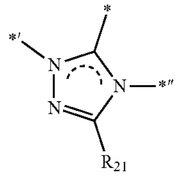
CY2-20
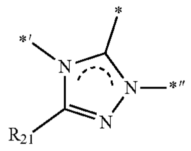
CY2-21
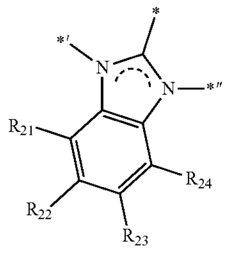
CY2-22
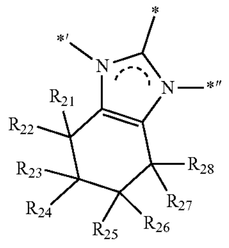
CY2-23
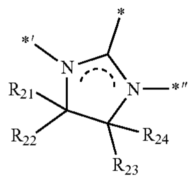
-continued
CY2-24
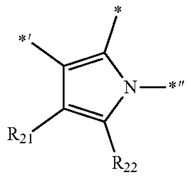
CY2-25
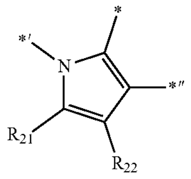
CY2-26
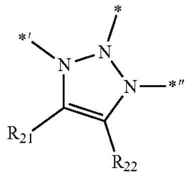
CY2-27
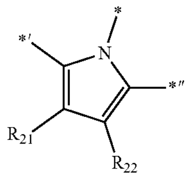
CY2-28
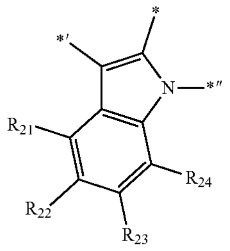
CY2-29
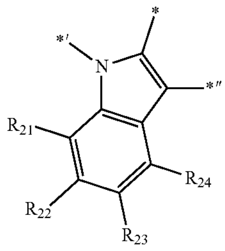
CY2-30
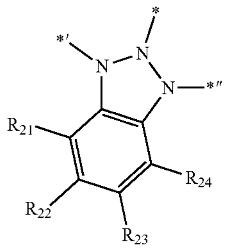

-continued

CY2-31

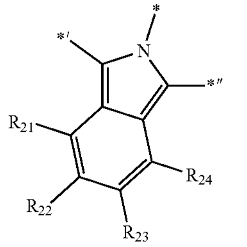

CY2-32

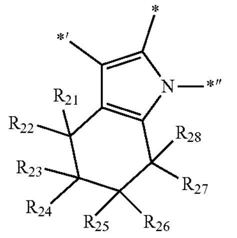

CY2-33

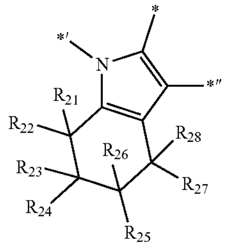

CY2-34

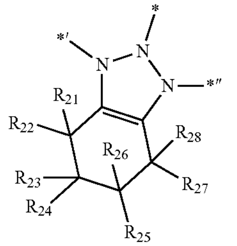

CY2-35

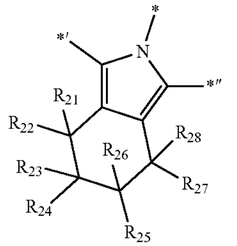

wherein, in Formulae CY2-1 to CY2-35, $Y_2$ may be C or N, $R_{21}$ to $R_{29}$ may each independently be as described in connection with $R_2$,

* indicates a binding site to M or $A_2$,

*' indicates a binding site to $T_1$, and

*" indicates a binding site to $T_2$.

In one or more embodiments, a group represented by

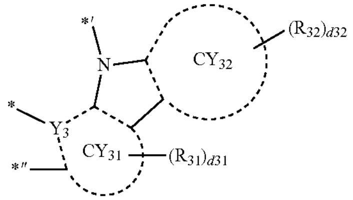

in Formula 1 may be a group represented by one of Formulae CY3-1 to CY3-9:

CY3-1

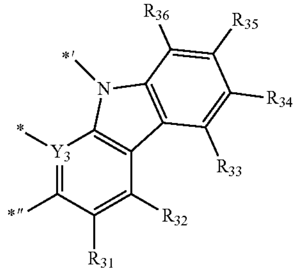

CY3-2

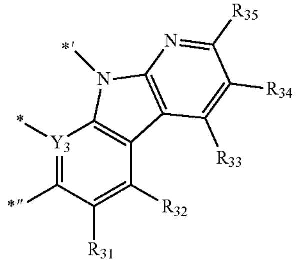

CY3-3

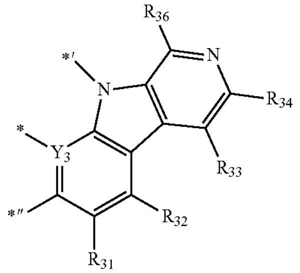

CY3-4

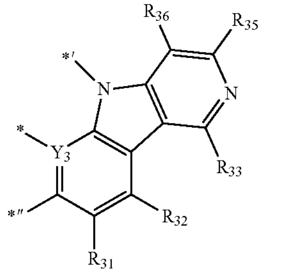

-continued

CY3-5

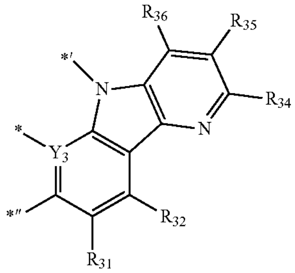

CY3-6

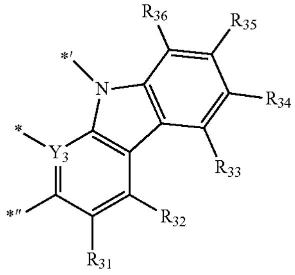

CY3-7

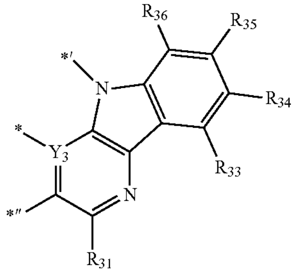

CY3-8

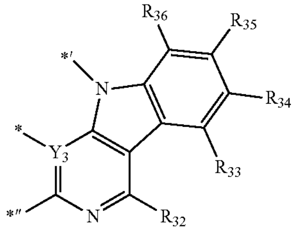

CY3-9

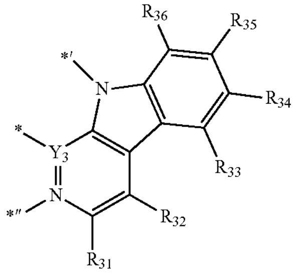

wherein, in Formulae CY3-1 to CY3-9, $Y_3$ may be C or N, $R_{31}$ to $R_{36}$ may each independently be as described in connection with $R_{31}$,

* indicates a binding site to M or $A_3$,

*' indicates a binding site to $T_3$, and

*" indicates a binding site to $T_2$.

In one or more embodiments, at least one of $R_{31}$ to $R_{36}$ in Formulae CY3-1 to CY3-9 may not be hydrogen. For example, in one or more embodiments, $R_{34}$ may not be hydrogen.

In one or more embodiments, a group represented by

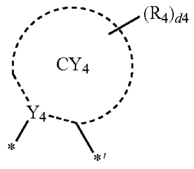

in Formula 1 may be a group represented by one of Formulae CY4-1 to CY4-29:

CY4-1

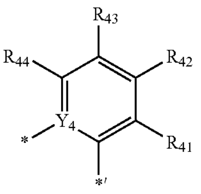

CY4-2

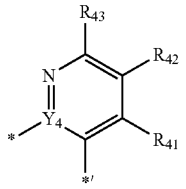

CY4-3

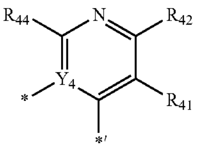

CY4-4

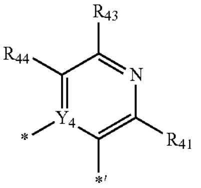

CY4-5

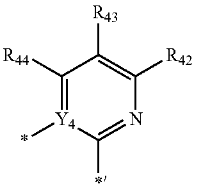

CY4-6

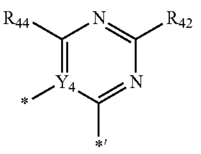

-continued
CY4-7
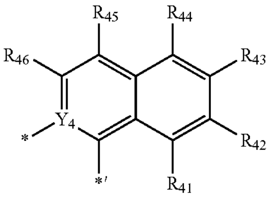
CY4-8
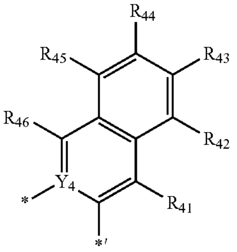
CY4-9
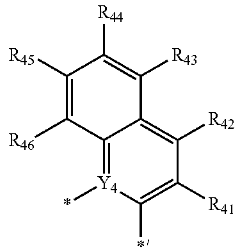
CY4-10
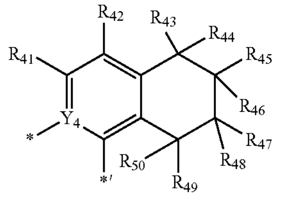
CY4-11
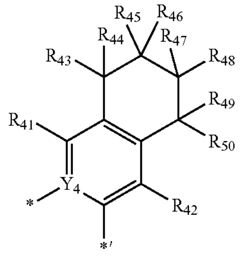
CY4-12
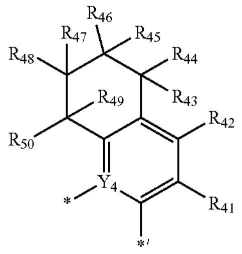
-continued
CY4-13
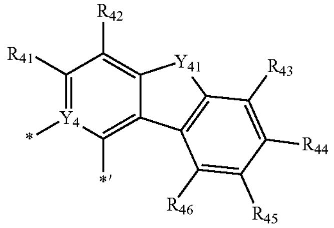
CY4-14
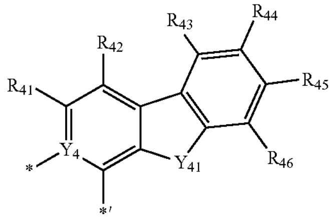
CY4-15
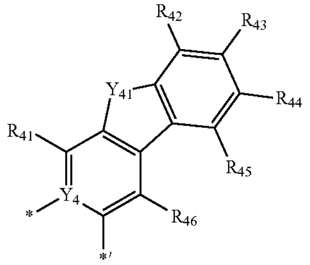
CY4-16
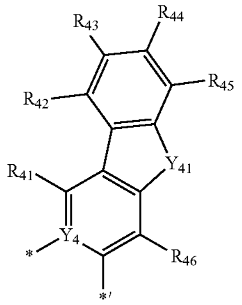
CY4-17
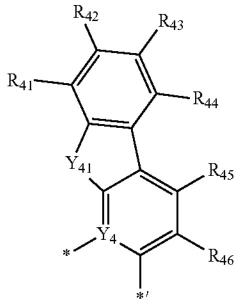
CY4-18
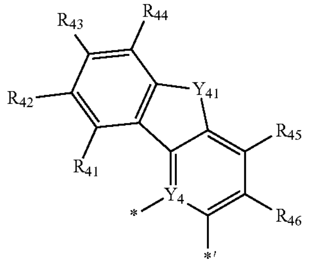

-continued

CY4-19

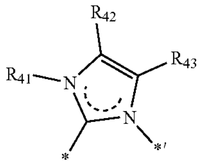

CY4-20

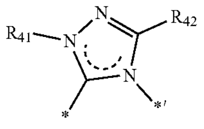

CY4-21

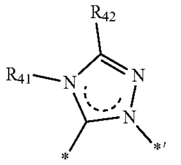

CY4-22

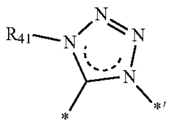

CY4-23

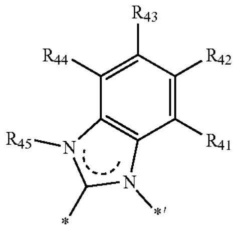

CY4-24

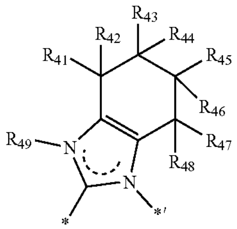

CY4-25

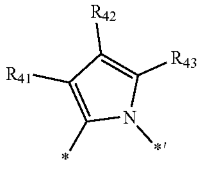

CY4-26

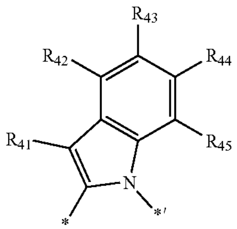

-continued

CY4-27

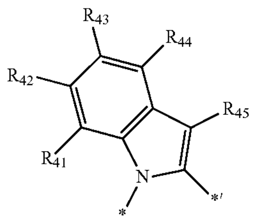

CY4-28

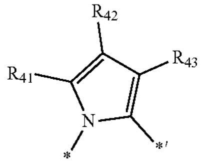

CY4-29

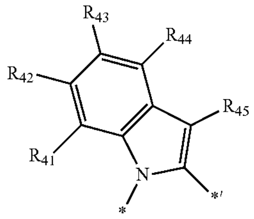

wherein, in Formulae CY4-1 to CY4-29, $Y_4$ may be C or N, $Y_{41}$ may be $N(R_{41a})$, O, Se, $C(R_{41a})(R_{41b})$, or $Si(R_{41a})(R_{41b})$, and $R_{41}$ to $R_{50}$, $R_{41a}$, and $R_{41b}$ may each independently be as described in connection with $R_4$,

* indicates a binding site to M or $A_4$, and

*' indicates a binding site to $T_3$.

In one or more embodiments, the organometallic compound represented by Formula 1 may be represented by one of Formulae 1-1 to 1-3:

Formula 1-1

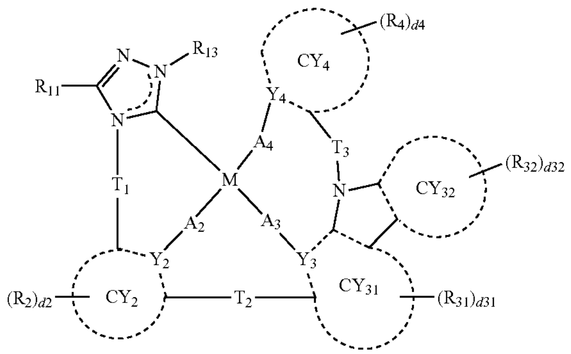

-continued

Formula 1-2

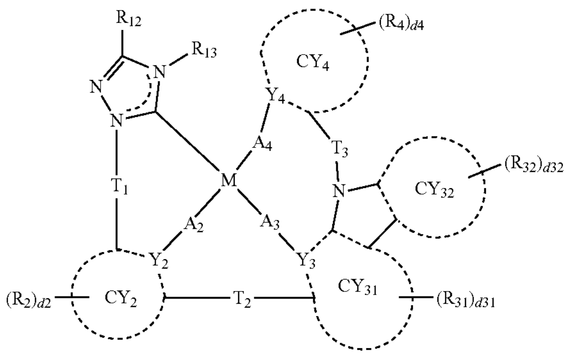

Formula 1-3

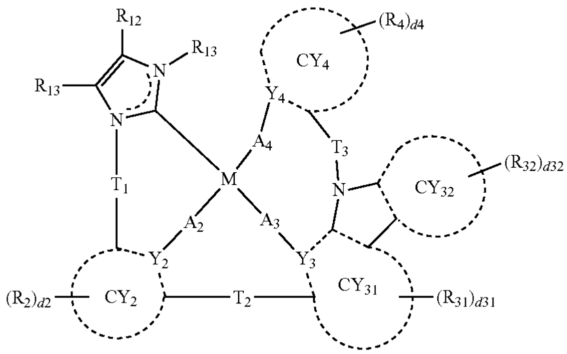

wherein, in Formulae 1-1 to 1-3,

M, ring $CY_2$, ring $CY_{31}$, ring $CY_{32}$, ring $CY_4$, $Y_2$ to $Y_4$, $A_2$ to $A_4$, $T_1$ to $T_3$, $R_{11}$ to $R_{13}$, $R_2$, $R_{31}$, $R_{32}$, $R_4$, d2, d31, d32, and d4 may each be as described herein.

In one or more embodiments, the organometallic compound represented by Formula 1 may be represented by one of Formulae 1-11 to 1-13:

Formula 1-11

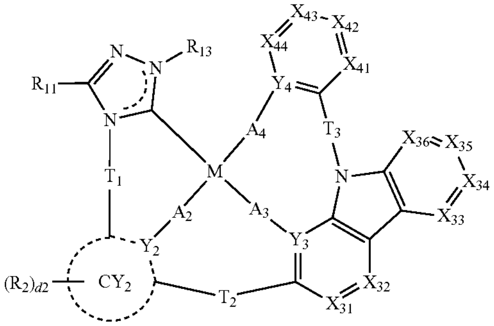

-continued

Formula 1-12

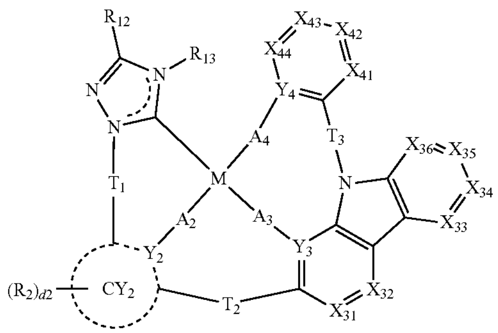

Formula 1-13

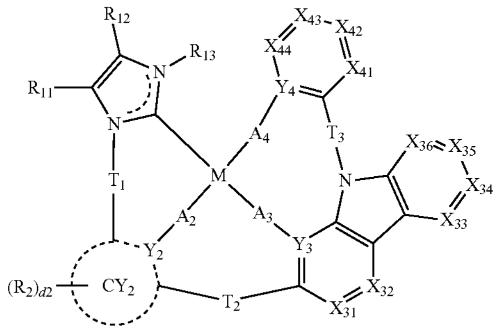

wherein, in Formulae 1-11 to 1-13, $X_{31}$ may be $C(R_{31})$ or N, $X_{32}$ may be $C(R_{32})$ or N, $X_{33}$ may be $C(R_{33})$ or N, $X_{34}$ may be $C(R_{34})$ or N, $X_{35}$ may be $C(R_{35})$ or N, and $X_{36}$ may be $C(R_{36})$ or N, $X_{41}$ may be $C(R_{41})$ or N, $X_{42}$ may be $C(R_{42})$ or N, $X_{43}$ may be $C(R_{43})$ or N, and $X_{44}$ may be $C(R_{44})$ or N, $R_{31}$ to $R_{36}$ may each be as described in connection with $R_{31}$, $R_{41}$ to $R_{44}$ may each be as described in connection with $R_4$, and M, ring $CY_2$, $Y_2$ to $Y_4$, $A_2$ to $A_4$, $T_1$ to $T_3$, $R_{11}$ to $R_{13}$, $R_2$, and d2 may each be as described herein.

In one or more embodiments, the organometallic compound may be represented by at least one of Compounds 1 to 195, but embodiments are not limited thereto:

1

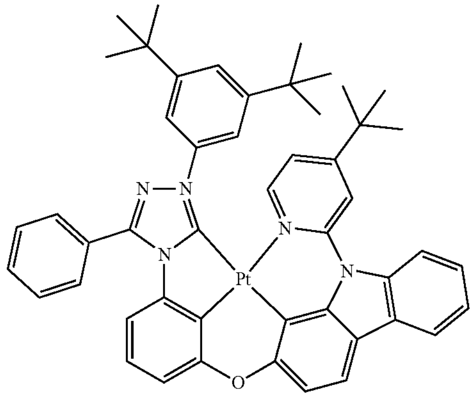

-continued
2
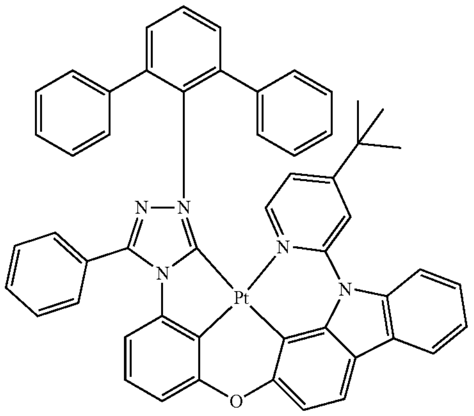
3
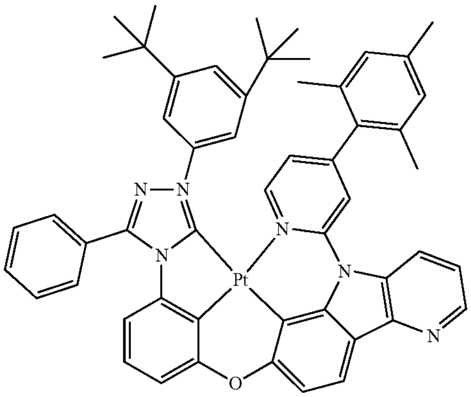
4
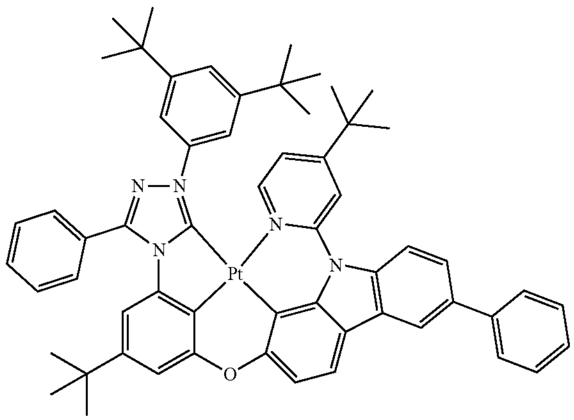
-continued
5
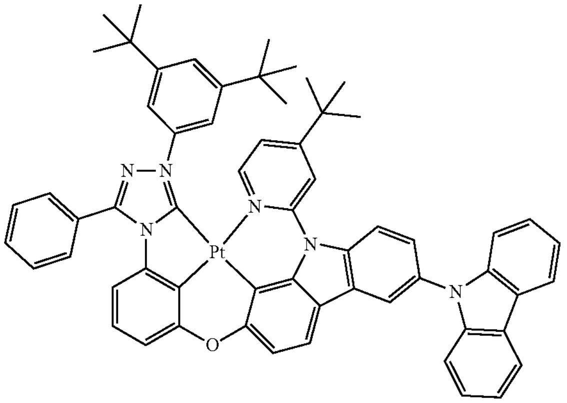
6
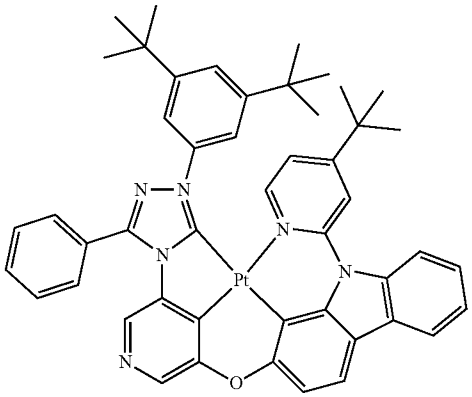
7
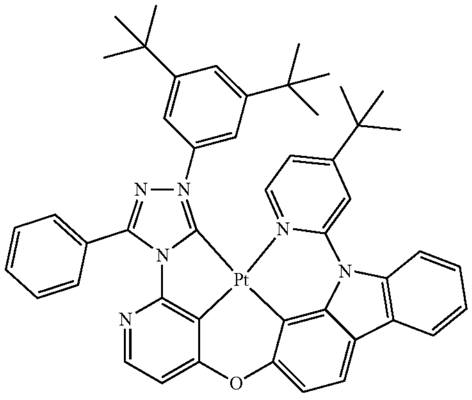

-continued
8
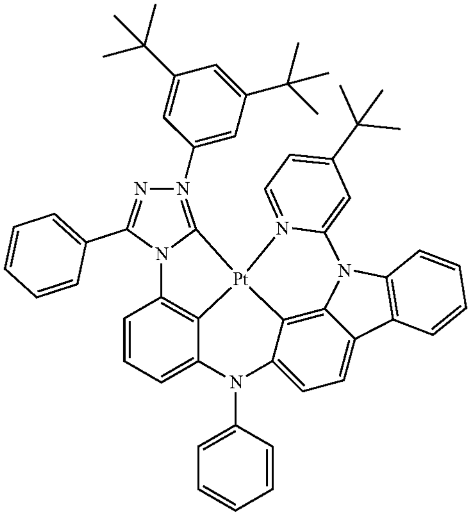
9
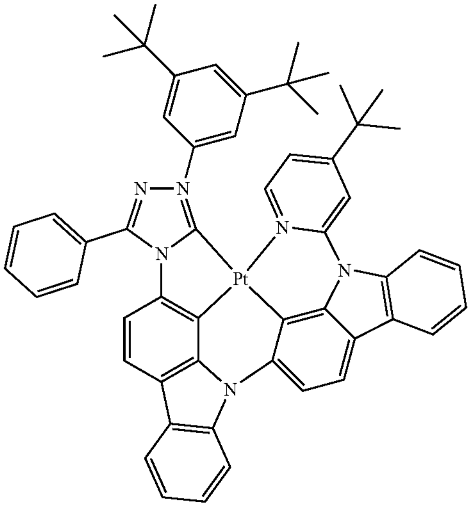
10
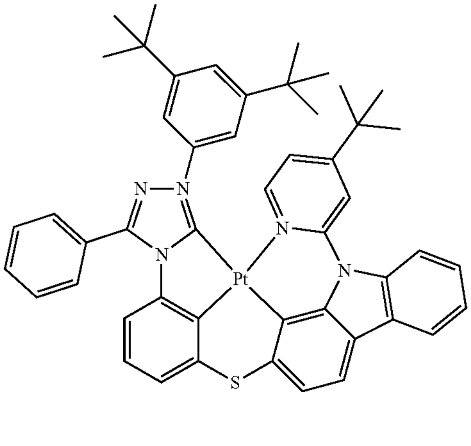
-continued
11
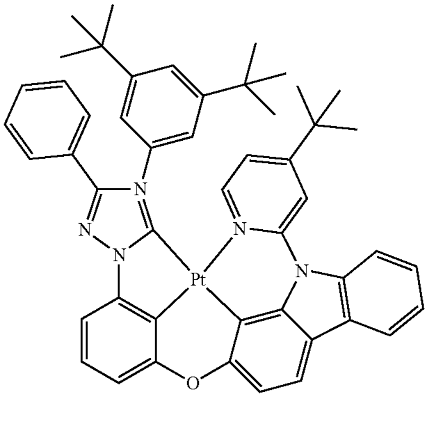
12
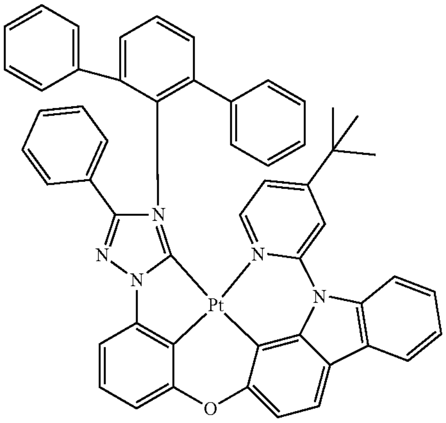
13
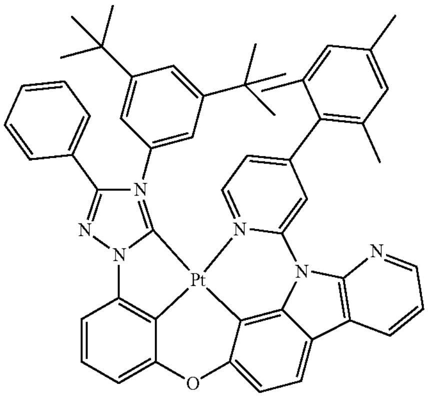

-continued
14
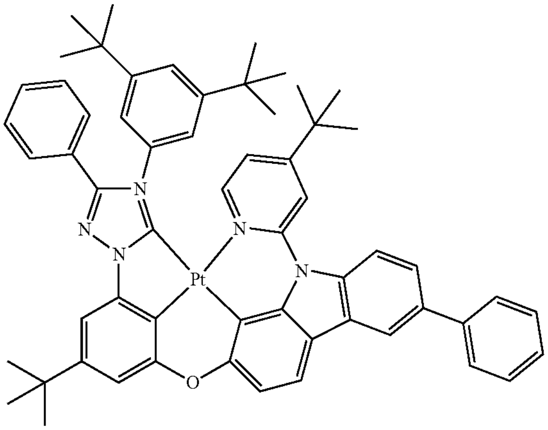
15
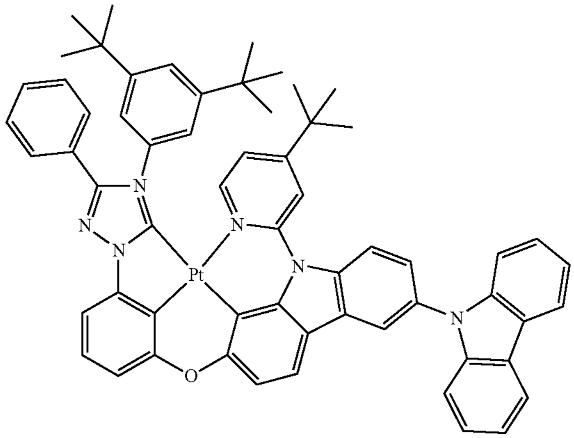
16
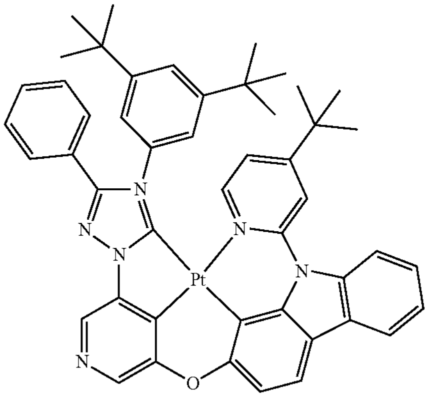
-continued
17
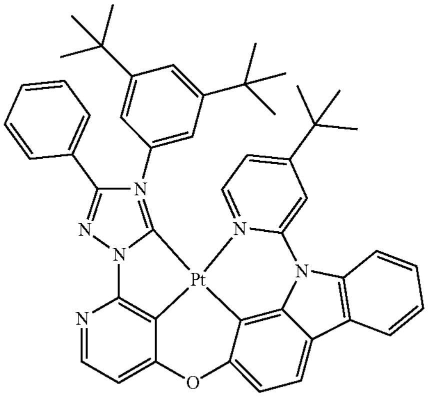
18
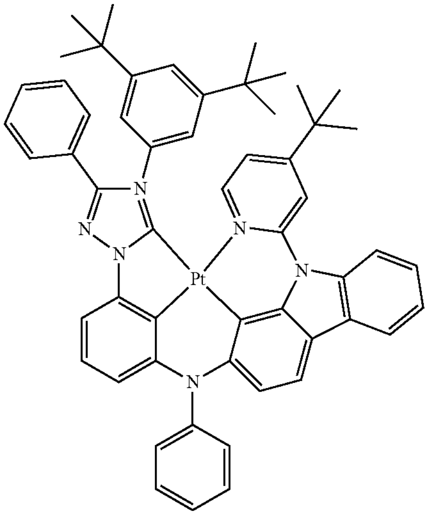
19
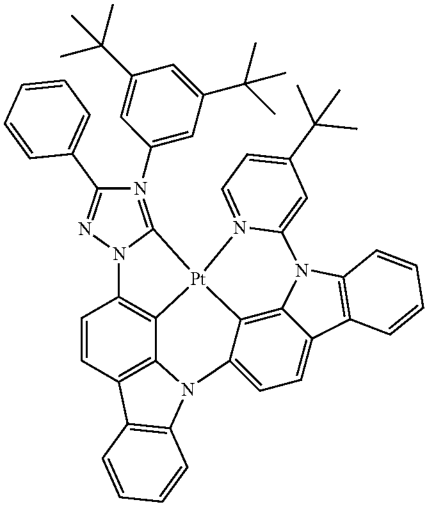

-continued
20
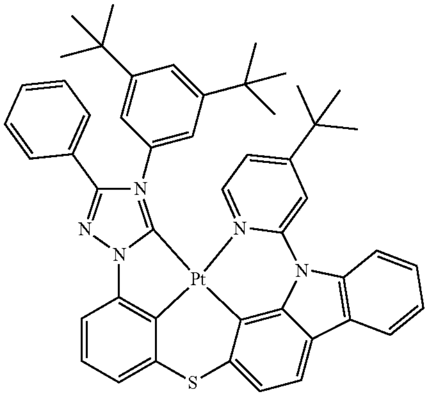
21
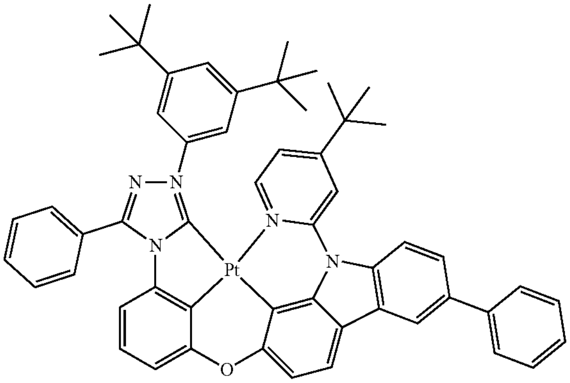
22
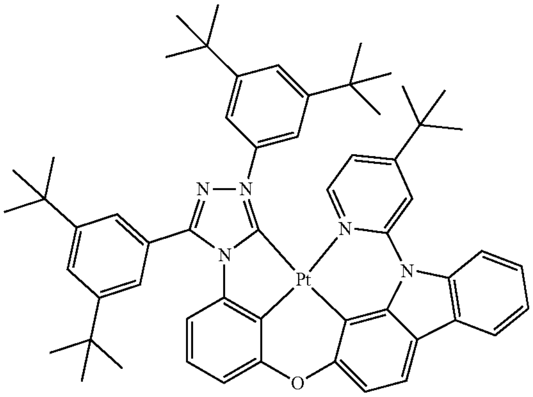
23
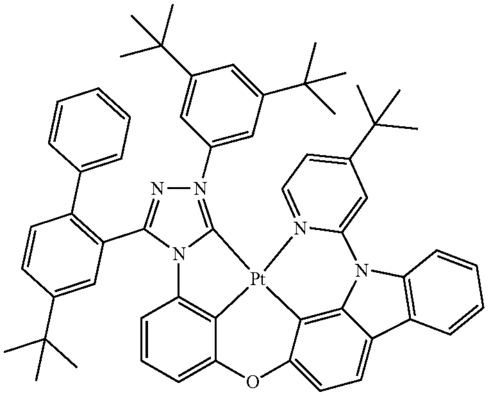
-continued
24
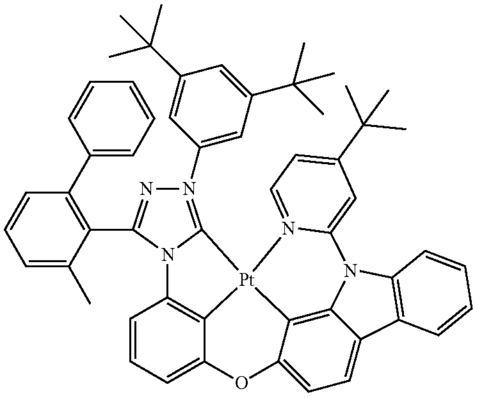
25
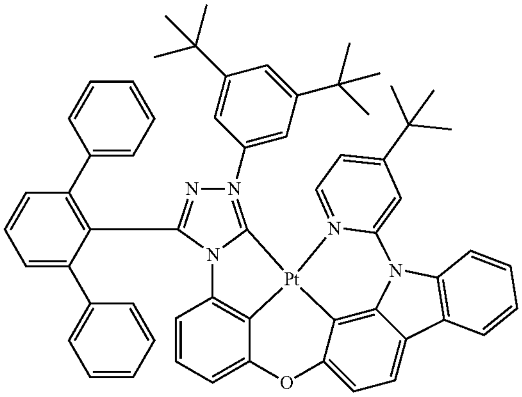
26
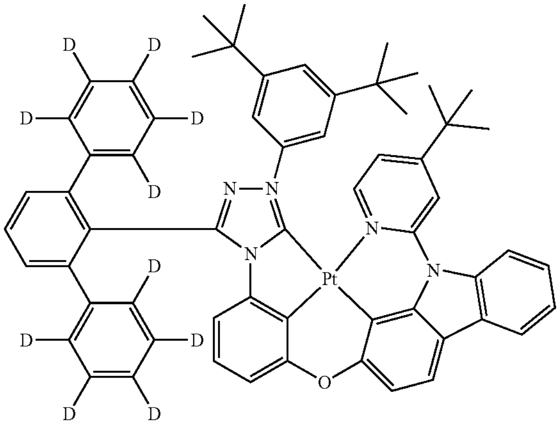

27
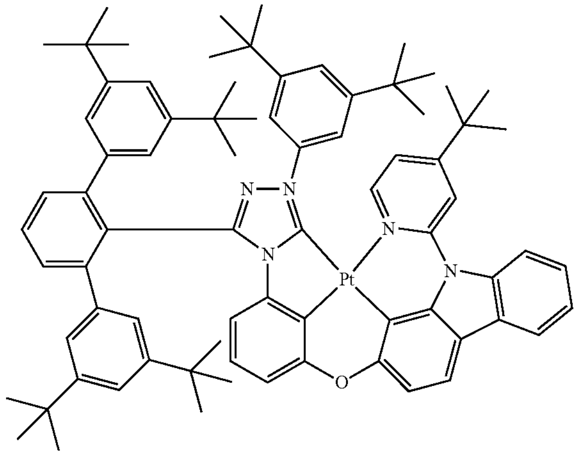
28
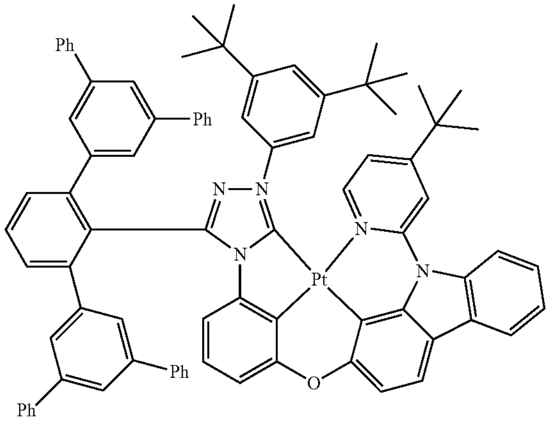
29
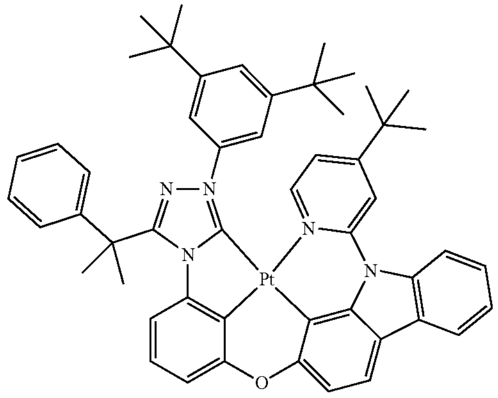
30
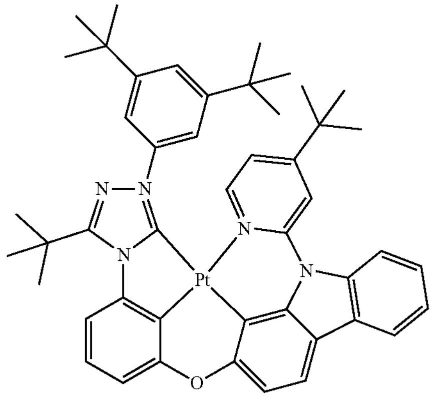
31
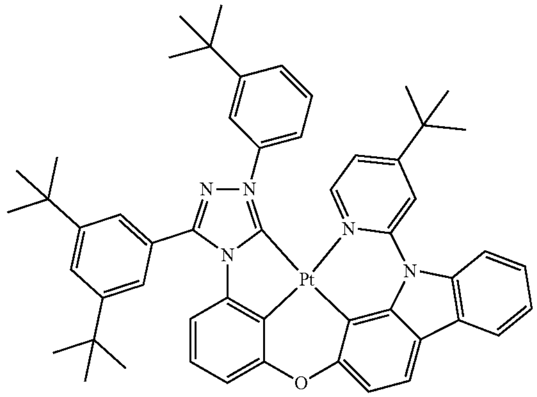
32
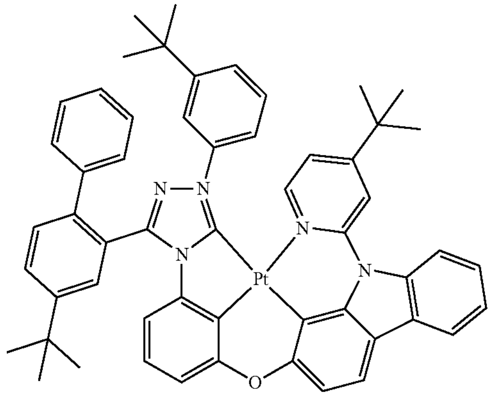
33
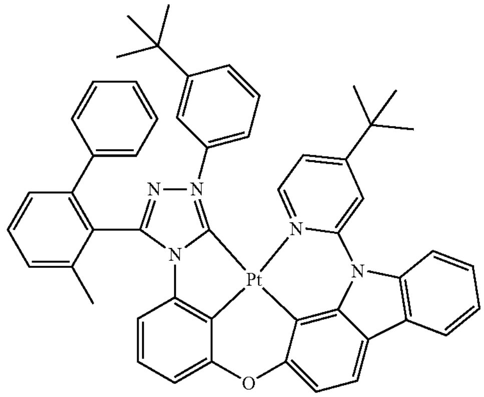

-continued
34
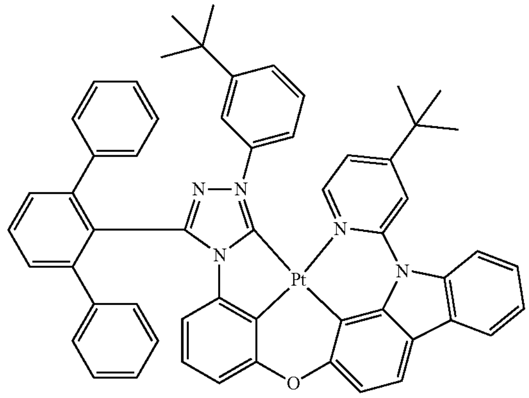
35
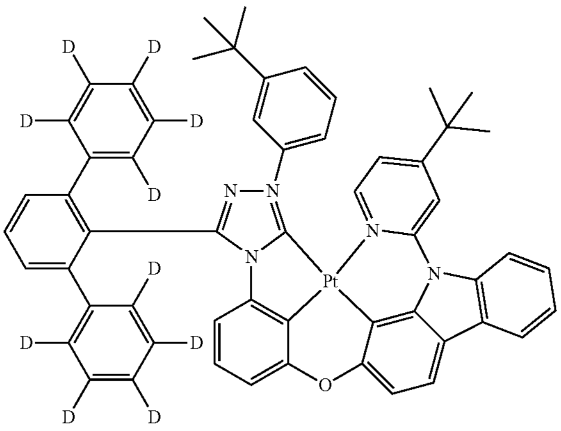
36
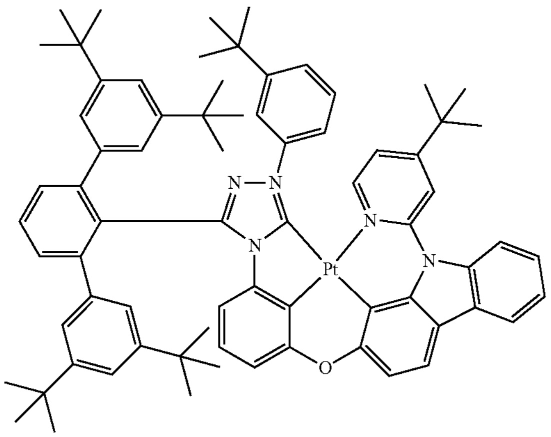
-continued
37
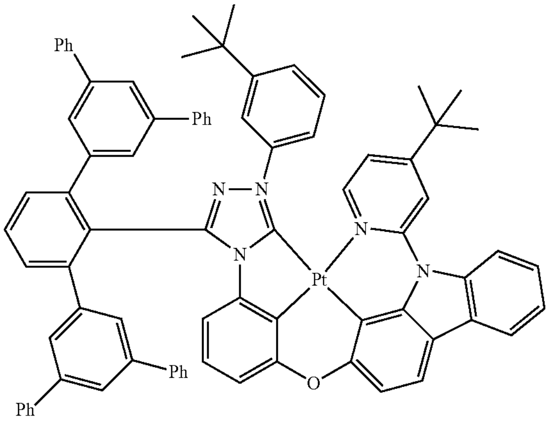
38
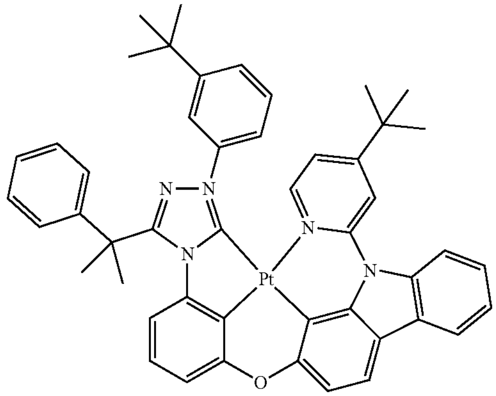
39
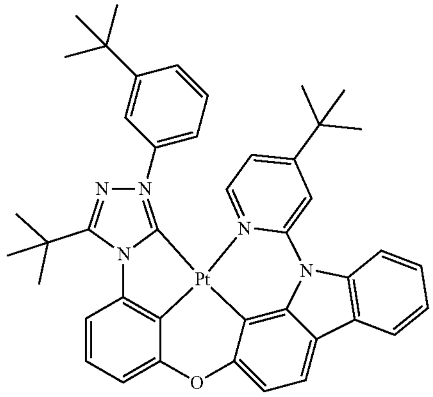
40
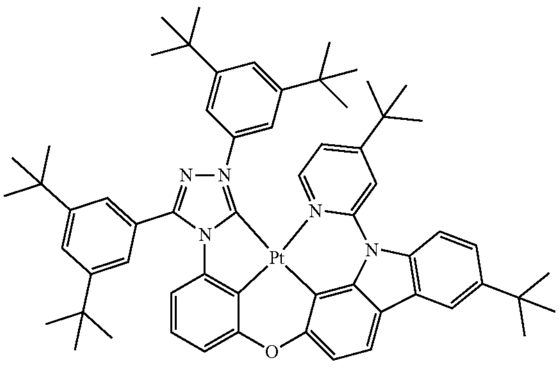

-continued
41
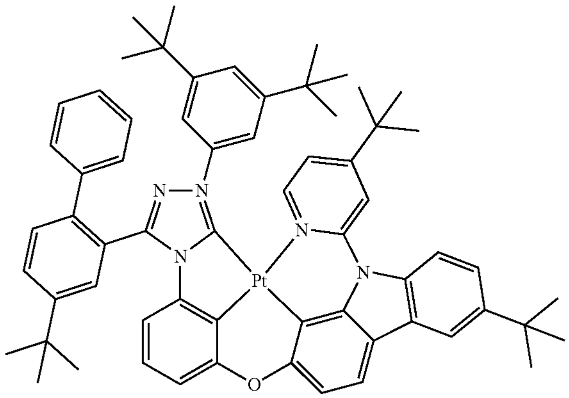
42
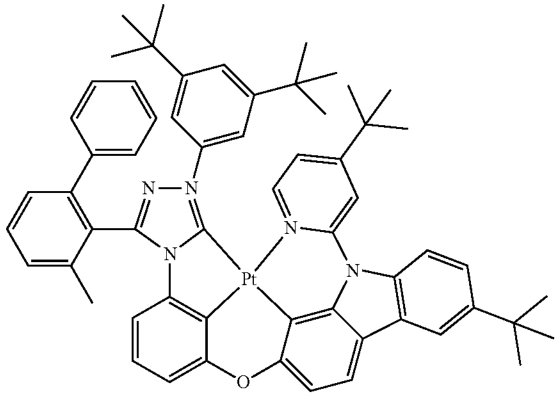
43
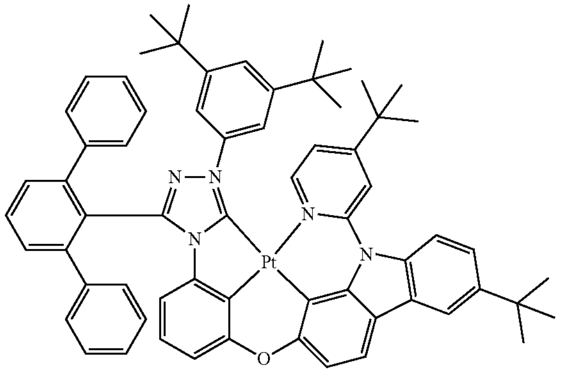
44
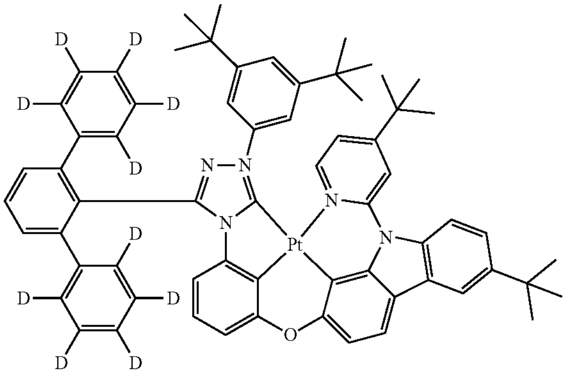
-continued
45
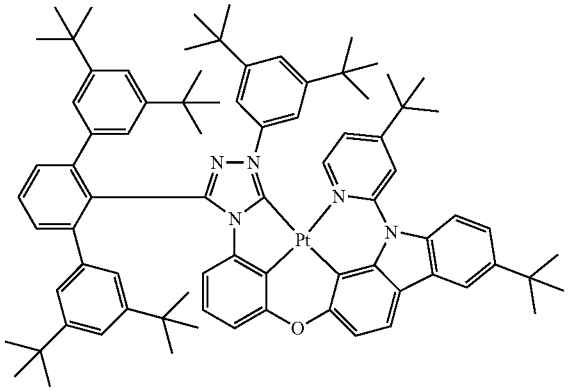
46
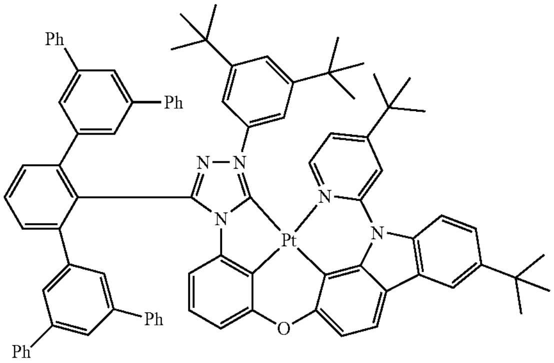
47
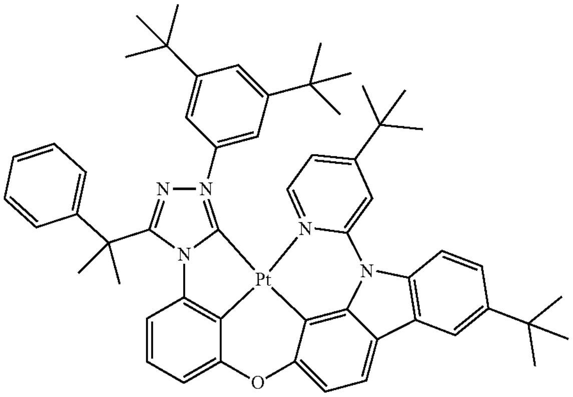
48
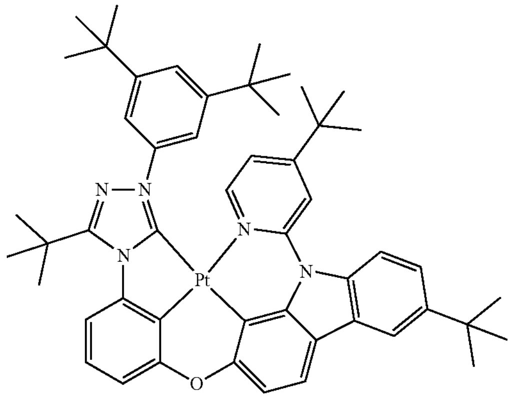

-continued
49
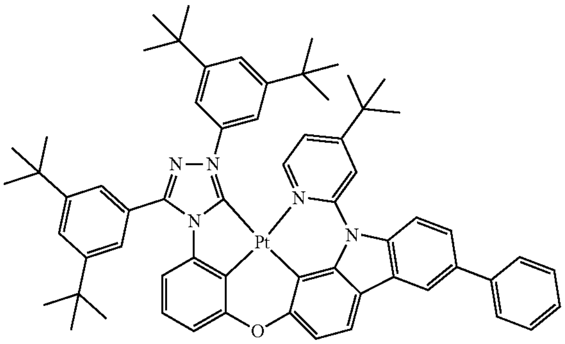
50
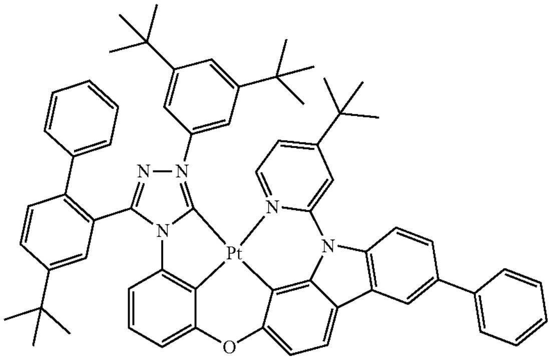
51
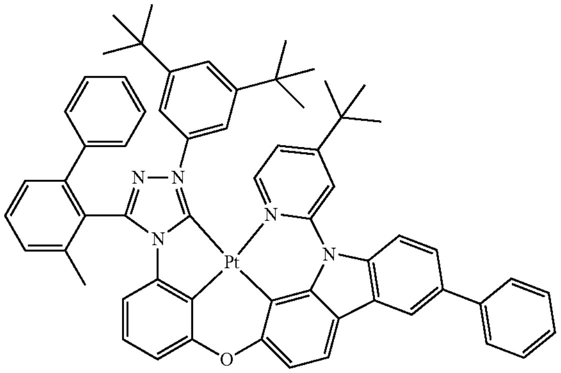
52
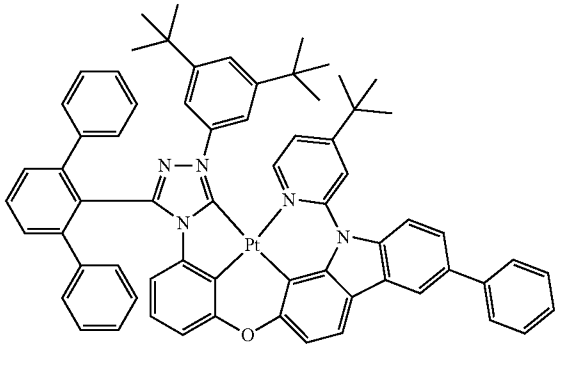
-continued
53
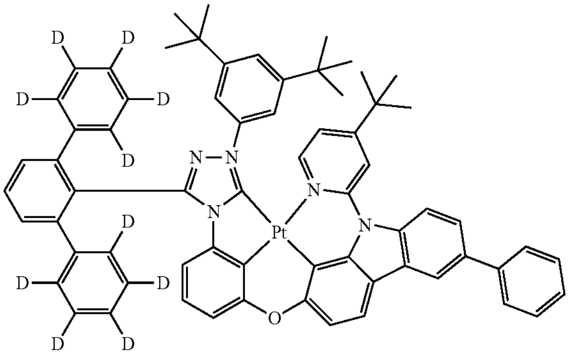
54
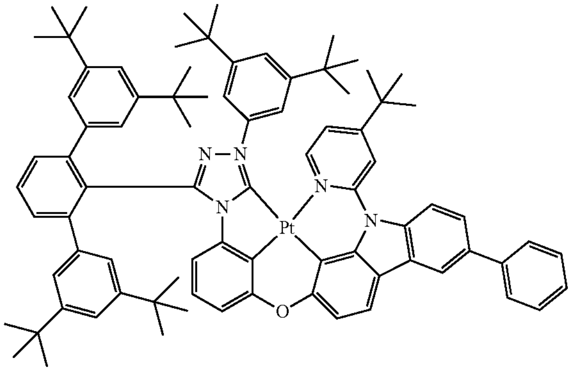
55
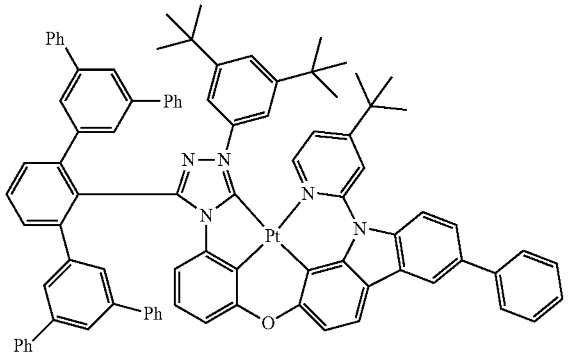
56
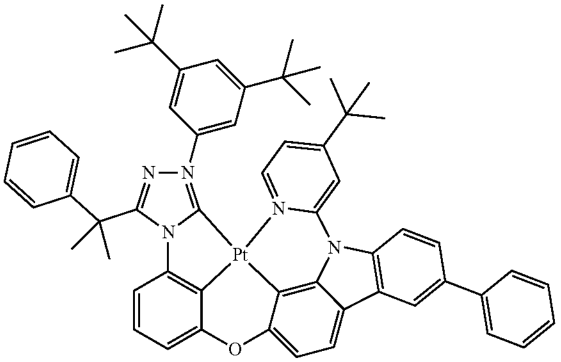

-continued
57
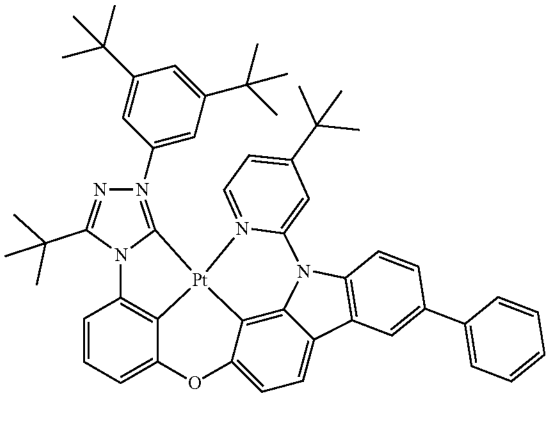
58
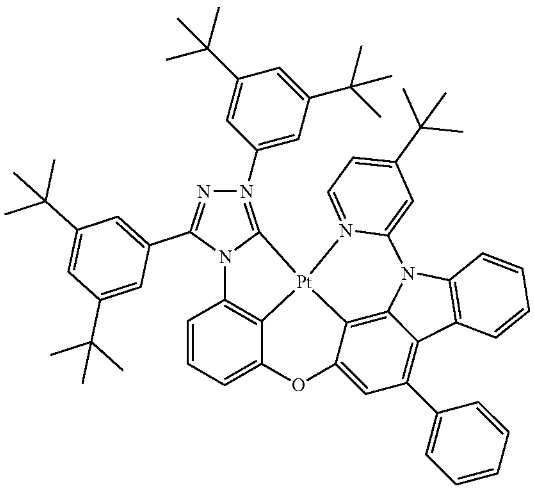
59
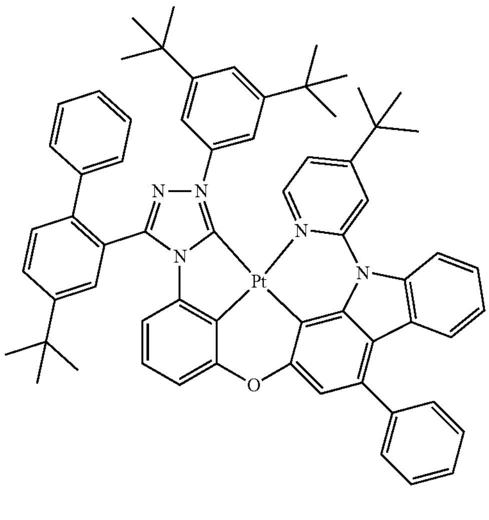
-continued
60
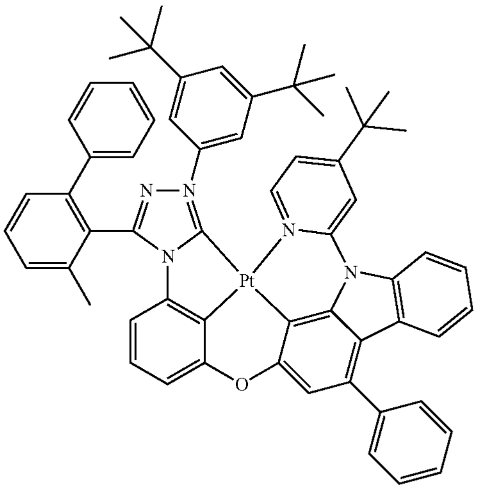
61
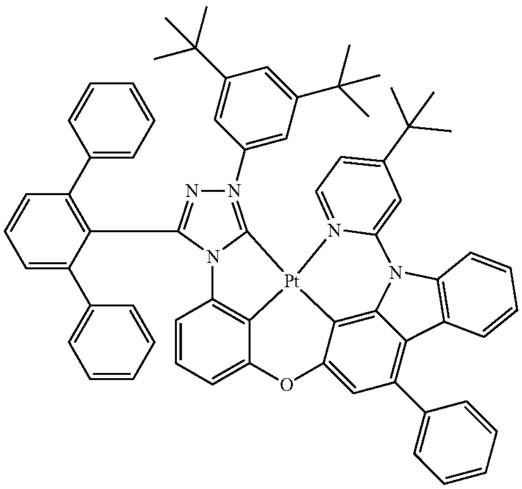
62
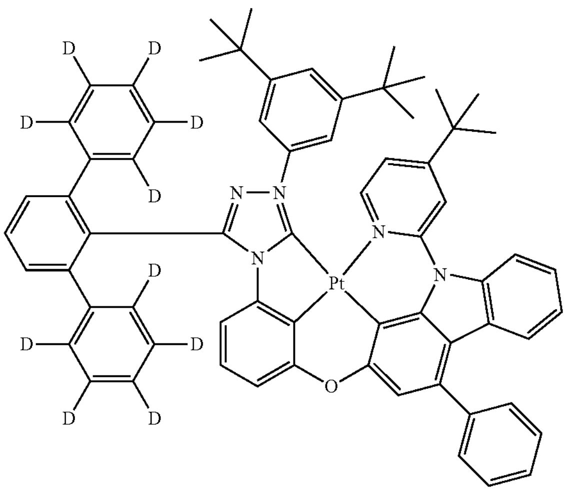

-continued
63
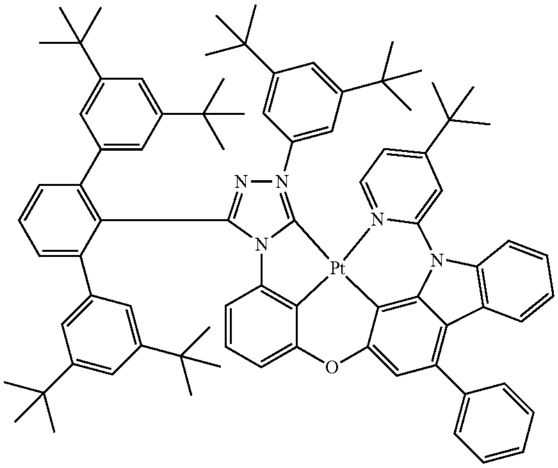
64
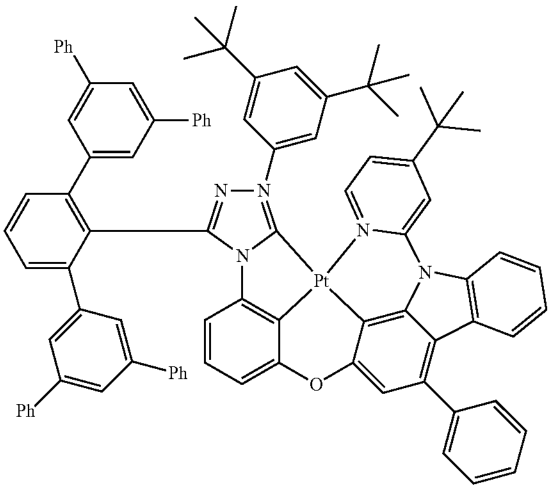
65
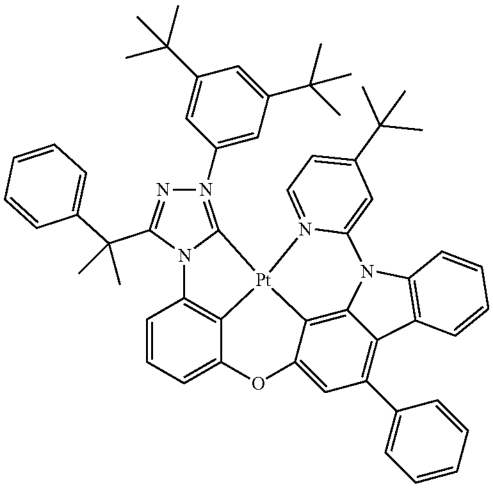
-continued
66
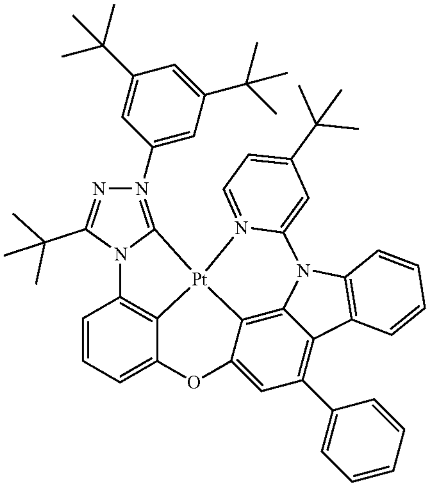
67
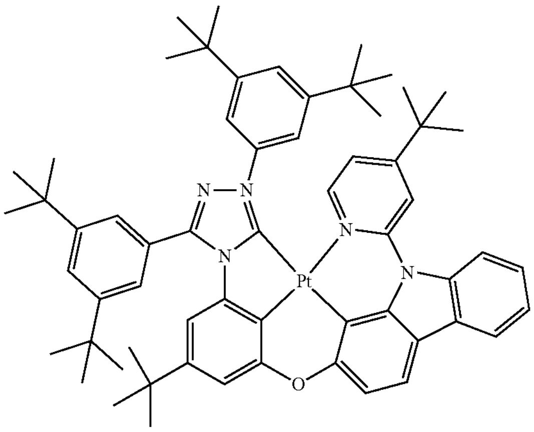
68
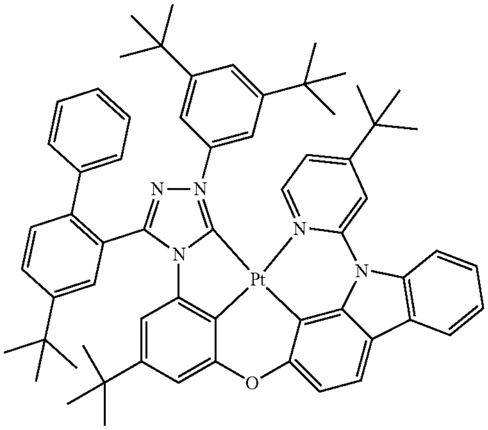

-continued
69
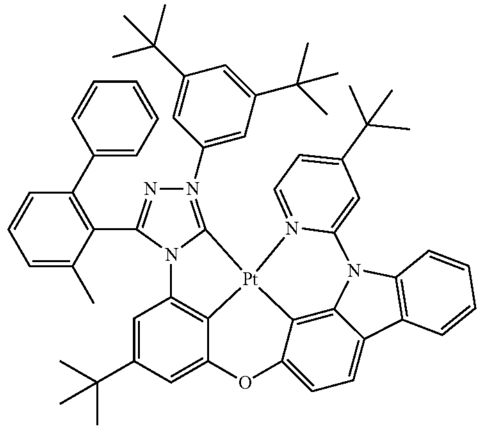
70
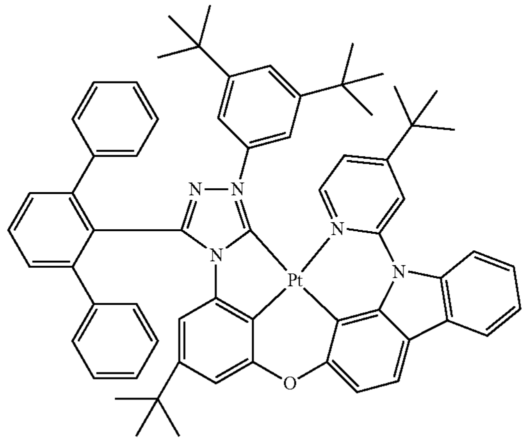
71
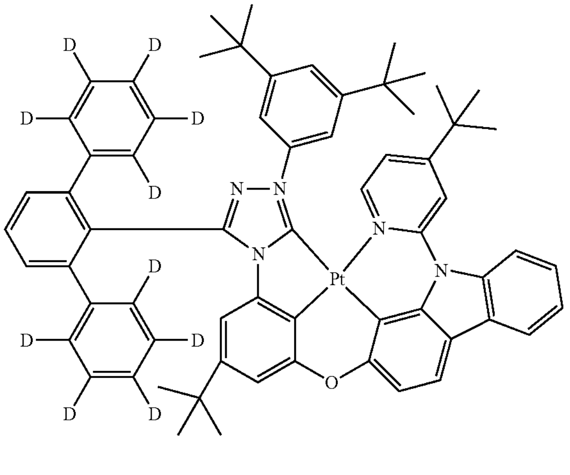
-continued
72
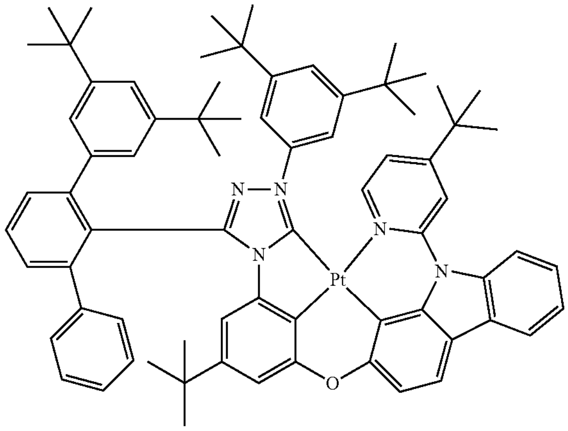
73
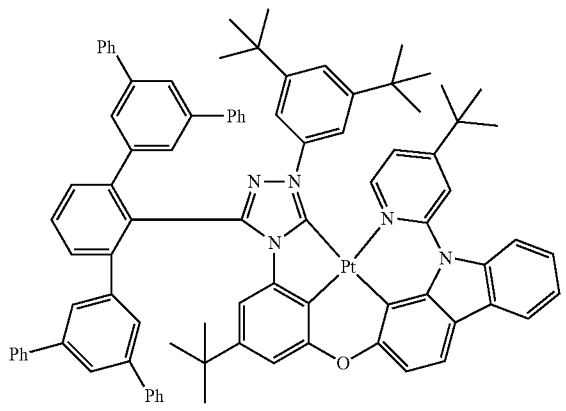
74
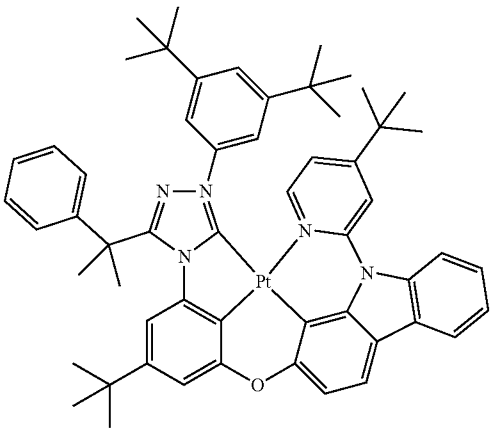

75
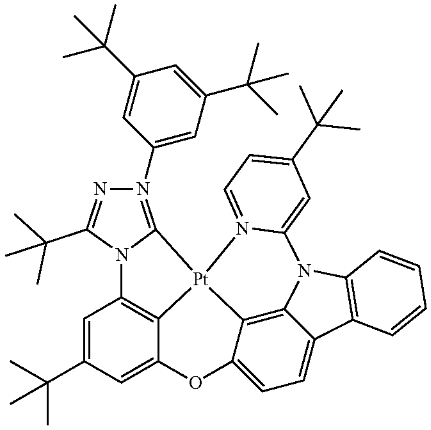
76
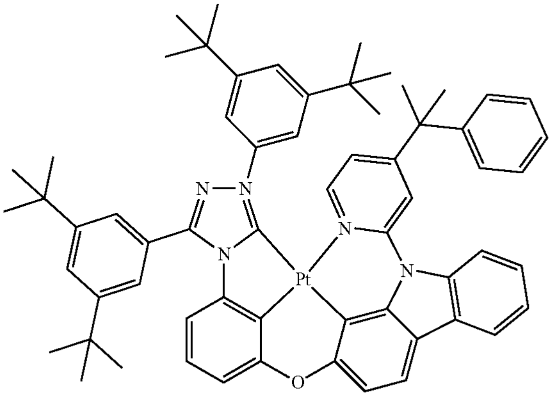
77
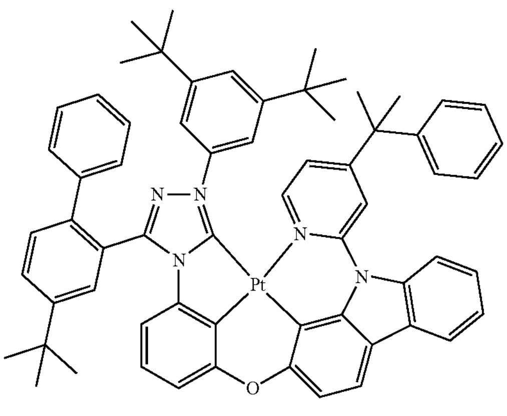
78
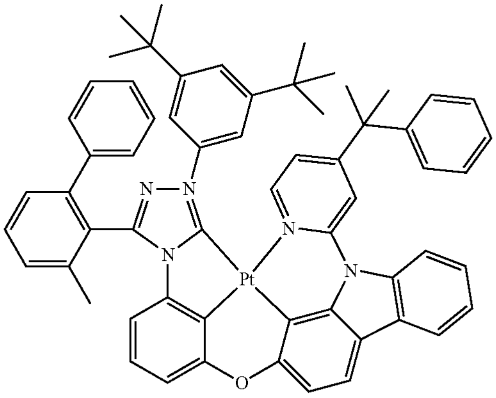
79
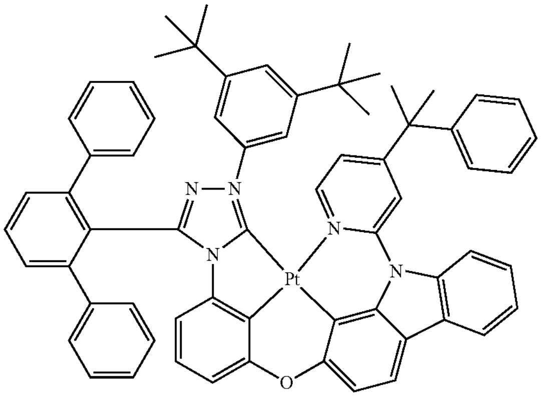
80
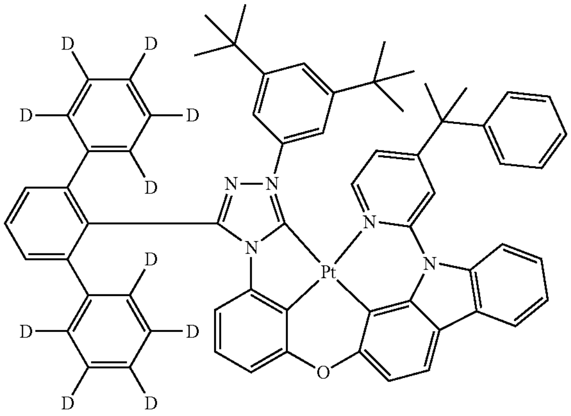

-continued
81
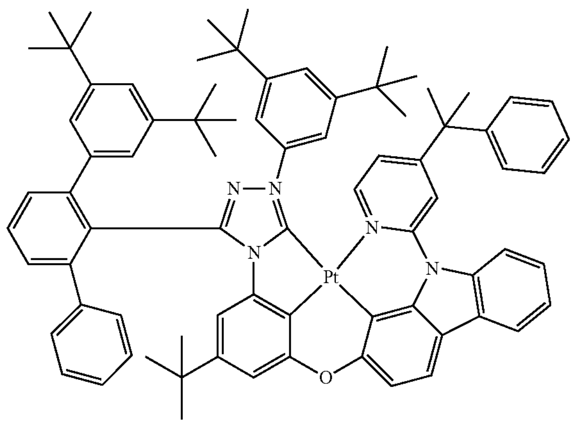
82
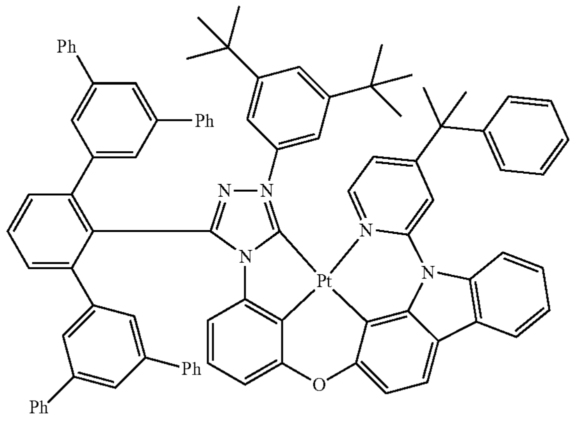
83
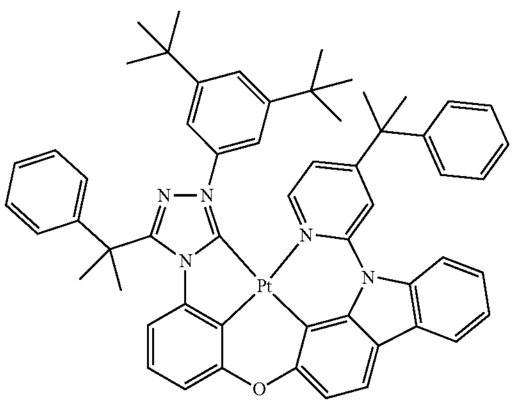
-continued
84
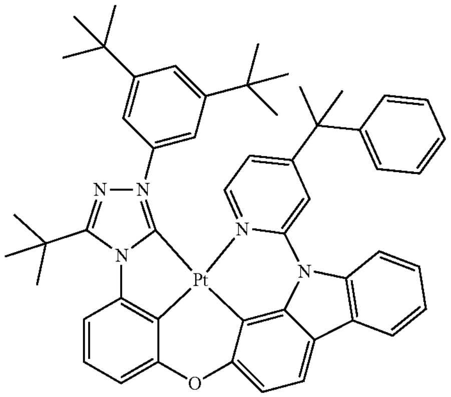
85
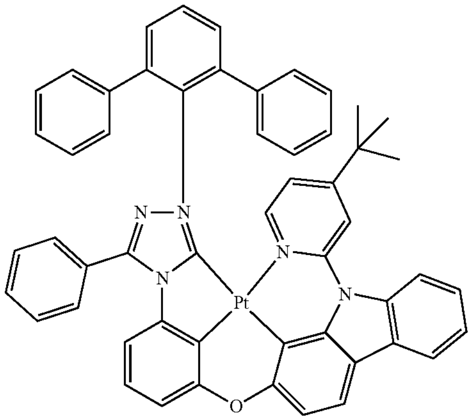
86
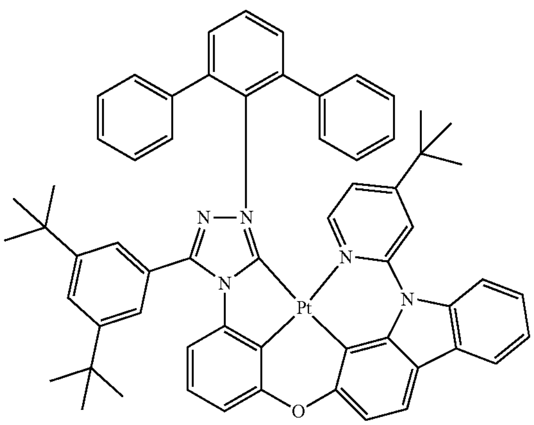

-continued
87
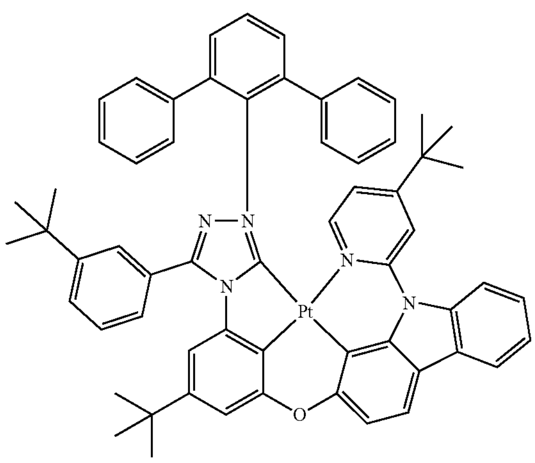
88
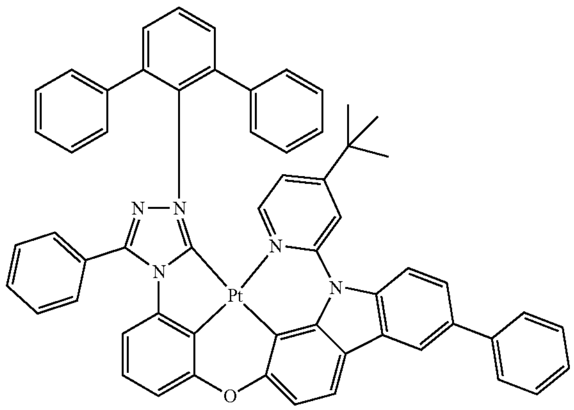
89
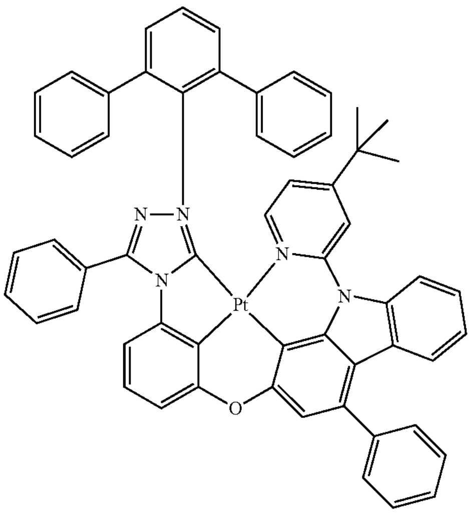
-continued
90
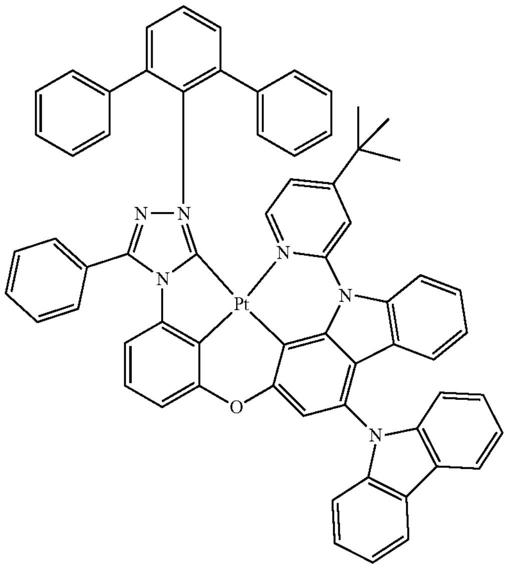
91
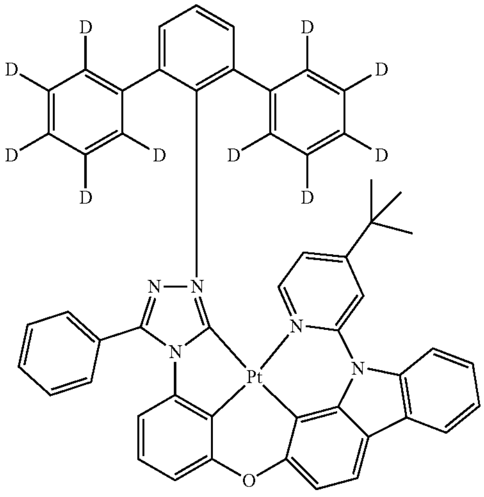
92
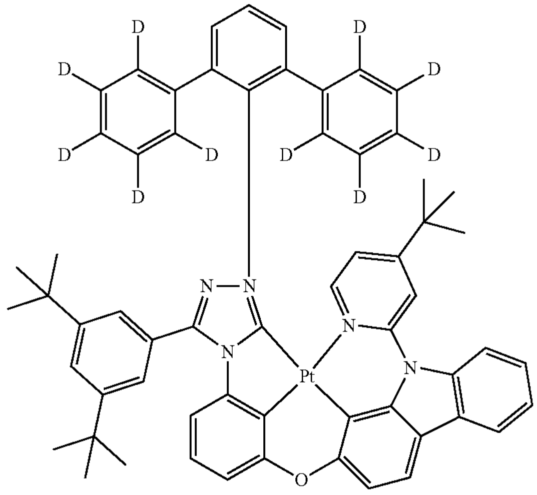

-continued
93
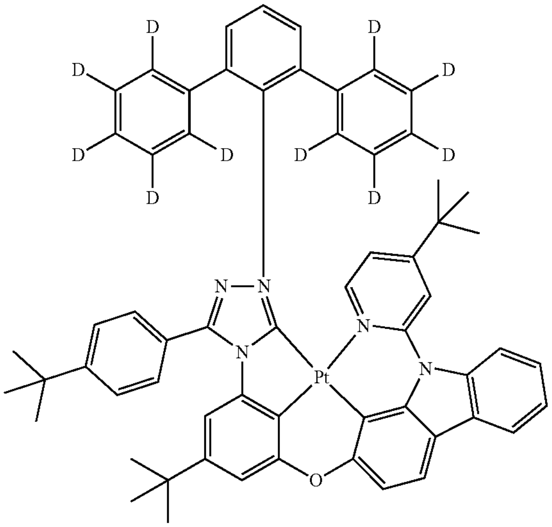
94
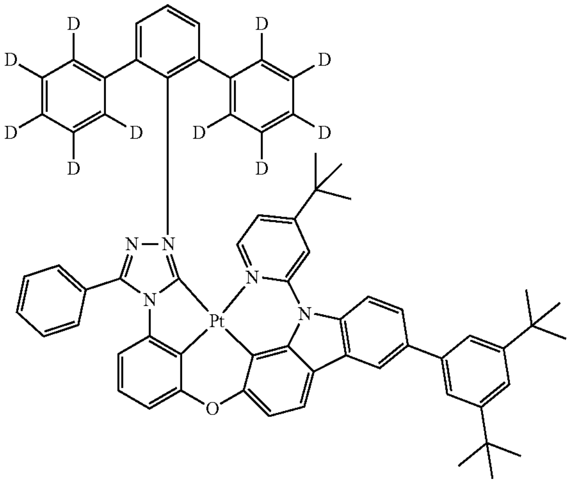
95
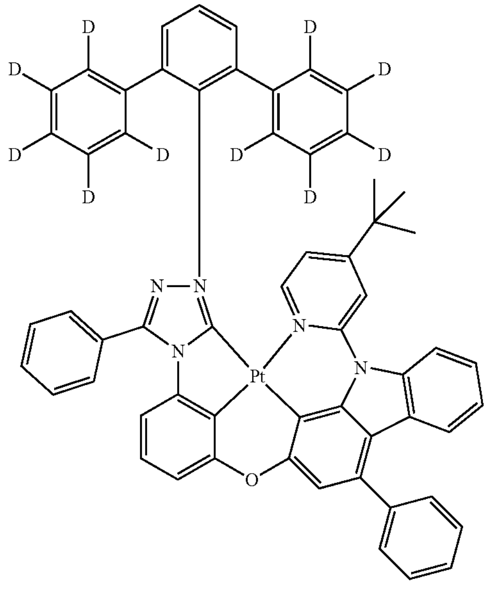
-continued
96
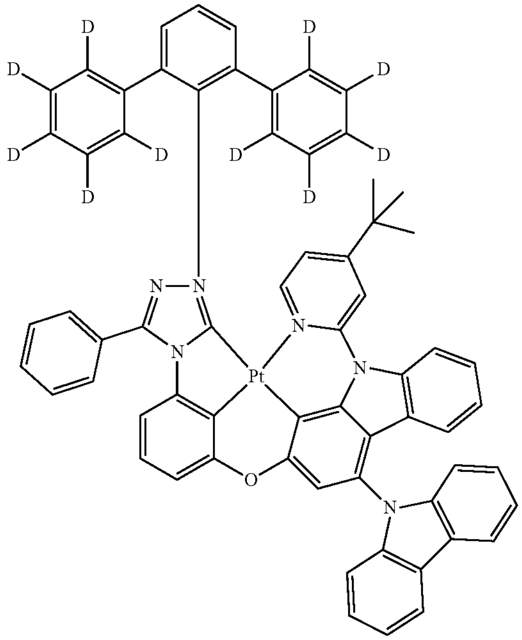
97
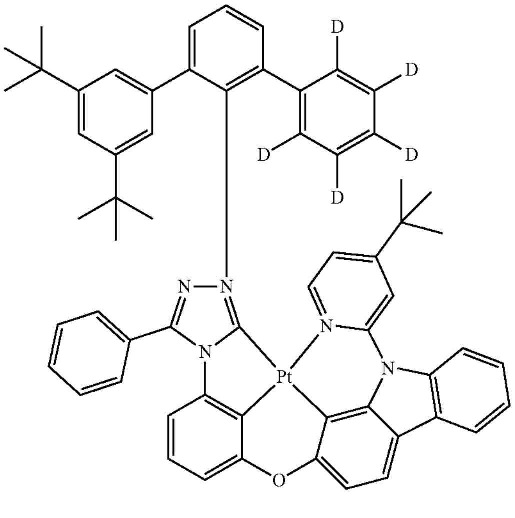

-continued
98
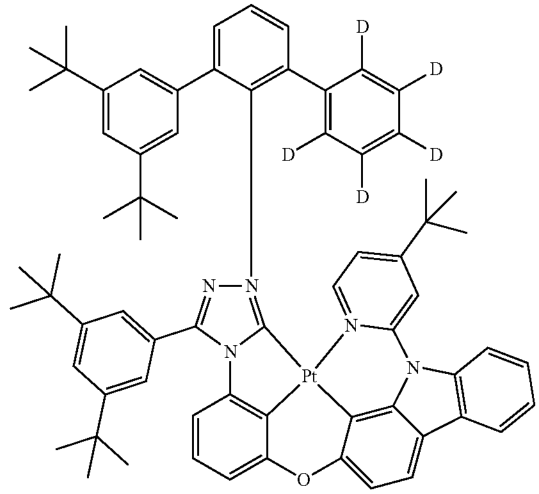
99
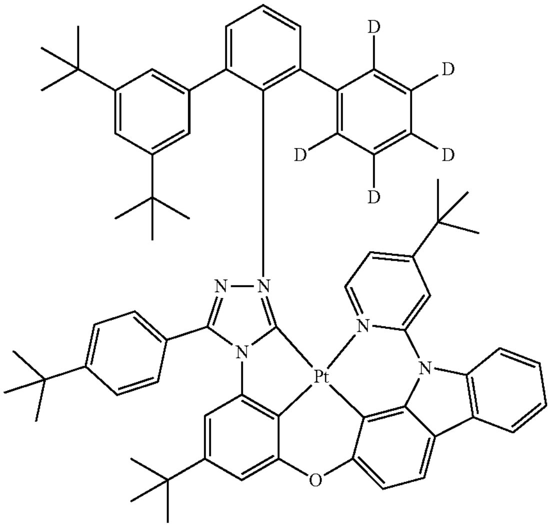
100
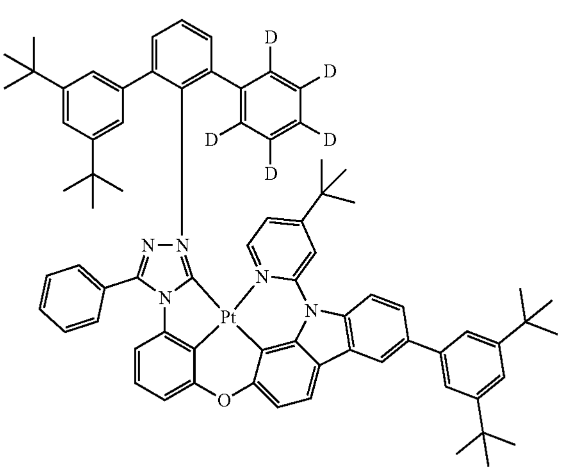
-continued
101
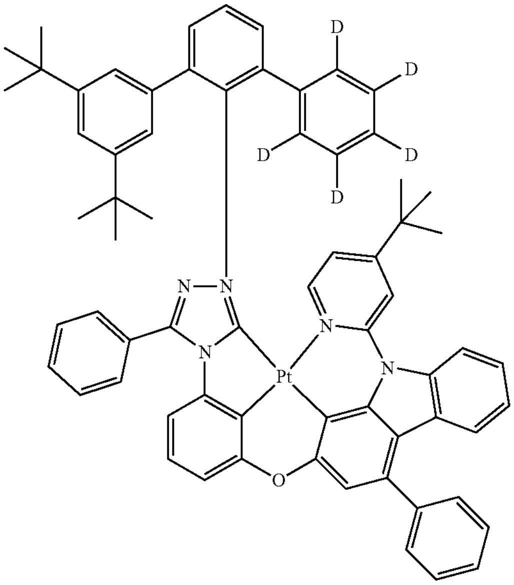
102
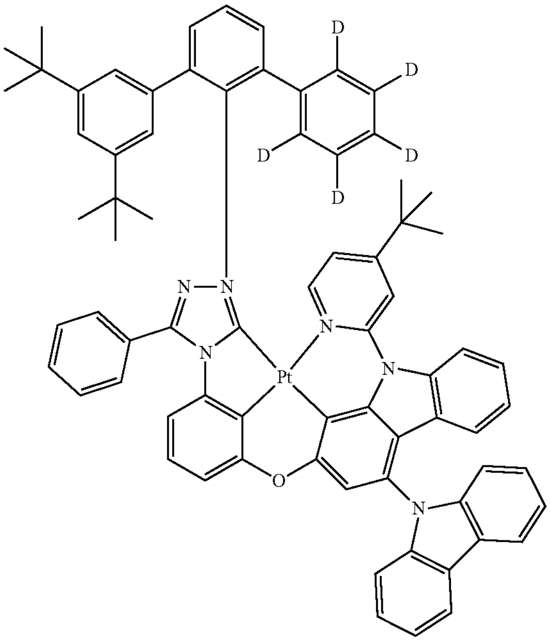

-continued
103
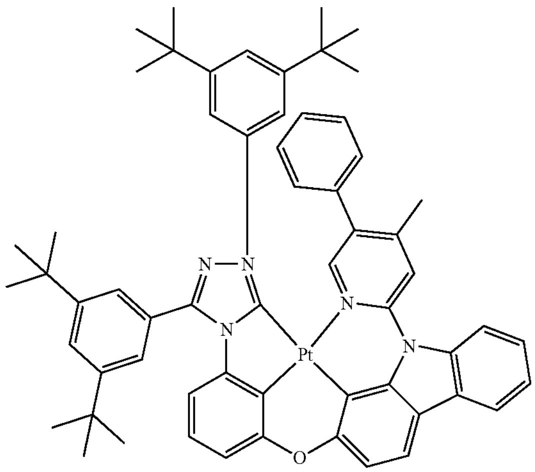
104
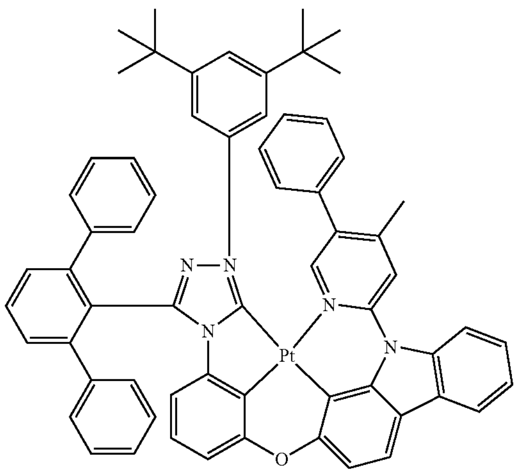
105
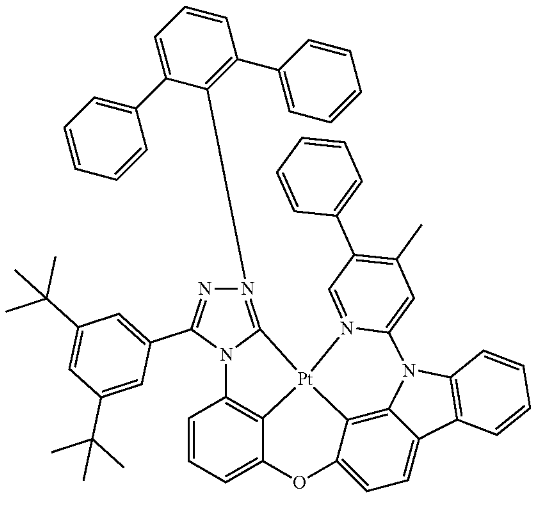
-continued
106
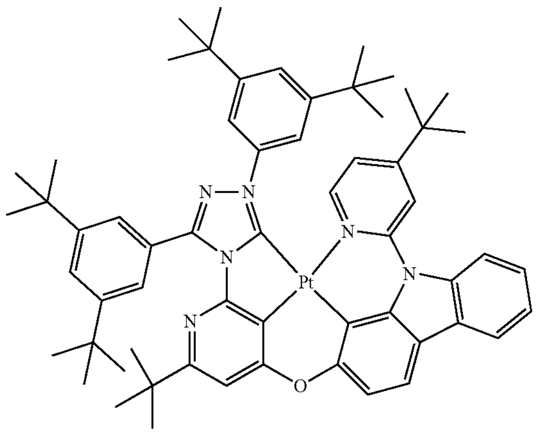
107
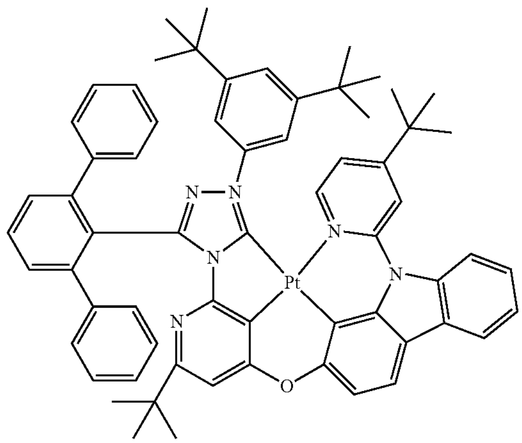
108
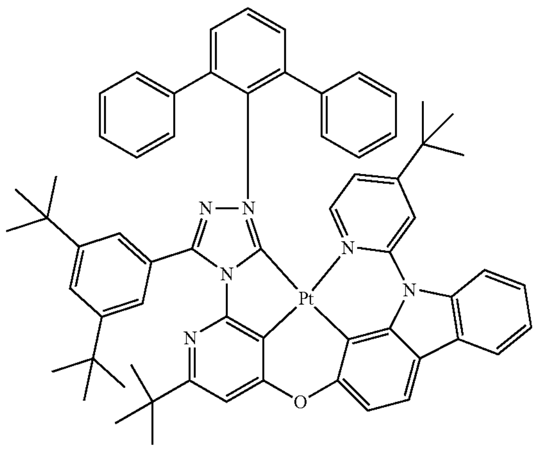

-continued
109
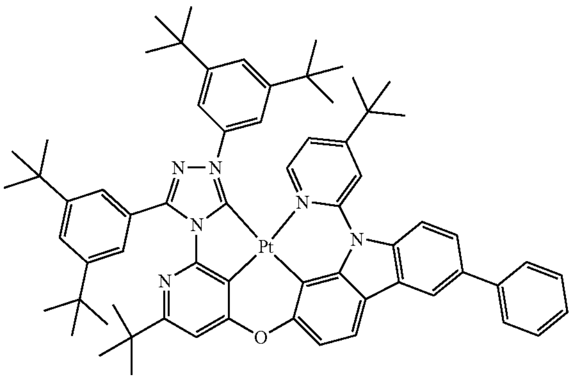
110
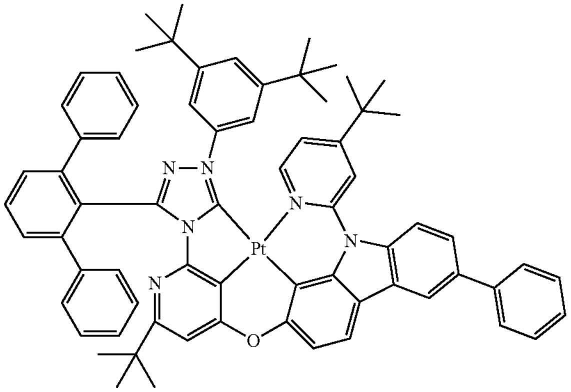
111
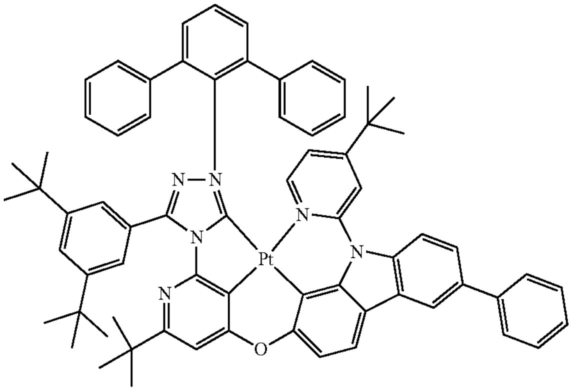
-continued
112
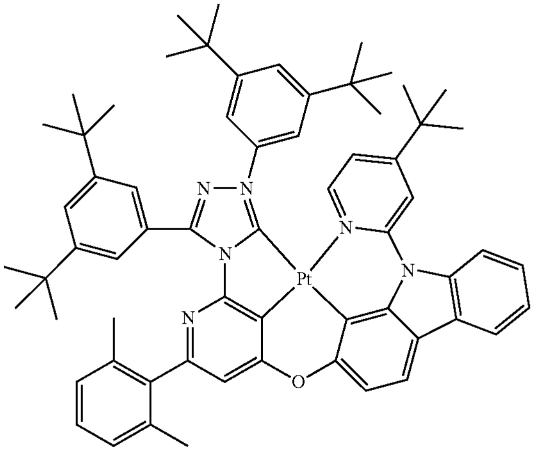
113
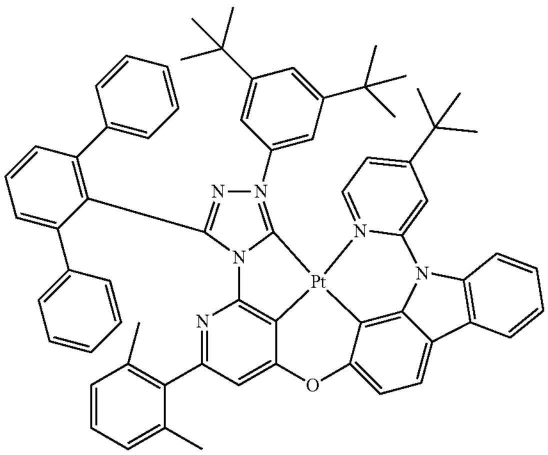
114
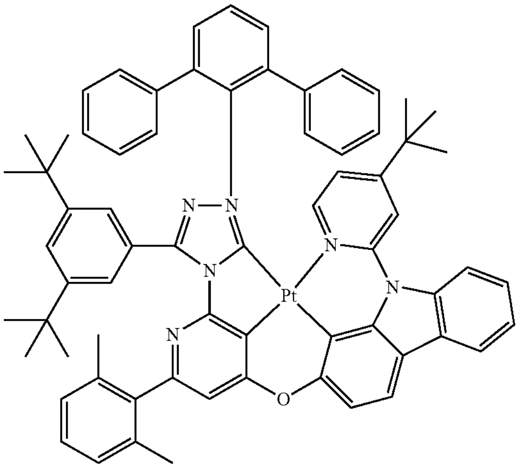

-continued
115
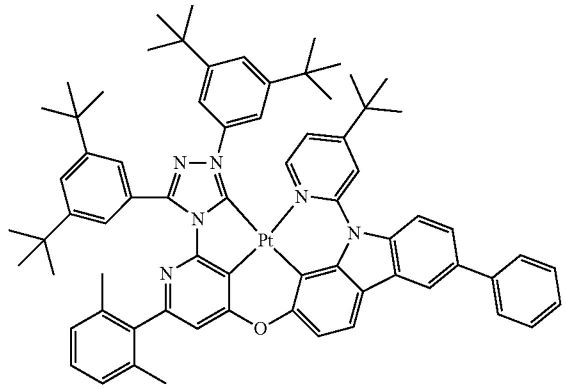
116
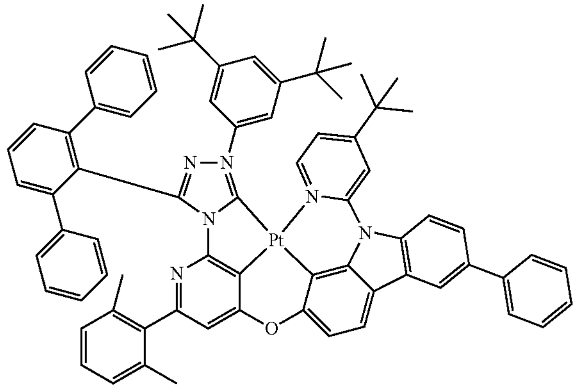
117
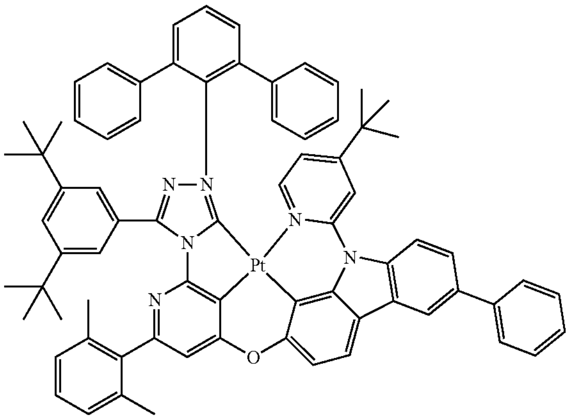
-continued
118
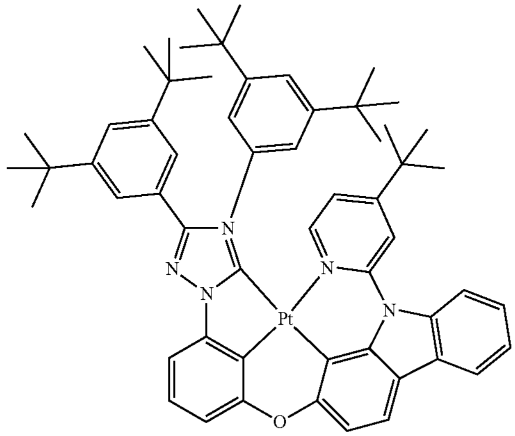
119
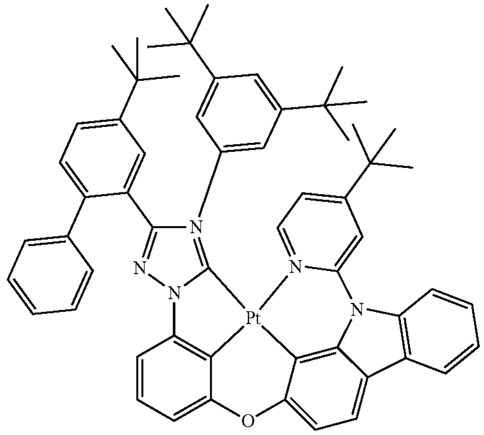
120
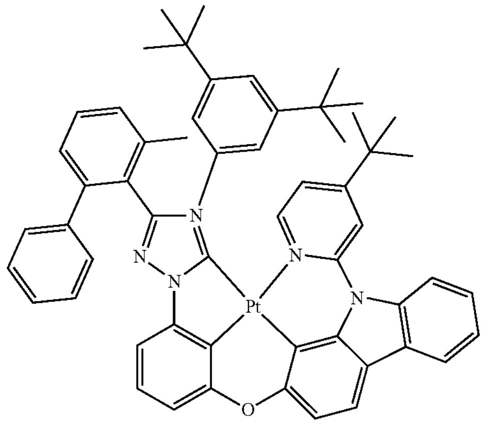

-continued
121
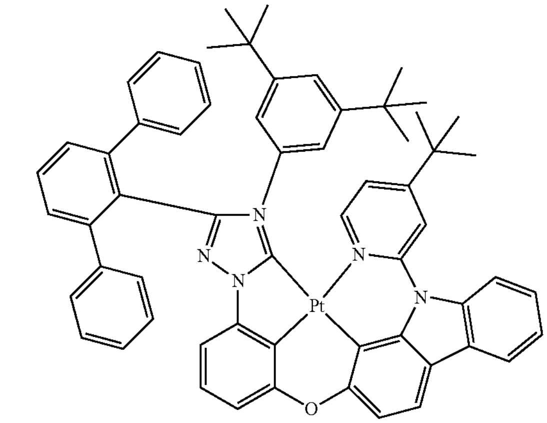
122
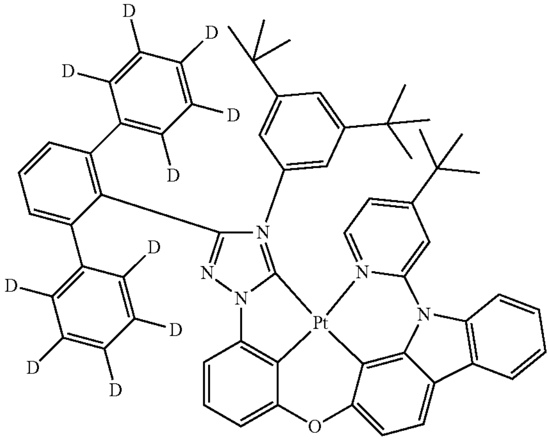
123
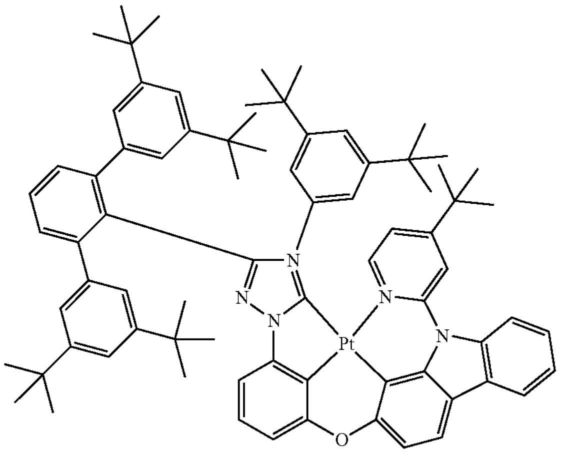
-continued
124
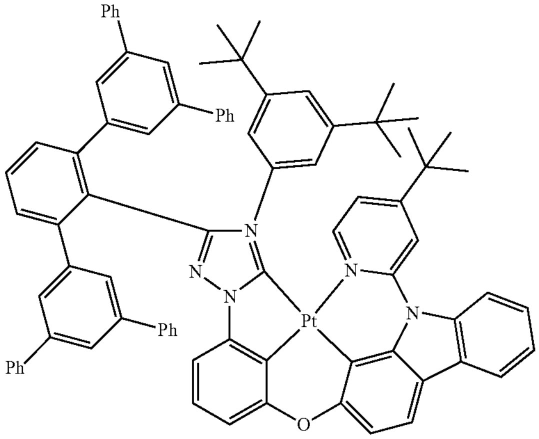
125
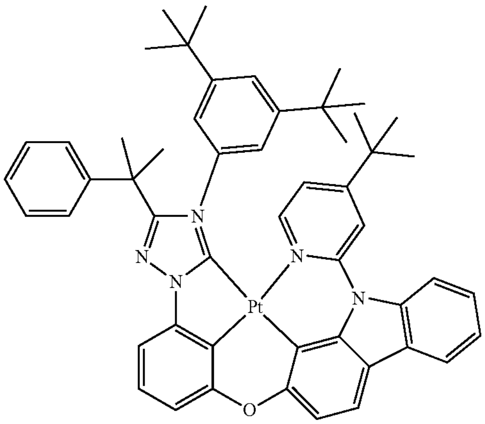
126
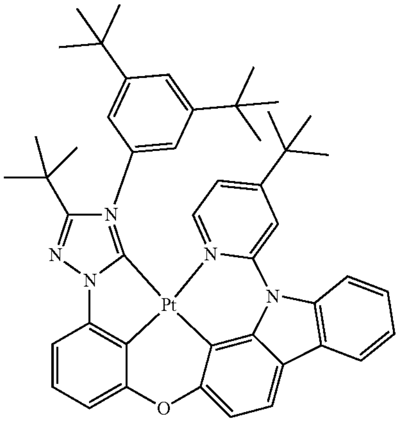

-continued
127
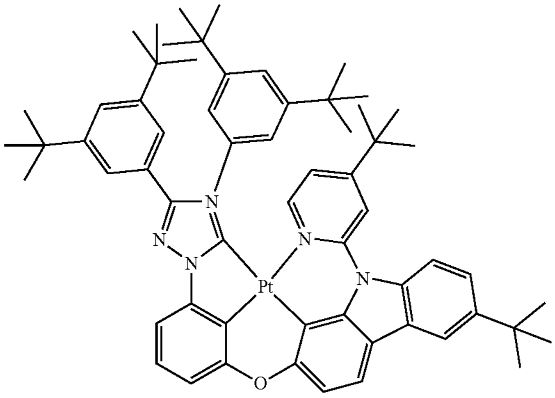
128
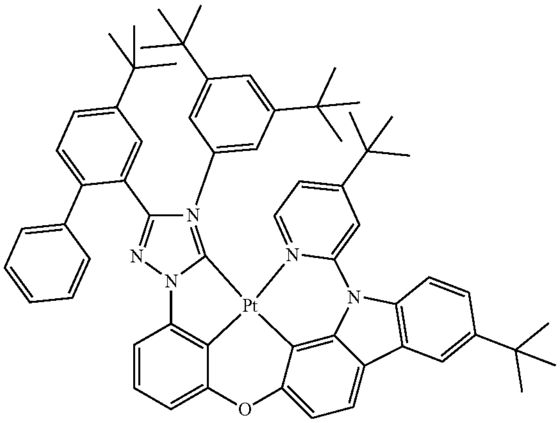
129
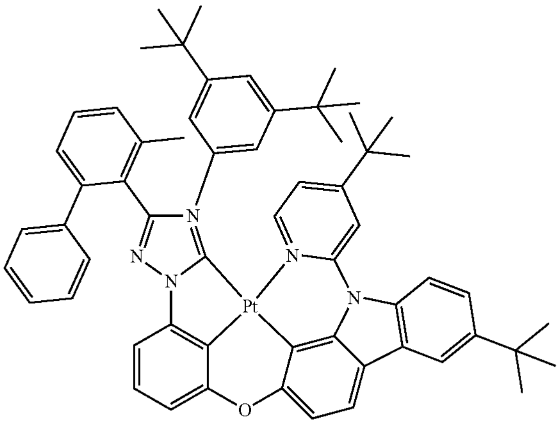
-continued
130
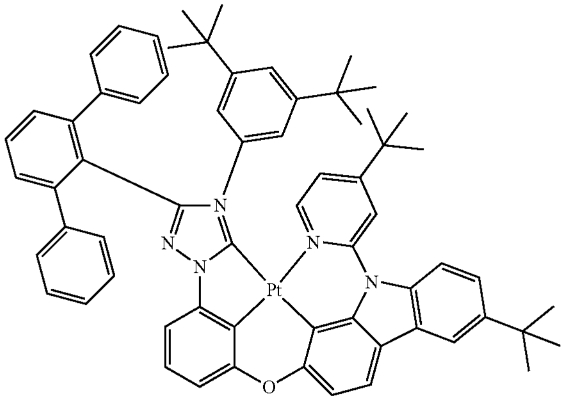
131
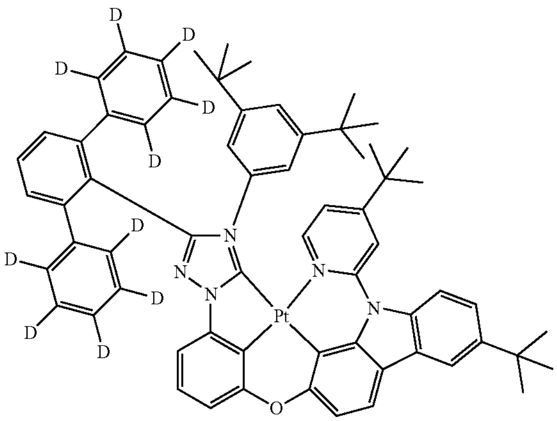
132
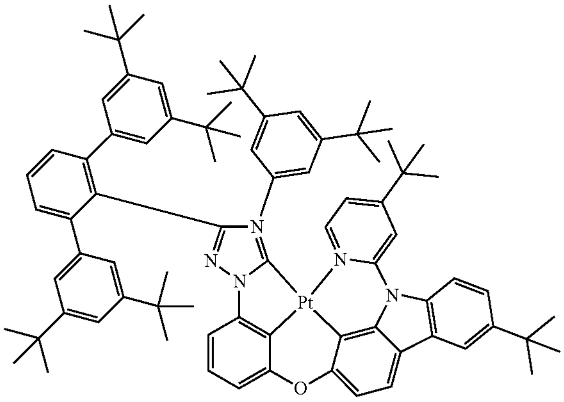

-continued
133
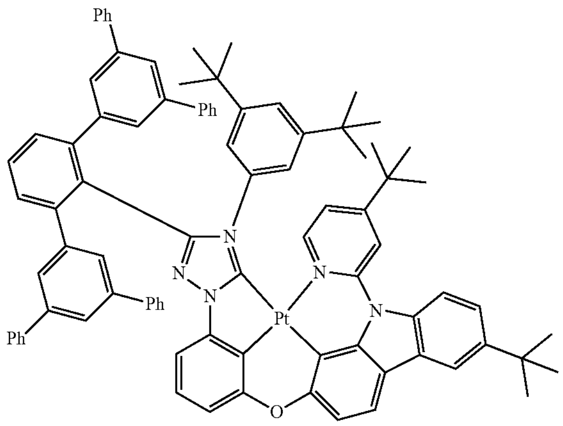
134
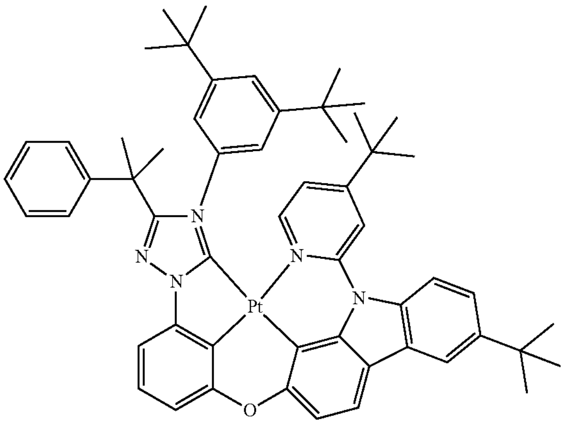
135
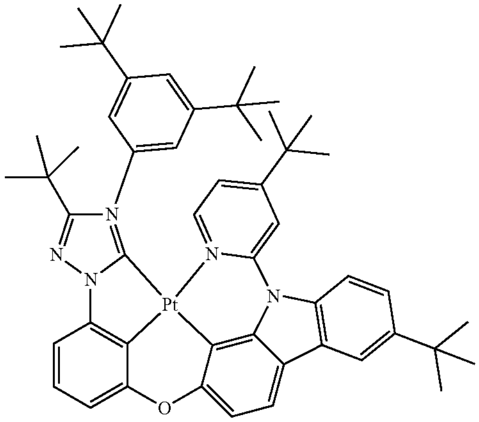
-continued
136
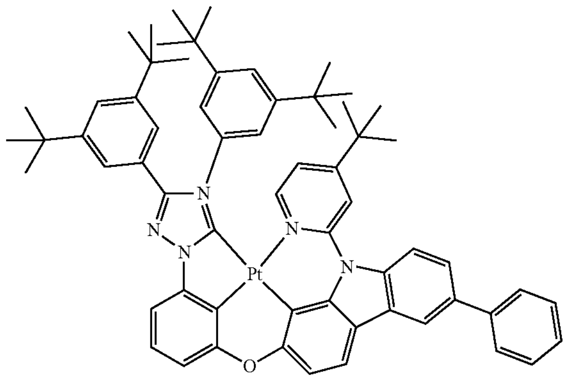
137
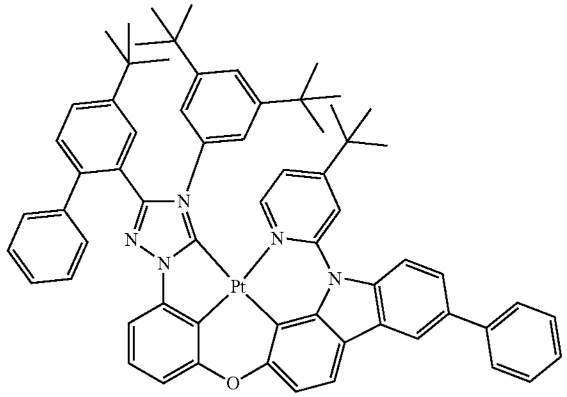
138
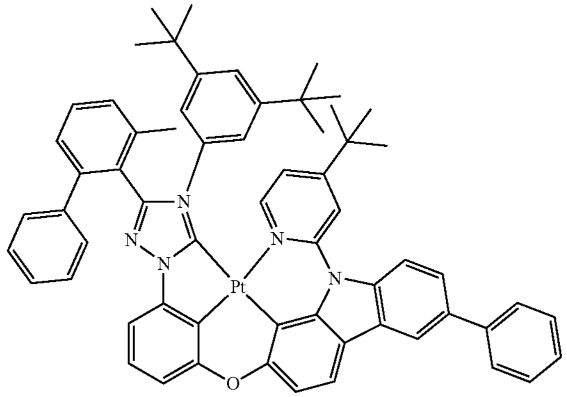
139
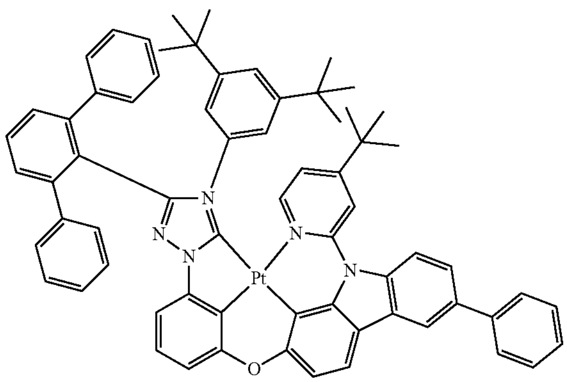

-continued
140
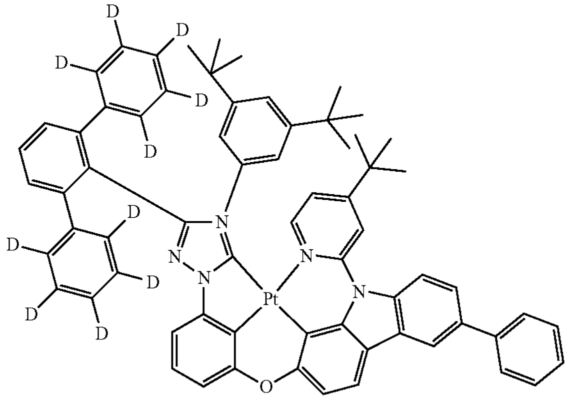
141
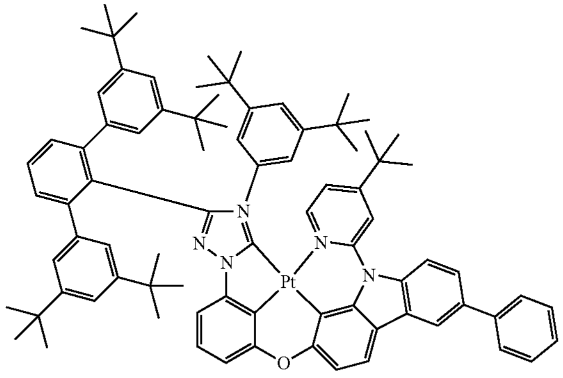
142
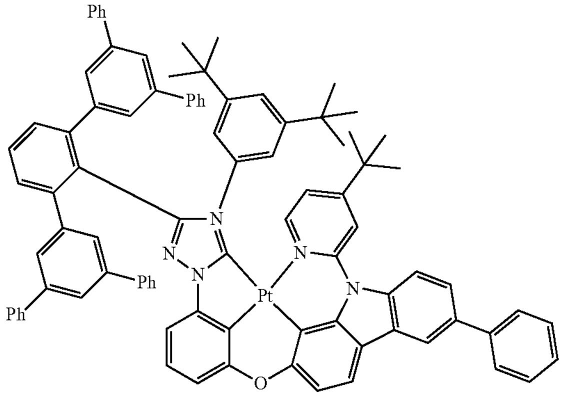
143
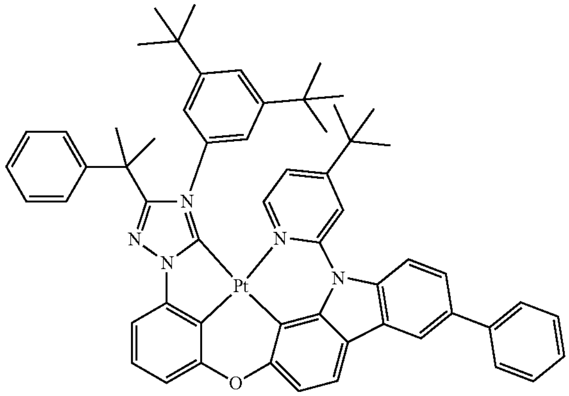
-continued
144
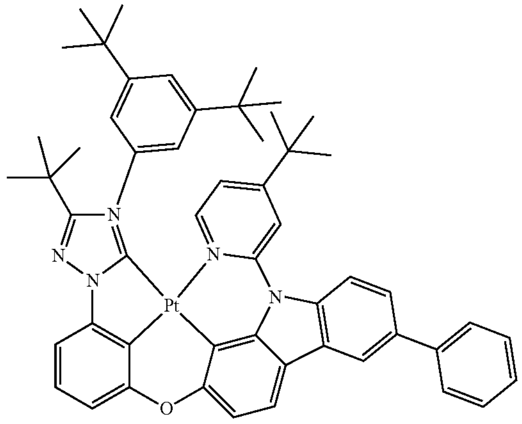
145
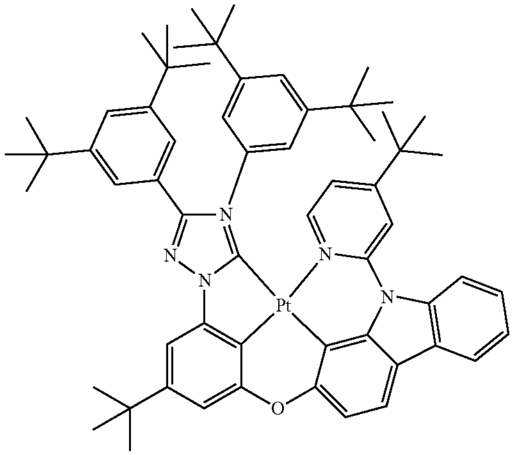
146
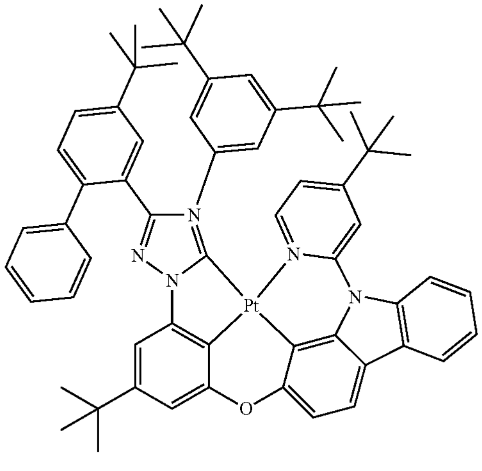

147
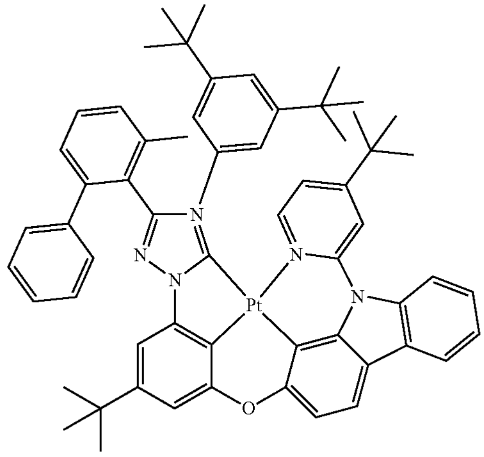
148
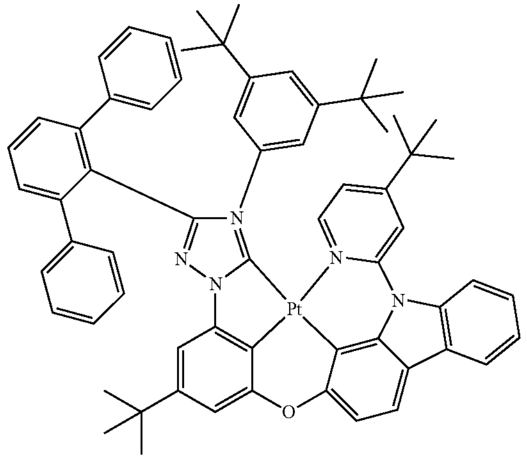
149
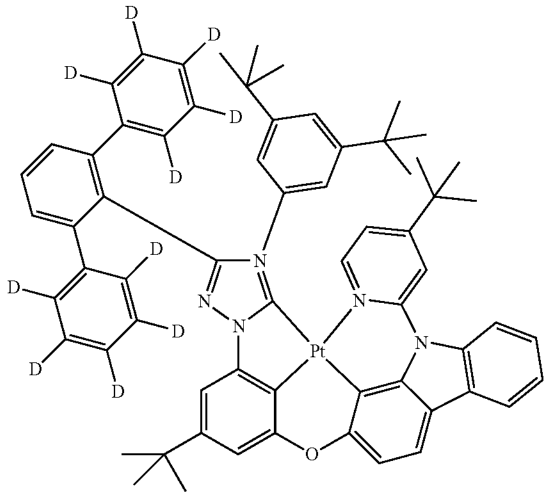
150
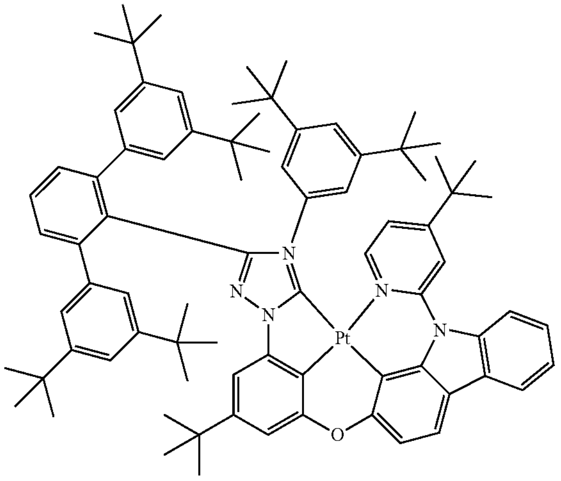
151
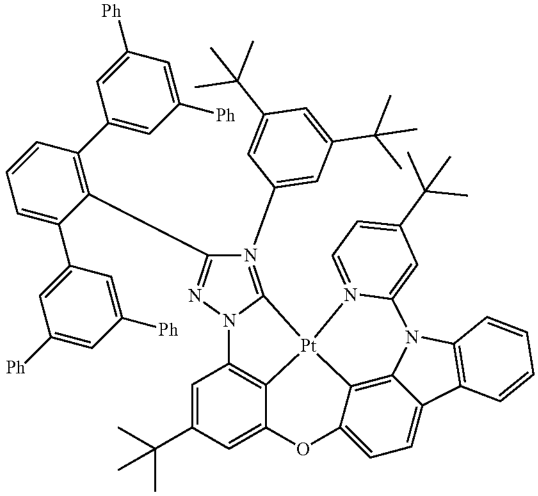
152
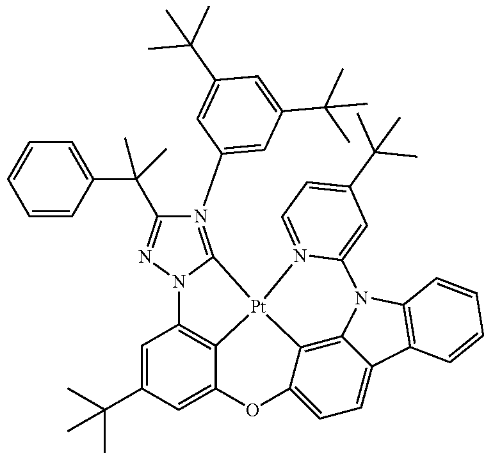

-continued
153
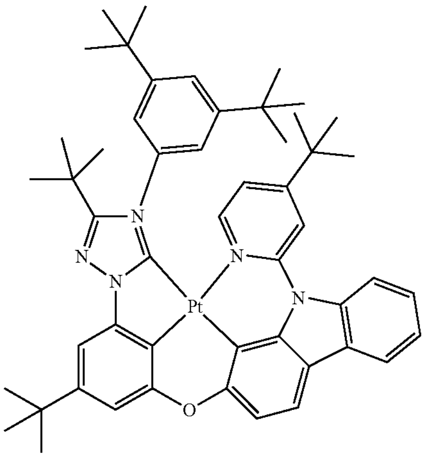
154
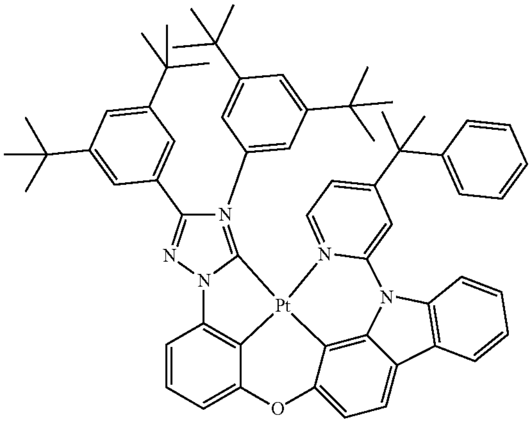
155
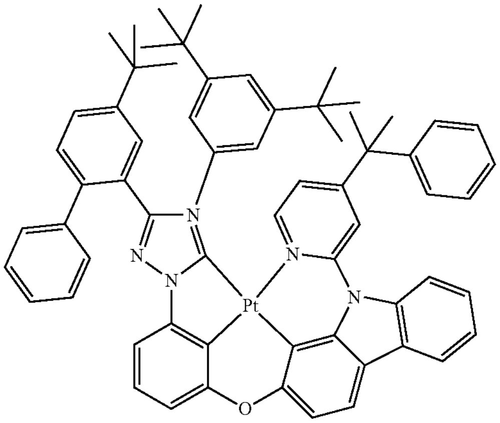
-continued
156
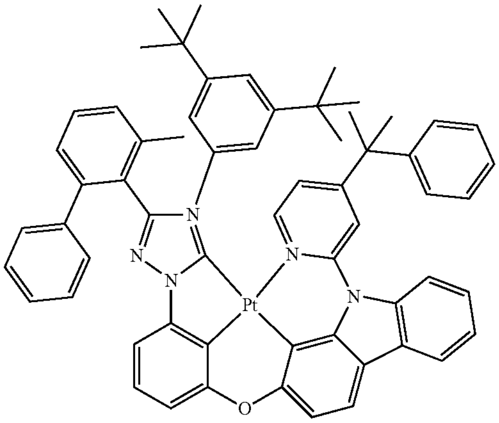
157
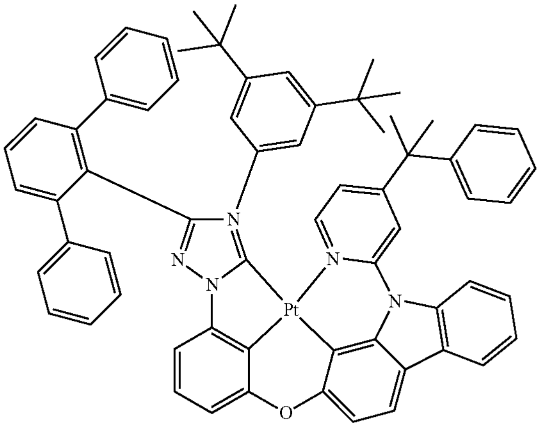
158
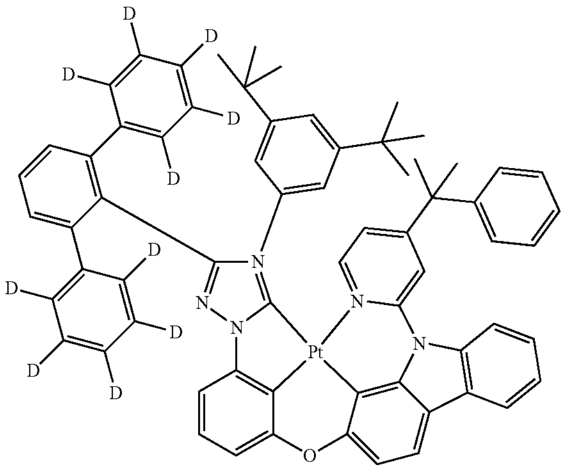

-continued
159
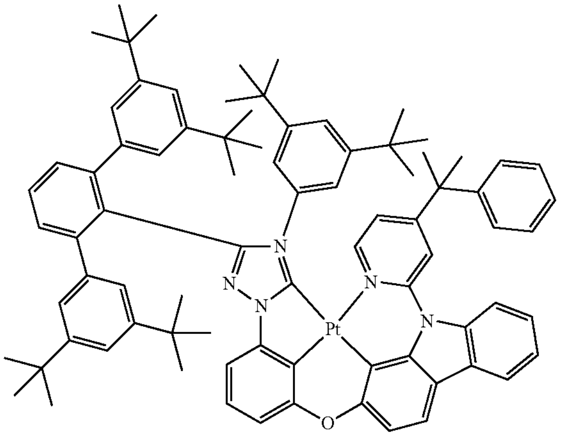
160
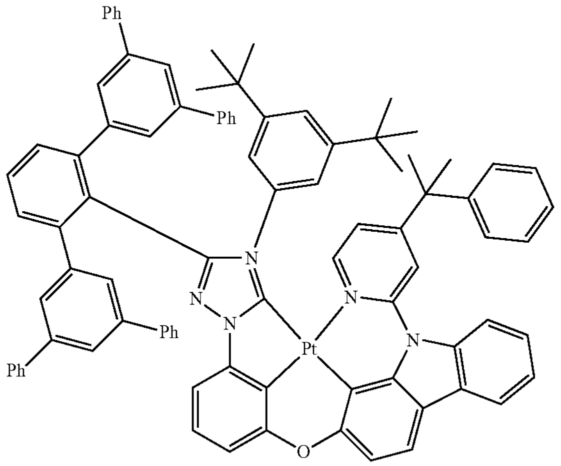
161
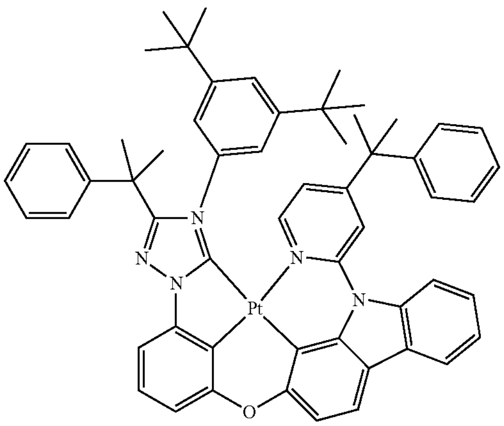
-continued
162
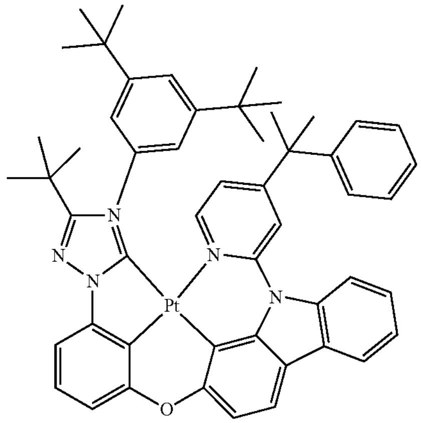
163
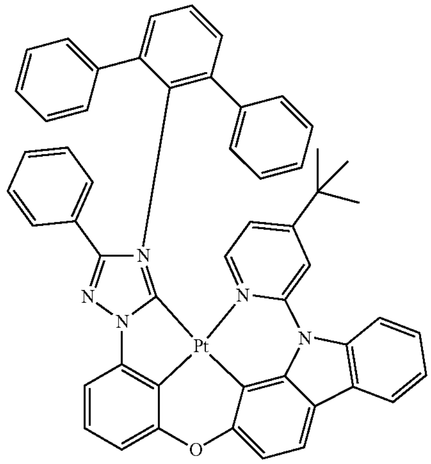
164
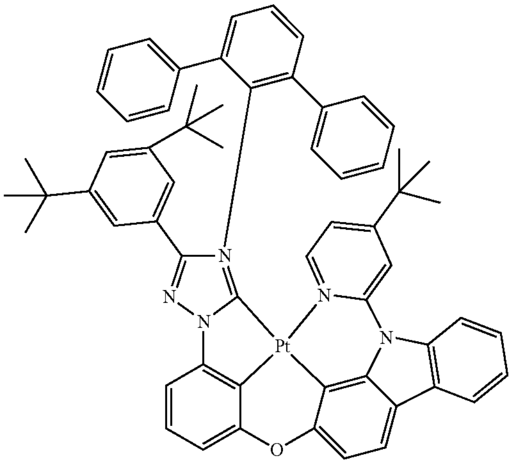

-continued
165
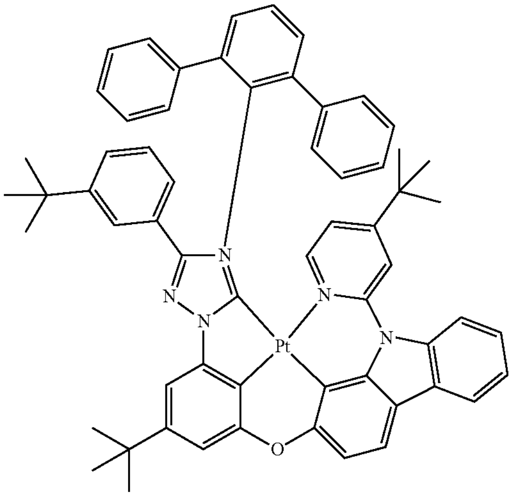
166
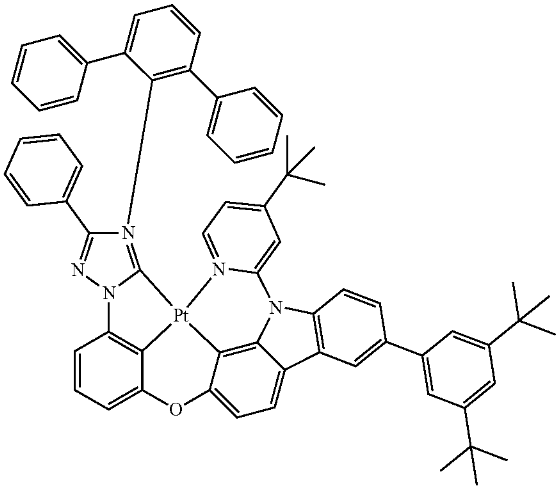
167
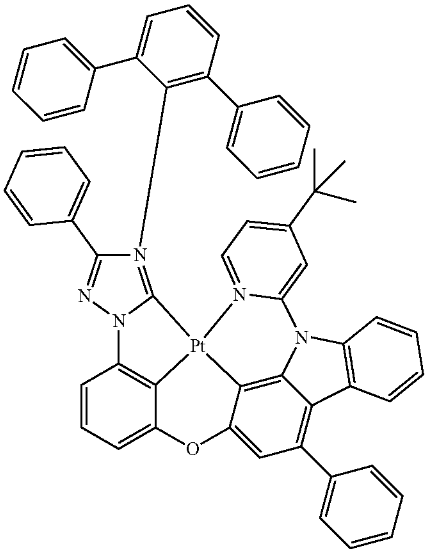
168
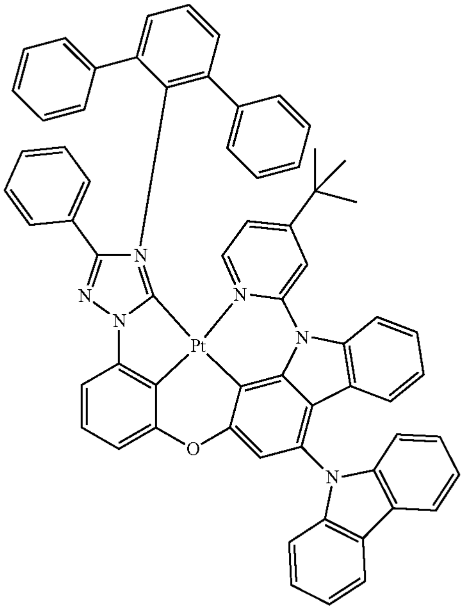
169
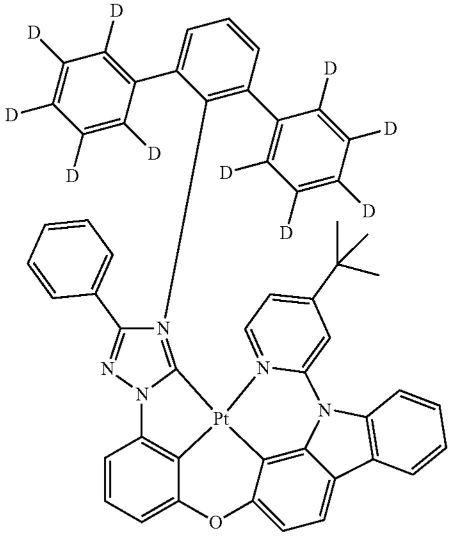

170
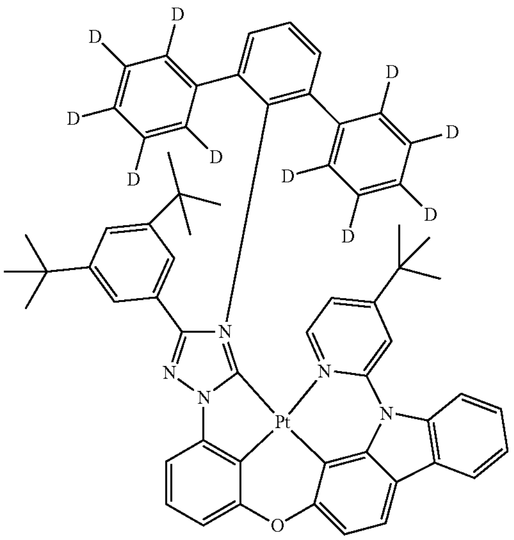
172
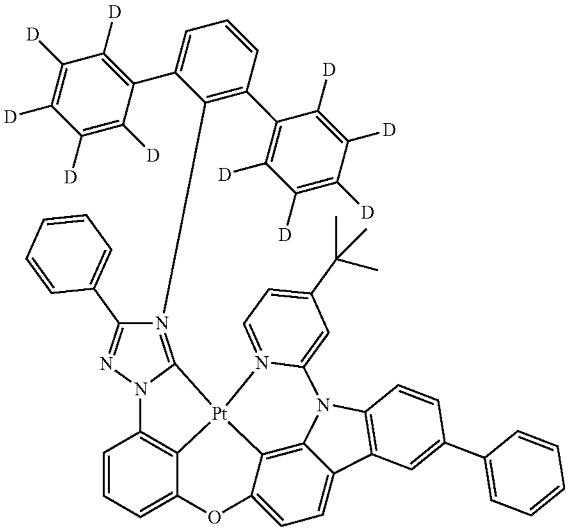
171
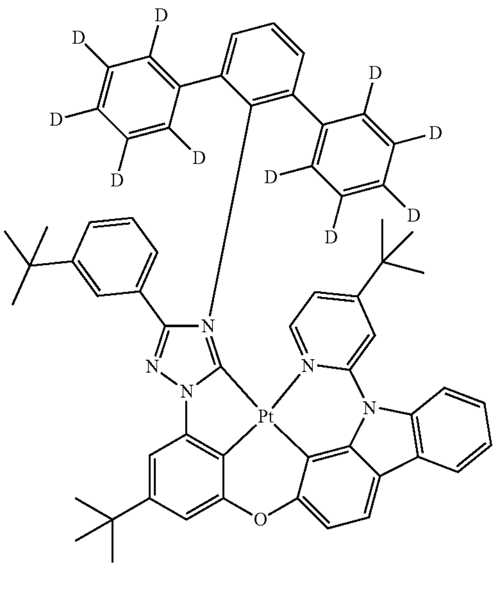
173
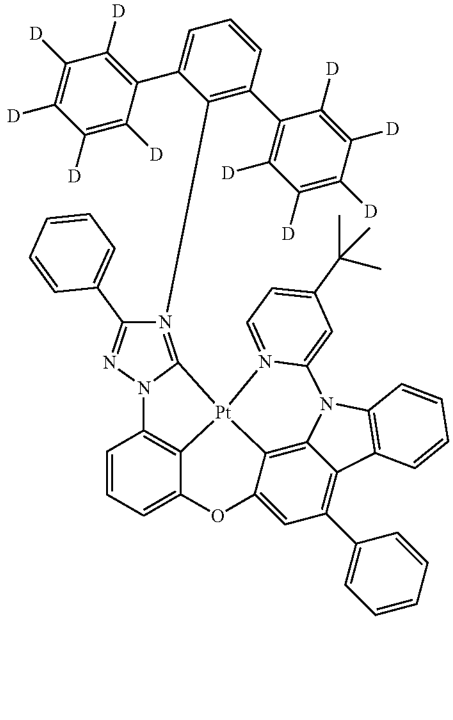

126
-continued
174
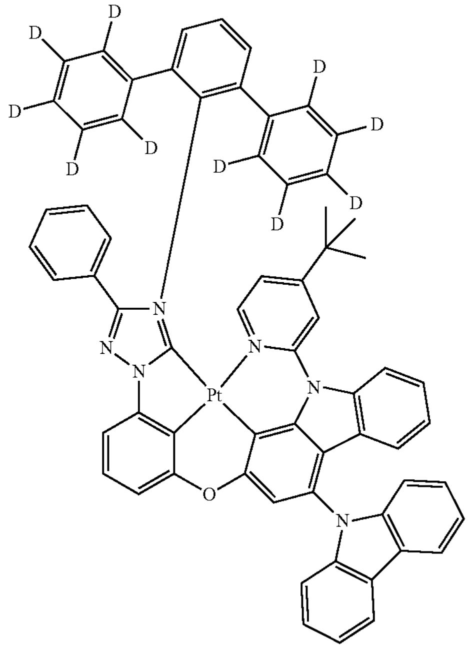
176
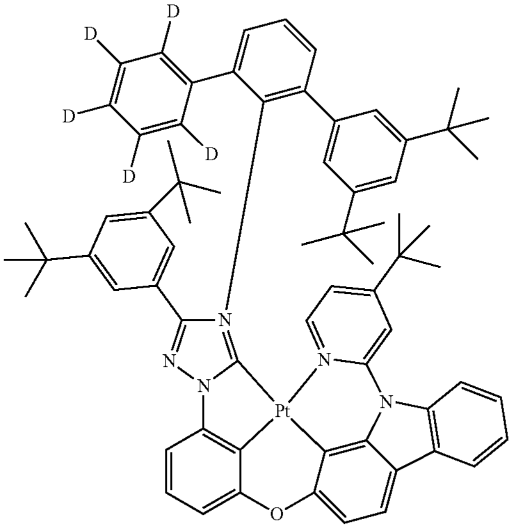
177
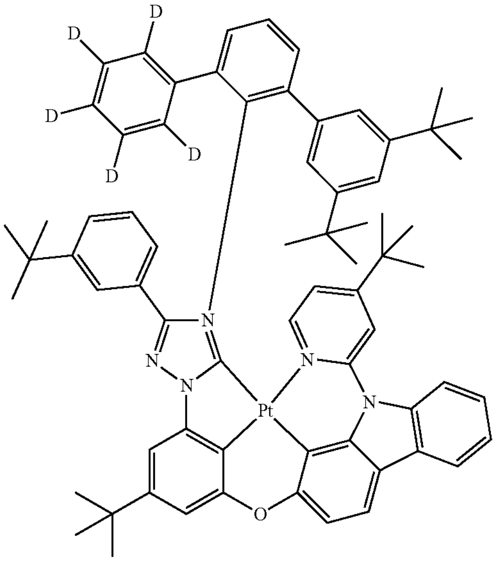
175
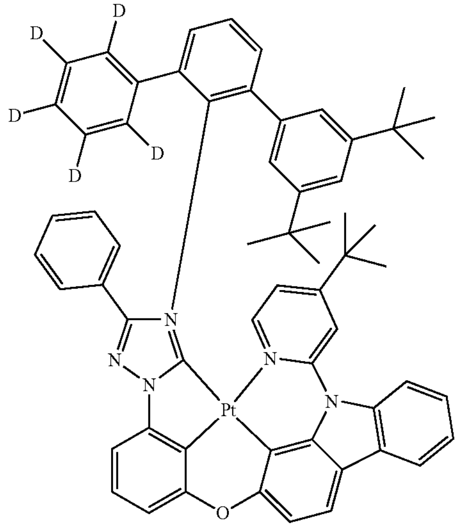
178
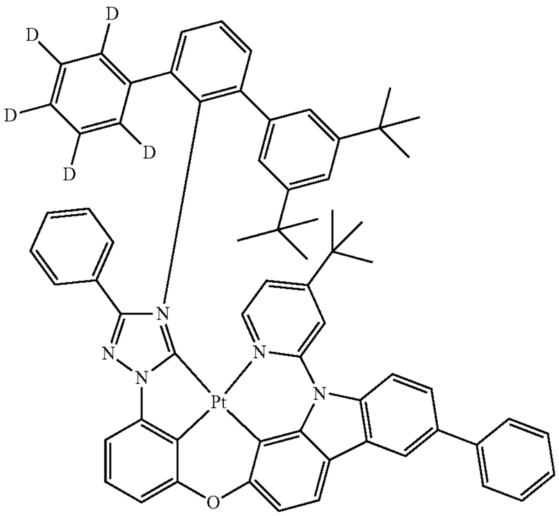

-continued
179
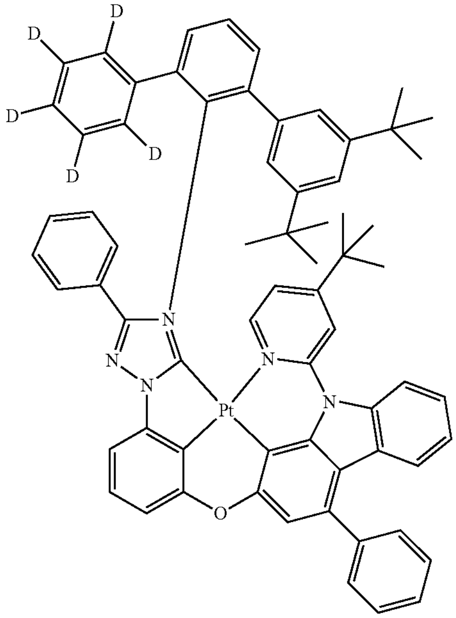
180
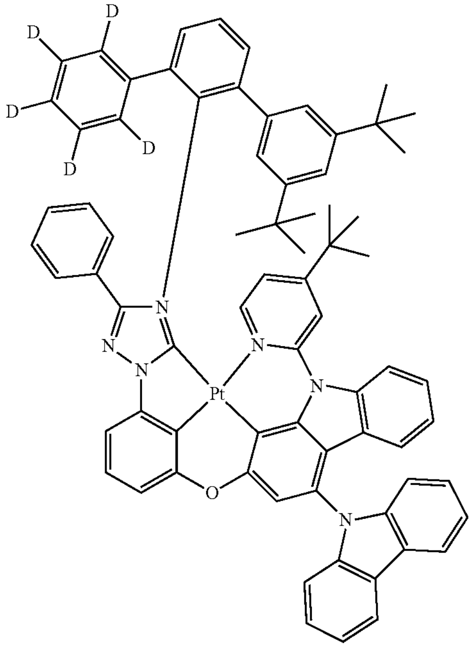
-continued
181
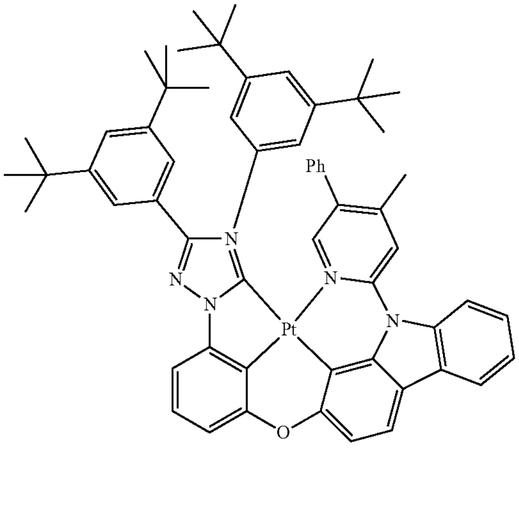
182
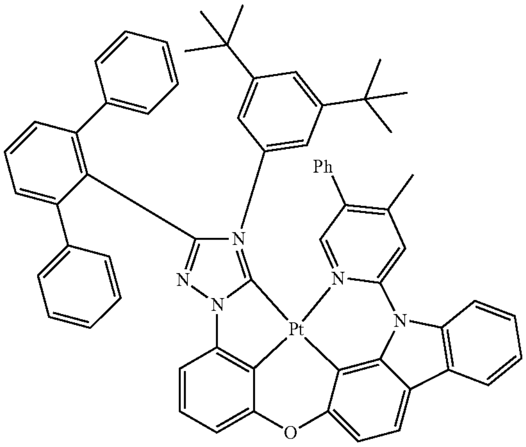
183
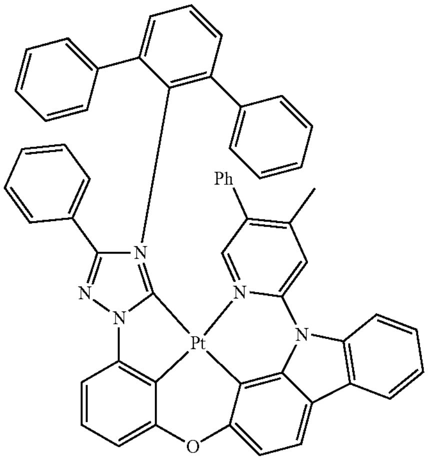

-continued
184
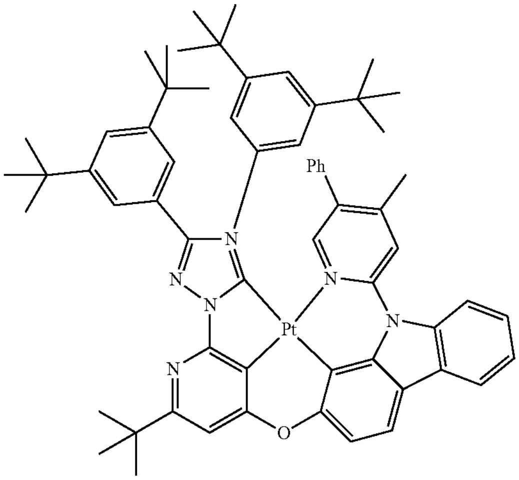
185
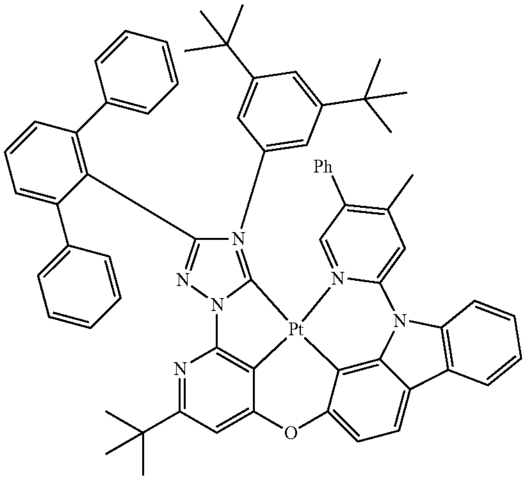
186
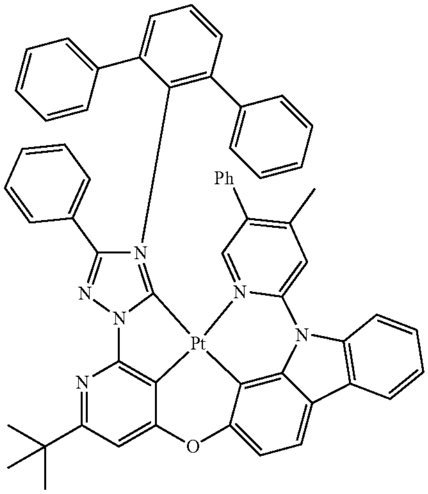
-continued
187
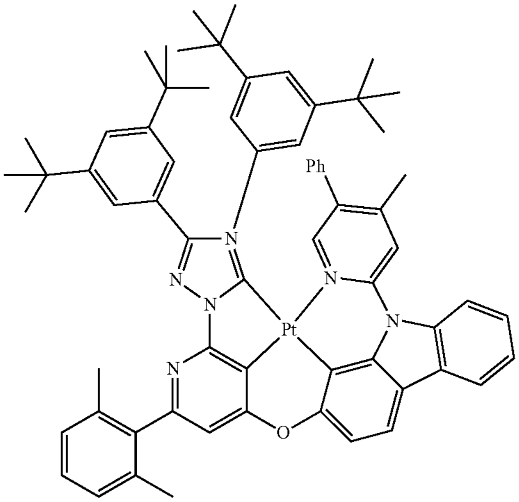
188
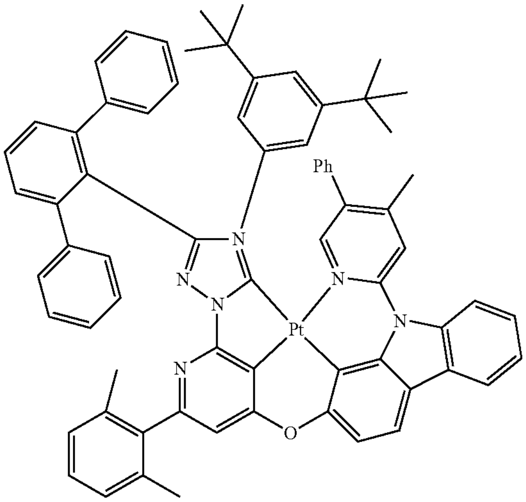
189
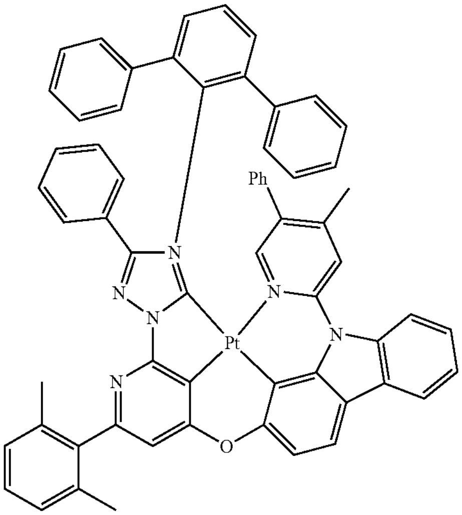

-continued

190

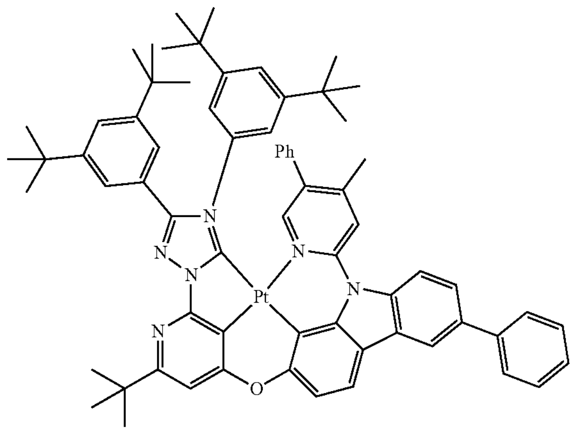

191

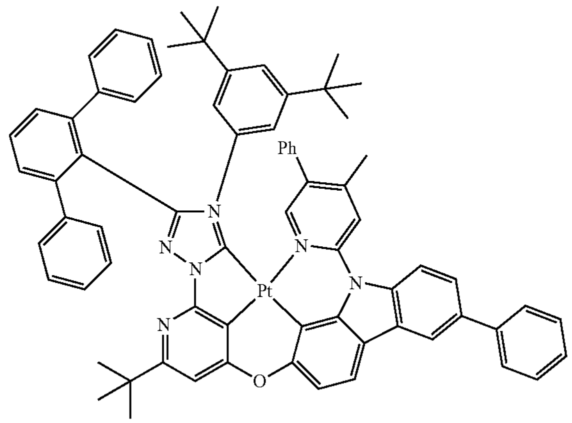

192

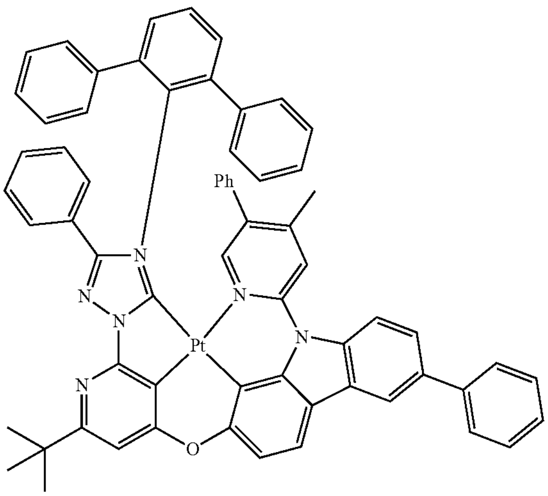

-continued

193

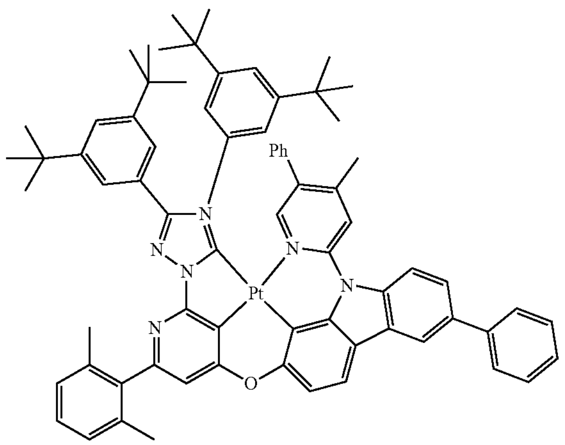

194

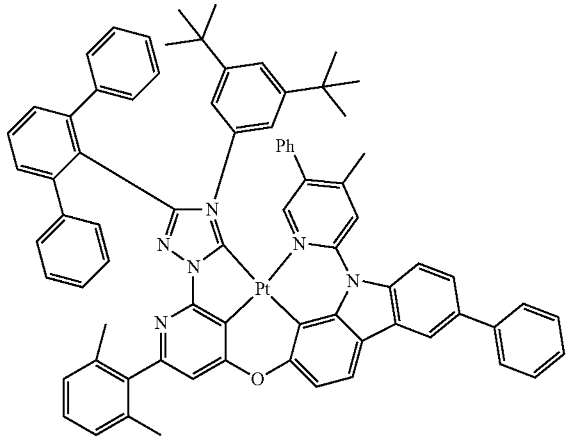

195

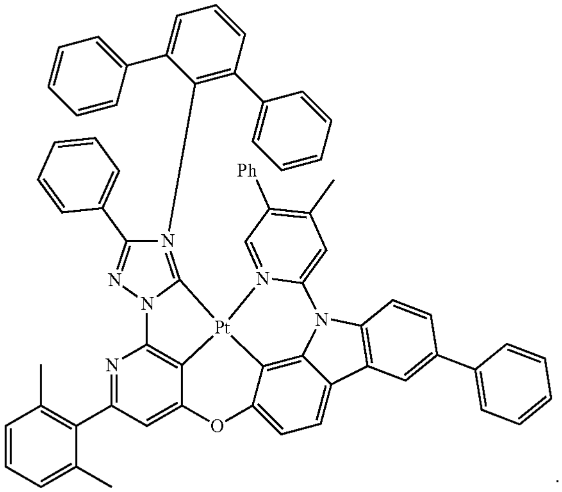

The organometallic compound represented by Formula 1 has a structure including at least three nitrogen atoms and a ligand including a carbazole moiety and a 5-membered ring moiety including a carbene structure.

Without wishing to be bound to theory, since the organometallic compound has at least three nitrogen atoms and a 5-membered ring moiety including a carbene structure, the organometallic compound may have a deep highest occupied molecular orbital (HOMO) energy level by introducing nitrogen with strong electronegativity, while maintaining a deep blue emission area. Thus, hole injection may be facilitated, so that the organometallic compound may have a low driving voltage.

Also, and without wishing to be bound to theory, since the organometallic compound includes a carbazole moiety, the organometallic compound may have increased stability against hole injection and light-emitting ability in a deep blue area. In addition, by controlling a three-dimensional structure, it is possible to reduce a bathochromic shift due to intermolecular interaction, which is observed mainly in a planar structure.

Synthesis methods of the organometallic compound represented by Formula 1 may be recognizable by one of ordinary skill in the art and by referring to Synthesis Examples provided below.

The HOMO energy level, lowest unoccupied molecular orbital (LUMO) energy level, $T_1$ energy level, and maximum emission wavelength ($\lambda_{max}$) some compounds of the organometallic compound represented by Formula 1 according one or more embodiments and Comparative Compounds $C_1$ and $C_2$ were calculated using a density functional theory (DFT) method of the Gaussian 09 program with the molecular structure optimized at the B3LYP level, and results thereof are shown in Table 1. The energy levels are expressed in electron volts (eV).

TABLE 1

| Compound No. | HOMO (eV) | LUMO (eV) | $T_1$ (eV) | Maximum emission wavelength ($\lambda_{max}$) (nm) |
|---|---|---|---|---|
| 1 | −4.68 | −1.19 | 2.72 | 456 |
| 11 | −4.64 | −1.17 | 2.70 | 460 |
| 21 | −4.71 | −1.22 | 2.72 | 452 |
| 5 | −4.82 | −1.31 | 2.77 | 450 |
| 16 | −4.84 | −1.31 | 2.72 | 452 |
| C1 | −4.58 | −1.21 | 2.68 | 463 |
| C2 | −4.94 | −1.52 | 2.46 | 491 |

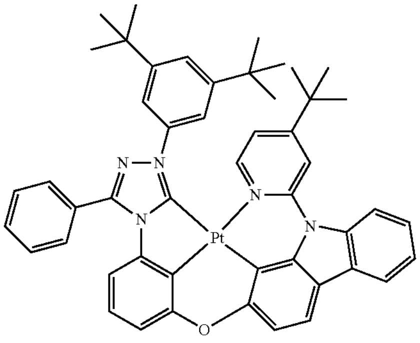

1

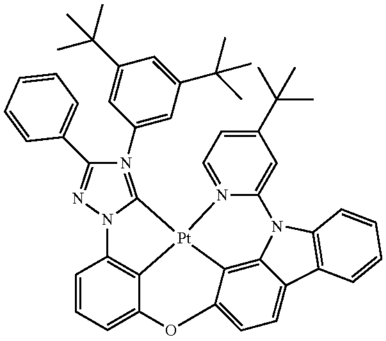

11

TABLE 1-continued

| Compound No. | HOMO (eV) | LUMO (eV) | $T_1$ (eV) | Maximum emission wavelength ($\lambda_{max}$) (nm) |
|---|---|---|---|---|

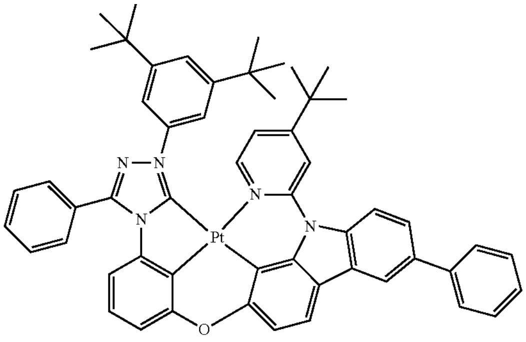

21

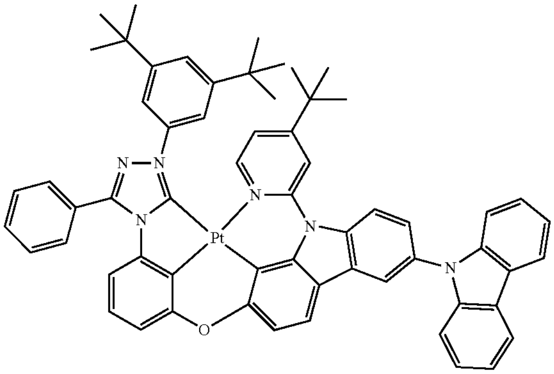

5

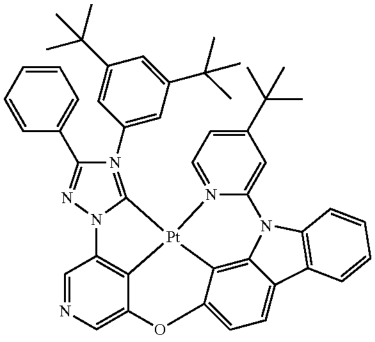

16

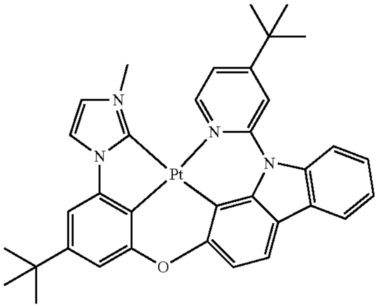

C1

TABLE 1-continued

| Compound No. | HOMO (eV) | LUMO (eV) | $T_1$ (eV) | Maximum emission wavelength ($\lambda_{max}$) (nm) |
|---|---|---|---|---|
| 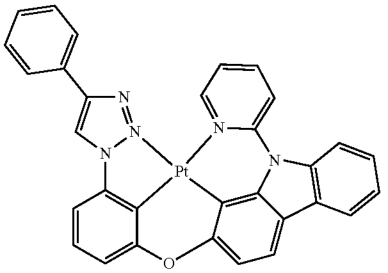 C2 | | | | |

Referring to Table 1, the organometallic compounds according to one or more embodiments were found to have a higher $T_1$ energy level and a maximum emission wavelength that is blue-shifted, as compared with Comparative Compound C2. Thus, the organometallic compound may have suitable electrical characteristics for use as a material for an emission layer of an organic light-emitting device, for example, as a blue luminescent material. In addition, the organometallic compound had a deeper HOMO energy level, as compared with Compound C1. Thus, hole injection may be facilitated, so that the driving voltage of an organic light-emitting device may be lowered.

Accordingly, another aspect provides an organic light-emitting device including a first electrode; a second electrode; and an organic layer arranged between the first electrode and the second electrode, wherein the organic layer includes an emission layer, and wherein the organic layer further includes at least one organometallic compound described herein.

Since the organic light-emitting device has an organic layer including at least one of the organometallic compounds described herein, the organic light-emitting device may have a low driving voltage, a high efficiency, a high luminance, a high quantum efficiency, and/or a long lifespan.

The expression "(an organic layer) includes at least one organometallic compound" as used herein may include a case in which "(an organic layer) includes identical organometallic compounds represented by Formula 1" and a case in which "(an organic layer) includes two or more different organometallic compounds represented by Formula 1".

For example, the organic layer may include, as the at least one organometallic compound, only Compound 1. In this regard, Compound 1 may be present in the emission layer of the organic light-emitting device. In one or more embodiments, the organic layer may include, as the at least one organometallic compound, Compound 1 and Compound 2. In this regard, Compound 1 and Compound 2 may be present in an identical layer (for example, both Compound 1 and Compound 2 may be present in the emission layer).

In one or more embodiments, the at least one organometallic compound may be included in the emission layer of the organic light-emitting device.

The at least one organometallic compound included in the emission layer may serve as an emitter. For example, the emission layer including the at least one organometallic compound represented by Formula 1 may emit phosphorescent light that is generated by transition of triplet excitons of the organometallic compound to a ground state.

In one or more embodiments, the emission layer of the organic light-emitting device may further include a host, and an amount of the host in the emission layer may be greater than an amount of the organometallic compound in the emission layer, based on a total weight of the emission layer.

For example, the emission layer of the organic light-emitting device may include a host and a dopant, and the dopant may include the at least one organometallic compound. The host may be selected from suitable hosts. That is, the organometallic compound may serve as a dopant. The emission layer may emit light having a maximum emission wavelength of about 440 nm to about 480 nm, for example, about 440 nm to about 470 nm. For example, the emission layer may emit a blue light.

In one or more embodiments, the emission layer may include a host and a dopant, the host may be any suitable host, and the dopant may include at least one of the organometallic compounds represented by Formula 1, and the emission layer may further include a fluorescent dopant. The emission layer may emit a fluorescent light that is generated by transfer of the triplet excitons of the at least one organometallic compound to the fluorescent dopant, and then a resulting electronic transition thereof.

The first electrode may be an anode, which is a hole injection electrode, and the second electrode may be a cathode, which is an electron injection electrode. In one or more embodiments, the first electrode may be a cathode, which is an electron injection electrode, and the second electrode may be an anode, which is a hole injection electrode.

In one or more embodiments, the first electrode may be an anode, the second electrode may be a cathode, and the organic layer may include a hole transport region arranged between the first electrode and the emission layer, and an electron transport region arranged between the emission layer and the second electrode, wherein the hole transport region may include a hole injection layer, a hole transport layer, an electron blocking layer, or a combination thereof, and the electron transport region may include a hole blocking layer, an electron transport layer, an electron injection layer, or a combination thereof.

For example, the at least one organometallic compound may be included in at least one of the hole transport region and the electron transport region.

Another aspect provides an electronic apparatus including the organic light-emitting device as described herein.

Description of FIG. 1

FIG. 1 is a schematic cross-sectional view of an organic light-emitting device 10 according to one or more embodiments. Hereinafter, the structure and manufacturing method of the organic light-emitting device 10 according to one or more embodiments will be described in further detail with reference to FIG. 1.

The organic light-emitting device 10 of FIG. 1 includes a first electrode 11, an organic layer 15, and a second electrode 19, which are sequentially stacked in this stated order.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and/or water resistance.

The first electrode 11 may be, for example, formed by depositing or sputtering a material for forming the first electrode 11 on the substrate. The first electrode 11 may be an anode. The material for forming the first electrode 11 may be selected from materials with a high work function to facilitate hole injection.

The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be a metal, such as magnesium (Mg), aluminum (Al), silver (Ag), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. For example, the first electrode 11 may have a three-layered structure of ITO/Ag/ITO, but embodiments are not limited thereto.

The organic layer 15 is arranged on the first electrode 11.

The organic layer 15 may include a hole transport region, an emission layer, and an electron transport region.

The hole transport region may be arranged between the first electrode 11 and the emission layer.

The hole transport region may include at least one of a hole injection layer, a hole transport layer, an electron blocking layer, a buffer layer, or a combination thereof.

The hole transport region may include only a hole injection layer or only a hole transport layer. In one or more embodiments, the hole transport region may have a hole injection layer/hole transport layer structure or a hole injection layer/hole transport layer/electron blocking layer structure, wherein, for each structure, respective layers are sequentially stacked in this stated order from the first electrode 11.

When the hole transport region includes a hole injection layer, the hole injection layer may be formed on the first electrode 11 by using one or more suitable methods, such as vacuum deposition, spin coating, casting, Langmuir-Blodgett (LB) deposition, or the like.

When the hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure in a range of about $10^{-8}$ torr to about $10^{-3}$ torr, and a deposition rate in a range of about 0.01 angstroms per second (Å/sec) to about 100 Å/sec, but embodiments are not limited thereto.

When the hole injection layer is formed by spin coating, the coating conditions may vary according to a material that is used to form the hole injection layer, and the structure and thermal characteristics of the hole injection layer. For example, the coating conditions may include a coating speed in a range of about 2,000 revolutions per minute (rpm) to about 5,000 rpm and a heat treatment for removing a solvent after coating at a temperature of about 80° C. to about 200° C., but embodiments are not limited thereto.

Conditions for forming the hole transport layer and the electron blocking layer may be similar to or the same as the conditions for forming the hole injection layer.

The hole transport region may include, for example, at least one of 4,4',4"-tris(3-methylphenylphenylamino)triphenylamine (m-MTDATA), 4,4',4"-tris(N,N-diphenylamino) triphenylamine (TDATA), 4,4',4"-tris{N-(2-naphthyl)-N-phenylamino}-triphenylamine (2-TNATA), N,N'-di(1-naphthyl)-N,N'-diphenylbenzidine (NPB), β-NPB, N,N'-bis (3-methylphenyl)-N,N'-diphenyl-[1,1-biphenyl]-4,4'-diamine (TPD), spiro-TPD, Spiro-NPB, methylated NPB, 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 4,4',4"-tris(N-carbazolyl)triphenylamine (TCTA), polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), (polyaniline)/poly(4-styrenesulfonate) (PANI/PSS), a compound represented by Formula 201, or a compound represented by Formula 202, but embodiments are not limited thereto:

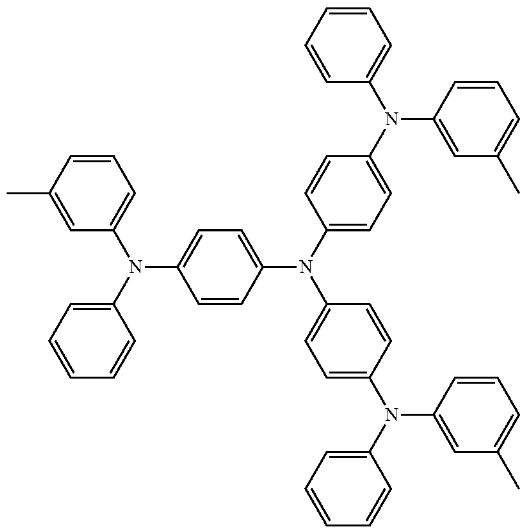

m-MTDATA

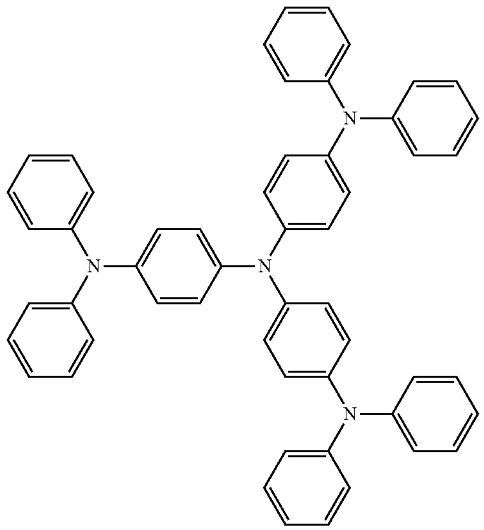

TDATA

-continued
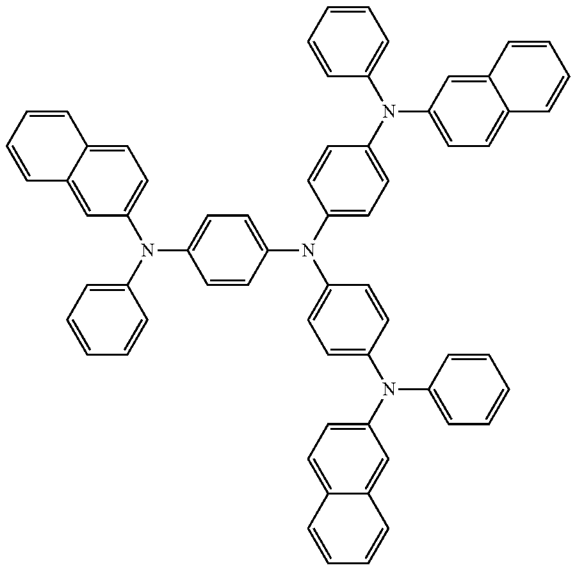
2-TNATA
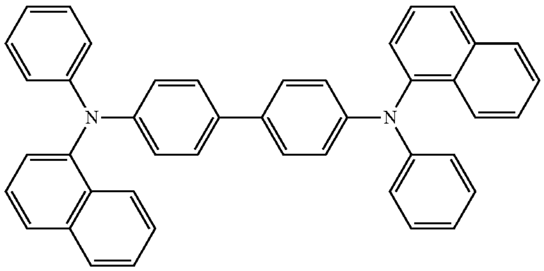
NPB
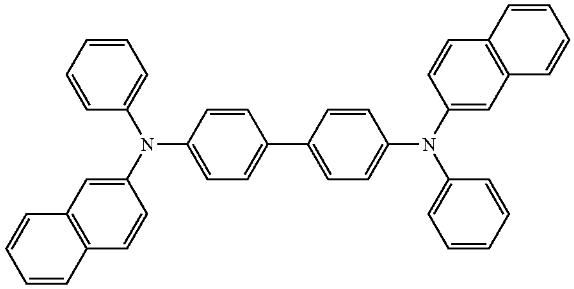
β-NPB
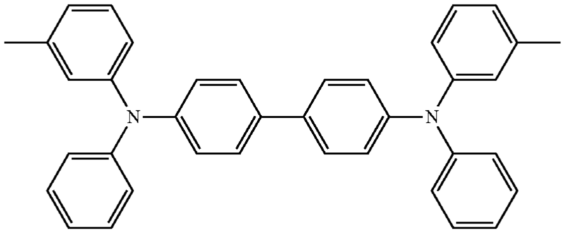
TPD
-continued
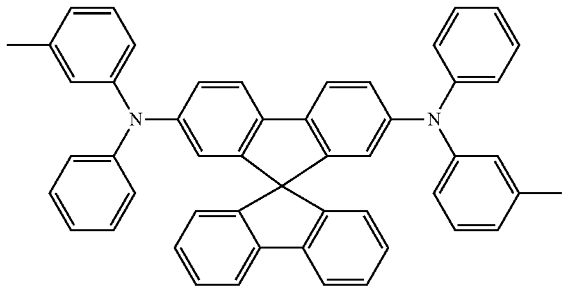
Spiro-TPD
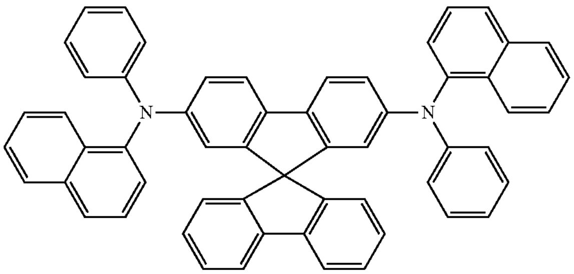
Spiro-NPB
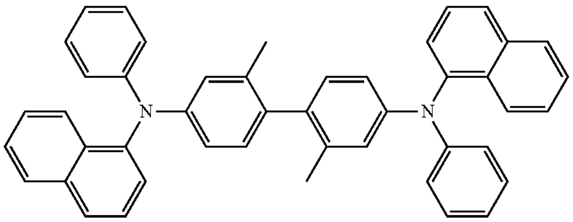
methylated NPB
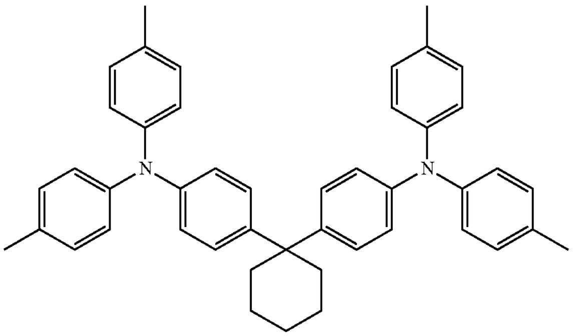
TAPC
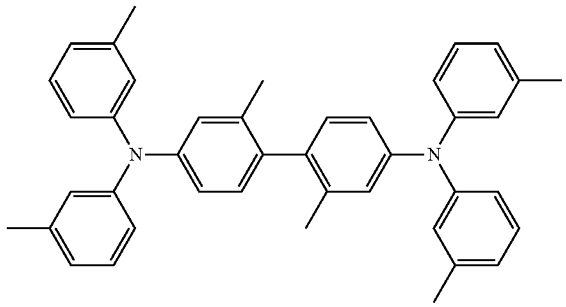
HMTPD -continued Formula 201

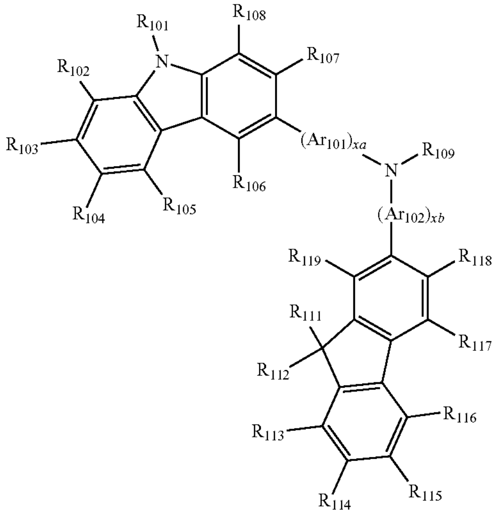

Formula 202

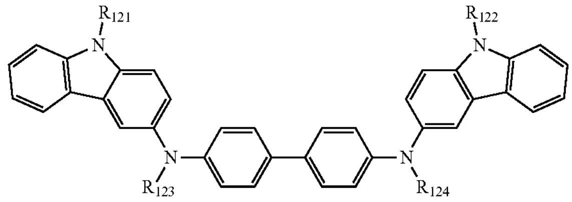

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or a combination thereof.

xa and xb in Formula 201 may each independently be an integer from 0 to 5, or may each independently be 0, 1, or 2. For example, xa may be 1 and xb may be 0, but embodiments are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, or the like), a $C_1$-$C_{10}$ alkoxy group (for example, a methoxy group, an ethoxy group, a propoxy group, a butoxy group, a pentoxy group, or the like), or a $C_1$-$C_{10}$ alkylthio group;

$C_1$-$C_{10}$ alkyl group, a $C_1$-$C_{10}$ alkoxy group, or a $C_1$-$C_{10}$ alkylthio group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_1$-$C_{10}$ alkylthio group, or a combination thereof.

$R_{109}$ in Formula 201 may be a phenyl group, a naphthyl group, an anthracenyl group, or a pyridinyl group, each unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a naphthyl group, an anthracenyl group, a pyridinyl group, or a combination thereof.

In one or more embodiments, the compound represented by Formula 201 may be represented by Formula 201A:

Formula 201A

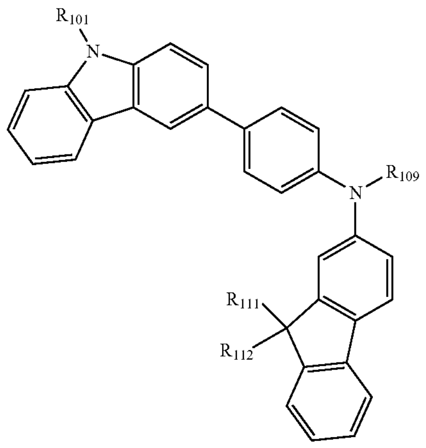

wherein, in Formula 201A, $R_{101}$, $R_{111}$, $R_{112}$, and $R_{109}$ may each be as described herein.

For example, the hole transport region may include one of Compounds HT1 to HT20, or a combination thereof, but embodiments are not limited thereto:
HT1
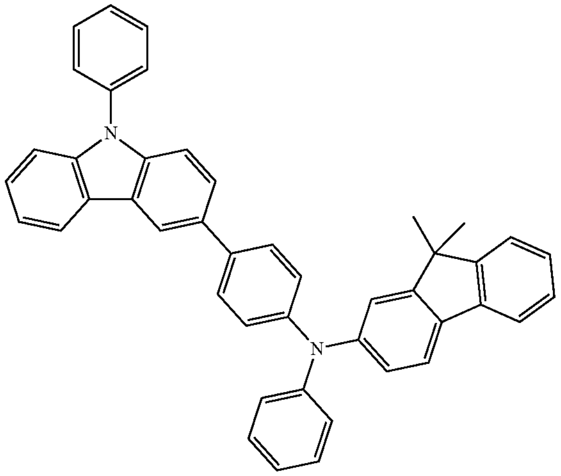
HT2
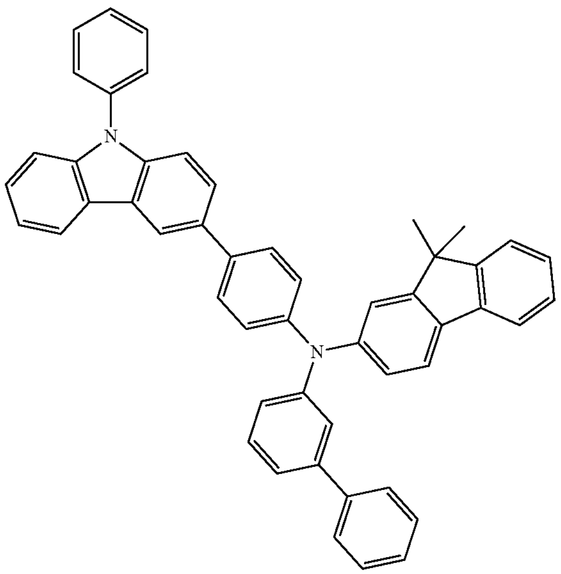
-continued
HT3
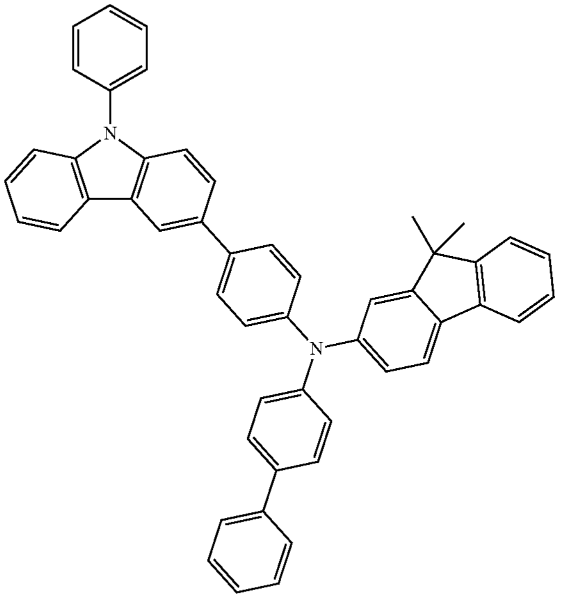
HT4
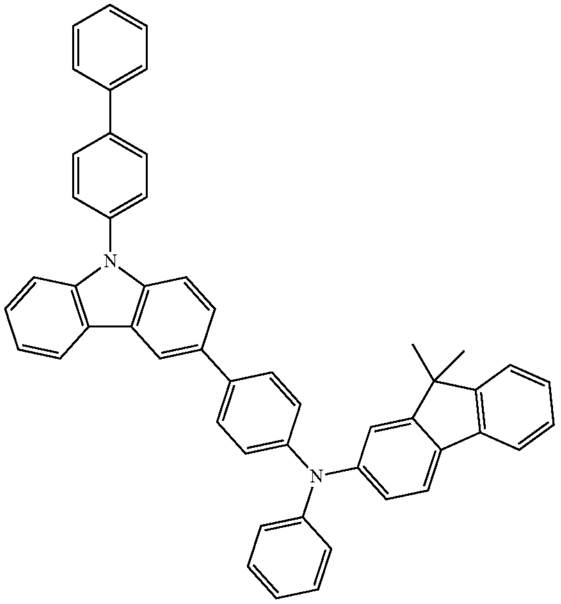

-continued
HT5
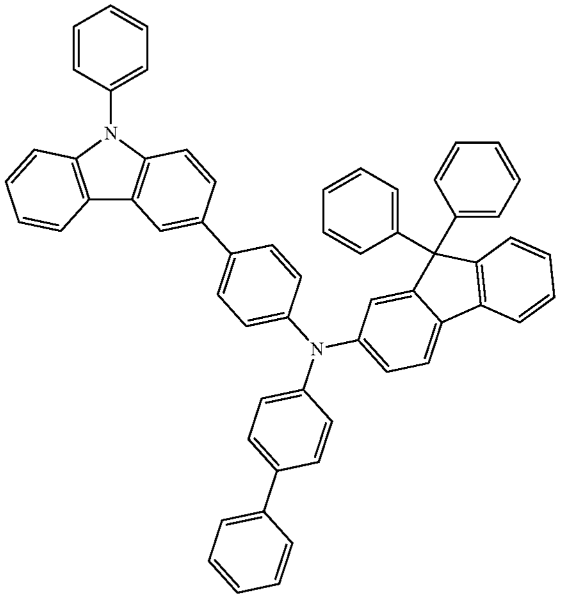
HT6
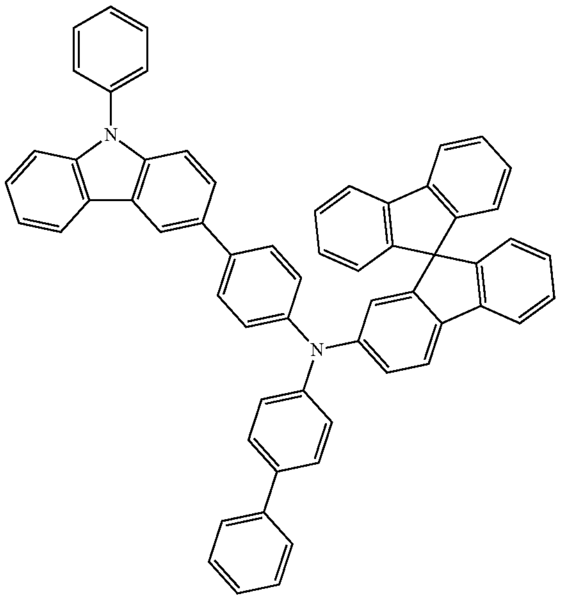
-continued
HT7
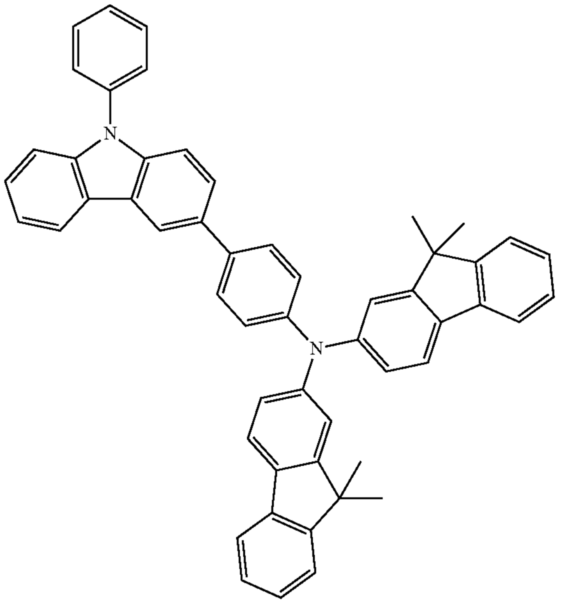
HT8
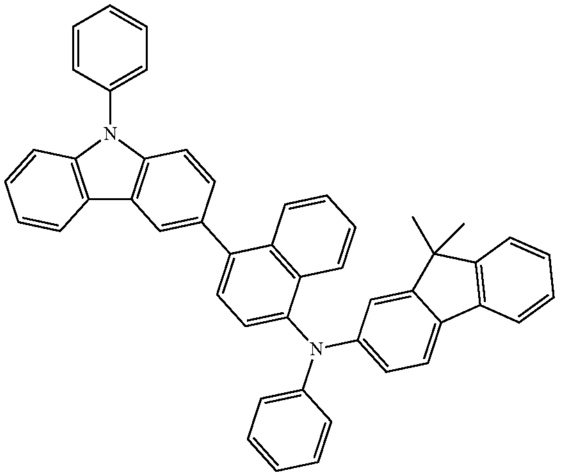
HT9
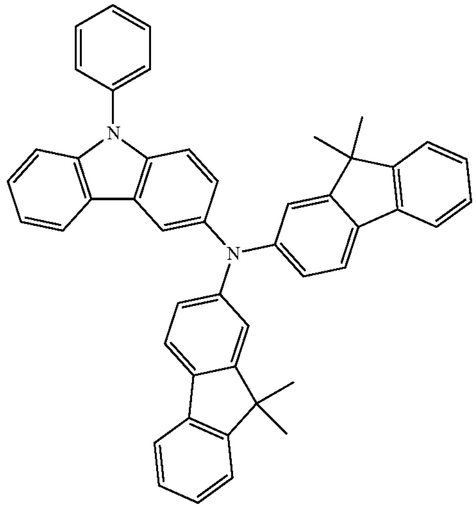

-continued
HT10
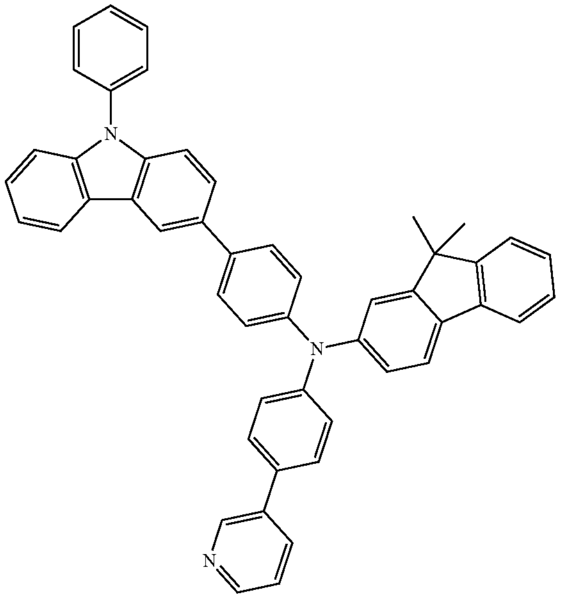
HT11
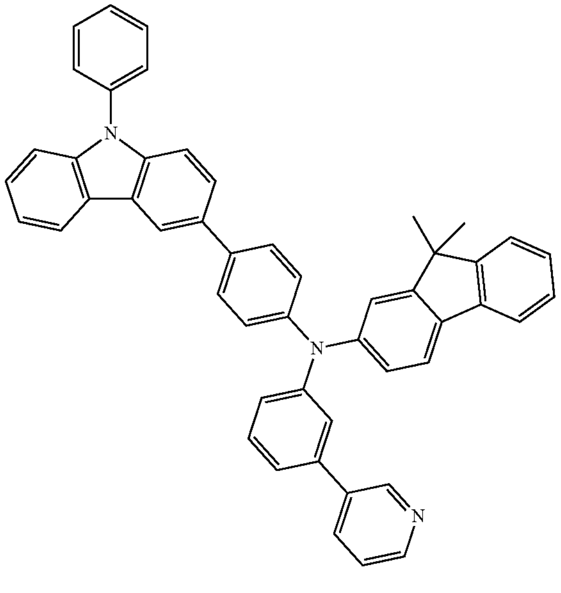
-continued
HT12
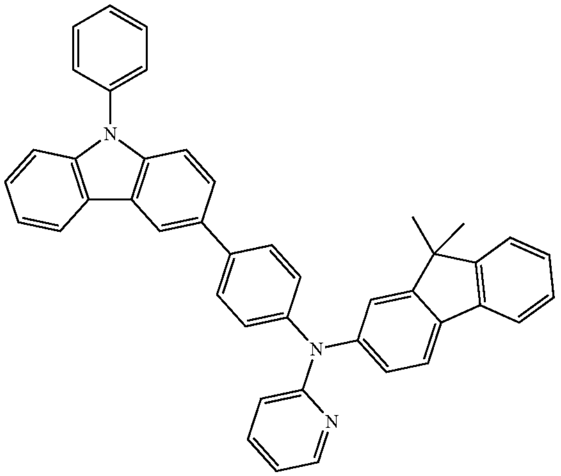
HT13
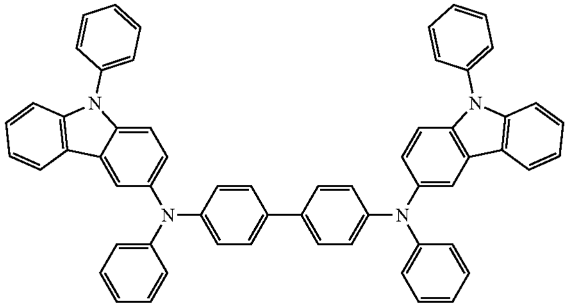
HT14
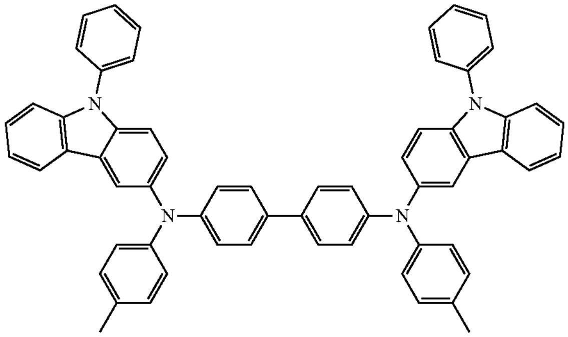
HT15
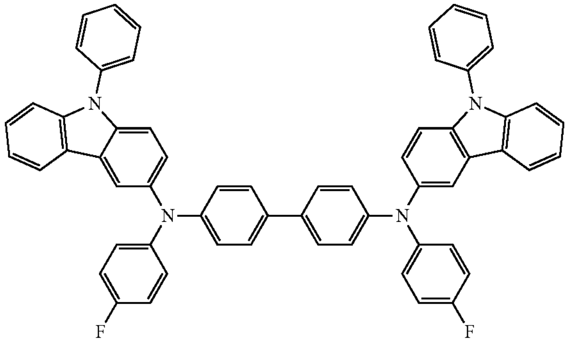

-continued

HT16

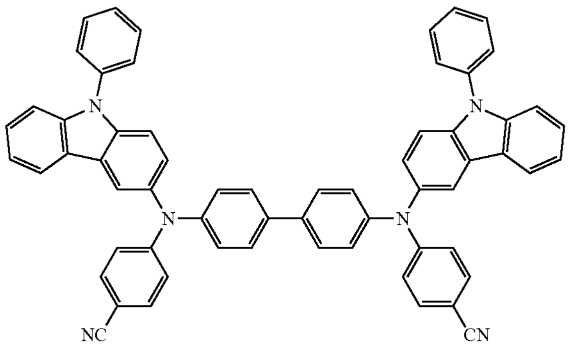

HT17

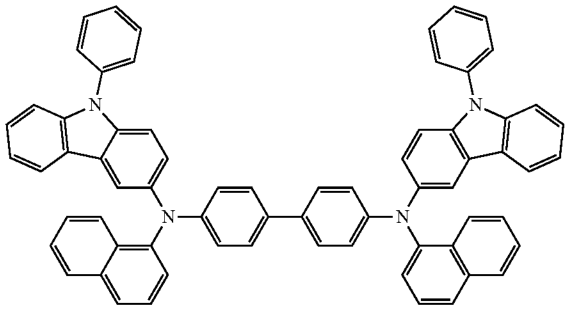

HT18

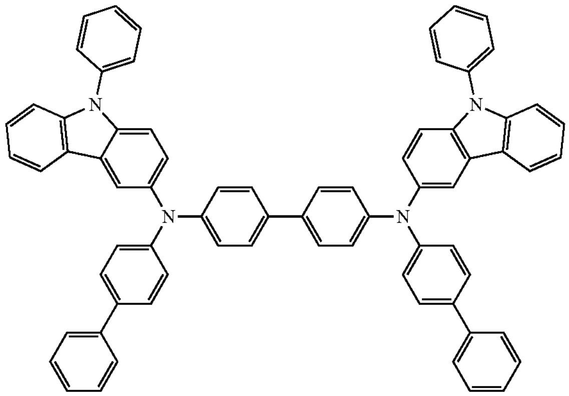

HT19

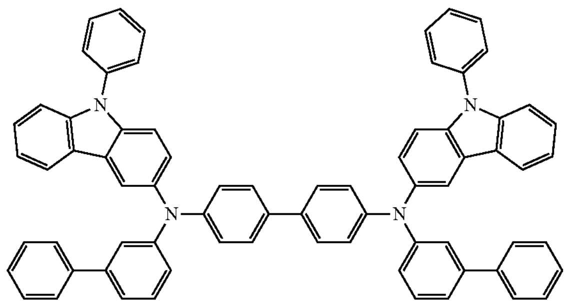

-continued

HT20

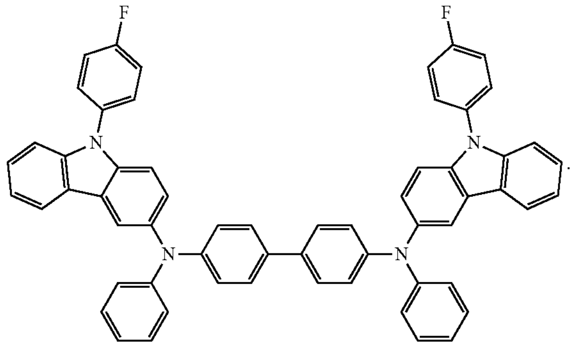

A thickness of the hole transport region may be about 100 angstroms (Å) to about 10,000 Å, for example, about 100 Å to about 1,000 Å. When the hole transport region includes at least one of a hole injection layer and a hole transport layer, a thickness of the hole injection layer may be about 100 Å to about 10,000 Å, for example, about 100 Å to about 1,000 Å, and a thickness of the hole transport layer may be about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to the materials described above, a charge-generation material for improving conductive properties. The charge-generation material may be homogeneously or non-homogeneously (heterogeneously) dispersed in the hole transport region.

The charge-generation material may be, for example, a p-dopant. The p-dopant may include a quinone derivative, a metal oxide, a cyano group-containing compound, or a combination thereof, but embodiments are not limited thereto. For example, non-limiting examples of the p-dopant may include a quinone derivative, such as tetracyanoquinodimethane (TCNQ), 2,3,5,6-tetrafluoro-tetracyano-1,4-benzoquinonedimethane (F4-TCNQ), 1,3,4,5,7,8-hexafluorotetracyanonaphthoquinodimethane (F6-TCNQ), or the like; a metal oxide, such as a tungsten oxide, a molybdenum oxide, or the like; or a cyano group-containing compound, such as Compound HT-D1 or Compound HT-D2, but embodiments are not limited thereto:

HT-D1

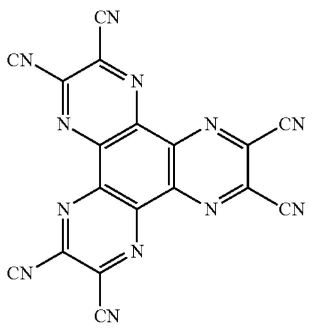

-continued

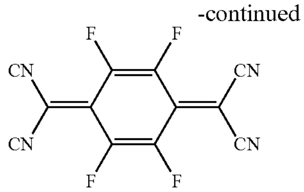

F4-TCNQ

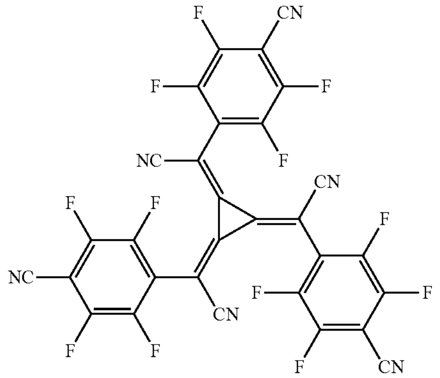

HT-D2

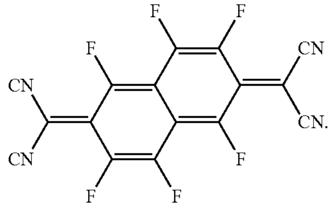

F6-TCNNQ

The hole transport region may further include a buffer layer.

The buffer layer may compensate for an optical resonance distance according to a wavelength of light emitted from the emission layer to increase efficiency.

The emission layer may be formed on the hole transport region by using one or more suitable methods, such as vacuum deposition, spin coating, casting, and/or LB deposition. When the emission layer is formed by vacuum deposition or spin coating, the deposition or coating conditions may be similar to those applied in forming the hole injection layer, though the deposition or coating conditions may vary according to a material that is used to form the emission layer.

The hole transport region may further include an electron blocking layer. The electron blocking layer may include any suitable material available in the art, for example, 1,3-bis (N-carbazolyl)benzene (mCP), but embodiments are not limited thereto:

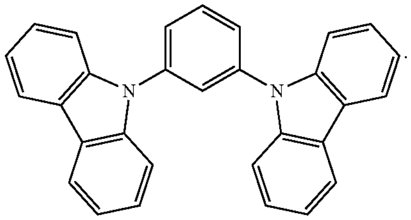

mCP

A thickness of the electron blocking layer may be about 50 Å to about 1,000 Å, for example, about 70 Å to about 500 Å. When the thickness of the electron blocking layer is within this range, satisfactory electron blocking characteristics may be obtained without a substantial increase in driving voltage.

When the organic light-emitting device 10 is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit a white light, and various modifications are possible.

The emission layer may include at least one of the organometallic compounds represented by Formula 1.

The emission layer may include a host and a dopant, and the dopant may include at least one of the organometallic compounds represented by Formula 1.

The host may include 1,3,5-tri(1-phenyl-1H-benzo[d]imidazol-2-yl)phenyl (TPBi), 3-tert-butyl-9,10-di(naphth-2-yl) anthracene (TBADN), 9,10-di(naphthalene-2-yl)anthracene (ADN) (also referred to as “DNA”), 4,4'-bis(N-carbazolyl)-1,1'-biphenyl (CBP), 4,4'-bis(9-carbazolyl)-2,2'-dimethyl-biphenyl (CDBP), 1,3,5-tris(carbazole-9-yl)benzene (tCP), 1,3-bis(N-carbazolyl)benzene (mCP), Compound H50, Compound H51, Compound H52, or a combination thereof, but embodiments are not limited thereto:

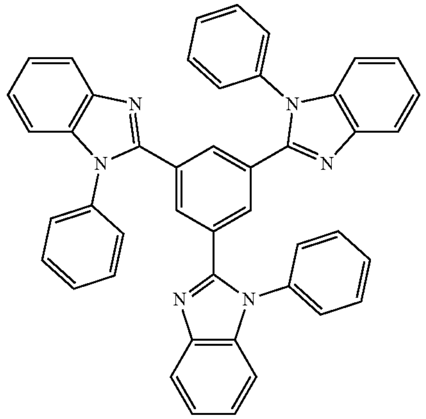

TPBi

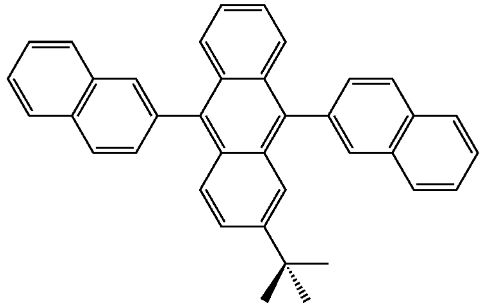

TBADN

-continued

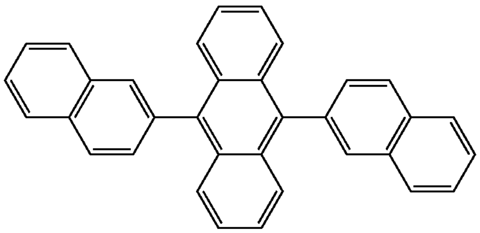

ADN

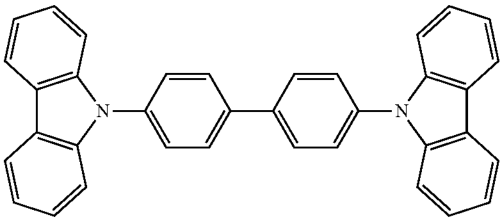

CBP

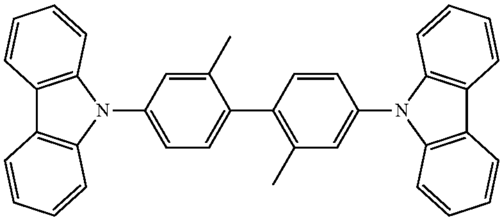

CDBP

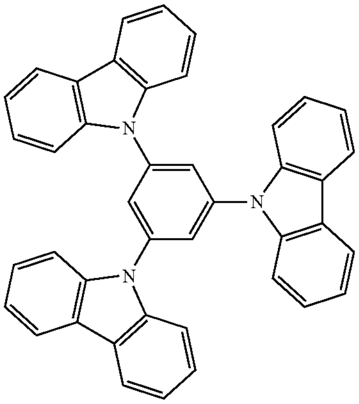

TCP

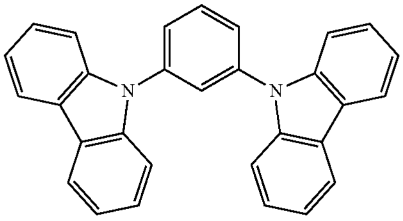

mCP

H50

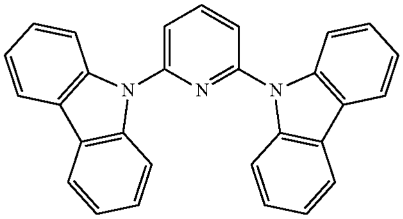

-continued

H51

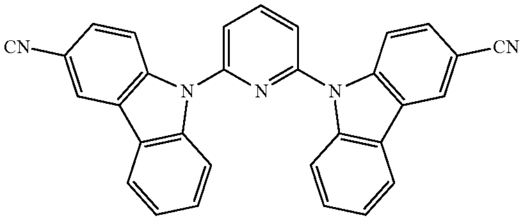

H52

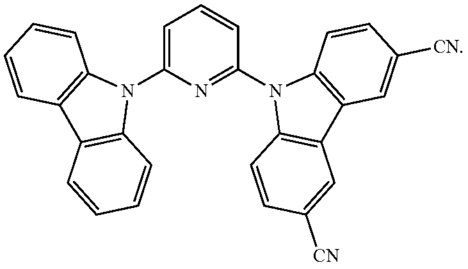

In one or more embodiments, the host may further include a compound represented by Formula 301:

Formula 301

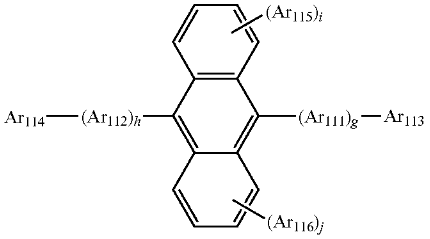

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with at least one of a phenyl group, a naphthyl group, an anthracenyl group, or a combination thereof.

$Ar_{113}$ to $Ar_{116}$ in Formula 301 may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with at least one of a phenyl group, a naphthyl group, an anthracenyl group, or a combination thereof.

g, h, i, and j in Formula 301 may each independently be 0, 1, 2, 3, or 4. For example, g, h, i, and j in Formula 301 may each independently be 0, 1, or 2.

$Ar_{113}$ to $Ar_{116}$ in Formula 301 may each independently be:

a $C_1$-$C_{10}$ alkyl group substituted with at least one of a phenyl group, a naphthyl group, an anthracenyl group, or a combination thereof;

a phenyl group, a naphthyl group, an anthracenyl group, a pyrenyl group, a phenanthrenyl group, or a fluorenyl group;

a phenyl group, a naphthyl group, an anthracenyl group, a pyrenyl group, a phenanthrenyl group, or a fluorenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a phenyl group, a naphthyl group, an anthracenyl group, a pyrenyl group, a phenanthrenyl group, a fluorenyl group, or a combination thereof; or a compound represented by the formula:

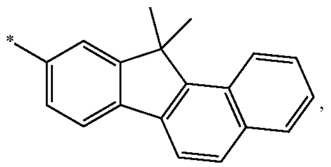 [SMILES: *c1ccc2c(c1)C(C)(C)c1c-2ccc2ccccc12]

but embodiments are not limited thereto.

In one or more embodiments, the host may include a compound represented by Formula 302:

Formula 302

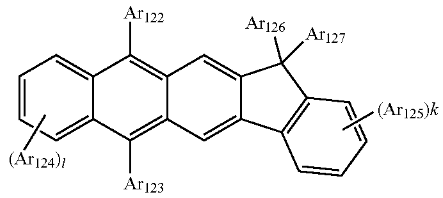

wherein, in Formula 302, $Ar_{122}$ to $Ar_{125}$ may each be as described in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, a propyl group, or the like).

k and l in Formula 302 may each independently be an integer of 0, 1, 2, 3, or 4. For example, k and l in Formula 302 may each independently be 0, 1, or 2.

When the organic light-emitting device 10 is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit a white light, and various modifications are possible.

When the emission layer includes a host and a dopant, an amount of the dopant may be about 0.01 part by weight to about 20 parts by weight, based on 100 parts by weight of the emission layer, but embodiments are not limited thereto. When the amount of the dopant is within this range, light emission without quenching may be realized.

In one or more embodiments, the organic layer 15 of the organic light-emitting device 10 may further include, in addition to the at least one organometallic compound represented by Formula 1, at least one fluorescent dopant.

For example, the at least one fluorescent dopant may be a condensed polycyclic compound, a styryl-based compound, or a combination thereof.

In one or more embodiments, the fluorescent dopant may be a compound represented by Formula 501:

Formula 501

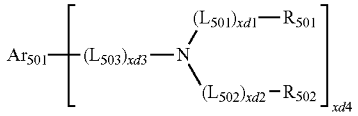

wherein, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{501})(Q_{502})(Q_{503})$ (wherein $Q_{501}$ to $Q_{503}$ may each independently be hydrogen, a $C_1$-$C_{60}$ alkyl group, a $C_1$-$C_{60}$ alkoxy group, a $C_1$-$C_{60}$ alkylthio group, a $C_6$-$C_{60}$ aryl group, a $C_7$-$C_{60}$ alkyl aryl group, a $C_7$-$C_{60}$ aryl alkyl group, a $C_1$-$C_{60}$ heteroaryl group, a $C_2$-$C_{60}$ alkyl heteroaryl group, a $C_2$-$C_{60}$ heteroaryl alkyl group, a monovalent non-aromatic condensed polycyclic group, or a monovalent non-aromatic condensed heteropolycyclic group), or a combination thereof, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or a combination thereof, xd1 to xd3 may each independently be 0, 1, 2, or 3, and xd4 may be 0, 1, 2, 3, 4, 5, or 6.

For example, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18, each substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —$Si(Q_{501})(Q_{502})(Q_{503})$ (wherein $Q_{501}$ to $Q_{503}$ may each independently be hydrogen, a $C_1$-$C_{20}$ alkyl group, a $C_1$-$C_{20}$ alkoxy group, a $C_1$-$C_{20}$ alkylthio group, a phenyl group, a biphenyl group, a terphenyl group, or a naphthyl group), or a combination thereof, 501-1

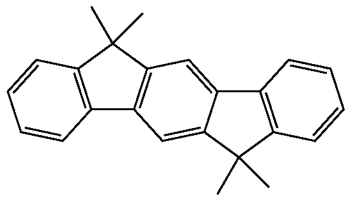

501-2

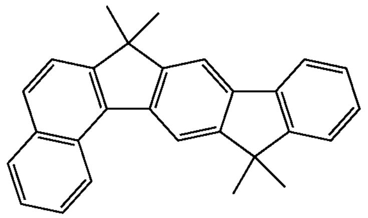

501-3

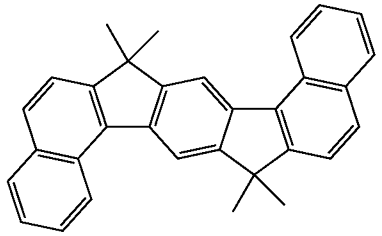

501-4

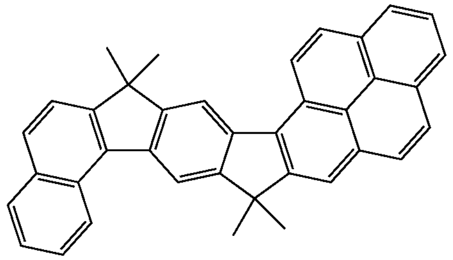

501-5

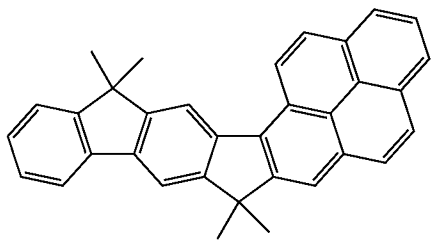

-continued
501-6
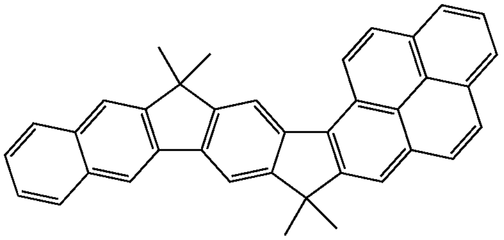
501-7
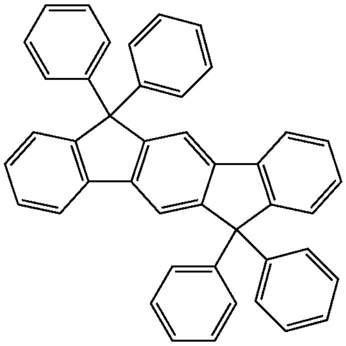
501-8
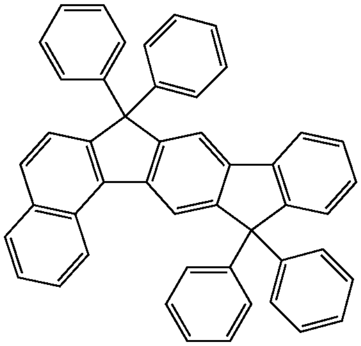
501-9
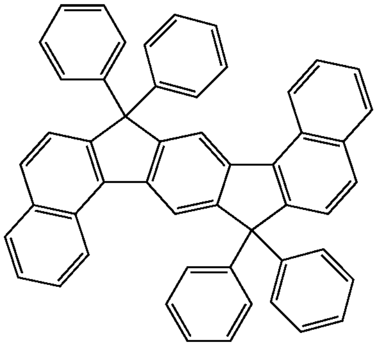
-continued
501-10
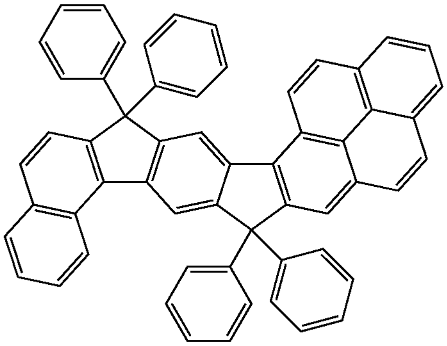
501-11
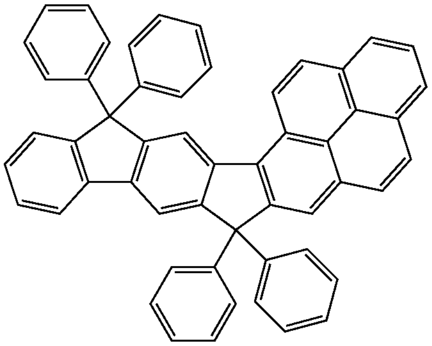
501-12
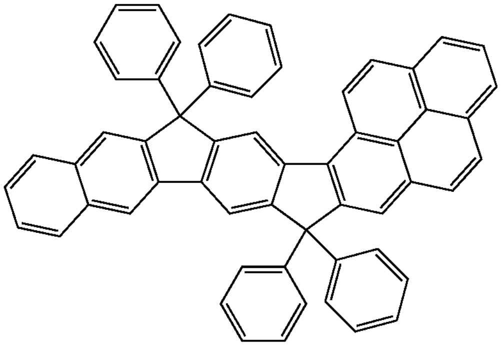
501-13
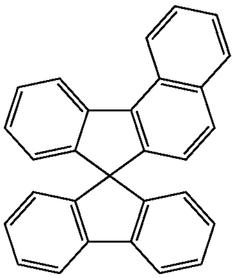
501-14
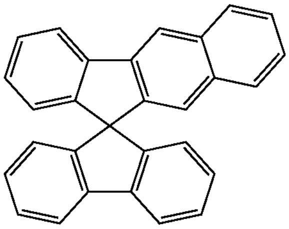

-continued
501-15
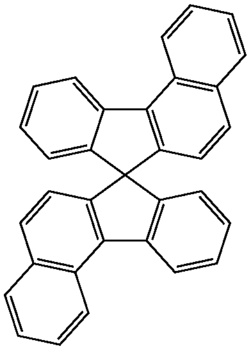
501-16
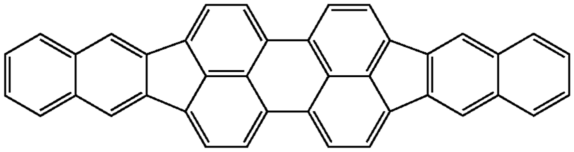
-continued
501-17
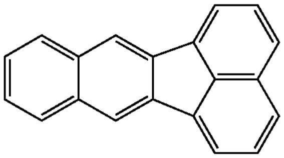
501-18
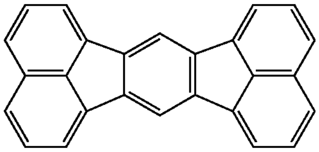
$L_{501}$ to $L_{503}$ are each as described in connection with $L_{21}$, xd1 to xd3 may each independently be 0, 1, or 2, and xd4 may be 0, 1, 2, or 3, but embodiments are not limited thereto.
The fluorescent dopant may include, for example, at least one of Compounds FD(1) to FD(16), Compounds FD1 to FD13, or a combination thereof, but embodiments are not limited thereto:
FD(1)
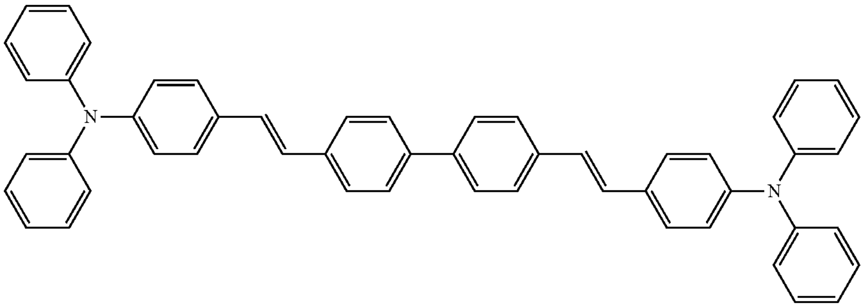
FD(2)
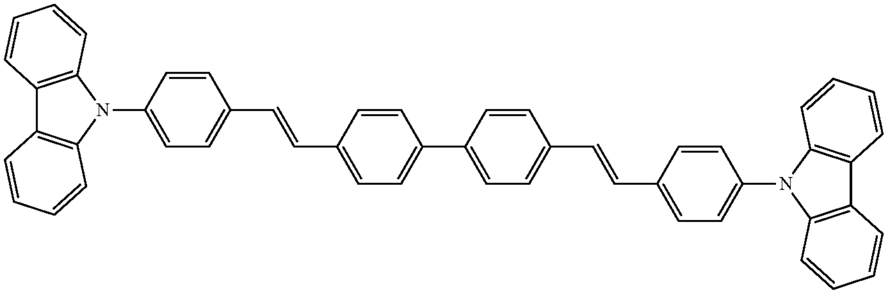
FD(3)
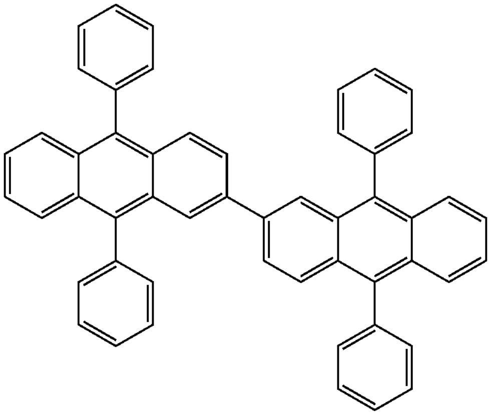
FD(4)
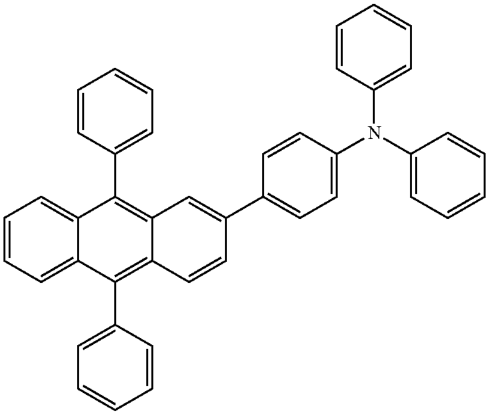

-continued
FD(5)
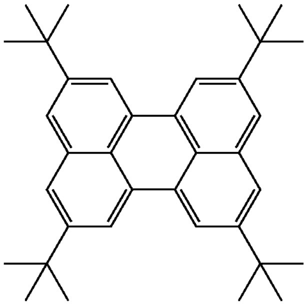
FD(6)
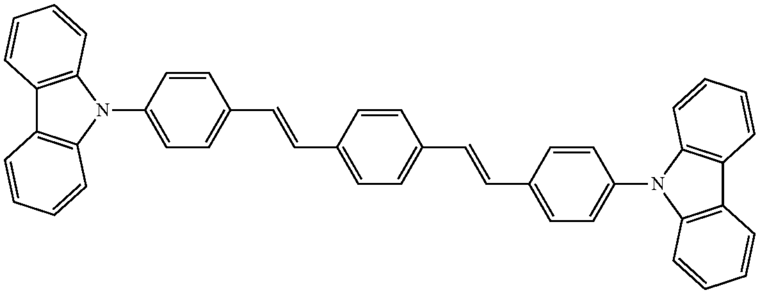
FD(7)
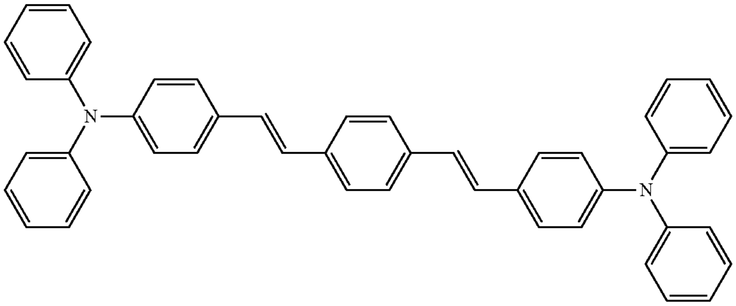
FD(8)
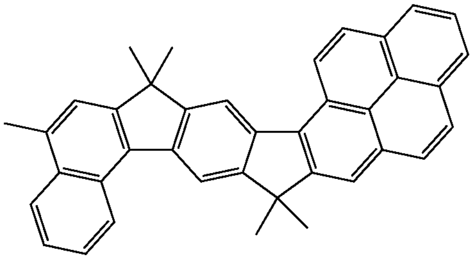
FD(9)
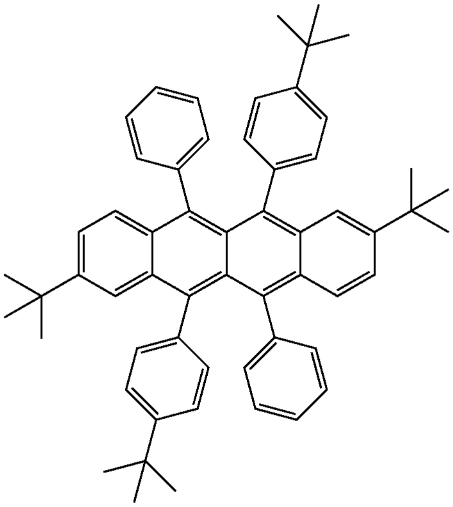

-continued
FD(10)
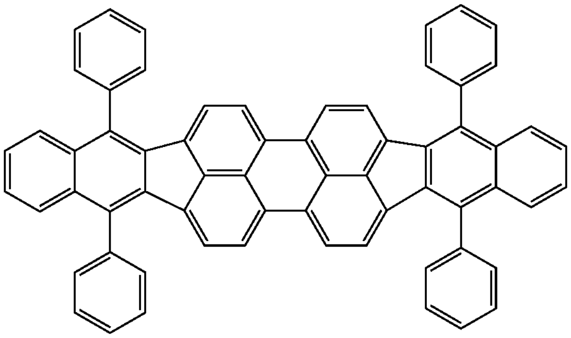
FD(11)
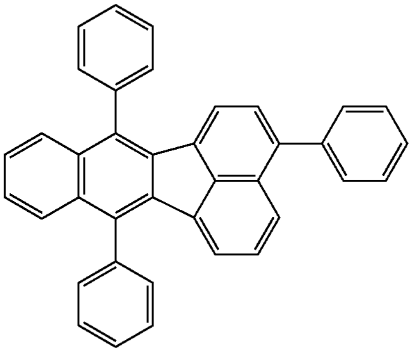
FD(12)
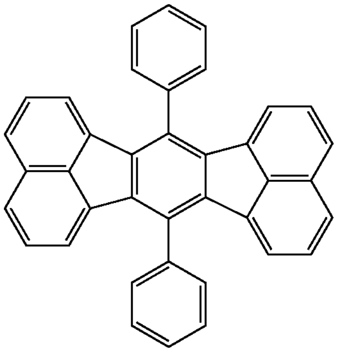
FD(13)
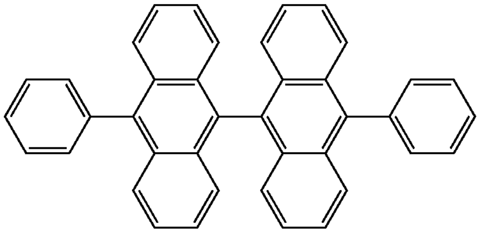
FD(14(
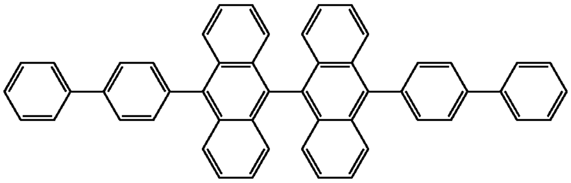
FD(15)
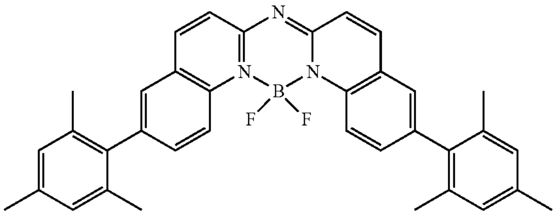
FD(16)
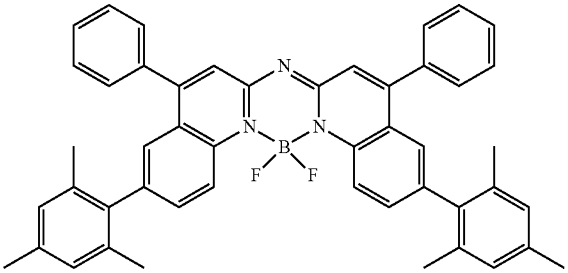

-continued
FD1
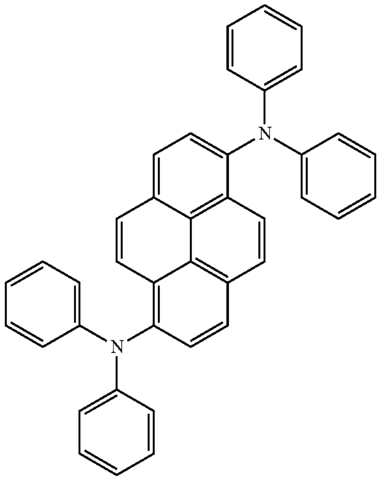
FD2
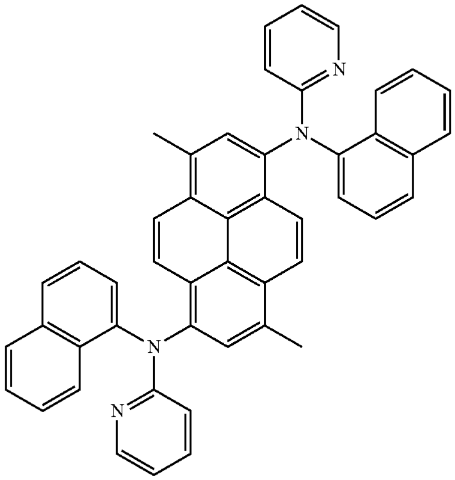
FD3
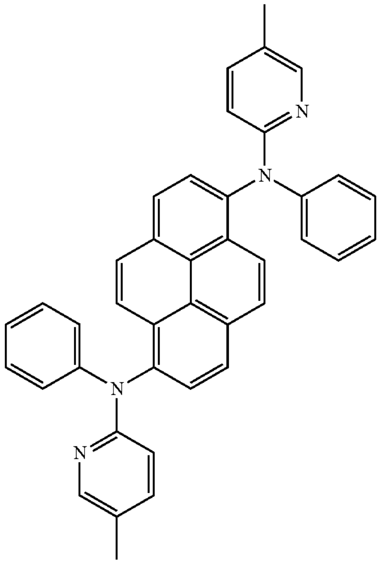
FD4
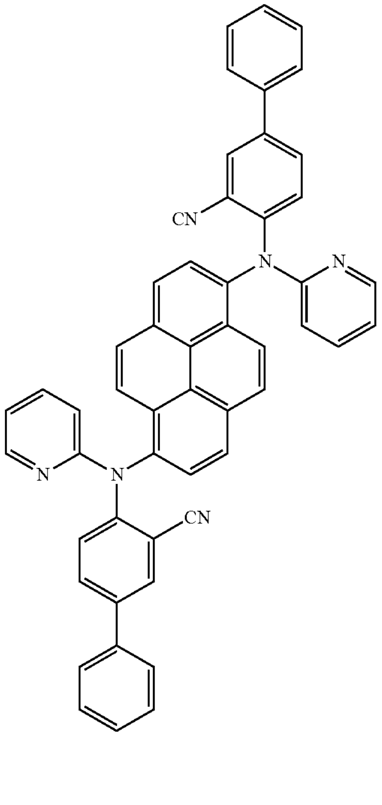

-continued
FD5
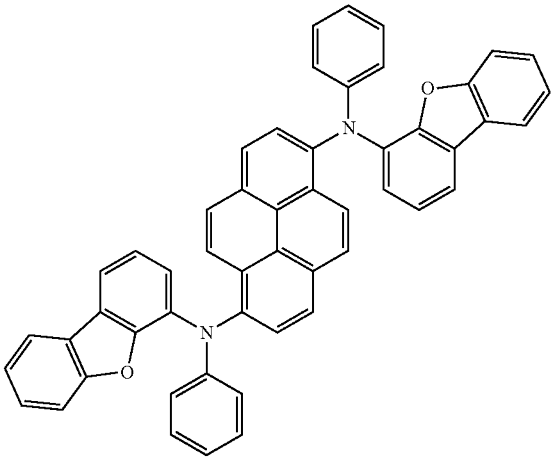
FD6
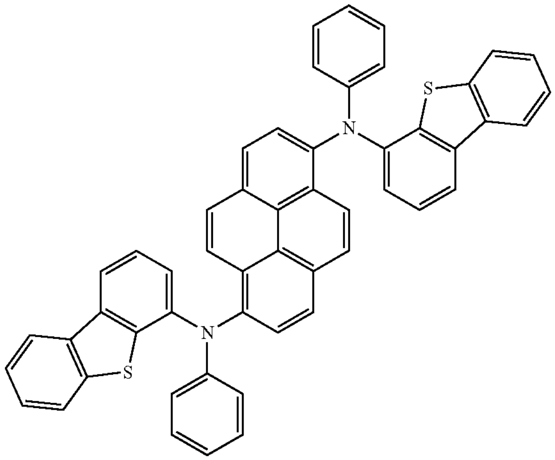
FD7
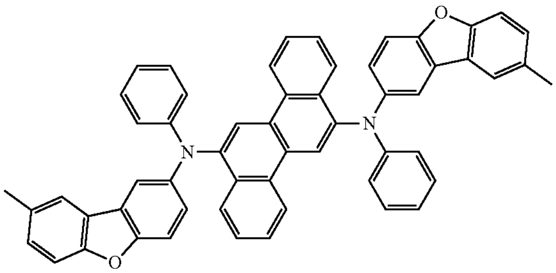
FD8
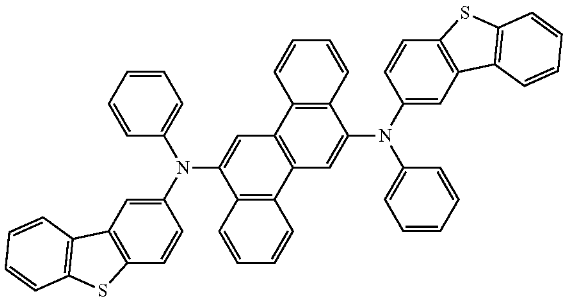
FD9
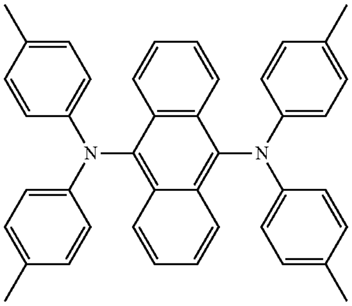
FD10
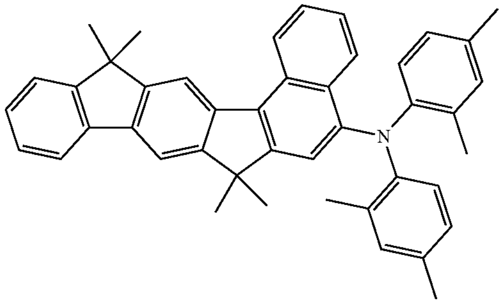
FD11
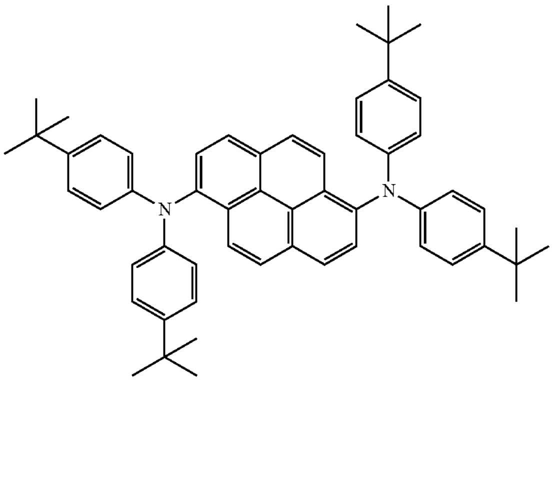
FD12
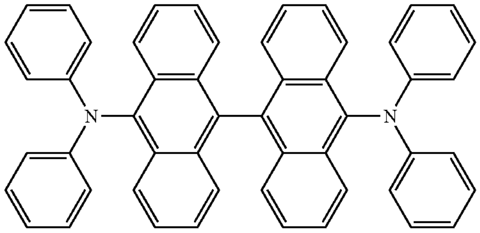

-continued

FD13

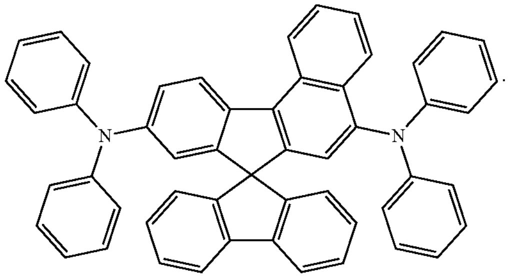

A thickness of the emission layer may be about 100 Å to about 1,000 Å, for example, about 200 Å to about 600 Å. When the thickness of the emission layer is within this range, excellent luminescence characteristics may be obtained without a substantial increase in driving voltage.

Next, the electron transport region may be arranged on the emission layer.

The electron transport region may include at least one of a hole blocking layer, an electron transport layer, an electron injection layer, or a combination thereof.

For example, the electron transport region may have a hole blocking layer/electron transport layer/electron injection layer structure or an electron transport layer/electron injection layer structure, but embodiments are not limited thereto. The electron transport layer may have a single-layered structure or a multi-layered structure including two or more different materials.

Conditions for forming the hole blocking layer, the electron transport layer, and the electron injection layer which constitute the electron transport region may be similar to or the same as the conditions for forming the hole injection layer.

When the electron transport region includes a hole blocking layer, the hole blocking layer may include, for example, at least one of 2,9-dimethyl-4,7-diphenyl-1,10-phenanthroline (BCP) or 4,7-diphenyl-1,10-phenanthroline (Bphen), but embodiments are not limited thereto:

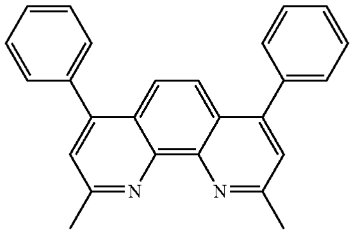

BCP

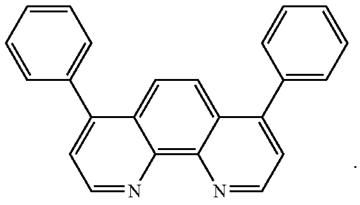

Bphen

A thickness of the hole blocking layer may be about 20 Å to about 1,000 Å, for example, about 30 Å to about 300 Å. When the thickness of the hole blocking layer is within this range, excellent hole blocking characteristics may be obtained without a substantial increase in driving voltage.

The electron transport layer may include at least one of 2,9-dimethyl-4,7-diphenyl-1,10-phenanthroline (BCP), 4,7-diphenyl-1,10-phenanthroline (Bphen), tris(8-hydroxy-quinolinato)aluminum ($Alq_3$), bis(2-methyl-8-quinolinolato-N1,O8)-(1,1'-biphenyl-4-olato)aluminum (BAlq), 3-(4-biphenylyl)-4-phenyl-5-tert-butylphenyl-1,2,4-triazole (TAZ), or 4-(naphthalen-1-yl)-3,5-diphenyl-4H-1,2,4-triazole (NTAZ), but embodiments are not limited thereto:

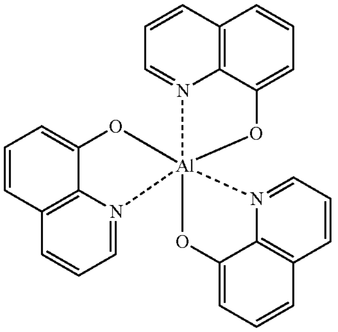

$Alq_3$

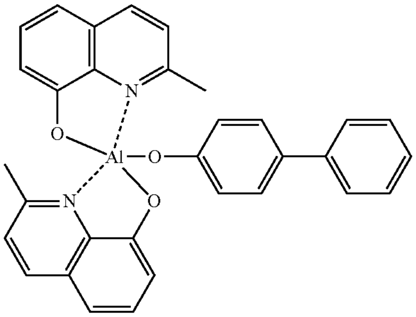

BAlq

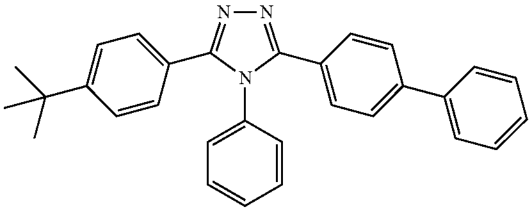

TAZ

-continued
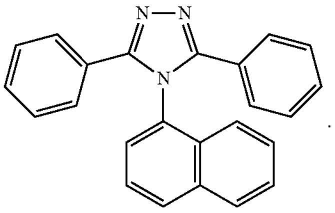
NTAZ
In one or more embodiments, the electron transport layer may include at least one of Compounds ET1 to ET25, but embodiments are not limited thereto:
ET1
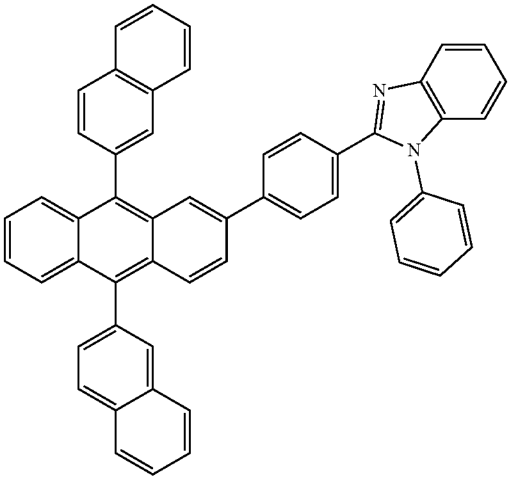
ET2
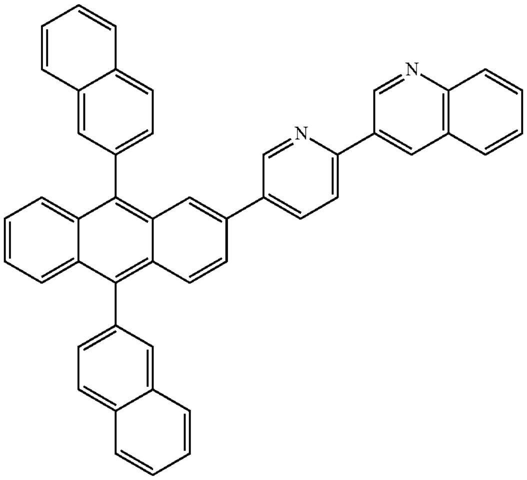
-continued
ET3
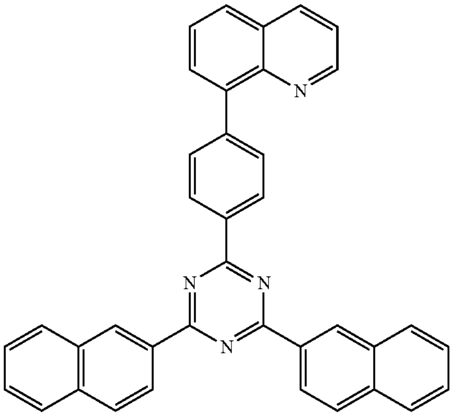
ET4
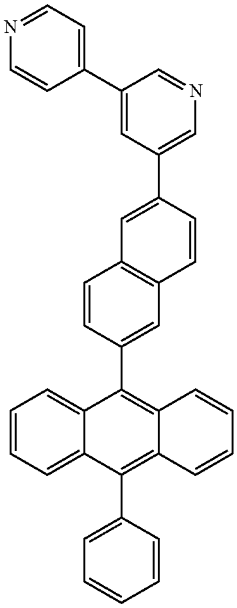
ET5
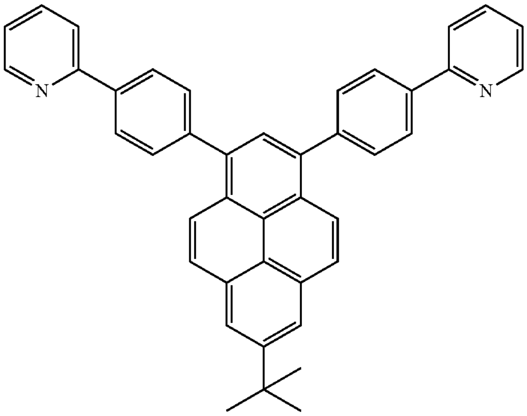

-continued
ET6
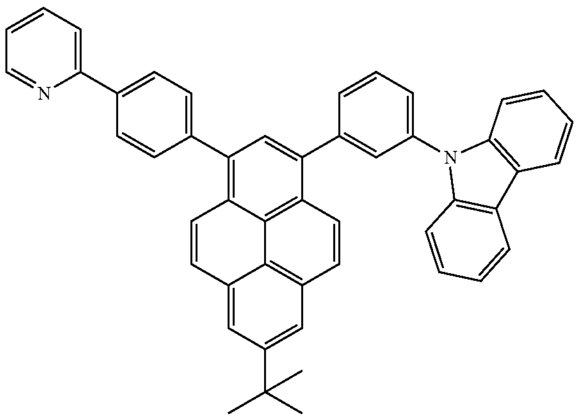
ET7
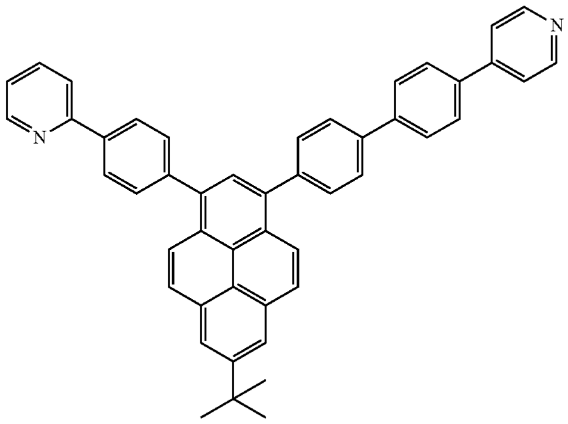
ET8
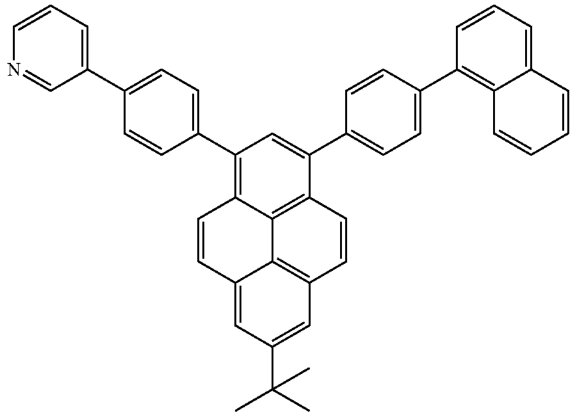
-continued
ET9
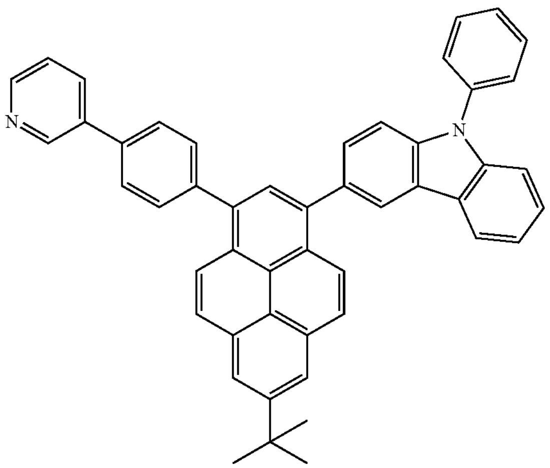
ET10
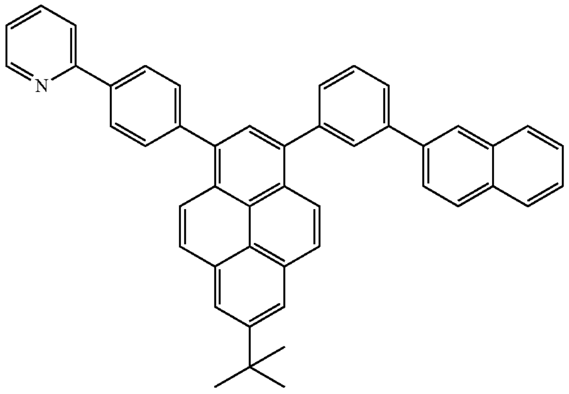
ET11
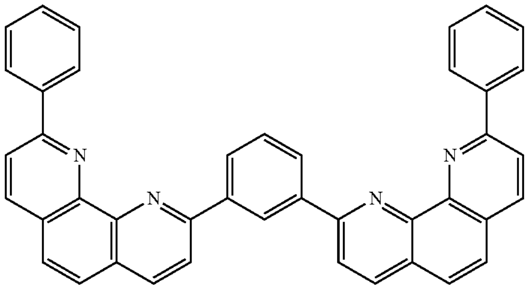
ET12
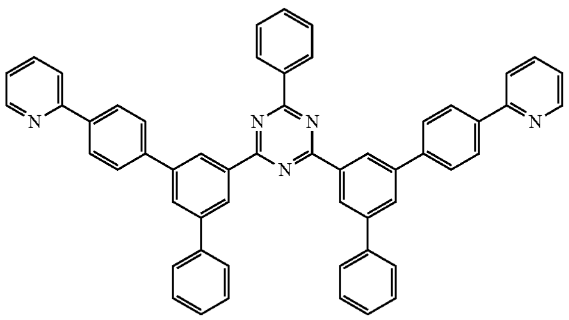

ET13
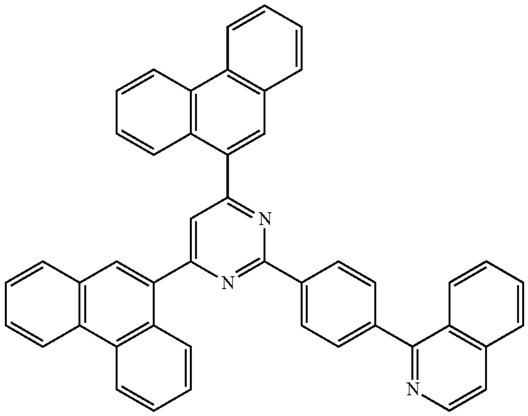
ET14
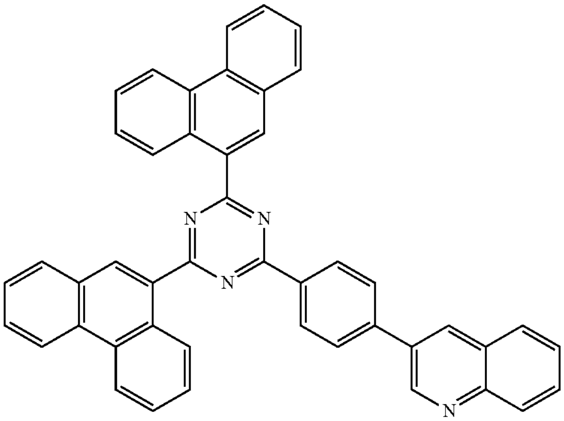
ET15
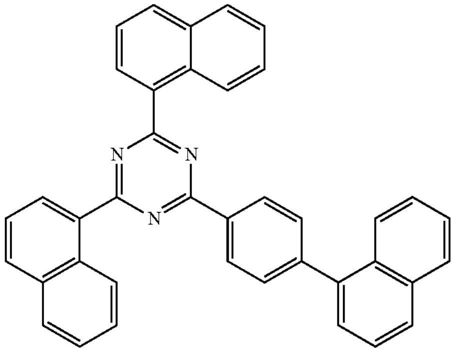
ET16
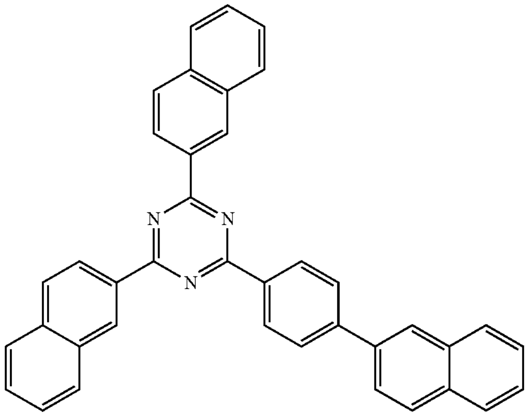
ET17
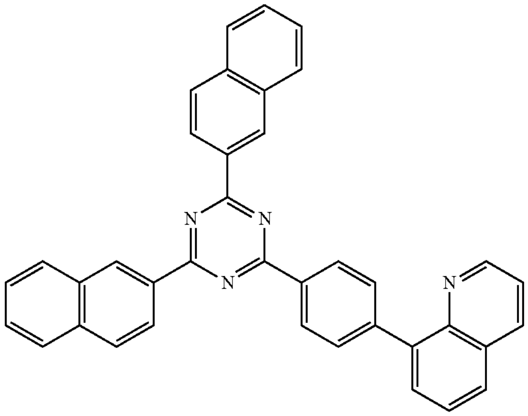
ET18
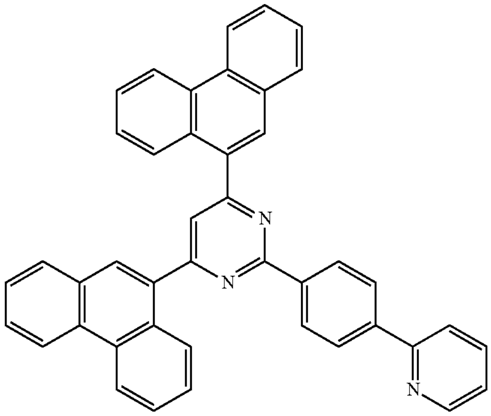

-continued
ET19
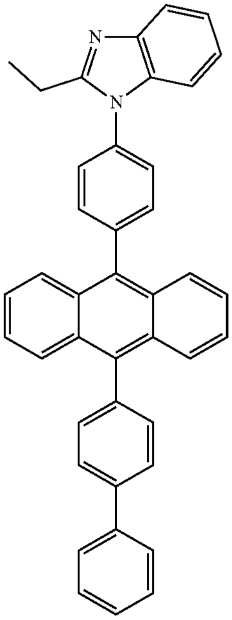
ET20
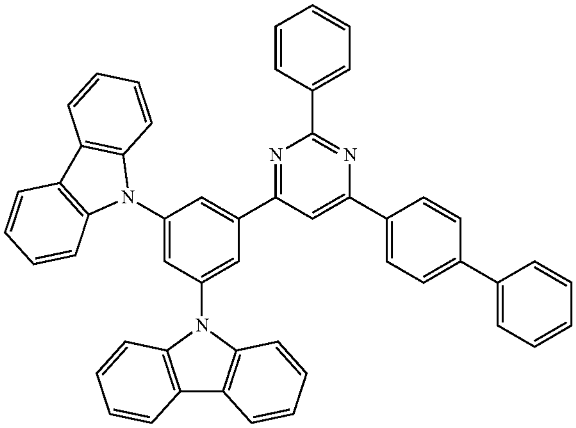
ET21
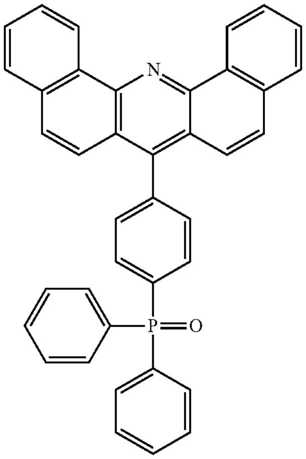
-continued
ET22
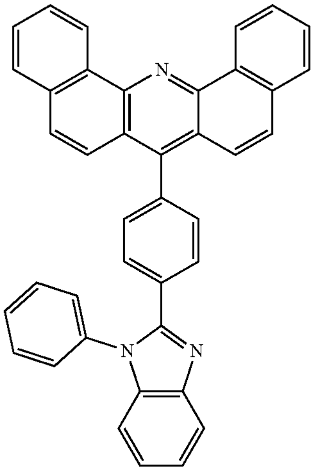
ET23
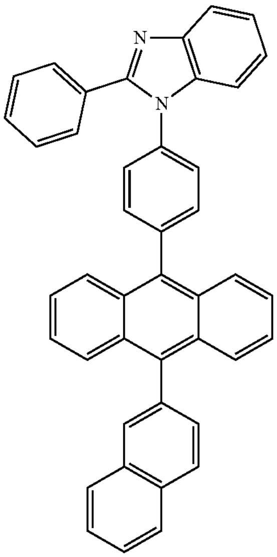
ET24
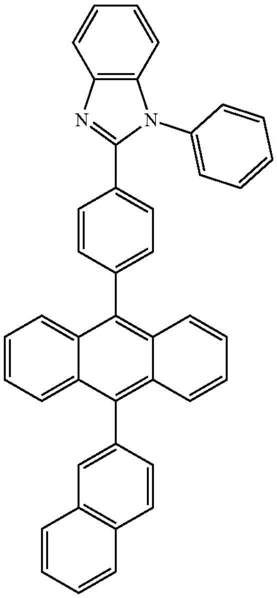

-continued

ET25

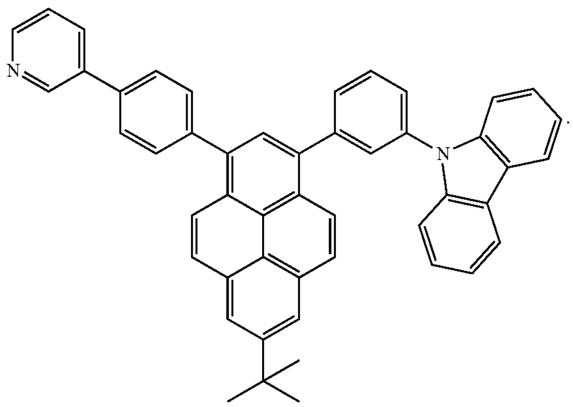

A thickness of the electron transport layer may be about 100 Å to about 1,000 Å, for example, about 150 Å to about 500 Å. When the thickness of the electron transport layer is within this range, satisfactory electron transporting characteristics may be obtained without a substantial increase in driving voltage.

The electron transport layer may include, in addition to the materials described herein, a metal-containing material.

The metal-containing material may include a Li complex. The Li complex may include, for example, Compound ET-D1 (lithium quinolate, LiQ) or ET-D2, but embodiments are not limited thereto:

ET-D1

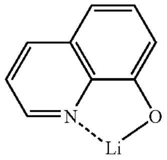

ET-D2

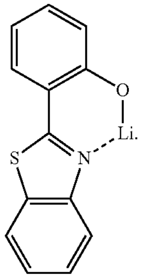

The electron transport region may include an electron injection layer that facilitates injection of electrons from the second electrode 19.

The electron injection layer may include at least one of LiQ, LiF, NaCl, CsF, $Li_2O$, or BaO, but embodiments are not limited thereto.

A thickness of the electron injection layer may be about 1 Å to about 100 Å, for example, about 3 Å to about 90 Å. When the thickness of the electron injection layer is within this range, satisfactory electron injection characteristics may be obtained without a substantial increase in driving voltage.

The second electrode 19 may be arranged on the organic layer 15. The second electrode 19 may be a cathode. A material for forming the second electrode 19 may be a metal, an alloy, an electrically conductive compound, or a combination thereof, each of which may have a relatively low work function. For example, the material for forming the second electrode 19 may be lithium (Li), magnesium (Mg), aluminum (Al), silver (Ag), aluminum-lithium (Al—Li), calcium (Ca), magnesium-indium (Mg—In), or magnesium-silver (Mg—Ag). In one or more embodiments, to manufacture a top-emission type light-emitting device, a transmissive electrode formed using ITO or IZO may be used as the second electrode 19.

Hereinbefore, the organic light-emitting device 10 has been described with reference to FIG. 1, but embodiments are not limited thereto.

According to another aspect, the organic light-emitting device may be included in an electronic apparatus. Thus, an electronic apparatus including the organic light-emitting device is provided. The electronic apparatus may include, for example, a display, an illumination, a sensor, or the like, but embodiments are not limited thereto.

EXPLANATION OF TERMS

The term "$C_1$-$C_{60}$ alkyl group" as used herein refers to a linear or branched saturated aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an isoamyl group, a hexyl group, or the like. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof may include a methoxy group, an ethoxy group, an isopropyloxy group, or the like.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and non-limiting examples thereof may include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and non-limiting examples thereof may include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, a cycloheptyl group, or the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent monocyclic group including at least one heteroatom selected from B, N, O, P, Si, Ge, Se, and S as a ring-forming atom and 1 to 10 carbon atoms as ring forming atom(s), and non-limiting examples thereof may include a tetrahydrofuranyl group, a tetrahydrothiophenyl group, or the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof may include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from B, N, O, P, Si, Ge, Se, and S as a ring-forming atom, 1 to 10 carbon atoms as ring forming atom(s), and at least one double bond in the ring thereof. Non-limiting examples of the $C_1$-$C_{10}$ heterocycloalkenyl group may include a 2,3-dihydrofuranyl group, a 2,3-dihydrothiophenyl group, or the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group that includes a carbocyclic aromatic system having 6 to 60 carbon atoms, and the term "$C_6$-$C_{60}$ arylene group" as used herein refers to a divalent group that includes a carbocyclic aromatic system having 6 to 60 carbon atoms. Non-limiting examples of the $C_6$-$C_{60}$ aryl group may include a phenyl group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a carbocyclic aromatic system having at least one heteroatom selected from B, N, O, P, Si, Ge, Se, and S as a ring-forming atom and 1 to 60 carbon atoms as ring forming atom(s). The term "$C_1$-$C_{60}$ heteroarylene group" as used herein refers to a divalent group having a carbocyclic aromatic system having at least one heteroatom selected from B, N, O, P, Si, Ge, Se, and S as a ring-forming atom and 1 to 60 carbon atoms as ring forming atom(s). Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, an isoquinolinyl group, or the like. When the $C_1$-$C_{60}$ heteroaryl group and the $C_1$-$C_{60}$ heteroarylene group each include two or more rings, the two or more rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_2$-$C_{60}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_{60}$ aryloxy group" as used herein refers to $-OA_{102}$ (wherein $A_{102}$ is the $C_6$-$C_{60}$ aryl group), and the term "$C_6$-$C_{60}$ arylthio group" as used herein refers to $-SA_{103}$ (wherein $A_{103}$ is the $C_6$-$C_{60}$ aryl group).

The term "$C_1$-$C_{60}$ heteroaryloxy group" as used herein indicates $-OA_{104}$ (wherein $A_{104}$ is a $C_1$-$C_{60}$ heteroaryl group), and the term "$C_1$-$C_{60}$ heteroarylthio group" as used herein indicates $-SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group may include a fluorenyl group or the like. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed with each other, at least one heteroatom selected from B, N, O, P, Si, Ge, Se, and S, other than carbon atoms, as a ring-forming atom, and no aromaticity in its entire molecular structure. Non-limiting examples of the monovalent non-aromatic condensed heteropolycyclic group may include a carbazolyl group or the like. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms as ring forming atom(s). The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, $-F$, $-Cl$, $-Br$, $-I$, $-SF_5$, $-CD_3$, $-CD_2H$, $-CDH_2$, $-CF_3$, $-CF_2H$, $-CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(Q_{18})(Q_{19})$, or —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, and a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(Q_{28})(Q_{29})$ or —$P(=O)(Q_{28})(Q_{29})$, or —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(Q_{38})(Q_{39})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

For example, $Q_1$ to Q, $Q_{11}$ to $Q_{19}$, $Q_{21}$ to $Q_{29}$, and $Q_{31}$ to $Q_{39}$ as used herein may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$, or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, a $C_1$-$C_{10}$ alkyl group, a phenyl group, or a combination thereof.

The term "room temperature" as used herein refers to a temperature of about 25° C.

The terms "a biphenyl group, a terphenyl group, and a tetraphenyl group" as used herein each refer to a monovalent group having two, three, and four phenyl groups linked to each other via a single bond, respectively.

Hereinafter, a compound and an organic light-emitting device according to one or more exemplary embodiments will be described in further detail with reference to Synthesis Examples and Examples. However, embodiments are not limited thereto. The wording "'B' was used instead of 'A'" as used in describing Synthesis Examples means that an amount of 'A' used was identical to an amount of 'B' used, in terms of a molar equivalent.

EXAMPLES

Synthesis Example 1: Synthesis of Compound 1

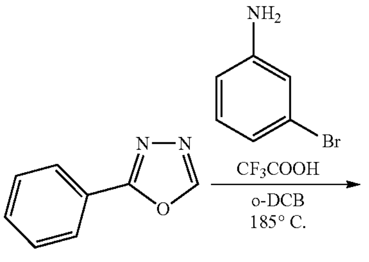

1-A

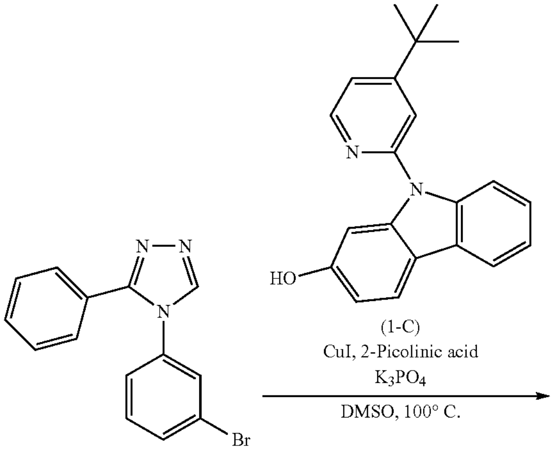

1-B

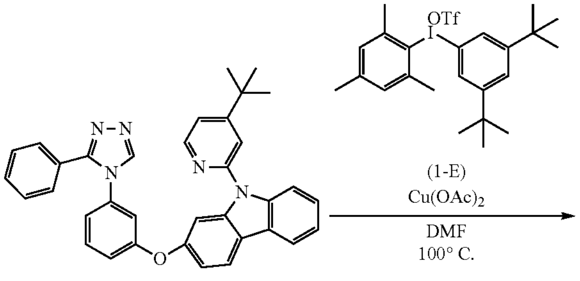

1-D

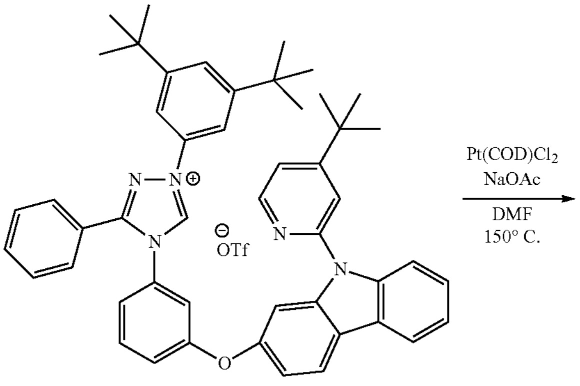

1-F

-continued

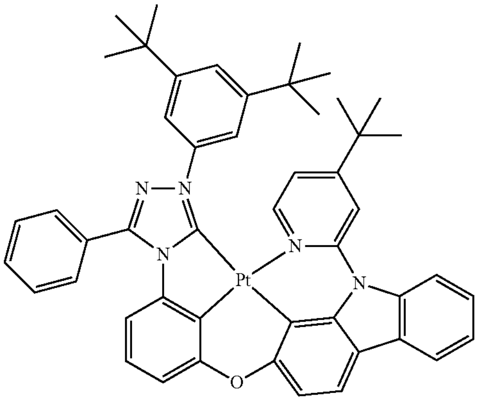

Compound 1

Synthesis of [Compound 1-B]

Compound 1-A (11.5 grams (g), 78.7 millimoles (mmol)), 3-bromoaniline (7.71 milliliters (mL), 70.8 mmol), and trifluoroacetic acid (6.00 mL, 78.7 mmol) were placed in a round-bottom flask, and then mixed with o-dichlorobenzene (75 mL). The resultant reaction solution was stirred and heated under reflux at 185° C. for 12 hours. After completion of the reaction, the temperature was allowed to lower to room temperature, and then, ethyl acetate and a saturated aqueous $Na_2CO_3$ solution were added to the reaction solution. An organic solution layer was extracted therefrom using ethyl acetate, the organic layer was dried using anhydrous $MgSO_4$, and then the product was filtered. The filtrate was concentrated and purified through silica gel column chromatography to obtain 5.0 g (yield of 21%) of Compound 1-B.

High performance liquid chromatography-mass spectrometry (HPLC-MS): 301.99 $[M+H]^+$.

Synthesis of [Compound 1-D]

Compound 1-B (5.00 g, 16.6 mmol), Compound 1-C (5.80 g, 18.3 mmol), CuI (0.634 g, 3.33 mmol), 2-picolinic acid (0.902 g, 7.33 mmol), and $K_3PO_4$ (10.6 g, 50.0 mmol) were placed in a round-bottom flask, and then mixed with dimethyl sulfoxide (DMSO) (110 mL). The resultant reaction solution was stirred and heated under reflux at 100° C. for 12 hours. After completion of the reaction, the temperature was allowed to lower to room temperature, and then, ethyl acetate and a saturated aqueous ammonium chloride solution were added to the reaction solution. An organic solution layer was extracted therefrom using ethyl acetate, the organic layer was dried using anhydrous $MgSO_4$, and then the product was filtered. The filtrate was concentrated under a reduced pressure and purified through silica gel column chromatography to obtain 5.4 g (yield of 49%) of Compound 1-D.

HPLC-MS: 536.21 $[M+H]^+$.

Synthesis of [Compound 1-F]

Compound 1-D (4.2 g, 7.80 mmol), Compound 1-E (6.84 g, 11.7 mmol), and copper(II) acetate $(Cu(Oac)_2)$ (0.14 g, 0.780 mmol) were placed in a round-bottom flask, and then mixed with dimethylformamide (DMF) (40 mL). The resultant reaction solution was stirred and heated under reflux at 100° C. for 12 hours. After completion of the reaction, the temperature was allowed to lower to room temperature, and then, ethyl acetate and a saturated aqueous ammonium chloride solution were added to the reaction solution. An organic solution layer was extracted therefrom using ethyl acetate, the organic layer was dried using anhydrous $MgSO_4$, and then the product was filtered. The filtrate was concentrated under a reduced pressure and purified through silica gel column chromatography to obtain 6.0 g (yield of 88%) of Compound 1-F.

HPLC-MS: 724.36 [M-OTf]$^+$.

Synthesis of [Compound 1]

Compound 1-F (6.00 g, 6.86 mmol), dichloro(1,5-cyclooctadiene)platinum(II) ($Pt(COD)Cl_2$) (2.82 g, 7.55 mmol), and sodium acetate (NaOAc) (1.69 g, 20.6 mmol) were placed in a round-bottom flask, and then mixed with DMF (100 mL). The resultant reaction solution was stirred and heated under reflux at 160° C. for 12 hours. After completion of the reaction, the temperature was allowed to lower to room temperature, and then, the reaction solution was diluted with dichloromethane. The precipitate was filtered using celite/silica, and then, deionized (DI) water was added to the filtrate. An organic solution layer was extracted therefrom using dichloromethane, the organic layer was dried using anhydrous $MgSO_4$, and then the product was filtered. The filtrate was concentrated under a reduced pressure and purified through silica gel column chromatography to obtain 2.00 g (yield of 32%) of Compound 1.

HPLC-MS: 917.29 [M+H]$^+$.

Synthesis Example 2: Synthesis of Compound 11

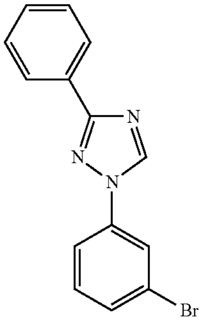

11-A

+

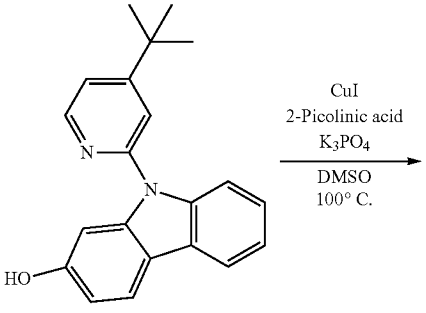

1-C

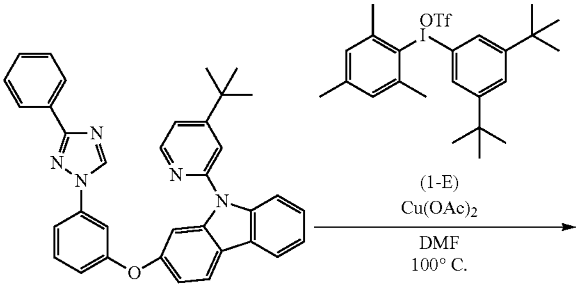

11-B

-continued

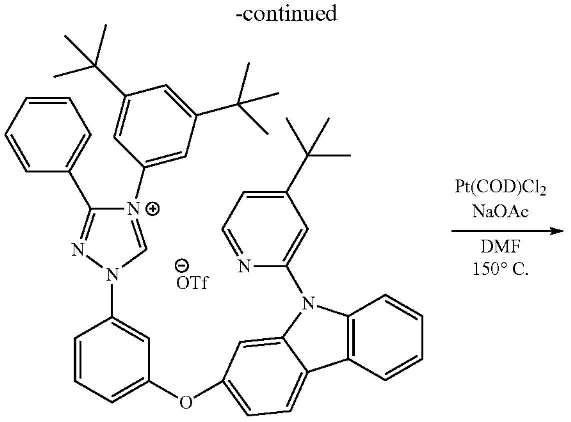

11-C

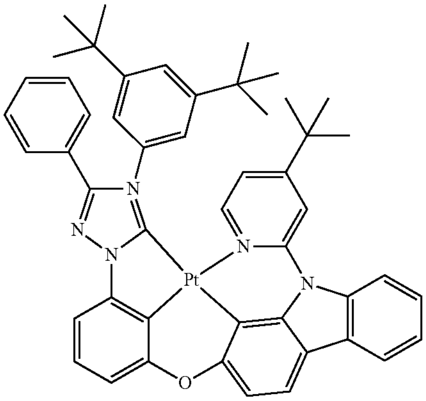

Compound 11

Synthesis of [Compound 11-B]

Compound 2-A (6.70 g, 22.3 mmol), Compound 1-C(7.77 g, 24.6 mmol), CuI (0.850 g, 4.46 mmol), 2-picolinic acid (1.21 g, 9.82 mmol), and $K_3PO_4$ (14.2 g, 67.0 mmol) were placed in a round-bottom flask, and then mixed with DMSO (150 mL). The resultant reaction solution was stirred and heated under reflux at 100° C. for 12 hours. After completion of the reaction, the temperature was allowed to lower to room temperature, and then, ethyl acetate and a saturated aqueous ammonium chloride solution were added to the reaction solution. An organic solution layer was extracted therefrom using ethyl acetate, the organic layer was dried using anhydrous $MgSO_4$, and then the product was filtered. The filtrate was concentrated under a reduced pressure and purified through silica gel column chromatography to obtain 6.3 g (yield of 53%) of Compound 11-B.

HPLC-MS: 536.23 [M+H]$^+$.

Synthesis of [Compound 11-C]

Compound 11-B (3.8 g, 7.09 mmol), Compound 1-E (6.22 g, 10.6 mmol), and $Cu(OAc)_2$ (0.135 g, 0.710 mmol) were placed in a round-bottom flask, and then mixed with DMF (30 mL). The resultant reaction solution was stirred and heated under reflux at 100° C. for 12 hours. After completion of the reaction, the temperature was allowed to lower to room temperature, and then, ethyl acetate and a saturated aqueous ammonium chloride solution were added to the reaction solution. An organic solution layer was extracted therefrom using ethyl acetate, the organic layer was dried using anhydrous $MgSO_4$, and then the product was filtered. The filtrate was concentrated under a reduced pressure and purified through silica gel column chromatography to obtain 4.0 g (yield of 65%) of Compound 11-C.

HPLC-MS: 724.38 [M-OTf]$^+$.

Synthesis of [Compound 11]

Compound 11-C(6.00 g, 6.86 mmol), $Pt(COD)Cl_2$ (2.82 g, 7.55 mmol), and NaOAc (1.69 g, 20.6 mmol) were placed in a round-bottom flask, and then mixed with DMF (100 mL). The resultant reaction solution was stirred and heated under reflux at 160° C. for 12 hours. After completion of the reaction, the temperature was allowed to lower to room temperature, and then, the reaction solution was diluted with dichloromethane. The precipitate was filtered using celite/silica, and then, DI water was added to the filtrate. An organic solution layer was extracted therefrom using dichloromethane, the organic layer was dried using anhydrous $MgSO_4$, and then the product was filtered. The filtrate was concentrated and purified through silica gel column chromatography to obtain 2.00 g (yield of 32%) of Compound 11.

HPLC-MS: 917.29 $[M+H]^+$.

Evaluation Example 1: Evaluation of Photoluminescence (PL) Spectrum

Figure 2:
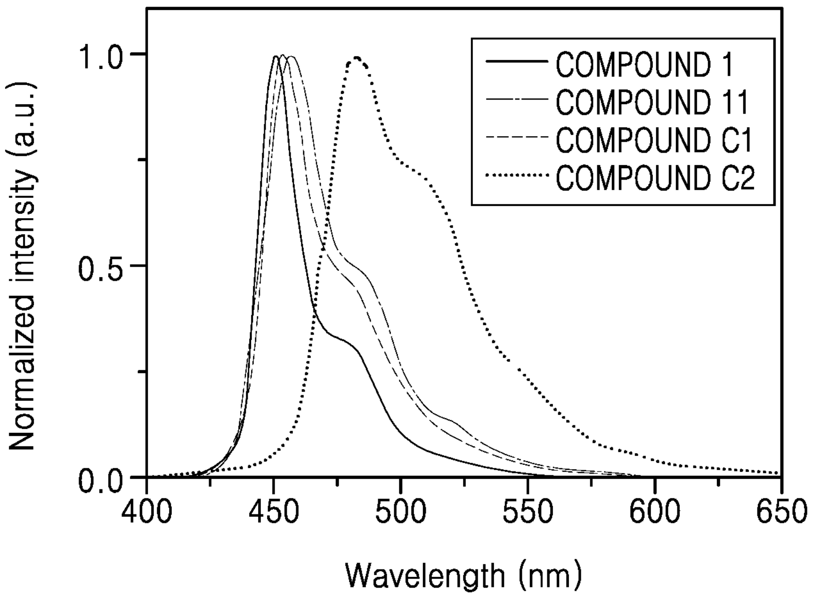
FIG. 2 is a graph of normalized intensity (arbitrary units, a.u.) versus wavelength (nanometers, nm) and shows photoluminescence (PL) spectra of compounds according to one or more exemplary embodiments and comparative compounds.
Figure 3:
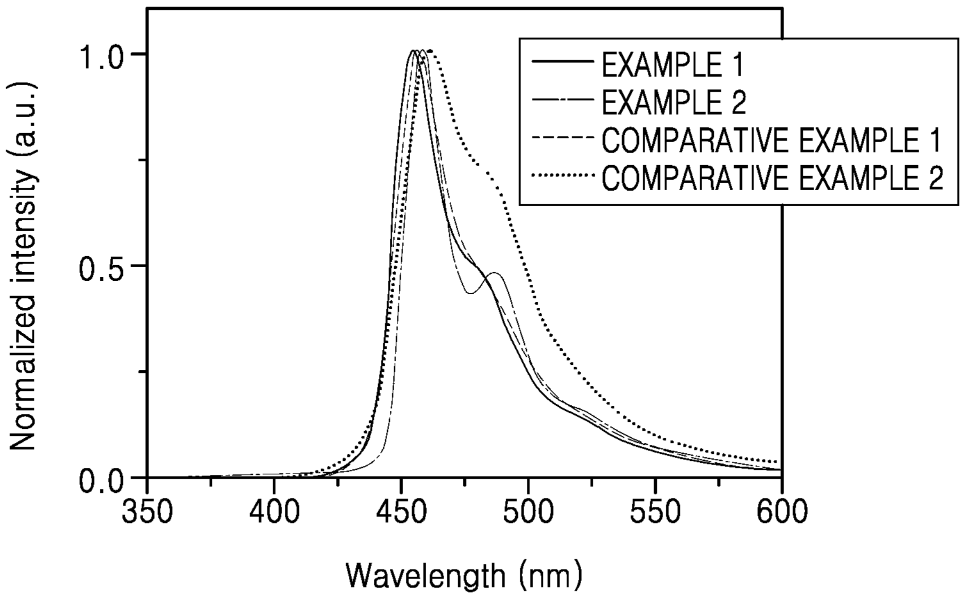
FIG. 3 is a graph of normalized intensity (a.u.) versus wavelength (nm) and shows electroluminescence (EL) spectra of light-emitting devices respectively including compounds according to one or more exemplary embodiments and comparative compounds.

Compound 1, Compound 11, Comparative Compound C1, and Comparative Compound C2 were each diluted in toluene at a concentration of 104 molar (M). Then, the photoluminescence (PL) spectrum of each compound was measured using an ISC PC1 spectrofluorometer, in which a xenon lamp was mounted, and the results are shown in FIG. 2. The maximum emission wavelength value ($\lambda_{max}$, nm) and $T_1$ energy (eV) of each compound were obtained from the PL spectrum thereof, and the results are shown in Table 2.

In detail, the $T_1$ energy was converted into an energy level value at the maximum emission wavelength. In addition, the HOMO and LUMO energy levels of each compound were measured by differential pulse voltammetry (DPV). The solvent used for the measurement was DMF, and tetrabutylammonium fluoride (TBAF) was used as an electrolyte. In addition, the reference electrode Ag/Ag+ was used, and the counter electrode Pt and the working electrode Pt were used. During the measurement, ferrocene (Fc) was used as a reference material, and the HOMO of Fc is known to be −4.8 eV. Accordingly, the HOMO and LUMO energy levels of each compound were calculated by applying the potential value measured by DPV to the data calculation method below. The reference data is shown in Table 1A, below.

TABLE 1A

| | Measurement potential | Energy level (eV) |
|---|---|---|
| Ref. | $\alpha$ | −4.8 |
| HOMO | $\beta$ | $-4.8-(\beta-\alpha)$ |
| LUMO | $\gamma$ | $-4.8-(-\gamma-\alpha)$ |

TABLE 2

| Compound | HOMO (eV) | LUMO (eV) | $T_1$ (eV) | $\lambda_{max}$ (nm) |
|---|---|---|---|---|
| 1 | −5.32 | −2.01 | 2.75 | 451 |
| 11 | −5.31 | −1.98 | 2.71 | 458 |
| C1 | −5.20 | −2.01 | 2.73 | 454 |
| C2 | −5.18 | −2.37 | 2.57 | 482 |

TABLE 2-continued

| Compound | HOMO (eV) | LUMO (eV) | $T_1$ (eV) | $\lambda_{max}$ (nm) |
|---|---|---|---|---|

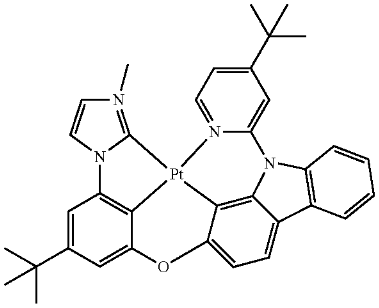

C1

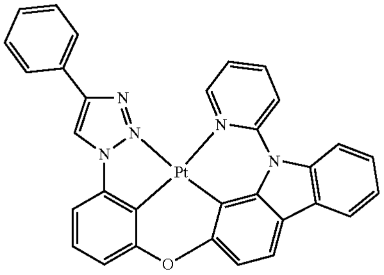

C2

Referring to Table 2, Compounds 1 and 11 according to one or more embodiments were found to emit a deep blue light and have deeper HOMO energy values than Comparative Compounds C1 and C2.

Example 1

An ITO glass substrate was cut to a size of 50 millimeters (mm)×50 mm×0.5 mm, sonicated in acetone, isopropyl alcohol, and DI water, each for 15 minutes, and then washed by exposure to UV ozone for 30 minutes each.

Then, m-MTDATA was deposited on an ITO electrode (anode) on the glass substrate at a deposition rate of 1 Å/sec to form a hole injection layer having a thickness of 600 Å, and then, α-NPD was deposited on the hole injection layer at a deposition rate of 1 Å/sec to form a hole transport layer having a thickness of 250 Å.

Compound 1 (dopant) and CBP (host) were co-deposited on the hole transport layer at a deposition rate of 0.1 Å/sec and a deposition rate of 1 Å/sec, respectively, to form an emission layer having a thickness of 400 Å.

BAlq was deposited on the emission layer at a deposition rate of 1 Å/sec to form a hole blocking layer having a thickness of 50 Å, $Alq_3$ was deposited on the hole blocking layer to form an electron transport layer having a thickness of 300 Å, LiF was deposited on the electron transport layer to form an electron injection layer having a thickness of 10 Å, and then, Al was vacuum-deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+Compound 1 (10 wt %) (400 Å)/BAlq (50 Å)/$Alq_3$ (300 Å)/LiF (10 Å)/Al (1,200 Å).

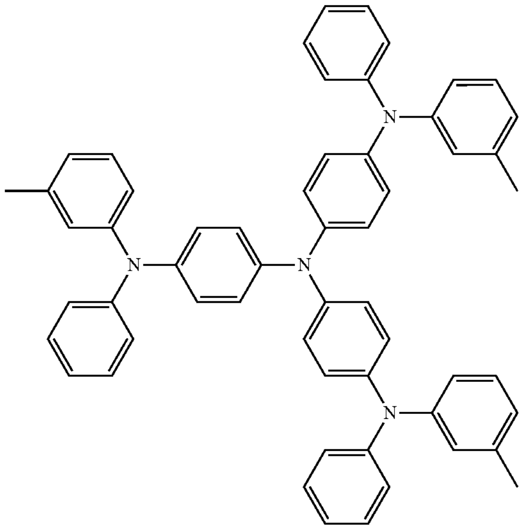

m-MTDATA

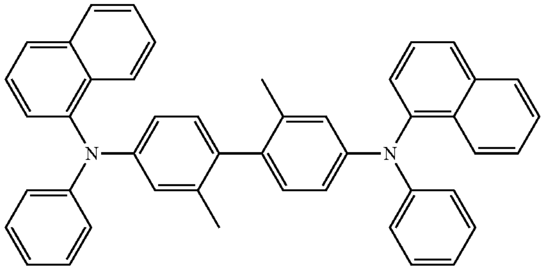

α-NPD

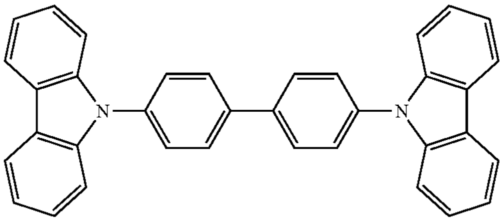

CBP

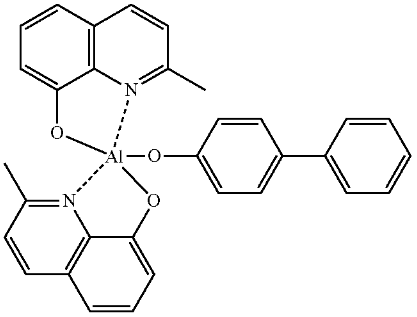

BAlq

-continued

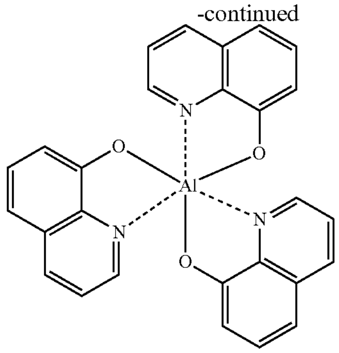

$Alq_3$

Example 2

An organic light-emitting device was manufactured in a similar manner as in Example 1, except that Compound 11 was used instead of Compound 1 to form an emission layer.

Comparative Example 1

An organic light-emitting device was manufactured in a similar manner as in Example 1, except that Compound C1 was used instead of Compound 1 to form an emission layer.

Comparative Example 2

An organic light-emitting device was manufactured in a similar manner as in Example 1, except that Compound C3 was used instead of Compound 1 to form an emission layer.

Figure 4:
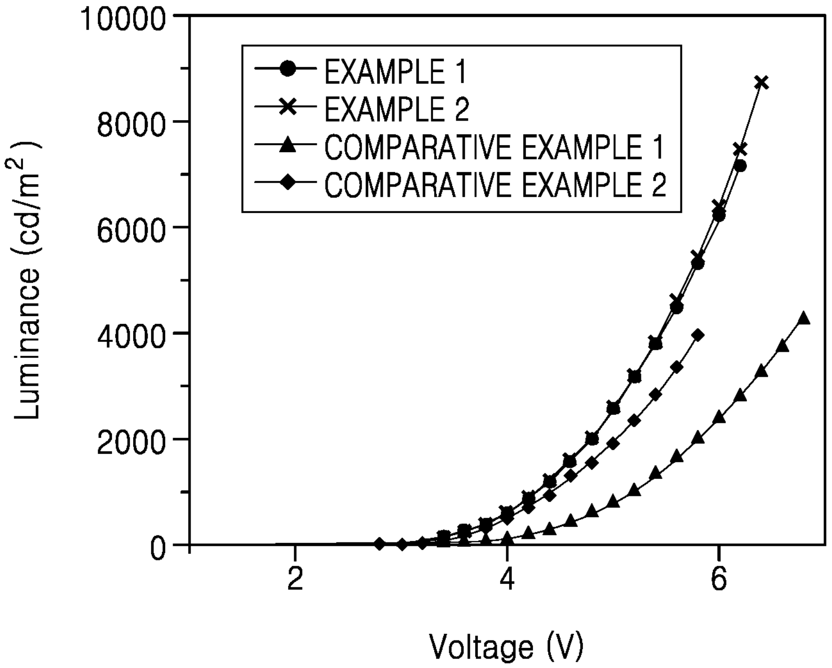
FIG. 4 is a graph of luminance (candela per square meter, cd/$m^2$) versus voltage (Volts, V) and shows luminance of compounds according to one or more exemplary embodiments and comparative compounds according to voltages.

Evaluation Example 2: Evaluation of Characteristics of Organic Light-Emitting Devices The electroluminescence (EL) spectrum of each of the organic light-emitting devices manufactured according to Examples 1 and 2 and Comparative Examples 1 and 2 were measured, and the results are shown in Table 3. Also, a graph of luminance according to voltage of each device is shown in FIG. 4. The maximum emission wavelength (nm), driving voltage (relative value, %), and external quantum luminescence efficiency (EQE, relative value, %, at 1,000 cd/$m^2$) of each device were evaluated from the EL spectrum thereof, and the results are shown in Table 3. The maximum emission wavelength of the EL spectrum was evaluated from the EL spectrum (at 1,000 cd/$m^2$) measured using a luminance meter (Minolta Cs-1000A) for each of the organic light-emitting devices. The driving voltage and external quantum luminescence efficiency were evaluated using a current-voltmeter (Keithley 2400) and a luminance meter (Minolta Cs-1000A), and were expressed as relative values (%) based on the lowest values.

TABLE 3

| | Dopant compound No. | Maximum emission wavelength (nm) | Driving voltage (%, relative value) | External quantum luminescence efficiency (%, relative value) |
|---|---|---|---|---|
| Example 1 | 1 | 454 | 83 | 233 |
| Example 2 | 11 | 458 | 83 | 274 |
| Comparative Example 1 | C1 | 456 | 100 | 154 |

TABLE 3-continued

| | Dopant compound No. | Maximum emission wavelength (nm) | Driving voltage (%, relative value) | External quantum luminescence efficiency (%, relative value) |
|---|---|---|---|---|
| Comparative Example 2 | C3 | 461 | 87 | 100 |

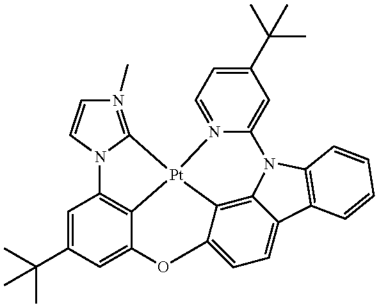

C1

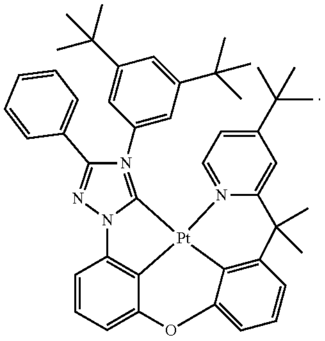

C3

Referring to Table 3, the organic light-emitting devices of Examples 1 and 2 were found to have lower driving voltages and higher external quantum luminescence efficiencies, as compared with the organic light-emitting devices of Comparative Examples 1 and 2.

By using at least one of the organometallic compounds represented by Formula 1, an organic light-emitting device having excellent luminescence efficiency, and an electronic apparatus including the same was provided.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

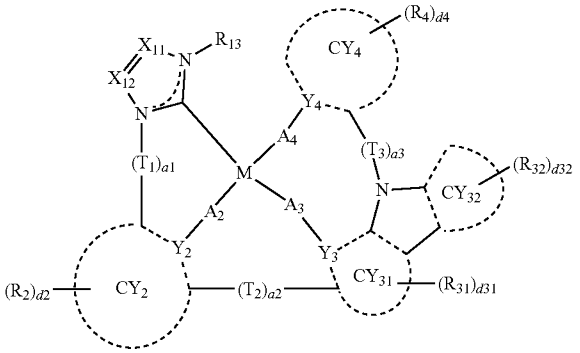

wherein, in Formula 1,

M is a transition metal, $X_{11}$ is N or $C(R_{11})$, $X_{12}$ is N or $C(R_{12})$, at least one of $X_1$ and $X_{12}$ is N, ring $CY_2$, ring $CY_{31}$, ring $CY_{32}$, and ring $CY_4$ are each independently a $C_3$-$C_{60}$ carbocyclic group or a $C_1$-$C_{60}$ heterocyclic group, $Y_2$ to $Y_4$ are each independently C or N, $A_2$ to $A_4$ are each independently a chemical bond, 0, or S, $T_1$ is a single bond, a double bond, *—N[$(L_1)_{b1}$-$(R_{1a})$]—*', *—B($R_{1a}$)—*', *—P($R_{1a}$)—*', *—C($R_{1a}$)($R_{1b}$)—*', *—Si($R_{1a}$)($R_{1b}$)—*', *—Ge($R_{1a}$)($R_{1b}$)—*', *—S—*', *—Se—*', *—O—*', *—C(=O)—*', *—S(=O)—*', *—S$(=O)_2$—*', *—C($R_{1a}$)=*', *=C($R_{1a}$)—*', *—C($R_{1a}$)=C($R_{1b}$)—*', *—C(=S)—*', or *—C≡C—*', $T_2$ is a single bond, a double bond, *—N[$(L_2)_{b2}$-$(R_{2a})$]—*', *—P($R_{2a}$)—*', *—C($R_{2a}$)($R_{2b}$)—*', *—Si($R_{2a}$)($R_{2b}$)—*', *—Ge($R_{2a}$)($R_{2b}$)—*', *—S—*', *—Se—*', *—O—*', *—C(=O)—*', *—S(=O)—*', *—S$(=O)_2$—*', *—C($R_{2a}$)=*', *=C($R_{2a}$)—*', *—C($R_{2a}$)=C($R_{2b}$)—*', *—C(=S)—*', or *—C≡C—*', $T_3$ is a single bond, a double bond, *—N[$(L_3)_{b3}$-$(R_{3a})$]—*', *—B($R_{3a}$)—*', *—P($R_{3a}$)—*', *—C($R_{3a}$)($R_{3b}$)—*', *—Si($R_{3a}$)($R_{3b}$)—*', *—Ge($R_{3a}$)($R_{3b}$)—*', *—S—*', *—Se—*', *—O—*, *—C(=O)—*', *—S(=O)—*', *—S$(=O)_2$—*', *—C($R_{3a}$)=*', *=C($R_{3a}$)—*', *—C($R_{3a}$)=C($R_{3b}$)—*', *—C(=S)—*', or *—C≡C—*', a1 to a3 are each independently an integer from 1 to 3,

* and *' each indicate a binding site to a neighboring atom, $L_1$ to $L_3$ are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b1 to b3 are each independently an integer from 1 to 3, $R_{1a}$, $R_{1b}$, $R_2$, $R_{2b}$, $R_{3a}$, $R_{3b}$, $R_4$, $R_{10a}$, $R_{11}$ to $R_{13}$, $R_{31}$, and $R_{32}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a $C_2$-$C_{60}$ alkyl heteroaryl group, a $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —Ge($Q_1$)($Q_2$)($Q_3$), —N($Q_4$)($Q_5$), —B($Q_6$)($Q_7$), —P($Q_8$)($Q_9$), or —P(═O)($Q_8$)($Q_9$), $R_{2a}$ is hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted monovalent non-aromatic condensed polycyclic group, —Si($Q_1$)($Q_2$)($Q_3$), —Ge($Q_1$)($Q_2$)($Q_3$), —N($Q_4$)($Q_5$), —B($Q_6$)($Q_7$), —P($Q_8$)($Q_9$), or —P(═O)($Q_8$)($Q_9$), d2, d31, d32, and d4 are each independently an integer from 0 to 10, at least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a C1-$C_{60}$ heteroarylthio group, a monovalent non-aromatic condensed polycyclic group, a monovalent non-aromatic condensed heteropolycyclic group, —Si($Q_{11}$)($Q_{12}$)($Q_{13}$), —Ge($Q_{11}$)($Q_{12}$)($Q_{13}$), —N($Q_{14}$)($Q_{15}$), —B($Q_{16}$)($Q_{17}$), —P($Q_{18}$)($Q_{19}$), —P(═O)($Q_{18}$)($Q_{19}$), or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $-Si(Q_{21})(Q_{22})(Q_{23})$, $-Ge(Q_{21})(Q_{22})(Q_{23})$, $-N(Q_{24})(Q_{25})$, $-B(Q_{26})(Q_{27})$, $-P(Q_{28})(Q_{29})$, $-P(=O)(Q_{28})(Q_{29})$, or a combination thereof; or $-Si(Q_{31})(Q_{32})(Q_{33})$, $-Ge(Q_{31})(Q_{32})(Q_{33})$, $-N(Q_{34})(Q_{35})$, $-B(Q_{36})(Q_{37})$, $-P(Q_{38})(Q_{39})$, or $-P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, $-SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

2. The organometallic compound of claim 1, wherein M is iridium (Ir), platinum (Pt), osmium (Os), titanium (Ti), zirconium (Zr), hafnium (Hf), europium (Eu), terbium (Tb), thulium (Tm), rhodium (Rh), palladium (Pd), or gold (Au).

3. The organometallic compound of claim 1, wherein $X_{11}$ is N, and $X_{12}$ is $C(R_{12})$;

$X_{11}$ is $C(R_{11})$, and $X_{12}$ is N; or $X_{11}$ is N, and $X_{12}$ is N, and $R_{11}$ and $R_{12}$ are respectively as defined for $R_{11}$ and $R_{12}$ in claim 1.

4. The organometallic compound of claim 1, wherein ring $CY_2$, ring $CY_{31}$, ring $CY_{32}$, and ring $CY_4$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzotriazole, a benzoxazole group, a benzothiazole group, a benzoxadiazole group, a benzothiadiazole group, a 5,6,7,8-tetrahydroisoquinoline group, or a 5,6,7,8-tetrahydroquinoline group.

5. The organometallic compound of claim 1, wherein at least one of $Y_2$ to $Y_4$ is N.

6. The organometallic compound of claim 1, wherein $R_{1a}$, $R_{1b}$, $R_2$, $R_{2b}$, $R_{3a}$, $R_{3b}$, $R_4$, $R_{10a}$, $R_{11}$ to $R_{13}$, $R_{31}$, and $R_{32}$ are each independently:

hydrogen, deuterium, —F, —Cl, —Br, —I, $-SF_5$, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{60}$ alkylthio group, each substituted with at least one of deuterium, —F, —Cl, —Br, —I, $-SF_5$, $-CD_3$, $-CD_2H$, $-CDH_2$, $-CF_3$, $-CF_2H$, $-CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{31})(Q_{32})(Q_{33})$, or a combination thereof; or —$Si(Q_1)(Q_2)(Q_3)$, —$Ge(Q_1)(Q_2)(Q_3)$, —$N(Q_4)(Q_5)$, —$B(Q_6)(Q_7)$, —$P(Q_8)(Q_9)$, or —$P(=O)(Q_8)(Q_9)$, and $Q_1$ to $Q_9$ and $Q_{31}$ to $Q_{33}$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one of deuterium, a $C_1$-$C_{10}$ alkyl group, a phenyl group, or a combination thereof.

7. The organometallic compound of claim 1, wherein $R_{1a}$, $R_{1b}$, $R_2$, $R_{2b}$, $R_{3a}$, $R_{3b}$, $R_4$, $R_{10a}$, $R_{11}$ to $R_{13}$, $R_{31}$, and $R_{32}$ are each independently:

hydrogen, deuterium, —F, —Cl, —Br, —I, —$SF_5$, —$CD_3$, —$CD_2H$, —$CDH_2$, —$CF_3$, —$CF_2H$, —$CFH_2$, a cyano group, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a group represented by one of Formulae 9-1 to 9-61, 9-201 to 9-237, 10-1 to 10-129, or 10-201 to 10-355;

a group represented by one of Formulae 9-1 to 9-61, 9-201 to 9-237, 10-1 to 10-129, or 10-201 to 10-350 in which at least one hydrogen is substituted with deuterium, —F, or a cyano group; or —$Si(Q_1)(Q_2)(Q_3)$, —$Ge(Q_1)(Q_2)(Q_3)$, or —$N(Q_4)(Q_5)$, and $Q_1$ to $Q_5$ are respectively as defined for $Q_1$ to $Q_5$ in claim 1:

9-1

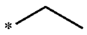

9-2

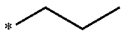

9-3

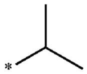

9-4

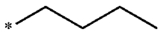

9-5

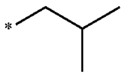

9-6

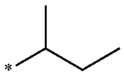

9-7

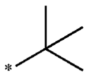

9-8

9-9

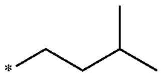

9-10

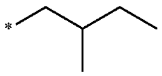

9-11

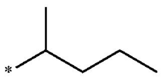

-continued
9-12
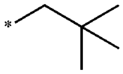
9-13
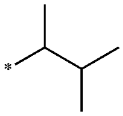
9-14
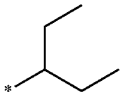
9-15
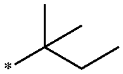
9-16
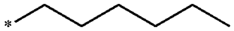
9-17
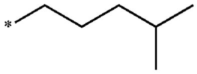
9-18
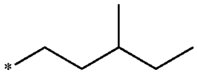
9-19
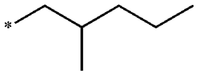
9-20
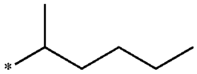
9-21
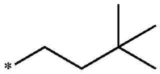
9-22
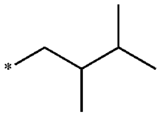
9-23
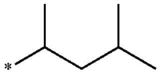
9-24
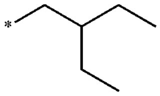
9-25
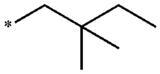
9-26
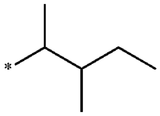
9-27
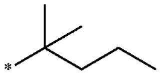
-continued
9-28
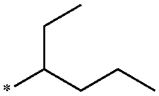
9-29
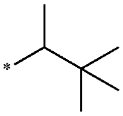
9-30
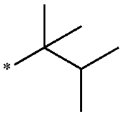
9-31
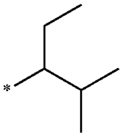
9-32
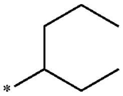
9-33
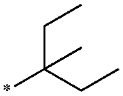
9-34
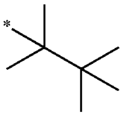
9-35
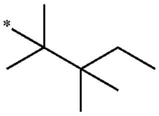
9-36
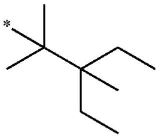
9-37
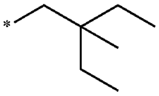
9-38
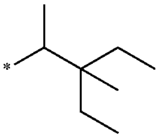
9-39
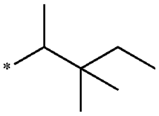
9-40
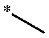

-continued
9-41
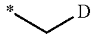
9-42
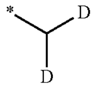
9-43
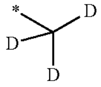
9-44
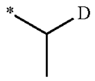
9-45
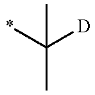
9-46
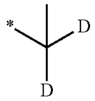
9-47
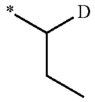
9-48
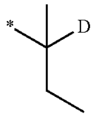
9-49
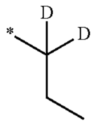
9-50
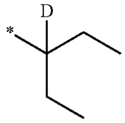
9-51
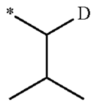
9-52
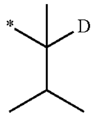
9-53
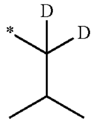
9-54
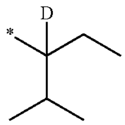
-continued
9-55
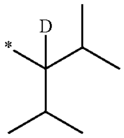
9-56
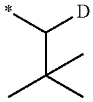
9-57
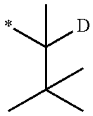
9-58
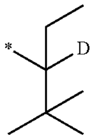
9-59
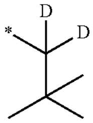
9-60
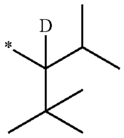
9-61
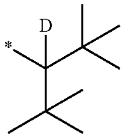
9-201
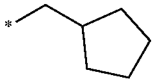
9-202
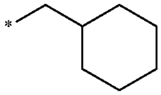
9-203
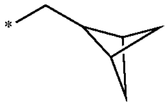
9-204
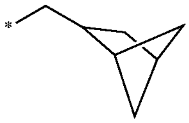
9-205
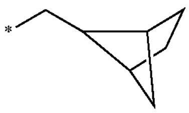

-continued
9-206
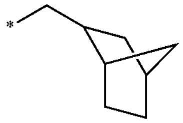
9-207
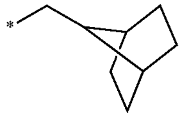
9-208
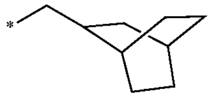
9-209
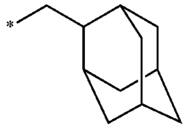
9-210
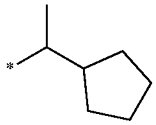
9-211
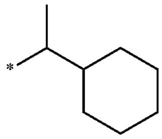
9-212
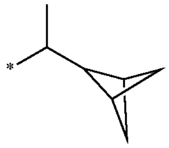
9-213
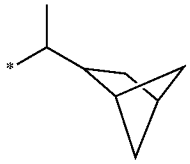
9-214
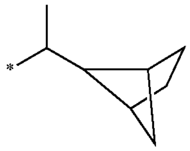
9-215
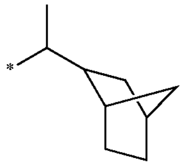
-continued
9-216
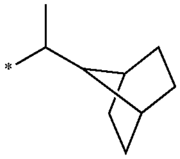
9-217
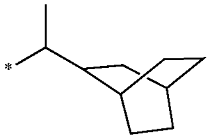
9-218
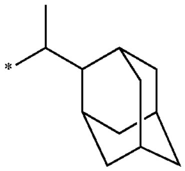
9-219
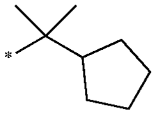
9-220
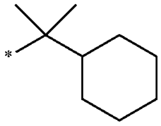
9-221
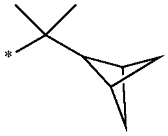
9-222
9-223
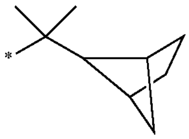
9-224
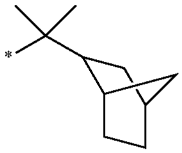
9-225
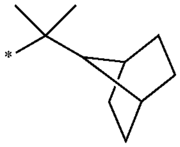

-continued
9-226
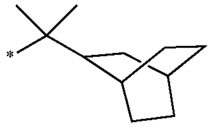
9-227
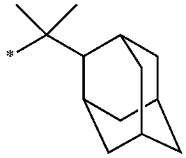
9-228
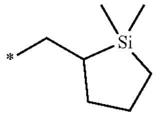
9-229
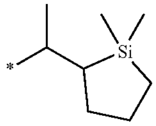
9-230
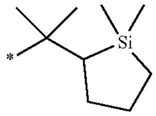
9-231
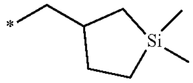
9-232
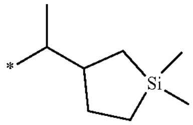
9-233
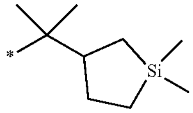
9-234
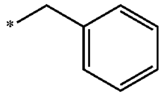
9-235
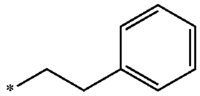
9-236
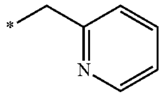
9-237
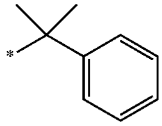
-continued
10-1
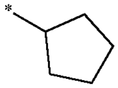
10-2
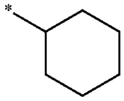
10-3
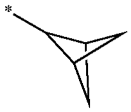
10-4
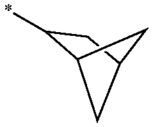
10-5
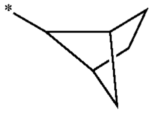
10-6
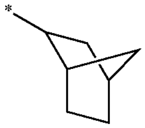
10-7
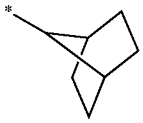
10-8
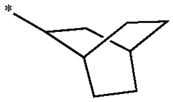
10-9
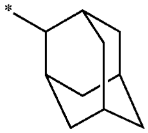
10-10
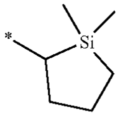
10-11
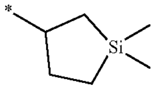
10-12
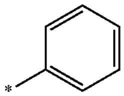
10-13
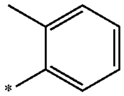

-continued
10-14
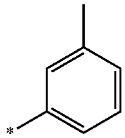
10-15
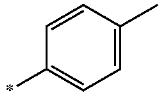
10-16
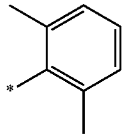
10-17
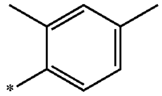
10-18
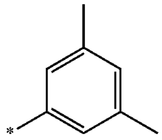
10-19
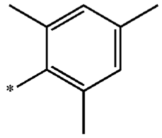
10-20
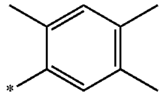
10-21
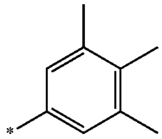
10-22
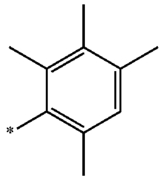
10-23
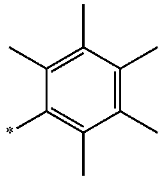
10-24
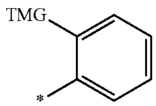
-continued
10-25
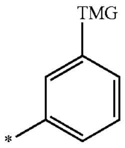
10-26
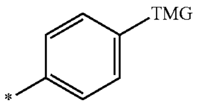
10-27
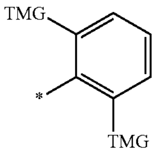
10-28
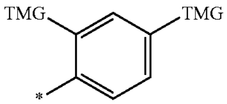
10-29
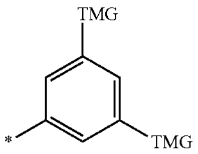
10-30
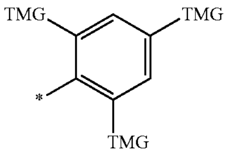
10-31
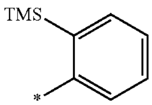
10-32
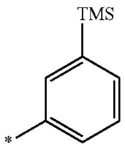
10-33
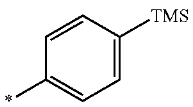
10-34
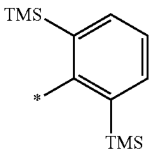
10-35
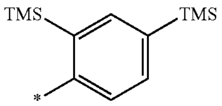

-continued
10-36
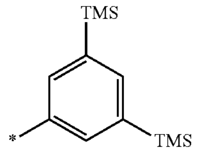
10-37
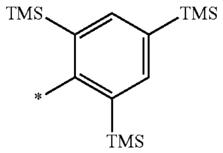
10-38
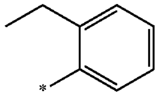
10-39
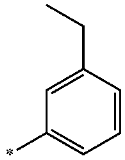
10-40
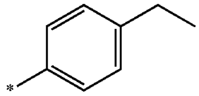
10-41
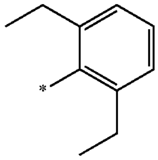
10-42
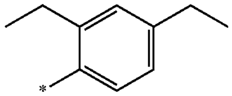
10-43
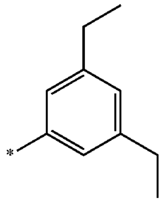
10-44
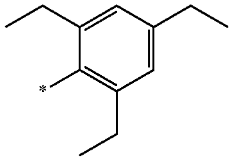
10-45
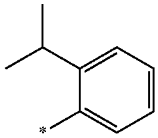
-continued
10-46
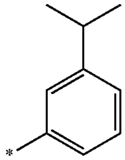
10-47
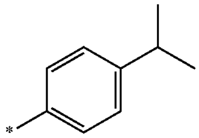
10-48
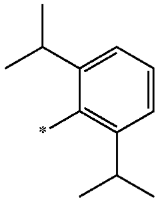
10-49
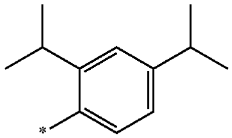
10-50
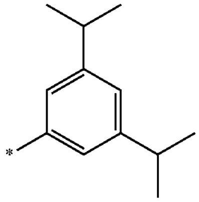
10-51
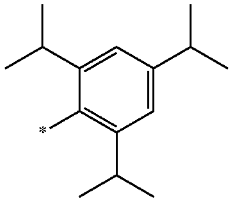
10-52
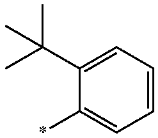
10-53
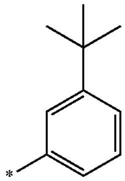
10-54
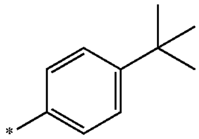

-continued
10-55
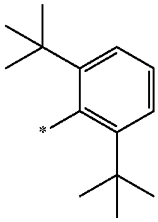
10-56
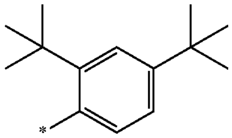
10-57
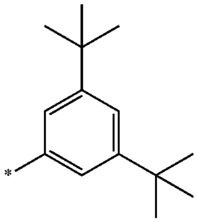
10-58
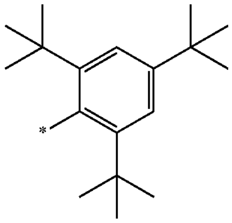
10-59
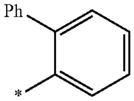
10-60
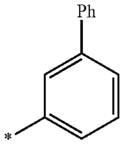
10-61
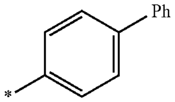
10-62
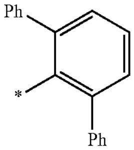
10-63
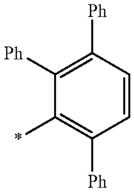
-continued
10-64
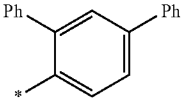
10-65
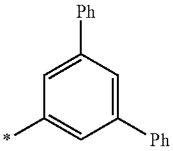
10-66
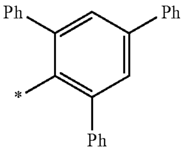
10-67
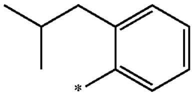
10-68
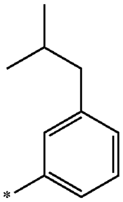
10-69
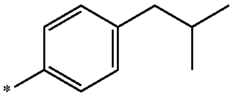
10-70
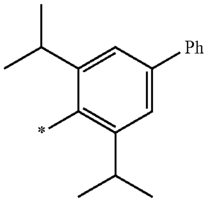
10-71
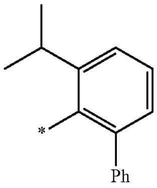
10-72
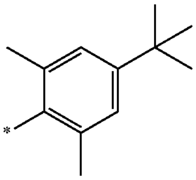

10-73
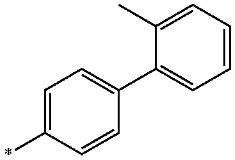
10-74
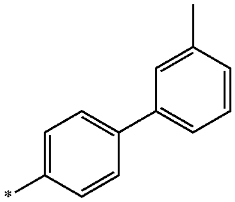
10-75
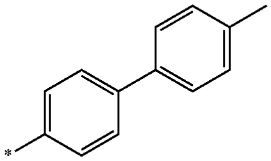
10-76
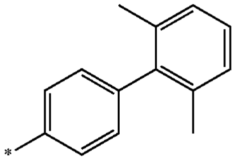
10-77
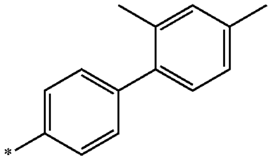
10-78
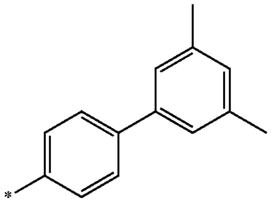
10-79
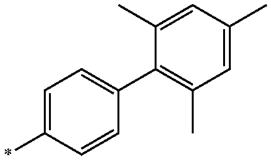
10-80
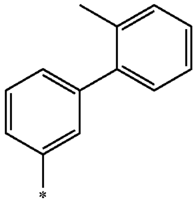
10-81
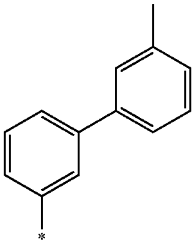
10-82
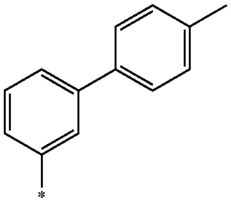
10-83
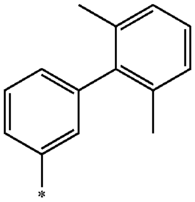
10-84
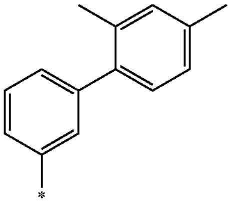
10-85
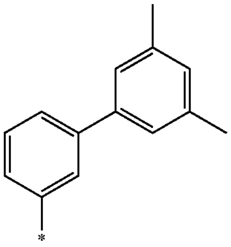
10-86
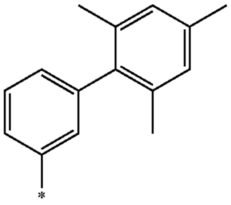
10-87
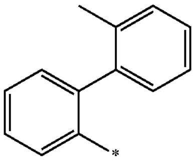

-continued
10-88
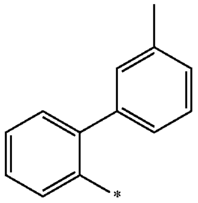
10-89
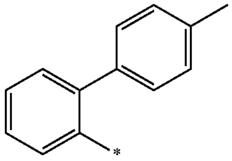
10-90
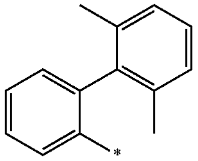
10-91
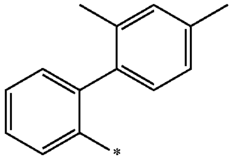
10-92
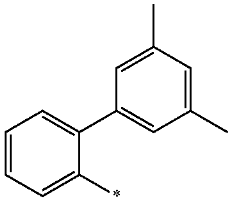
10-93
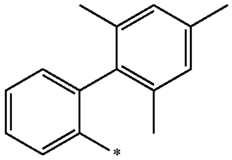
10-94
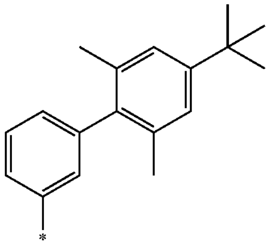
10-95
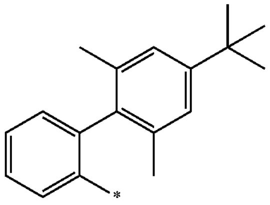
-continued
10-96
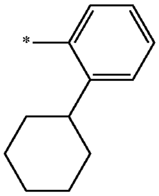
10-97
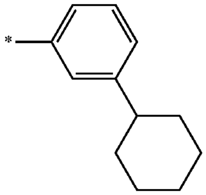
10-98
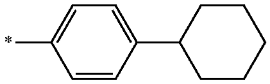
10-99
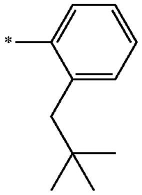
10-100
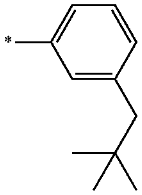
10-101
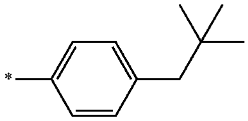
10-102
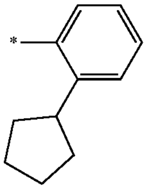
10-103
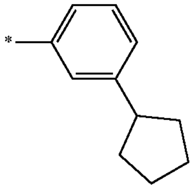
10-104
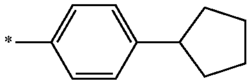

-continued
10-105
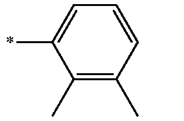
10-106
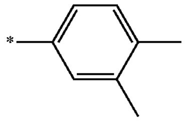
10-107
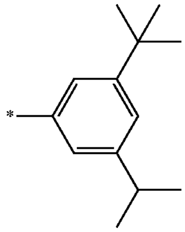
10-108
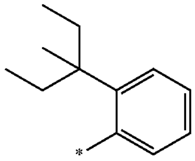
10-109
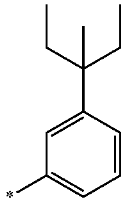
10-110
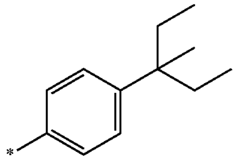
10-111
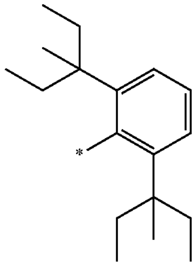
10-112
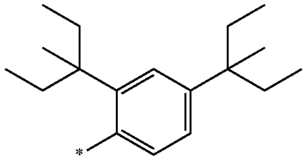
-continued
10-113
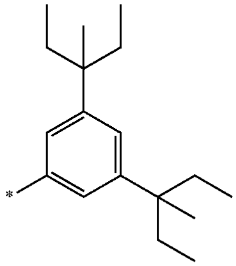
10-114
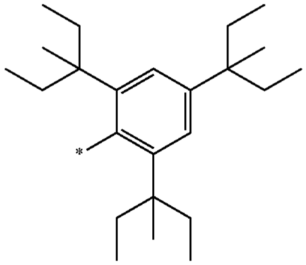
10-115
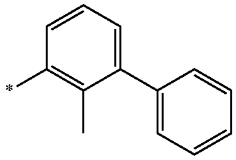
10-116
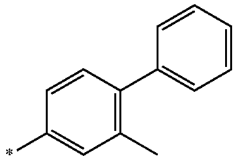
10-117
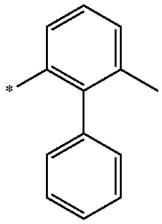
10-118
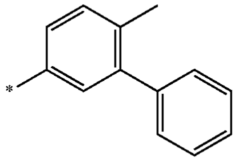
10-119
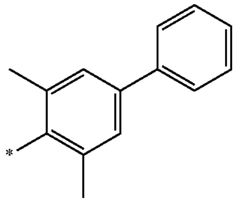

-continued
10-120
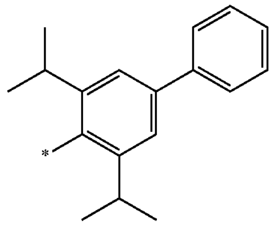
10-121
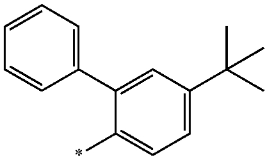
10-122
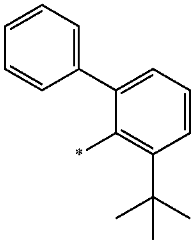
10-123
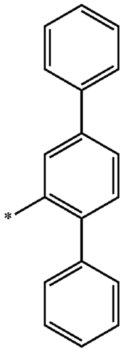
10-124
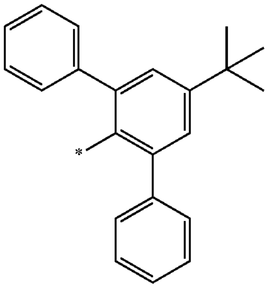
10-125
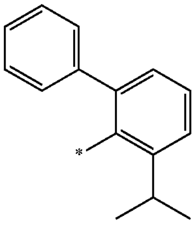
-continued
10-126
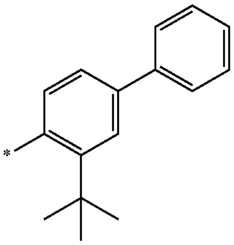
10-127
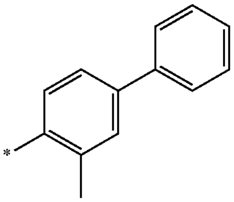
10-128
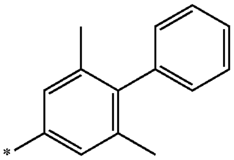
10-129
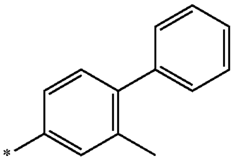
10-201
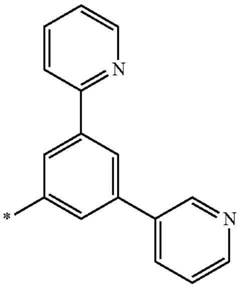
10-202
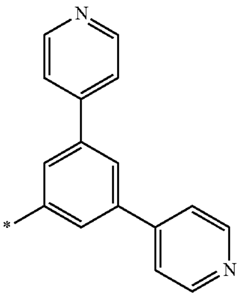

-continued
10-203
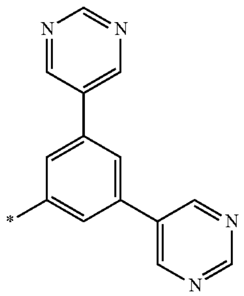
10-204
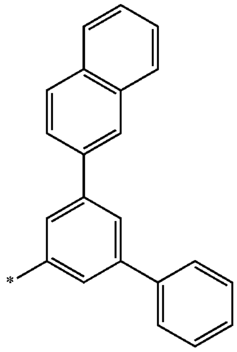
10-205
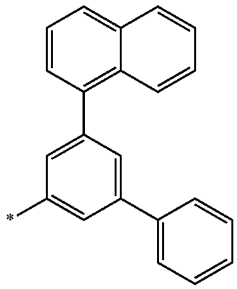
10-206
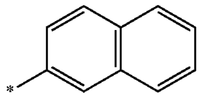
10-207
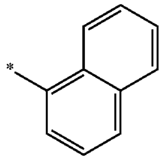
10-208
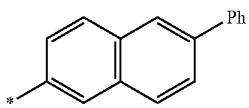
10-209
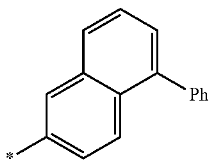
-continued
10-210
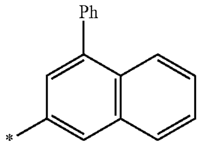
10-211
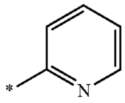
10-212
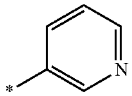
10-213
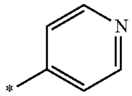
10-214
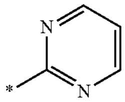
10-215
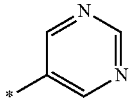
10-216
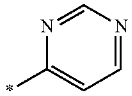
10-217
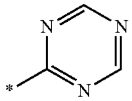
10-218
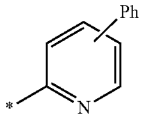
10-219
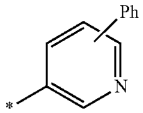
10-220
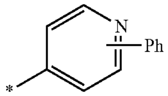
10-221
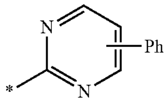
10-222
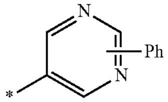

-continued
10-223
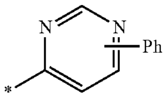
10-224
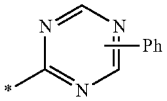
10-225
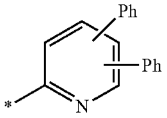
10-226
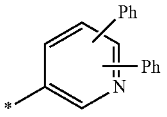
10-227
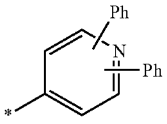
10-228
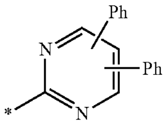
10-229
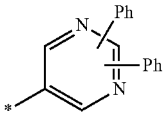
10-230
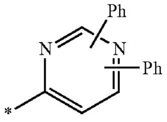
10-231
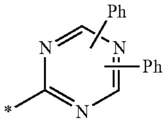
10-232
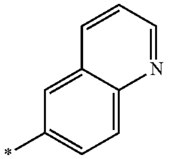
10-233
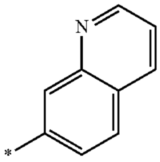
-continued
10-234
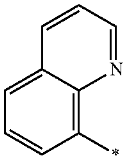
10-235
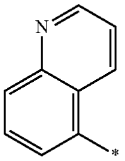
10-236
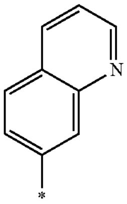
10-237
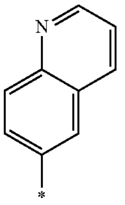
10-238
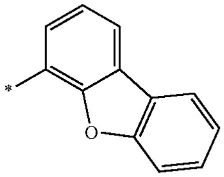
10-239
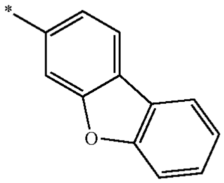
10-240
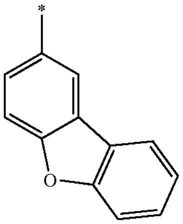
10-241
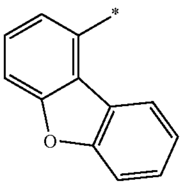

-continued
10-242
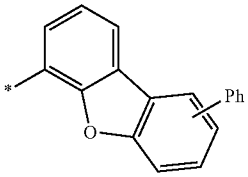
10-243
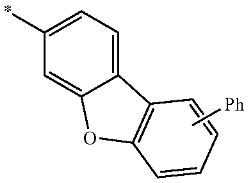
10-244
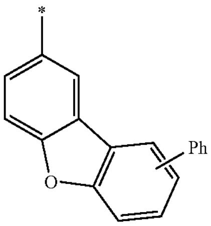
10-245
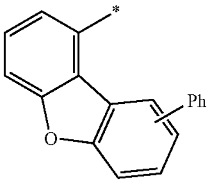
10-246
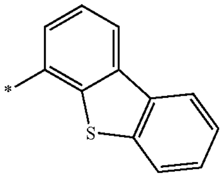
10-247
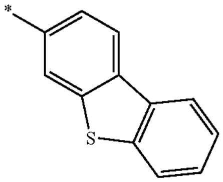
10-248
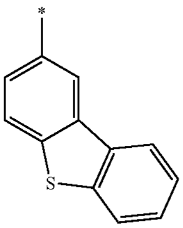
10-249
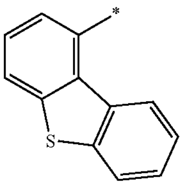
-continued
10-250
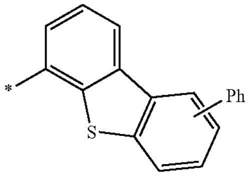
10-251
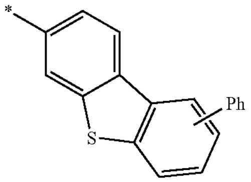
10-252
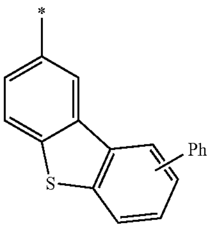
10-253
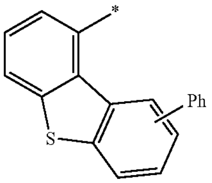
10-254
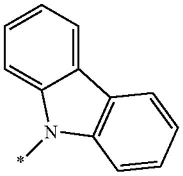
10-255
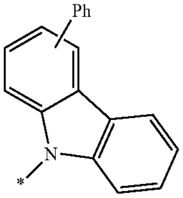
10-256
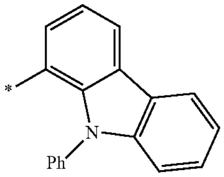
10-257
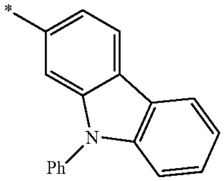

10-258
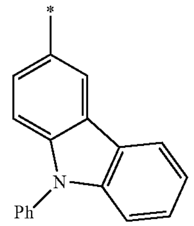
10-259
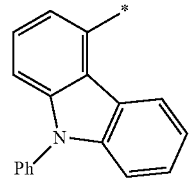
10-260
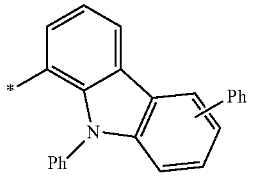
10-261
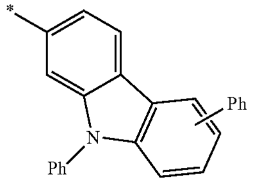
10-262
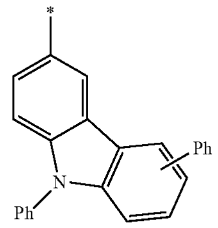
10-263
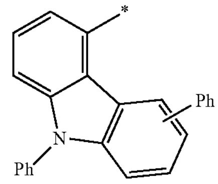
10-264
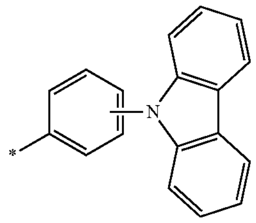
10-265
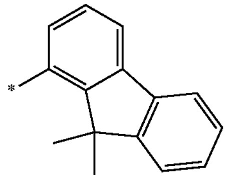
10-266
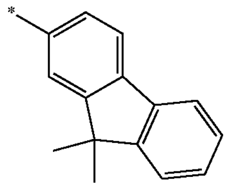
10-267
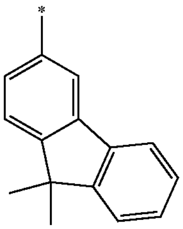
10-268
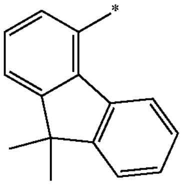
10-269
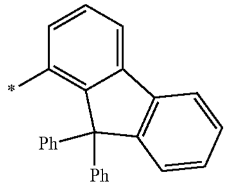
10-270
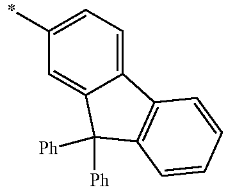
10-271
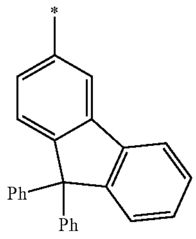

-continued
10-272
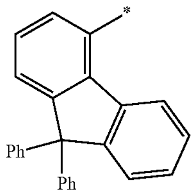
10-273
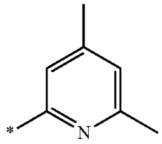
10-274
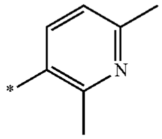
10-275
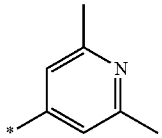
10-276
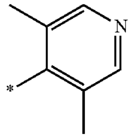
10-277
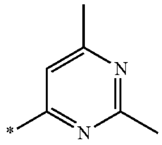
10-278
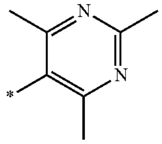
10-279
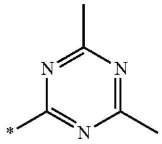
10-280
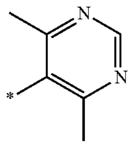
10-281
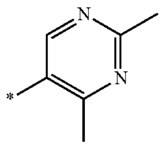
-continued
10-282
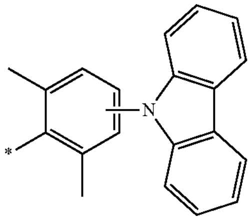
10-283
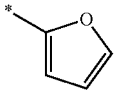
10-284
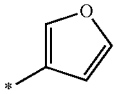
10-285
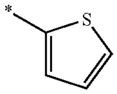
10-286
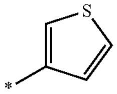
10-287
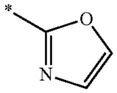
10-288
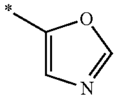
10-289
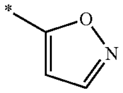
10-290
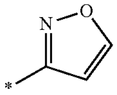
10-291
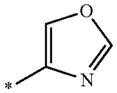
10-292
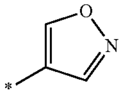
10-293
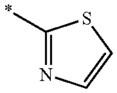
10-294
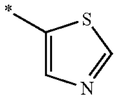

-continued
10-295
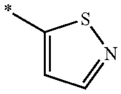
10-296
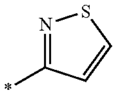
10-297
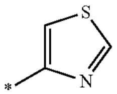
10-298
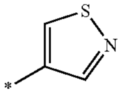
10-299
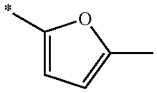
10-300
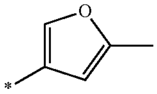
10-301
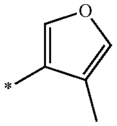
10-302
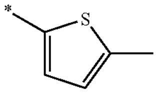
10-303
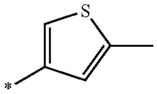
10-304
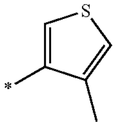
10-305
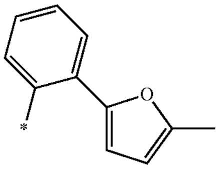
10-306
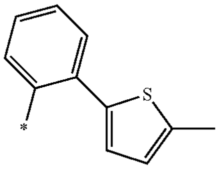
-continued
10-307
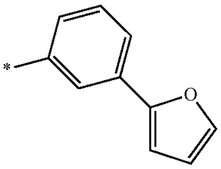
10-308
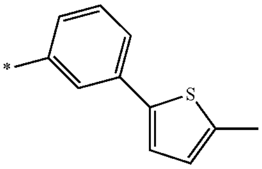
10-309
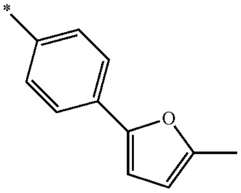
10-310
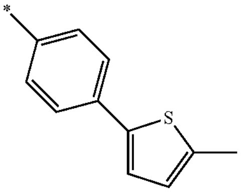
10-311
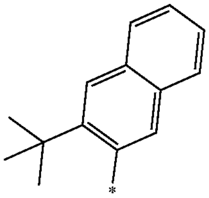
10-312
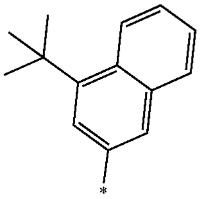
10-313
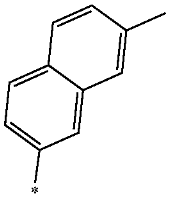
10-314
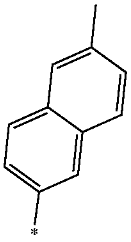

-continued
10-315
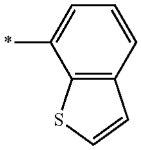
10-316
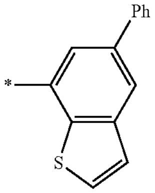
10-317
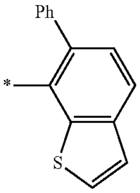
10-318
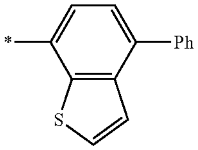
10-319
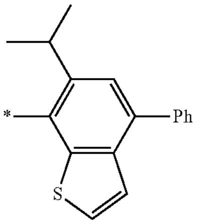
10-320
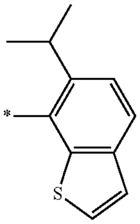
10-321
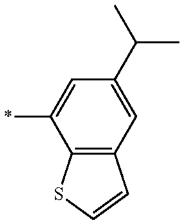
10-322
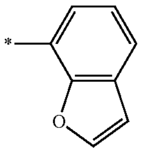
-continued
10-323
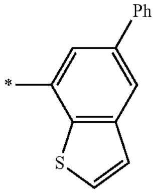
10-324
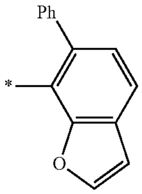
10-325
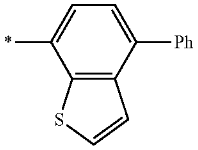
10-326
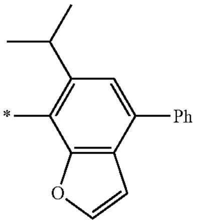
10-327
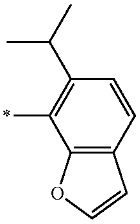
10-328
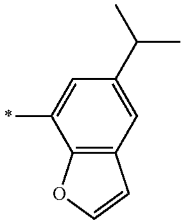
10-329
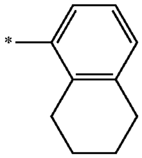
10-330
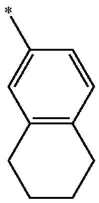

-continued
10-331
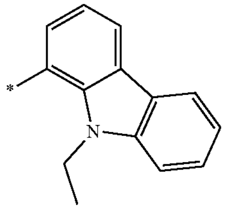
10-332
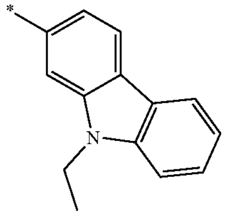
10-333
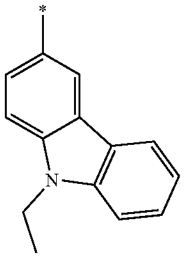
10-334
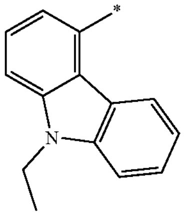
10-335
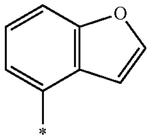
10-336
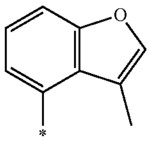
10-337
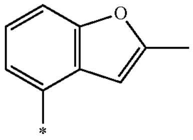
10-338
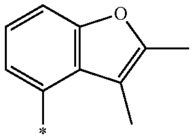
-continued
10-339
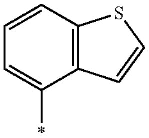
10-340
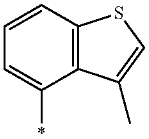
10-341
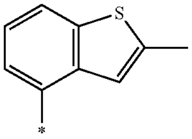
10-342
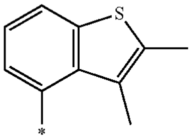
10-343
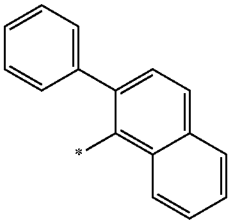
10-344
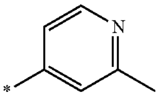
10-345
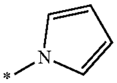
10-346
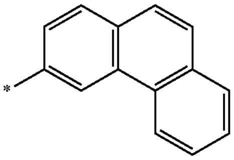
10-347
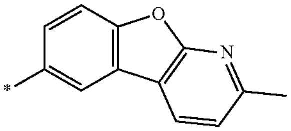
10-348
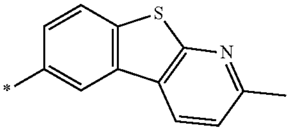

-continued 10-349

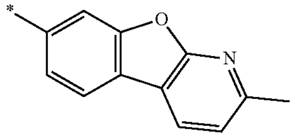

10-350

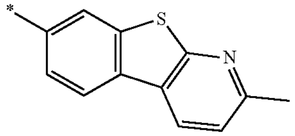

10-351

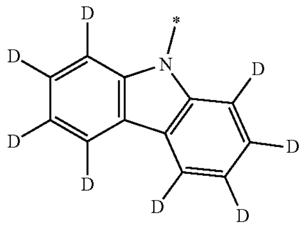

10-352

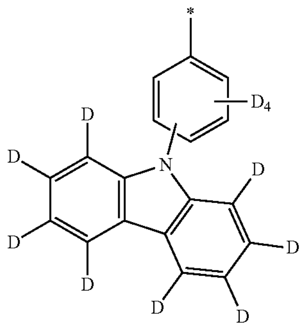

10-353

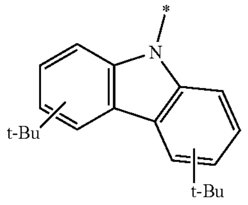

10-354

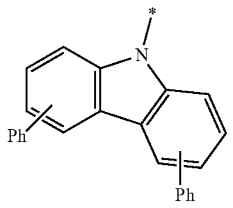

10-355

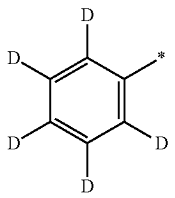

wherein, in Formulae 9-1 to 9-61, 9-201 to 9-237, 10-1 to 10-129, and 10-201 to 10-355, * indicates a binding site to a neighboring atom, "Ph" indicates a phenyl group, "TMS" indicates a trimethylsilyl group, and "TMG" indicates a trimethylgermyl group.

8. The organometallic compound of claim 1, wherein a group represented by

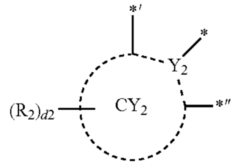

in Formula 1 is a group represented by one of Formulae 2-1 to 2-3:

Formual 2-1

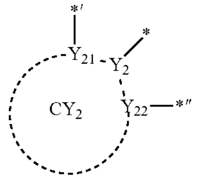

Formual 2-2

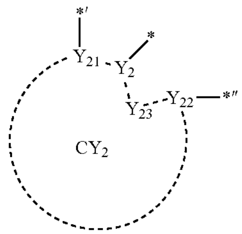

Formual 2-3

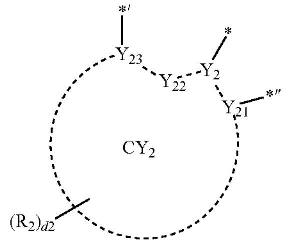

wherein, in Formulae 2-1 to 2-3, $Y_{21}$ to $Y_{23}$ are each independently C or N, $Y_{21}$ and $Y_2$ are linked to each other via a chemical bond, $Y_2$ and $Y_{22}$ are linked to each other via a chemical bond, $Y_2$ and $Y_{23}$ are linked to each other via a chemical bond, and $Y_{22}$ and $Y_{23}$ are linked to each other via a chemical bond,

*' indicates a binding site to $T_1$, *" indicates a binding site to $T_2$, and * indicates a binding site to $A_2$ or M, and ring $CY_2$, $Y_2$, $R_2$, and d2 are respectively as defined for ring $CY_2$, $Y_2$, $R_2$, and d2 in claim 1.

9. The organometallic compound of claim 1, wherein a group represented by

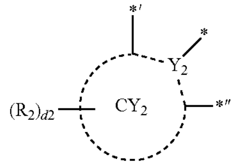

in Formula 1 is a group represented by one of Formulae CY2-1 to CY2-35:
CY2-1
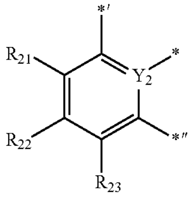
CY2-2
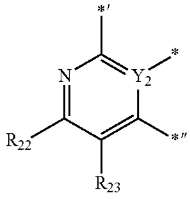
CY2-3
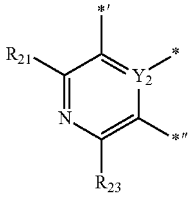
CY2-4
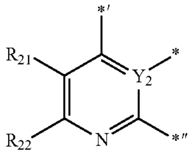
CY2-5
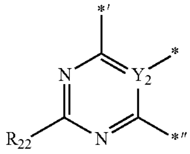
CY2-6
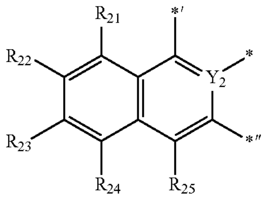
CY2-7
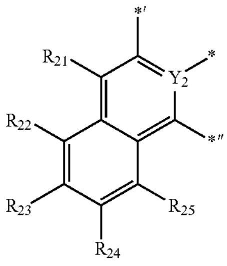
-continued
CY2-8
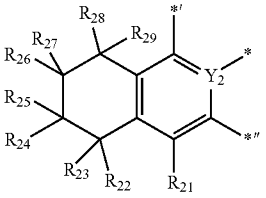
CY2-9
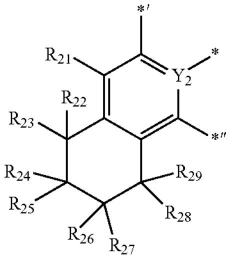
CY2-10
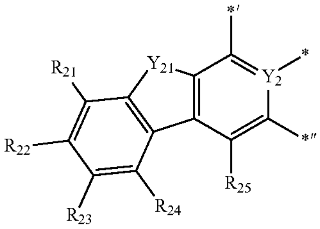
CY2-11
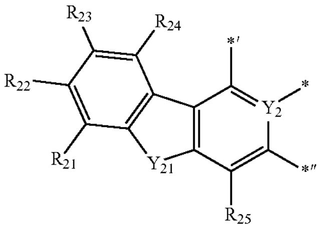
CY2-12
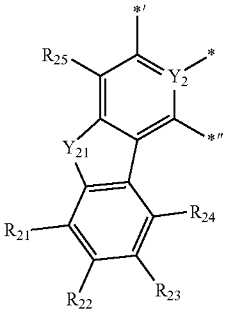
CY2-13
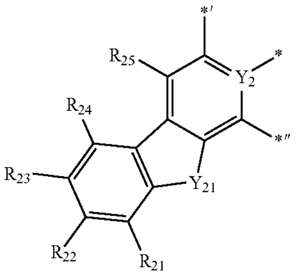

-continued
CY2-14
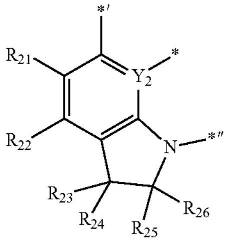
CY2-15
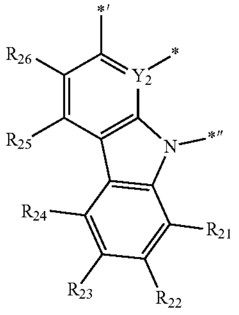
CY2-16
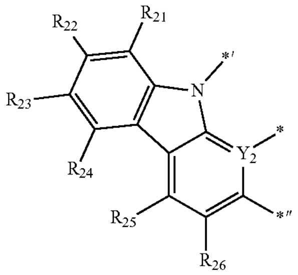
CY2-17
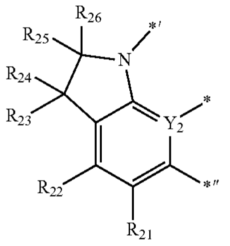
CY2-18
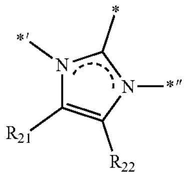
CY2-19
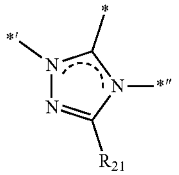
CY2-20
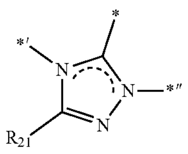
-continued
CY2-21
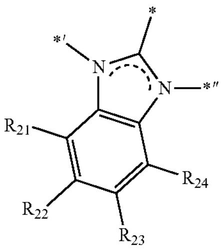
CY2-22
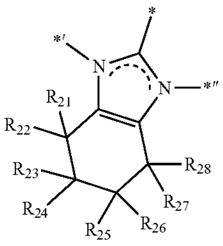
CY2-23
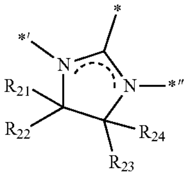
CY2-24
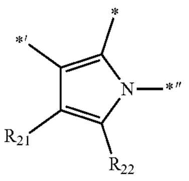
CY2-25
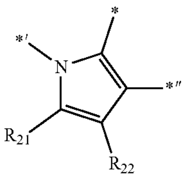
CY2-26
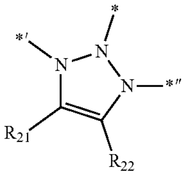
CY2-27
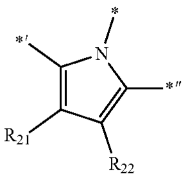

-continued

CY2-28

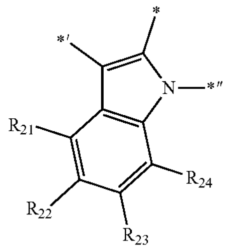

CY2-29

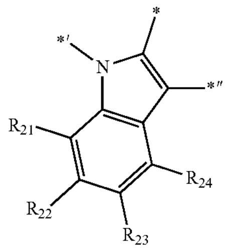

CY2-30

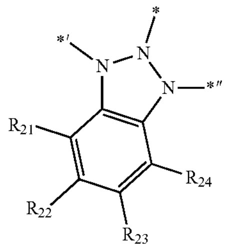

CY2-31

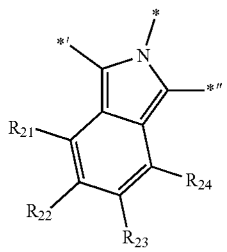

CY2-32

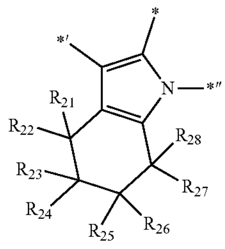

CY2-33

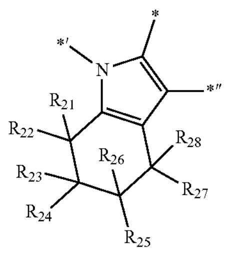

-continued

CY2-34

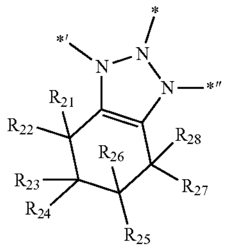

CY2-35

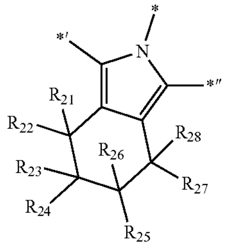

wherein, in Formulae CY2-1 to CY2-35, $Y_2$ is C or N, $R_{21}$ to $R_{29}$ are each independently as described for $R_2$ in claim 1, and

* indicates a binding site to M or $A_2$, *' indicates a binding site to $T_1$, and *" indicates a binding site to $T_2$.

10. The organometallic compound of claim 1, wherein a group represented by

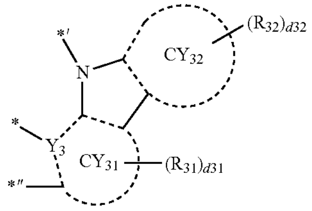

in Formula 1 is a group represented by one of Formulae CY3-1 to CY3-9:

CY3-1

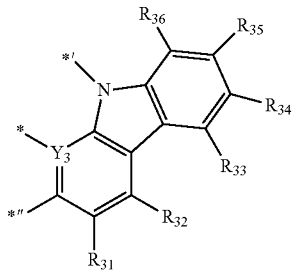

-continued

CY3-2

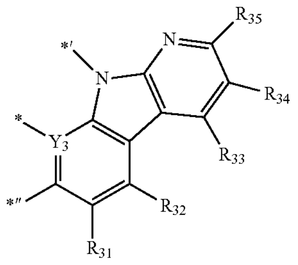

CY3-3

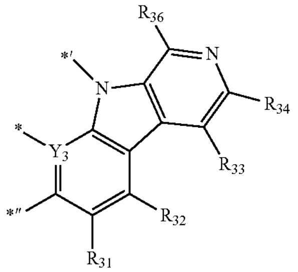

CY3-4

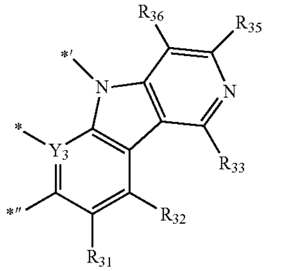

CY3-5

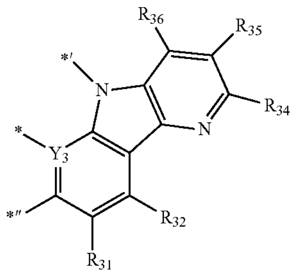

CY3-6

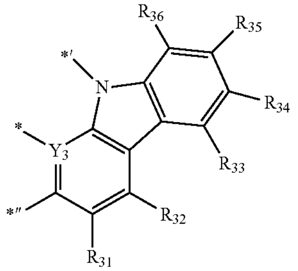

-continued

CY3-7

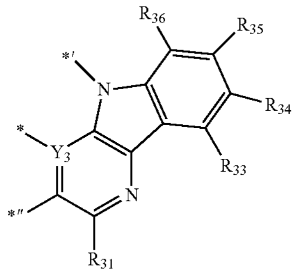

CY3-8

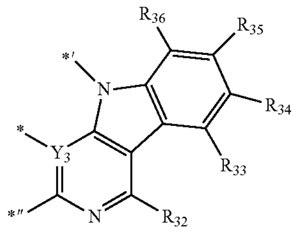

CY3-9

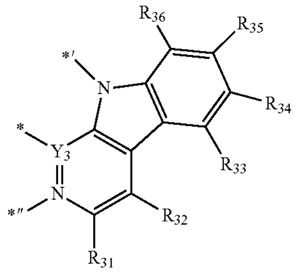

wherein, in Formulae CY3-1 to CY3-9, $Y_3$ is C or N, $R_{31}$ to $R_{36}$ are each independently as described for $R_{31}$ in claim 1, and

* indicates a binding site to M or $A_3$, *' indicates a binding site to $T_3$, and *" indicates a binding site to $T_2$.

11. The organometallic compound of claim 1, wherein a group represented by

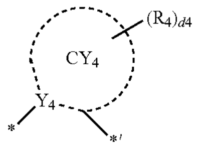

in Formula 1 is a group represented by one of Formulae CY4-1 to CY4-29:

CY4-1

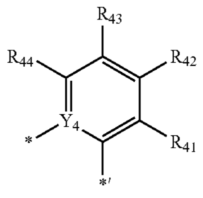

-continued
CY4-2
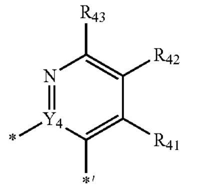
CY4-3
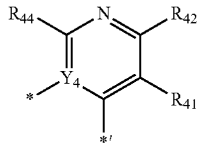
CY4-4
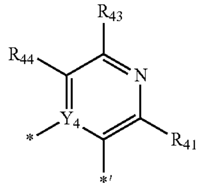
CY4-5
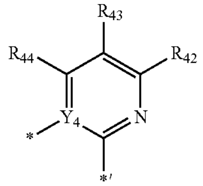
CY4-6
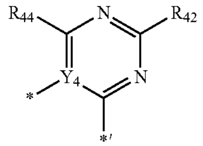
CY4-7
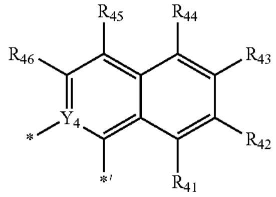
CY4-8
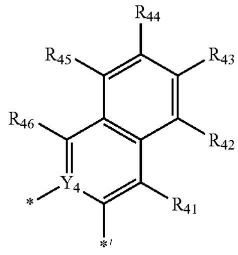
CY4-9
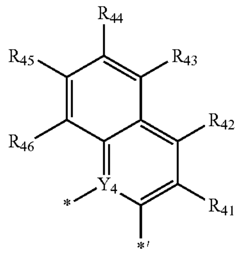
-continued
CY4-10
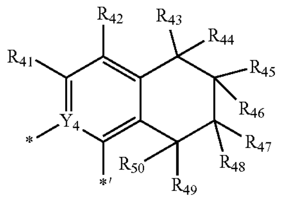
CY4-11
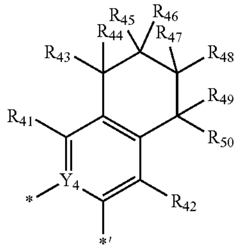
CY4-12
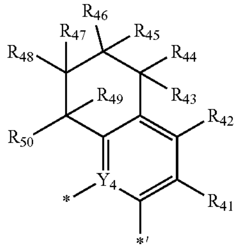
CY4-13
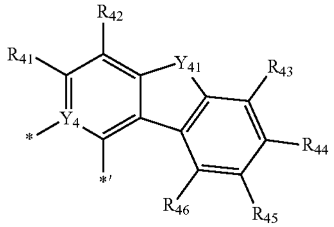
CY4-14
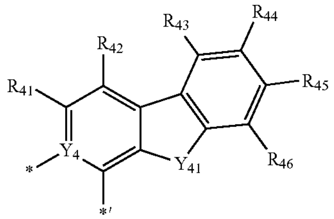
CY4-15
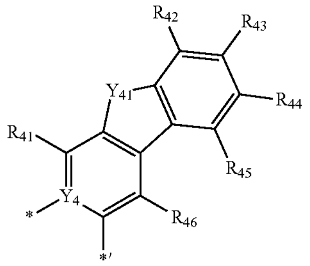

-continued
CY4-16
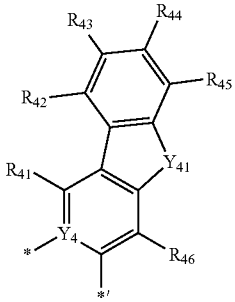
CY4-17
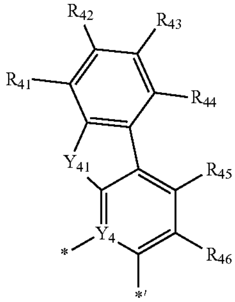
CY4-18
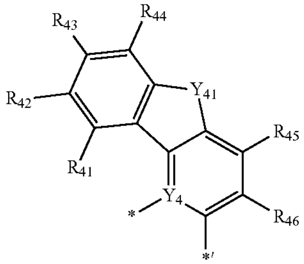
CY4-19
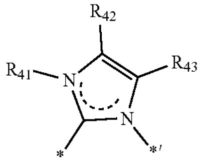
CY4-20
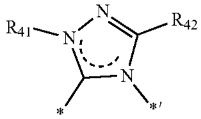
CY4-21
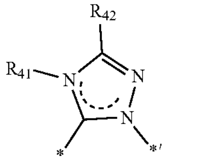
CY4-22
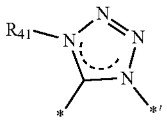
-continued
CY4-23
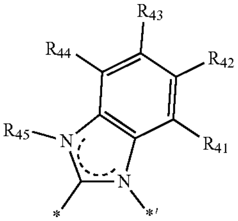
CY4-24
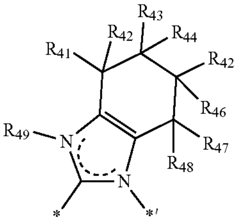
CY4-25
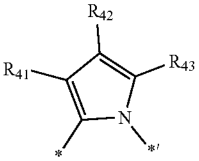
CY4-26
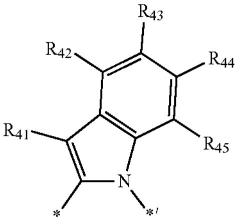
CY4-27
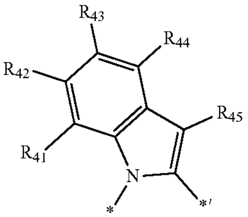
CY4-28
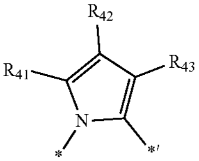
CY4-29
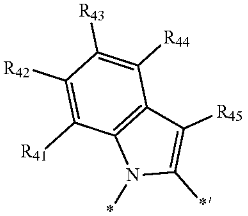
wherein, in Formulae CY4-1 to CY4-29,
$Y_4$ is C or N,
$Y_{41}$ is $N(R_{41a})$, O, Se, $C(R_{41a})(R_{41b})$, or $Si(R_{41a})(R_{41b})$, and
$R_{41}$ to $R_{50}$, $R_{41a}$, and $R_{41b}$ are each independently as described for $R_4$ in claim 1,

* indicates a binding site to M or $A_4$, and

*' indicates a binding site to $T_3$.

12. The organometallic compound of claim 1, wherein the organometallic compound is represented by one of Formulae 1-1 to 1-2:

Formula 1-1

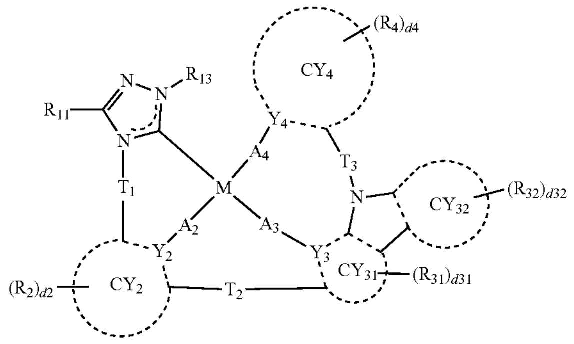

Formula 1-2

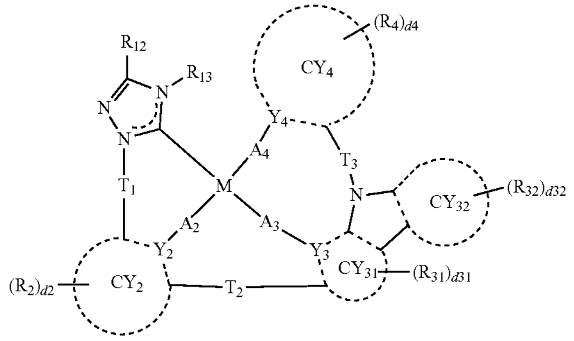

wherein, in Formulae 1-1 to 1-2,

M, ring $CY_2$, ring $CY_{31}$, ring $CY_{32}$, ring $CY_4$, $Y_2$ to $Y_4$, $A_2$ to $A_4$, $T_1$ to $T_3$, $R_{11}$ to $R_{13}$, $R_2$, $R_{31}$, $R_{32}$, $R_4$, d2, d31, d32, and d4 are respectively as define for M, ring $CY_2$, ring $CY_{31}$, ring $CY_{32}$, ring $CY_4$, $Y_2$ to $Y_4$, $A_2$ to $A_4$, $T_1$ to $T_3$, $R_{11}$ to $R_{13}$, $R_2$, $R_{31}$, $R_{32}$, $R_4$, d2, d31, d32, and d4 in claim 1.

13. The organometallic compound of claim 1, wherein the organometallic compound is represented by one of Formulae 1-11 to 1-12:

Formula 1-11

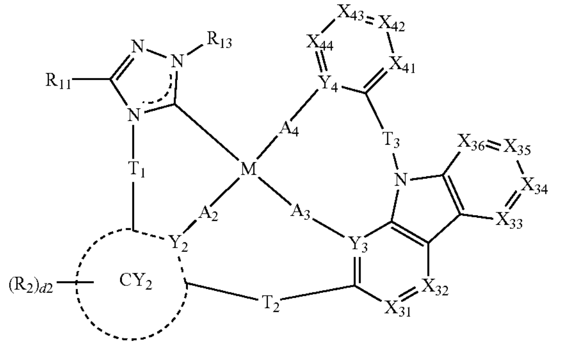

-continued

Formula 1-12

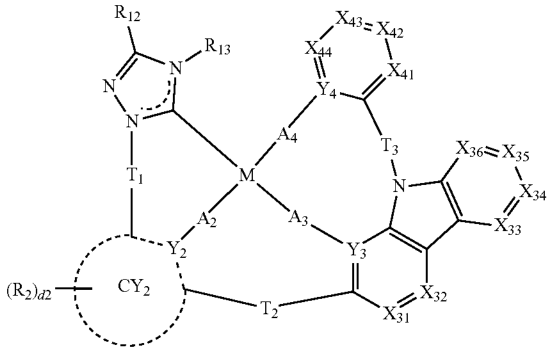

wherein, in Formulae 1-11 to 1-12, $X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, and $X_{36}$ is $C(R_{36})$ or N, $X_{41}$ is $C(R_{41})$ or N, $X_{42}$ is $C(R_{42})$ or N, $X_{43}$ is $C(R_{43})$ or N, and $X_{44}$ is $C(R_{44})$ or N, $R_{31}$ to $R_{36}$ are each independently as described for $R_{31}$ in claim 1, $R_{41}$ to $R_{44}$ are each independently as described for $R_4$ in claim 1, and M, ring $CY_2$, $Y_2$ to $Y_4$, $A_2$ to $A_4$, $T_1$ to $T_3$, $R_{11}$ to $R_{13}$, $R_2$, and d2 are respectively as defined for M, ring $CY_2$, $Y_2$ to $Y_4$, $A_2$ to $A_4$, $T_1$ to $T_3$, $R_{11}$ to $R_{13}$, $R_2$, and d2 in claim 1.

14. The organometallic compound of claim 1, wherein a highest occupied molecular orbital (HOMO) energy level of the organometallic compound is −5.25 electron Volts or less.

15. The organometallic compound of claim 1, wherein at least one of $T_1$ and $T_3$ is a single bond.

16. An organic light-emitting device, comprising:

a first electrode;

a second electrode; and an organic layer arranged between the first electrode and the second electrode, wherein the organic layer comprises an emission layer, and wherein the organic layer further comprises at least one of the organometallic compound of claim 1.

17. The organic light-emitting device of claim 16, wherein the emission layer comprises the at least one of the organometallic compound.

18. The organic light-emitting device of claim 17, wherein the emission layer emits light having a maximum emission wavelength of about 440 nanometer to about 470 nanometer.

19. The organic light-emitting device of claim 16, wherein the first electrode is an anode, the second electrode is a cathode, the organic layer further comprises a hole transport region arranged between the first electrode and the emission layer, and an electron transport region arranged between the emission layer and the second electrode, the hole transport region comprises a hole injection layer, a hole transport layer, an electron blocking layer, a buffer layer, or a combination thereof, and the electron transport region comprises a hole blocking layer, an electron transport layer, an electron injection layer, or a combination thereof.

20. An electronic apparatus, comprising the organic light-emitting device of claim 16.

* * * * *